(12) United States Patent
Um et al.

(10) Patent No.: US 12,473,257 B2
(45) Date of Patent: Nov. 18, 2025

(54) HETEROCYCLIC COMPOUND AND LIGHT-EMITTING DEVICE INCLUDING THE SAME

(71) Applicant: Samsung Display Co., Ltd., Yongin-si (KR)

(72) Inventors: Hyunah Um, Yongin-si (KR); Hyeongmin Kim, Yongin-si (KR); Heechoon Ahn, Yongin-si (KR); Yeseul Lee, Yongin-si (KR); Hyoyoung Lee, Yongin-si (KR); Yirang Im, Yongin-si (KR); Seowon Cho, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 929 days.

(21) Appl. No.: 17/450,145

(22) Filed: Oct. 6, 2021

(65) Prior Publication Data
US 2022/0112163 A1  Apr. 14, 2022

(30) Foreign Application Priority Data

Oct. 13, 2020 (KR) .................. 10-2020-0131817

(51) Int. Cl.
| | |
|---|---|
| *C07D 209/86* | (2006.01) |
| *C07D 519/00* | (2006.01) |
| *C07F 7/08* | (2006.01) |
| *H10K 85/40* | (2023.01) |
| *H10K 85/60* | (2023.01) |
| *H10K 50/11* | (2023.01) |
| *H10K 101/10* | (2023.01) |

(52) U.S. Cl.
CPC ......... *C07D 209/86* (2013.01); *C07D 519/00* (2013.01); *C07F 7/0812* (2013.01); *H10K 85/40* (2023.02); *H10K 85/6572* (2023.02); *H10K 85/6574* (2023.02); *H10K 85/6576* (2023.02); *H10K 50/11* (2023.02); *H10K 2101/10* (2023.02)

(58) Field of Classification Search
CPC .. C07D 209/82; C07D 209/812; C07F 7/0812
See application file for complete search history.

(56) References Cited

U.S. PATENT DOCUMENTS

| | | |
|---|---|---|
| 9,391,288 B2 | 7/2016 | Nagao et al. |
| 10,263,196 B2 | 4/2019 | Danz et al. |

(Continued)

FOREIGN PATENT DOCUMENTS

| | | |
|---|---|---|
| KR | 10-1632517 B1 | 6/2016 |
| KR | 10-2017-0142066 A | 12/2017 |

(Continued)

*Primary Examiner* — Michael M Dollinger
(74) *Attorney, Agent, or Firm* — Womble Bond Dickinson (US) LLP

(57) ABSTRACT

A heterocyclic compound is represented by Formula 1 in the present specification and satisfies at least one of Condition 1 to Condition 5, a light-emitting device includes the heterocyclic compound, and an electronic apparatus includes the light-emitting device. The light-emitting device includes: a first electrode; a second electrode facing the first electrode; and interlayer between the first electrode and the second electrode and including an emission layer; and the heterocyclic compound.

14 Claims, 3 Drawing Sheets

(56) References Cited

U.S. PATENT DOCUMENTS

| | | | |
|---|---|---|---|
| 10,297,760 B2 | 5/2019 | Kitamura et al. | |
| 2006/0177691 A1 | 8/2006 | Tai et al. | |
| 2017/0365796 A1 | 12/2017 | Kim et al. | |
| 2018/0066000 A1 | 3/2018 | Stoessel et al. | |
| 2018/0248127 A1 | 8/2018 | Lee et al. | |
| 2019/0173020 A1* | 6/2019 | Suzuki | C09K 11/06 |
| 2020/0079735 A1 | 3/2020 | Ma et al. | |
| 2020/0115364 A1* | 4/2020 | Aguilera-Iparraguirre | C07D 403/14 |
| 2020/0295269 A1* | 9/2020 | Lee | C07F 7/0812 |
| 2021/0210700 A1* | 7/2021 | Fleetham | H10K 85/6574 |
| 2022/0177496 A1* | 6/2022 | Kim | C07F 7/0816 |

FOREIGN PATENT DOCUMENTS

| | | | | |
|---|---|---|---|---|
| KR | 10-2018-0006423 A | 1/2018 | | |
| KR | 10-2018-0098809 A | 9/2018 | | |
| KR | 10-1971895 B1 | 4/2019 | | |
| KR | 10-2022438 B1 | 9/2019 | | |
| KR | 10-2020-0030480 A | 3/2020 | | |
| WO | WO-2018155642 A1 * | 8/2018 | | C07D 209/86 |
| WO | WO-2018237389 A1 * | 12/2018 | | C07D 209/82 |

* cited by examiner

HETEROCYCLIC COMPOUND AND LIGHT-EMITTING DEVICE INCLUDING THE SAME

CROSS-REFERENCE TO RELATED APPLICATION

This application claims priority to and the benefit of Korean Patent Application No. 10-2020-0131817, filed on Oct. 13, 2020, in the Korean Intellectual Property Office, the entire contents of which are hereby incorporated by reference.

BACKGROUND

1. Field

One or more embodiments of the present disclosure relate to a heterocyclic compound and a light-emitting device including the heterocyclic compound.

2. Description of Related Art

Organic light-emitting devices from among light-emitting devices are self-emission devices that have wide viewing angles, high contrast ratios, short response times, and excellent characteristics in terms of brightness, driving voltage, and response speed, compared to other devices in the art.

The organic light-emitting devices may include a first electrode on a substrate, and a hole transport region, an emission layer, an electron transport region, and a second electrode sequentially stacked on the first electrode. Holes provided from the first electrode may move toward the emission layer through the hole transport region, and electrons provided from the second electrode may move toward the emission layer through the electron transport region. Carriers, such as the holes and the electrons, recombine in the emission layer to produce excitons. These excitons transit (e.g., transition or relax) from an excited state to a ground state, thereby generating light.

SUMMARY

One or more embodiments of the present disclosure relate to a light-emitting device including a compound having excellent light efficiency and high stability, and an electronic apparatus including the light-emitting device.

Additional aspects of embodiments will be set forth in part in the description which follows and, in part, will be apparent from the description, or may be learned by practice of the presented embodiments of the disclosure.

According to an aspect of an embodiment, provided is a heterocyclic compound represented by Formula 1 and satisfying at least one of Condition 1 to Condition 5.

Formula 1

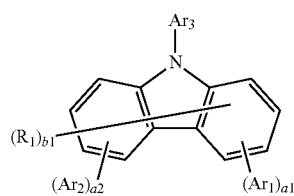

$Ar_1$ in Formula 1 may be a group represented by Formula 2A, $Ar_2$ in Formula 1 may be a group represented by Formula 2B, a1 and a2 in Formula 1 may each independently be an integer from 0 to 4, wherein a sum of a1 and a2 is 1 or more, $Ar_3$ in Formula 1 may be a group represented by one of Formulae 3A-1 to 3A-4 and 3B-1 to 3B-4,

2A

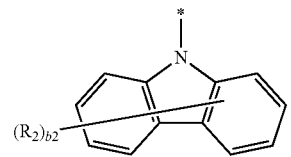

2B

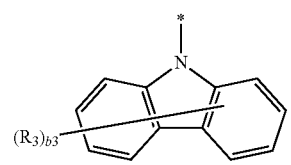

3A-1

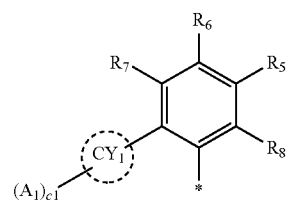

3A-2

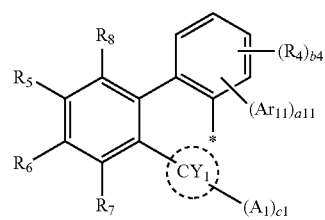

3A-3

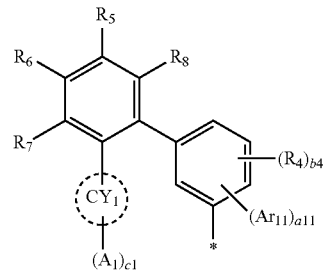

3A-4

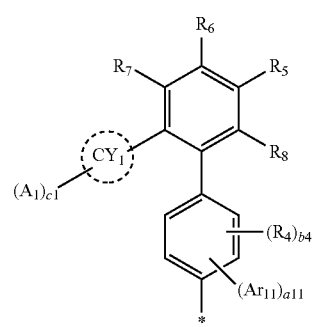

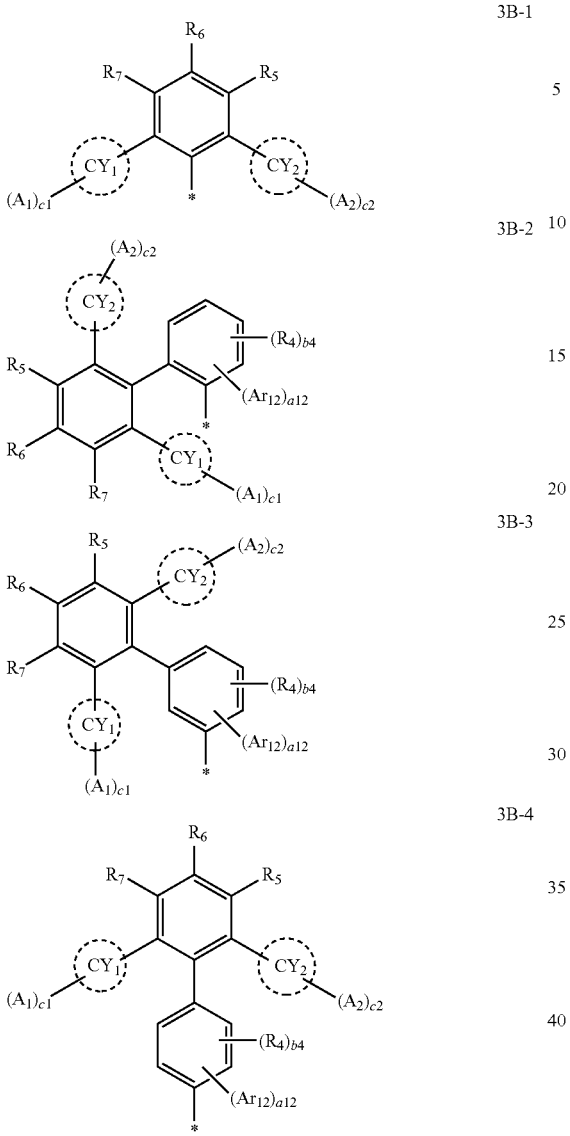

ring CY$_1$ and ring CY$_2$ in Formulae 3A-1 to 3A-4 and 3B-1 to 3B-4 may each independently be a π-electron-rich C$_3$-C$_{60}$ cyclic group or a pyridine group, in Formulae 3A-2 to 3A-4 and 3B-2 to 3B-4, Ar$_{11}$ may be a group represented by Formula 3A-1, Ar$_{12}$ may be a group represented by Formula 3B-1, and a11 and a12 may each independently be an integer from 0 to 4, R$_1$ to R$_7$, A$_1$, and A$_2$ in Formulae 1, 2A, 2B, 3A-1 to 3A-4, and 3B-1 to 3B-4 may each independently be hydrogen, deuterium, —F, —Cl, —Br, —I, a hydroxyl group, a cyano group, a nitro group, a C$_1$-C$_{60}$ alkyl group unsubstituted or substituted with at least one R$_{10a}$, a C$_2$-C$_{60}$ alkenyl group unsubstituted or substituted with at least one R$_{10a}$, a C$_2$-C$_{60}$ alkynyl group unsubstituted or substituted with at least one R$_{10a}$, a C$_1$-C$_{60}$ alkoxy group unsubstituted or substituted with at least one R$_{10a}$, a C$_3$-C$_{60}$ carbocyclic group unsubstituted or substituted with at least one R$_{10a}$, a C$_1$-C$_{60}$ heterocyclic group unsubstituted or substituted with at least one R$_{10a}$, a C$_6$-C$_{60}$ aryloxy group unsubstituted or substituted with at least one R$_{10a}$, a C$_6$-C$_{60}$ arylthio group unsubstituted or substituted with at least one R$_{10a}$, —C(Q$_{51}$)(Q$_{52}$)(Q$_{53}$), —Si(Q$_{51}$)(Q$_{52}$)(Q$_{53}$), —Si(Q$_1$)(Q$_2$)(Q$_3$), —N(Q$_1$)(Q$_2$), —B(Q$_1$)(Q$_2$), —C(=O)(Q$_1$), —S(=O)$_2$(Q$_1$), —P(=O)(Q$_1$)(Q$_2$), or —C(Q$_1$)(Q$_2$)(Q$_3$), wherein Q$_{51}$ to Q$_{53}$ may each independently be a C$_3$-C$_{60}$ carbocyclic group unsubstituted or substituted with at least one R$_{10a}$ or a C$_1$-C$_{60}$ heterocyclic group unsubstituted or substituted with at least one R$_{10a}$, two neighboring groups of Q$_{51}$ to Q$_{53}$ may optionally be linked to form a C$_5$-C$_{30}$ carbocyclic group unsubstituted or substituted with at least one R$_{10a}$ or a C$_2$-C$_{30}$ heterocyclic group unsubstituted or substituted with at least one R$_{10a}$, R$_8$ in Formulae 3A-1 to 3A-4 may be hydrogen, deuterium, or a C$_1$-C$_{60}$ alkyl group unsubstituted or substituted with at least one deuterium, b1 in Formula 1 may be an integer from 1 to 7, b2 and b3 in Formulae 2A and 2B may each independently be an integer from 1 to 8, b4 in Formulae 3A-2 to 3A-4 and 3B-2 to 3B-4 may be an integer from 1 to 4, c1 and c2 in Formulae 3A-1 to 3A-4 and 3B-1 to 3B-4 may each independently be an integer from 1 to 10,

* may indicate a binding site to a neighboring atom, and

R$_{10a}$ may be:

deuterium (-D), —F, —Cl, —Br, —I, a hydroxyl group, a cyano group, or a nitro group, a C$_1$-C$_{60}$ alkyl group, a C$_2$-C$_{60}$ alkenyl group, a C$_2$-C$_{60}$ alkynyl group, or a C$_1$-C$_{60}$ alkoxy group, each unsubstituted or substituted with deuterium, —F, —Cl, —Br, —I, a hydroxyl group, a cyano group, a nitro group, a C$_3$-C$_{60}$ carbocyclic group, a C$_1$-C$_{60}$ heterocyclic group, a C$_6$-C$_{60}$ aryloxy group, a C$_6$-C$_{60}$ arylthio group, —Si(Q$_{11}$)(Q$_{12}$)(Q$_{13}$), —N(Q$_{11}$)(Q$_{12}$), —B(Q$_{11}$)(Q$_{12}$), —C(=O)(Q$_{11}$), —S(=O)$_2$(Q$_{11}$), —P(=O)(Q$_{11}$)(Q$_{12}$), or any combination thereof, a C$_3$-C$_{60}$ carbocyclic group, a C$_1$-C$_{60}$ heterocyclic group, a C$_6$-C$_{60}$ aryloxy group, or a C$_6$-C$_{60}$ arylthio group, each unsubstituted or substituted with deuterium, —F, —Cl, —Br, —I, a hydroxyl group, a cyano group, a nitro group, a C$_1$-C$_{60}$ alkyl group, a C$_2$-C$_{60}$ alkenyl group, a C$_2$-C$_{60}$ alkynyl group, a C$_1$-C$_{60}$ alkoxy group, a C$_3$-C$_{60}$ carbocyclic group, a C$_1$-C$_{60}$ heterocyclic group, a C$_6$-C$_{60}$ aryloxy group, a C$_6$-C$_{60}$ arylthio group, —Si(Q$_{21}$)(Q$_{22}$)(Q$_{23}$), —N(Q$_{21}$)(Q$_{22}$), —B(Q$_{21}$)(Q$_{22}$), —C(=O)(Q$_{21}$), —S(=O)$_2$(Q$_{21}$), —P(=O)(Q$_{21}$)(Q$_{22}$), or any combination thereof, or —Si(Q$_{31}$)(Q$_{32}$)(Q$_{33}$), —N(Q$_{31}$)(Q$_{32}$), —B(Q$_{31}$)(Q$_{32}$), —C(=O)(Q$_{31}$), —S(=O)$_2$(Q$_{31}$), —P(=O)(Q$_{31}$)(Q$_{32}$), or —C(Q$_{31}$)(Q$_{32}$)(Q$_{33}$), wherein Q$_1$ to Q$_3$, Q$_{11}$ to Q$_{13}$, Q$_{21}$ to Q$_{23}$, and Q$_{31}$ to Q$_{33}$ may each independently be: hydrogen; deuterium; —F; —Cl; —Br; —I; a hydroxyl group; a cyano group; a nitro group; a C$_1$-C$_{60}$ alkyl group; a C$_2$-C$_{60}$ alkenyl group; a C$_2$-C$_{60}$ alkynyl group; a C$_1$-C$_{60}$ alkoxy group; or a C$_3$-C$_{60}$ carbocyclic group or a C$_1$-C$_{60}$ heterocyclic group, each unsubstituted or substituted with deuterium, —F, a cyano group, a C$_1$-C$_{60}$ alkyl group, a C$_1$-C$_{60}$ alkoxy group, a phenyl group, a biphenyl group, or any combination thereof.

Condition 1

When Ar$_3$ in Formula 1 is a group represented by one of Formulae 3A-1 to 3A-4, at least one of A$_1$(s) in the number of c1 in Formulae 3A-1 to 3A-4 is a group represented by —C(Q$_{51}$)(Q$_{52}$)(Q$_{53}$) or a group represented by —Si(Q$_{51}$)(Q$_{52}$)(Q$_{53}$).

Condition 2

Ar₃ in Formula 1 is a group represented by Formula 3B-2 or 3B-3.

Condition 3

When $Ar_3$ in Formula 1 is a group represented by one of Formulae 3B-1 and 3B-4, each of ring $CY_1$ and ring $CY_2$ in Formulae 3B-1 and 3B-4 is not a benzene group.

Condition 4 i) $Ar_3$ in Formula 1 is a group represented by one of Formulae 3B-1 and 3B-4, and ii) when each of ring $CY_1$ and ring $CY_2$ in Formulae 3B-1 and 3B-4 is a benzene group, in Formulae 2A, 2B, 3B-1, and 3B-4, at least one of $R_2(s)$ in the number of b2, $R_3(s)$ in the number of b3, $A_1(s)$ in the number of c1, and $A_2(s)$ in the number of c2 is not hydrogen.

Condition 5 i) $Ar_3$ in Formula 1 is a group represented by Formula 3B-1, and ii) when each of ring $CY_1$ and ring $CY_2$ in Formula 3B-1 is a benzene group, $R_6$ in Formula 3B-1 is a phenyl group unsubstituted or substituted with at least one $R_{11a}$, wherein $R_{11a}$ is: deuterium, —F, —Cl, —Br, —I, a hydroxyl group, or a nitro group; or a $C_1$-$C_{20}$ alkyl group unsubstituted or substituted with deuterium, —F, —Cl, —Br, —I, a hydroxyl group, a nitro group, or any combination thereof.

According to another aspect of an embodiment, a light-emitting device includes a first electrode, a second electrode facing the first electrode, an interlayer between the first electrode and the second electrode and including an emission layer, and the heterocyclic compound.

According to another aspect of an embodiment, an electronic apparatus includes the light-emitting device.

BRIEF DESCRIPTION OF THE DRAWINGS

The above and other aspects and features of certain embodiments of the disclosure will be more apparent from the following description taken in conjunction with the accompanying drawings, in which.

DETAILED DESCRIPTION

Figure 1:
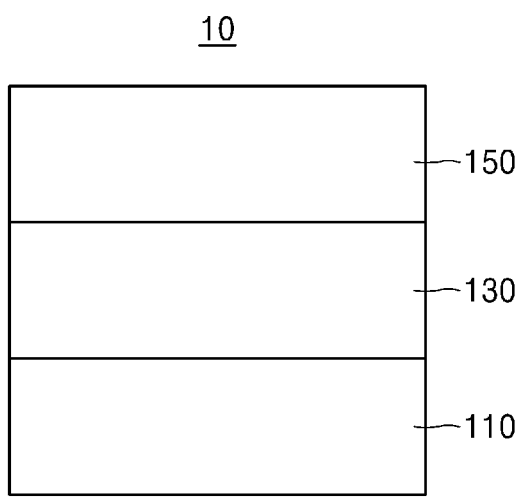
FIGS. 1 to 3 are each a schematic cross-sectional view of a structure of a light-emitting device according to an embodiment.

Reference will now be made in more detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of embodiments of the present description. As used herein, the term "and/or" includes any and all combinations of one or more of the associated listed items. Throughout the disclosure, the expressions "at least one of a, b or c" and "at least one of a, b and c" indicate only a, only b, only c, both a and b, both a and c, both b and c, all of a, b, and c, or variations thereof.

A heterocyclic compound represented by Formula 1 and satisfying at least one of Condition 1 to Condition 5 may be provided:

Formula 1

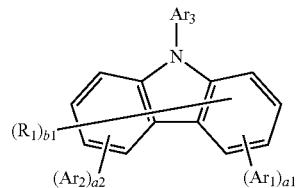

$Ar_1$ in Formula 1 may be a group represented by Formula 2A.

$Ar_2$ in Formula 1 may be a group represented by Formula 2B.

In an embodiment, Formula 1 may be a group represented by any one of Formulae 1(a) to 1(h):

1(a)

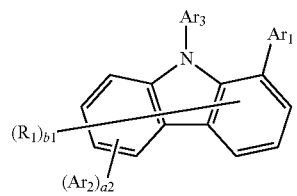

1(b)

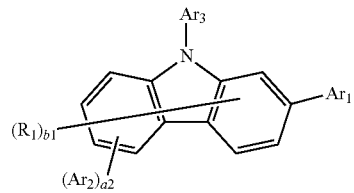

1(c)

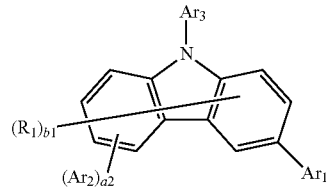

1(d)

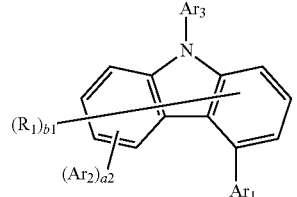

1(e)

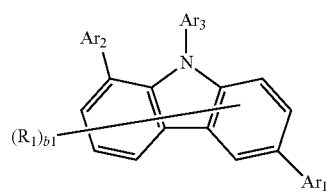

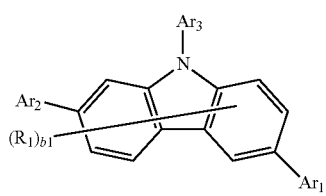
1(f)

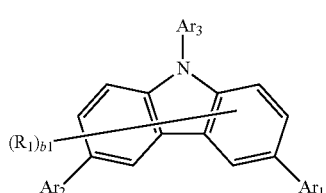
1(g)

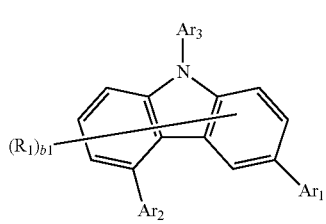
1(h)

$Ar_1$ to $Ar_3$, a2, $R_1$, and $b_1$ in Formulae 1(a) to 1(h) may be the same as described elsewhere in the specification.

a1 and a2 in Formula 1 may each independently be an integer from 0 to 4, wherein a sum of a1 and a2 may be 1 or more.

In an embodiment, in Formula 1, a1 may be 1, and a2 may be 0 or 1.

$Ar_3$ in Formula 1 may be a group represented by one of Formulae 3A-1 to 3A-4 and 3B-1 to 3B-4.

Hereinafter, Formulae 2A, 2B 3A-1 to 3A-4, and 3B-1 to 3B-4 will be further described.

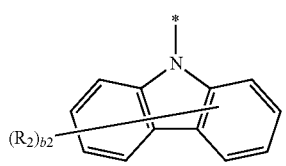
2A

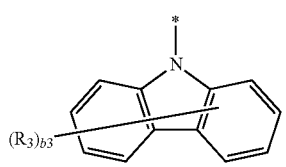
2B

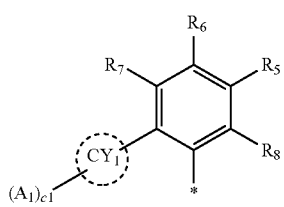
3A-1

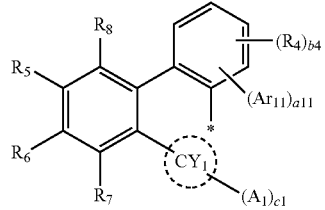
3A-2

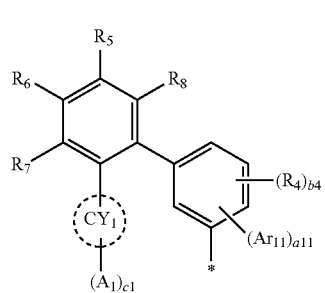
3A-3

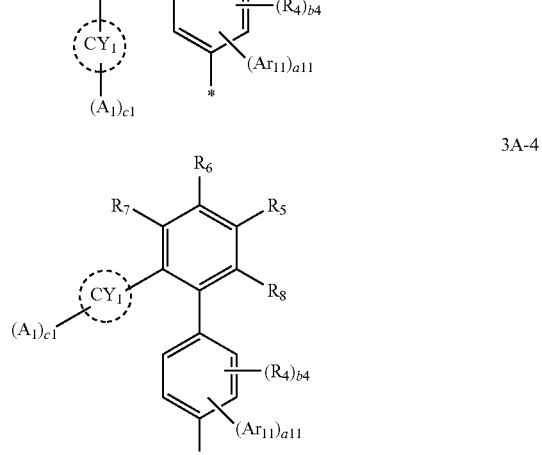
3A-4

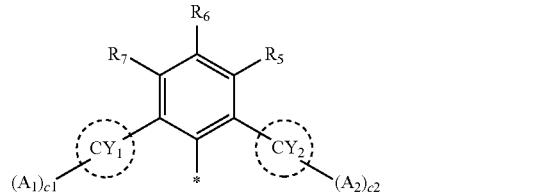
3B-1

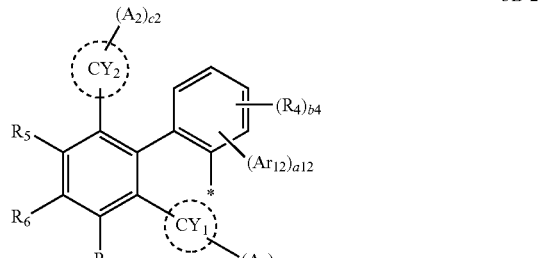
3B-2

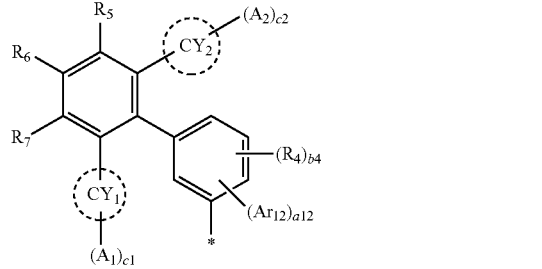
3B-3

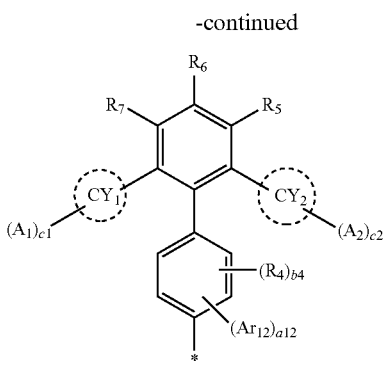

3B-4

Ring $CY_1$ and ring $CY_2$ in Formulae 3A-1 to 3A-4 and 3B-1 to 3B-4 may each independently be a π-electron-rich $C_3$-$C_{60}$ cyclic group or a pyridine group.

In an embodiment, ring $CY_1$ and ring $CY_2$ in Formulae 3A-1 to 3A-4 and 3B-1 to 3B-4 may each independently be a benzene group, a heptalene group, an indene group, a naphthalene group, an azulene group, an indacene group, an acenaphthylene group, a fluorene group, a spiro-bifluorene group, a benzofluorene group, a dibenzofluorene group, a phenalene group, a phenanthrene group, an anthracene group, a fluoranthene group, a triphenylene group, a pyrene group, a chrysene group, a naphthacene group, a picene group, a perylene group, a pentacene group, a hexacene group, a pentaphene group, a rubicene group, a coronene group, an ovalene group, a pyrrole group, a furan group, a thiophene group, an isoindole group, an indole group, an indene group, a benzofuran group, a benzothiophene group, a benzosilole group, a naphtho pyrrole group, a naphthofuran group, a naphthothiophene group, a naphtho silole group, a benzocarbazole group, a dibenzocarbazole group, a dibenzofuran group, a dibenzothiophene group, a carbazole group, a dibenzosilole group, an indenocarbazole group, an indolocarbazole group, a benzofurocarbazole group, a benzothienocarbazole group, a benzosilolocarbazole group, a triindolobenzene group, a pyrrolo phenanthrene group, a furano phenanthrene group, a thienophenanthrene group, a benzonaphthofuran group, a benzonaphthothiophene group, a (indolo)phenanthrene group, a (benzofurano)phenanthrene group, a (benzothieno)phenanthrene group, or a pyridine group.

In one or more embodiments, ring $CY_1$ and ring $CY_2$ in Formulae 3A-1 to 3A-4 and 3B-1 to 3B-4 may each independently be a benzene group, a naphthalene group, a fluorene group, a spiro-bifluorene group, a benzofluorene group, a dibenzofluorene group, a phenanthrene group, an anthracene group, a fluoranthene group, a triphenylene group, a pyrene group, a chrysene group, a naphthacene group, a furan group, a thiophene group, an isoindole group, an indole group, an indene group, a benzofuran group, a benzothiophene group, a benzosilole group, a naphtho pyrrole group, a naphthofuran group, a naphthothiophene group, a naphtho silole group, a benzocarbazole group, a dibenzocarbazole group, a dibenzofuran group, a dibenzothiophene group, a carbazole group, a dibenzosilole group, or a pyridine group.

In Formulae 3A-2 to 3A-4 and 3B-2 to 3B-4, $Ar_{11}$ may be a group represented by Formula 3A-1, $Ar_{12}$ may be a group represented by Formula 3B-1, and a11 and a12 may each independently be an integer from 0 to 4.

In an embodiment, a11 and a12 may be 0 or 1.

$R_1$ to $R_7$, $A_1$, and $A_2$ in Formulae 1, 2A, 2B, 3A-1 to 3A-4, and 3B-1 to 3B-4 may each independently be hydrogen, deuterium, —F, —Cl, —Br, —I, a hydroxyl group, a cyano group, a nitro group, a $C_1$-$C_{60}$ alkyl group unsubstituted or substituted with at least one $R_{10a}$, a $C_2$-$C_{60}$ alkenyl group unsubstituted or substituted with at least one $R_{10a}$, a $C_2$-$C_{60}$ alkynyl group unsubstituted or substituted with at least one $R_{10a}$, a $C_1$-$C_{60}$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, a $C_6$-$C_{60}$ aryloxy group unsubstituted or substituted with at least one $R_{10a}$, a $C_6$-$C_{60}$ arylthio group unsubstituted or substituted with at least one $R_{10a}$, —C$(Q_{51})(Q_{52})(Q_{53})$, —Si$(Q_{51})(Q_{52})(Q_{53})$, —Si$(Q_1)(Q_2)(Q_3)$, —N$(Q_1)(Q_2)$, —B$(Q_1)(Q_2)$, —C(=O)$(Q_1)$, —S(=O)$_2(Q_1)$, —P(=O)$(Q_1)(Q_2)$, or —C$(Q_1)(Q_2)(Q_3)$, wherein $Q_{51}$ to $Q_{53}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, and two neighboring groups of $Q_{51}$ to $Q_{53}$ may optionally be bond to form a $C_5$-$C_{30}$ carbocyclic group unsubstituted or substituted with at least one $R_{10a}$ or a $C_2$-$C_{30}$ heterocyclic group unsubstituted or substituted with at least one $R_{10a}$.

$R_8$ in Formulae 3A-1 to 3A-4 may be: hydrogen; deuterium; or a $C_1$-$C_{60}$ alkyl group unsubstituted or substituted with at least one deuterium.

b1 in Formula 1 may be an integer from 1 to 7.

b2 and b3 in Formulae 2A and 2B may each independently be an integer from 1 to 8.

b4 in Formulae 3A-2 to 3A-4 and 3B-2 to 3B-4 may be an integer from 1 to 4.

c1 and c2 in Formulae 3A-1 to 3A-4 and 3B-1 to 3B-4 may each independently be an integer from 1 to 10.

*, as used herein, may indicate a binding site to a neighboring atom.

Hereinafter, Condition 1 to Condition 5 will be further described.

Condition 1

When $Ar_3$ in Formula 1 is a group represented by one of Formulae 3A-1 to 3A-4, at least one of $A_1$(s) in the number of c1 in Formulae 3A-1 to 3A-4 is a group represented by —C$(Q_{51})(Q_{52})(Q_{53})$ or a group represented by —Si$(Q_{51})(Q_{52})(Q_{53})$.

Condition 2

$Ar_3$ in Formula 1 is a group represented by Formula 3B-2 or 3B-3.

Condition 3

When $Ar_3$ in Formula 1 is a group represented by one of Formulae 3B-1 and 3B-4, each of ring $CY_1$ and ring $CY_2$ in Formulae 3B-1 and 3B-4 is not a benzene group.

Condition 4 i) $Ar_3$ in Formula 1 is a group represented by one of Formulae 3B-1 and 3B-4, and ii) when each of ring $CY_1$ and ring $CY_2$ in Formulae 3B-1 and 3B-4 is a benzene group, in Formulae 2A, 2B, 3B-1, and 3B-4, at least one of $R_2$(s) in the number of b2, $R_3$(s) in the number of b3, $A_1$(s) in the number of c1, and $A_2$(s) in the number of c2 is not hydrogen.

Condition 5 i) $Ar_3$ in Formula 1 is a group represented by Formula 3B-1, and ii) when each of ring $CY_1$ and ring $CY_2$ in Formula 3B-1 is a benzene group, $R_6$ in Formula 3B-1 is a phenyl group unsubstituted or substituted with at least one $R_{11a}$, wherein $R_{11a}$ is: deuterium, —F, —Cl, —Br, —I, a hydroxyl group, or a nitro group; or a $C_1$-$C_{20}$ alkyl group unsubstituted or substituted with deuterium, —F, —Cl, —Br, —I, a hydroxyl group, a nitro group, or any combination thereof.

In an embodiment, the heterocyclic compound may satisfy one of Condition 1 to Condition 4, and $R_5$ to $R_8$ in Formulae 3A-1 to 3A-4 and 3B-1 to 3B-4 may each independently be: hydrogen; deuterium; or a $C_1$-$C_{60}$ alkyl group unsubstituted or substituted with at least one deuterium.

In an embodiment, the heterocyclic compound may satisfy Condition 1, and $Ar_3$ in Formula 1 may be a group represented by Formula 3A-1.

In an embodiment, the heterocyclic compound may satisfy Condition 2, and

Formula 3B-3 may be a group represented by one of Formulae 3B-3(1) to 3B-3(4):

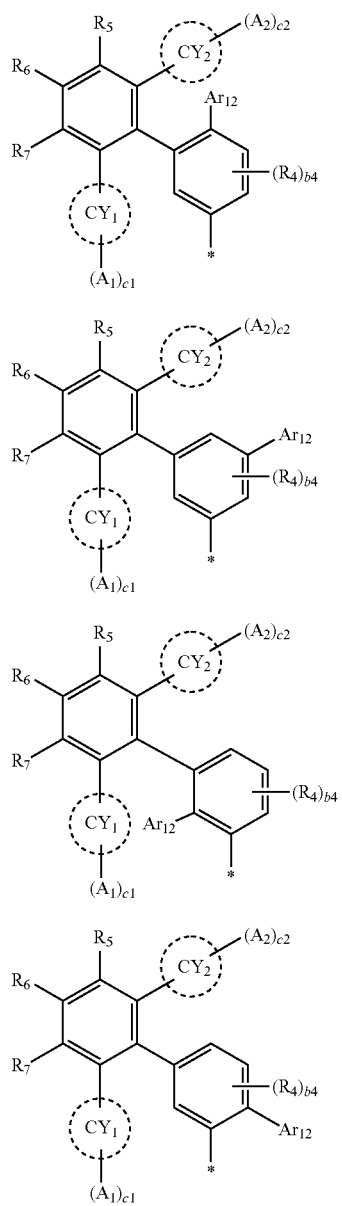

In Formulae 3B-3(1) to 3B-3(4), ring $CY_1$, ring $CY_2$, $Ar_{12}$, $R_4$ to $R_y$, $A_1$, $A_2$, b4, c1, and c2 may be the same as described elsewhere in the specification, and

* may indicate a binding site to a neighboring atom.

In an embodiment, the heterocyclic compound may satisfy Condition 3, and ring $CY_1$ and ring $CY_2$ may each independently be a benzene group, a naphthalene group, a fluorene group, a spiro-bifluorene group, a benzofluorene group, a dibenzofluorene group, a phenanthrene group, an anthracene group, a fluoranthene group, a triphenylene group, a pyrene group, a chrysene group, a naphthacene group, a furan group, a thiophene group, an isoindole group, an indole group, an indene group, a benzofuran group, a benzothiophene group, a benzosilole group, a naphtho pyrrole group, a naphthofuran group, a naphthothiophene group, a naphtho silole group, a benzocarbazole group, a dibenzocarbazole group, a dibenzofuran group, a dibenzothiophene group, a carbazole group, a dibenzosilole group, or a pyridine group.

In an embodiment, the heterocyclic compound may satisfy Condition 4, and in Formulae 2A, 2B, 3B-1, and 3B-4, $R_2$(s) in the number of b2, $R_3$(s) in the number of b3, $A_1$(s) in the number of c1, and $A_2$(s) in the number of c2 may each independently be:

hydrogen, deuterium, —F, —Cl, —Br, —I, a hydroxyl group, a cyano group, or a nitro group;

a $C_1$-$C_{20}$ alkyl group, a $C_2$-$C_{20}$ alkenyl group, a $C_2$-$C_{20}$ alkynyl group, or a $C_1$-$C_{20}$ alkoxy group, each unsubstituted or substituted with deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, a phenyl group, a naphthyl group, —Si($Q_{31}$)($Q_{32}$)($Q_{33}$), —N($Q_{31}$)($Q_{32}$), —B($Q_{31}$)($Q_{32}$), —C(=O)($Q_{31}$), —S(=O)$_2$($Q_{31}$), —P(=O)($Q_{31}$)($Q_{32}$), or any combination thereof;

a phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, a pyridinyl group, an isoindolyl group, an indolyl group, an indazolyl group, a purinyl group, a carbazolyl group, a phenanthrolinyl group, a benzofuranyl group, a benzothiophenyl group, a dibenzofuranyl group, a dibenzothiophenyl group, a benzocarbazolyl group, or a dibenzocarbazolyl group, each unsubstituted or substituted with deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, a $C_1$-$C_{20}$ alkyl group, a $C_2$-$C_{20}$ alkenyl group, a $C_2$-$C_{20}$ alkynyl group, a $C_1$-$C_{20}$ alkoxy group, a phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, a pyridinyl group, an isoindolyl group, an indolyl group, an indazolyl group, a purinyl group, a carbazolyl group, a phenanthrolinyl group, a benzofuranyl group, a benzothiophenyl group, a dibenzofuranyl group, a dibenzothiophenyl group, a benzocarbazolyl group, a dibenzocarbazolyl group, —Si($Q_{31}$)($Q_{32}$)($Q_{33}$), —N($Q_{31}$)($Q_{32}$), —B($Q_{31}$)($Q_{32}$), —C(=O)($Q_{31}$), —S(=O)$_2$($Q_{31}$), —P(=O)($Q_{31}$)($Q_{32}$), or any combination thereof; or —C(Q$_{51}$)(Q$_{52}$)(Q$_{53}$), —Si(Q$_{51}$)(Q$_{52}$)(Q$_{53}$), —Si(Q$_1$)(Q$_2$)(Q$_3$), —N(Q$_1$)(Q$_2$), —B(Q$_1$)(Q$_2$), —C(=O)(Q$_1$), —S(=O)$_2$(Q$_1$), —P(=O)(Q$_1$)(Q$_2$), or —C(Q$_1$)(Q$_2$)(Q$_3$).

In an embodiment, the heterocyclic compound may satisfy Condition 2A:

Condition 2A i) Ar$_3$ in Formula 1 is a group represented by Formula 3B-3, and ii) when ring CY$_1$ and ring CY$_2$ in Formula 3B-3 are each a benzene group, R$_6$ in Formula 3B-3 is a phenyl group unsubstituted or substituted with at least one R$_{11a}$, wherein R$_{11a}$ is: deuterium, —F, —Cl, —Br, —I, a hydroxyl group, or a nitro group; or a C$_1$-C$_{20}$ alkyl group unsubstituted or substituted with deuterium, —F, —Cl, —Br, —I, a hydroxyl group, a nitro group, or any combination thereof.

In an embodiment, the heterocyclic compound may satisfy Condition 2A or Condition 5, and in Formulae 1, 2A, 2B, 3B-1, and 3B-4, R$_1$ in the number of b1, R$_2$ in the number of b2, R$_3$ in the number of b3, A$_1$ in the number of c1, and A$_2$ in the number of c2 may each independently be:

hydrogen, deuterium, —F, —Cl, —Br, —I, a hydroxyl group, a cyano group, or a nitro group;

a C$_1$-C$_{20}$ alkyl group, a C$_2$-C$_{20}$ alkenyl group, a C$_2$-C$_{20}$ alkynyl group, or a C$_1$-C$_{20}$ alkoxy group, each unsubstituted or substituted with deuterium, —F, —Cl, —Br, —I, —CD$_3$, —CD$_2$H, —CDH$_2$, —CF$_3$, —CF$_2$H, —CFH$_2$, a hydroxyl group, a cyano group, a nitro group, a phenyl group, a naphthyl group, —Si(Q$_{31}$)(Q$_{32}$)(Q$_{33}$), —N(Q$_{31}$)(Q$_{32}$), —B(Q$_{31}$)(Q$_{32}$), —C(=O)(Q$_{31}$), —S(=O)$_2$(Q$_{31}$), —P(=O)(Q$_{31}$)(Q$_{32}$), or any combination thereof;

a phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, a pyridinyl group, an isoindolyl group, an indolyl group, an indazolyl group, a purinyl group, a carbazolyl group, a phenanthrolinyl group, a benzofuranyl group, a benzothiophenyl group, a dibenzofuranyl group, a dibenzothiophenyl group, a benzocarbazolyl group, or a dibenzocarbazolyl group, each unsubstituted or substituted with deuterium, —F, —Cl, —Br, —I, —CD$_3$, —CD$_2$H, —CDH$_2$, —CF$_3$, —CF$_2$H, —CFH$_2$, a hydroxyl group, a cyano group, a nitro group, a C$_1$-C$_{20}$ alkyl group, a C$_2$-C$_{20}$ alkenyl group, a C$_2$-C$_{20}$ alkynyl group, a C$_1$-C$_{20}$ alkoxy group, a phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, a pyridinyl group, an isoindolyl group, an indolyl group, an indazolyl group, a purinyl group, a carbazolyl group, a phenanthrolinyl group, a benzofuranyl group, a benzothiophenyl group, a dibenzofuranyl group, a dibenzothiophenyl group, a benzocarbazolyl group, a dibenzocarbazolyl group, —Si(Q$_{31}$)(Q$_{32}$)(Q$_{33}$), —N(Q$_{31}$)(Q$_{32}$), —B(Q$_{31}$)(Q$_{32}$), —C(=O)(Q$_{31}$), —S(=O)$_2$(Q$_{31}$), —P(=O)(Q$_{31}$)(Q$_{32}$), or any combination thereof; or —C(Q$_{51}$)(Q$_{52}$)(Q$_{53}$), —Si(Q$_{51}$)(Q$_{52}$)(Q$_{53}$), —Si(Q$_1$)(Q$_2$)(Q$_3$), —N(Q$_1$)(Q$_2$), —B(Q$_1$)(Q$_2$), —C(=O)(Q$_1$), —S(=O)$_2$(Q$_1$), —P(=O)(Q$_1$)(Q$_2$), or —C(Q$_1$)(Q$_2$)(Q$_3$).

In an embodiment, the heterocyclic compound may satisfy Condition 2A or Condition 5, and in Formulae 1, 2A, 2B, 3B-1, and 3B-4, R$_1$ in the number of b1, R$_2$ in the number of b2, R$_3$ in the number of b3, A$_1$ in the number of c1, and A$_2$ in the number of c2 may each independently be:

hydrogen, deuterium, —F, —Cl, —Br, —I, a hydroxyl group, a cyano group, or a nitro group;

a C$_1$-C$_{20}$ alkyl group unsubstituted or substituted with deuterium, —F, —Cl, —Br, —I, —CD$_3$, —CD$_2$H, —CDH$_2$, —CF$_3$, —CF$_2$H, —CFH$_2$, a hydroxyl group, a cyano group, a nitro group, or any combination thereof;

a phenyl group unsubstituted or substituted with deuterium, —F, —Cl, —Br, —I, —CD$_3$, —CD$_2$H, —CDH$_2$, —CF$_3$, —CF$_2$H, —CFH$_2$, a hydroxyl group, a cyano group, a nitro group, a C$_1$-C$_{20}$ alkyl group, a phenyl group, or any combination thereof; or —C(Q$_{51}$)(Q$_{52}$)(Q$_{53}$), —Si(Q$_{51}$)(Q$_{52}$)(Q$_{53}$), —Si(Q$_1$)(Q$_2$)(Q$_3$), or —C(Q$_1$)(Q$_2$)(Q$_3$).

In an embodiment, the heterocyclic compound may satisfy Condition 4A:

Condition 4A i) Ar$_3$ in Formula 1 is a group represented by one of Formulae 3B-1 and 3B-4, and ii) when each of ring CY$_1$ and ring CY$_2$ in Formulae 3B-1 and 3B-4 is a benzene group, in Formulae 2A, 2B, 3B-1, and 3B-4, at least one of R$_2$(s) in the number of b2, R$_3$(s) in the number of b3, A$_1$(s) in the number of c1, A$_2$(s) in the number of c2 is not hydrogen, and R$_6$ in Formulae 3B-1 and 3B-4 may be hydrogen.

In an embodiment, the heterocyclic compound may be selected from Compounds 1 to 102:

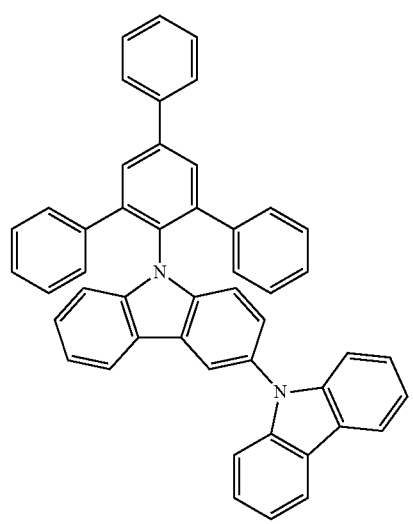

1

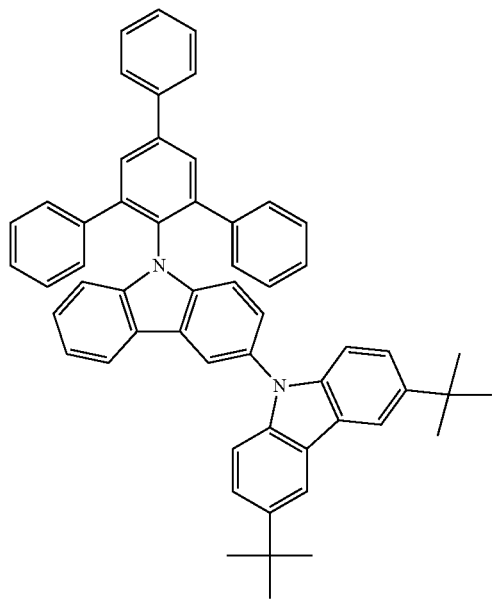
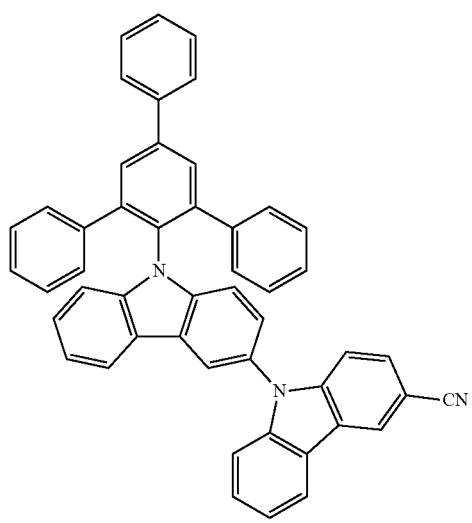
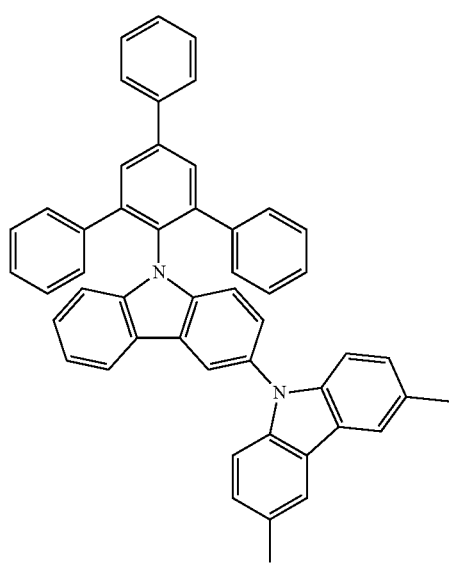
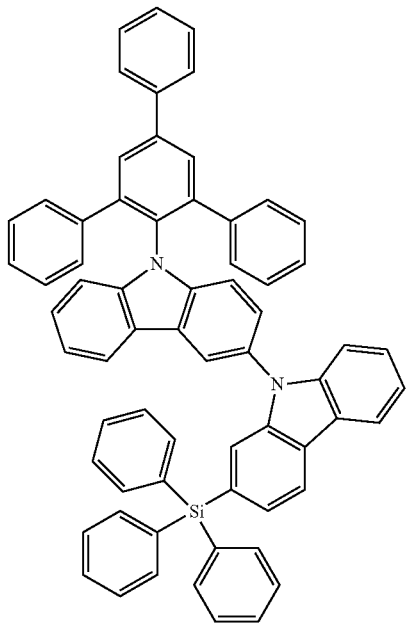
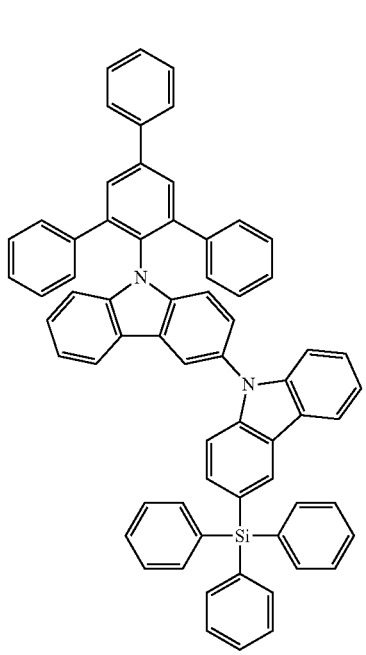

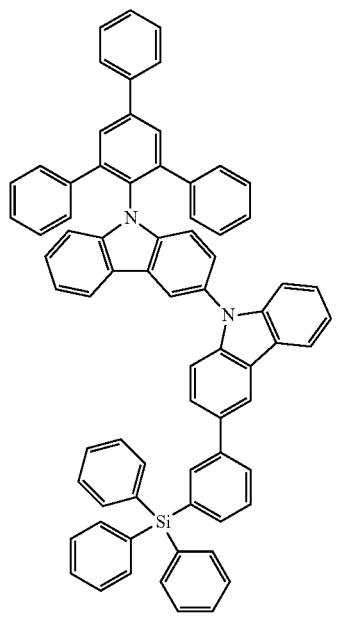
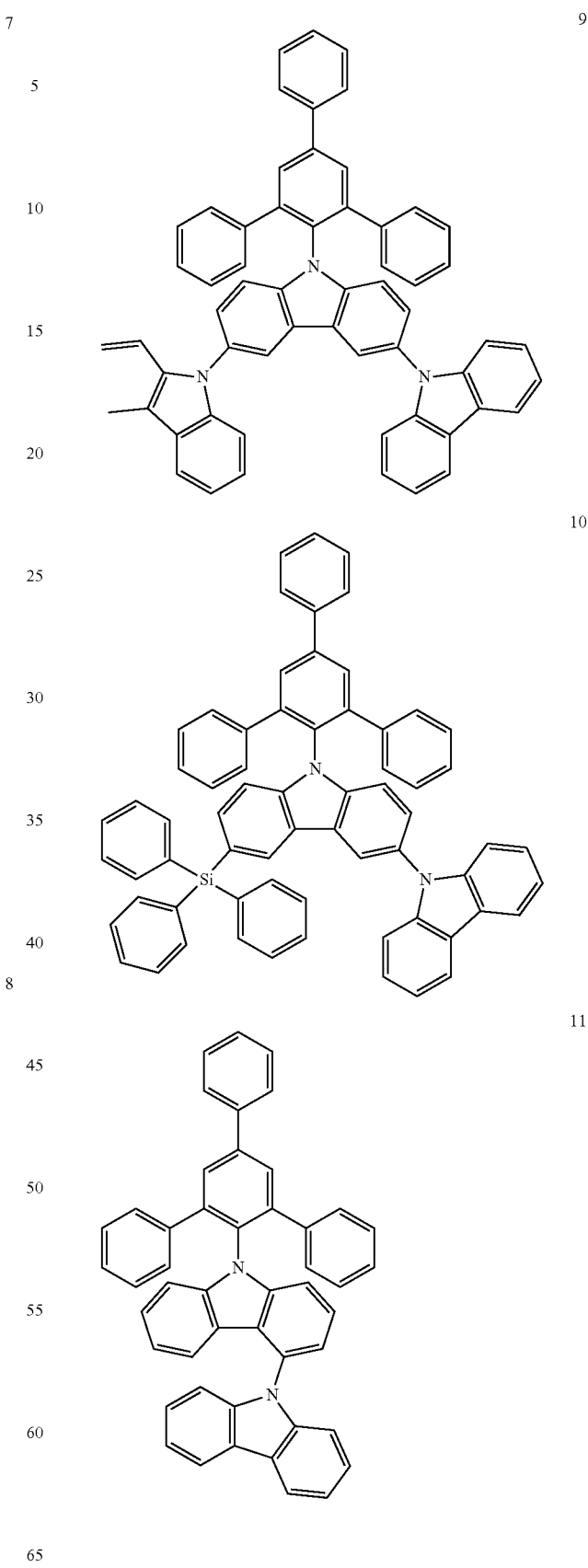

12
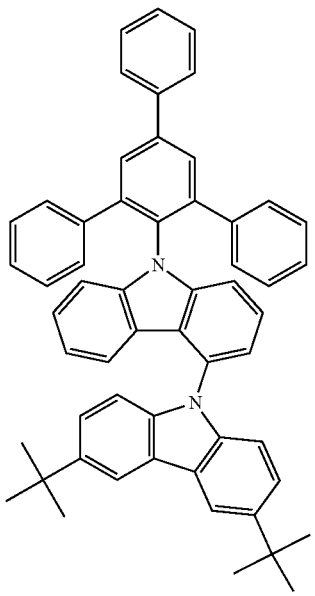
13
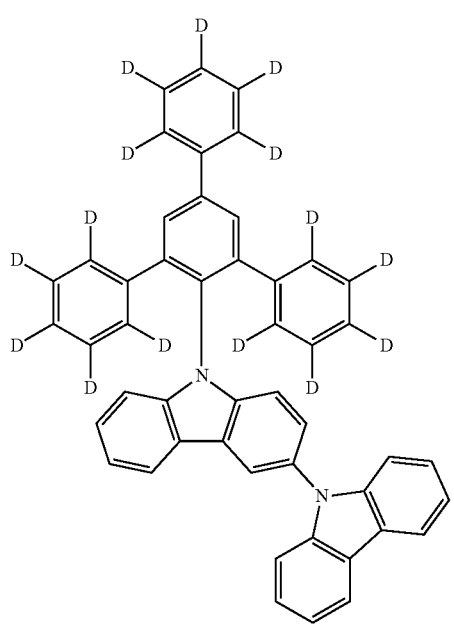
14
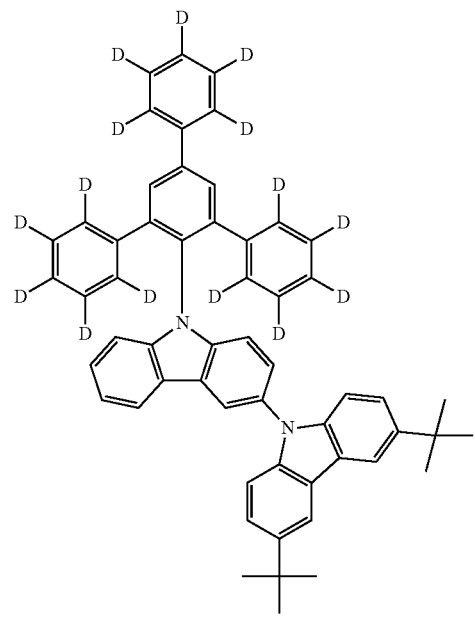
15
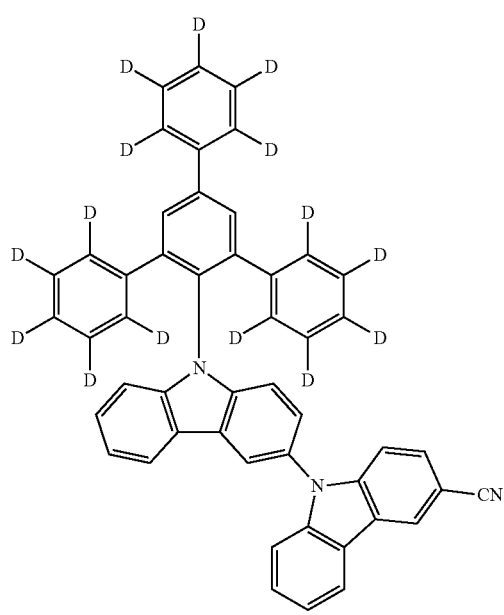

16
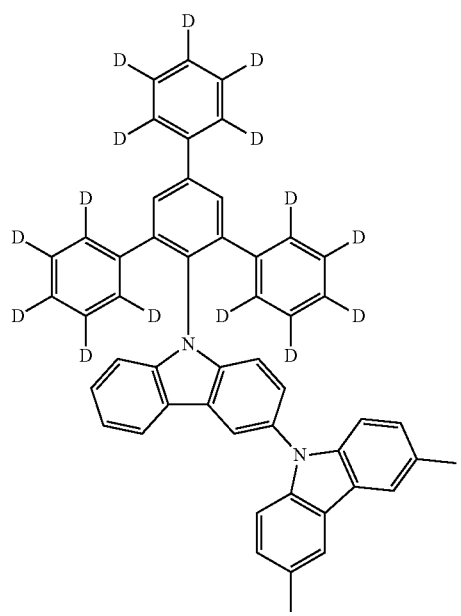
17
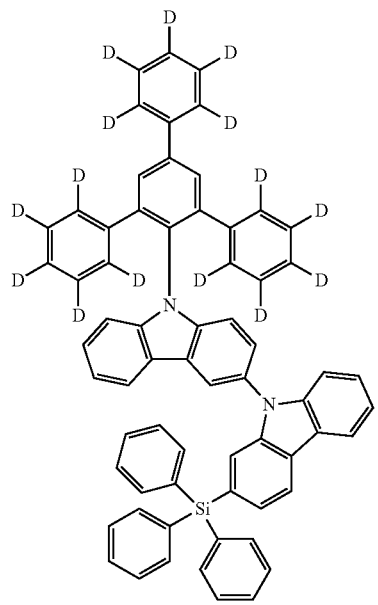
18
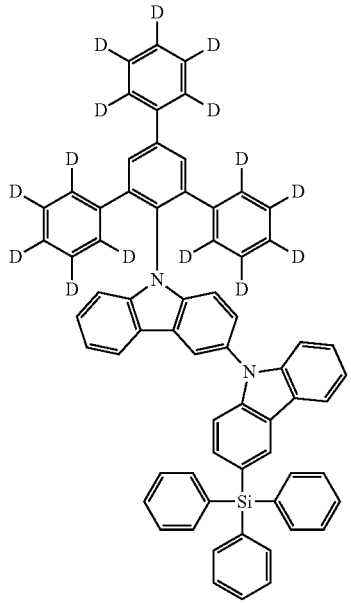
19
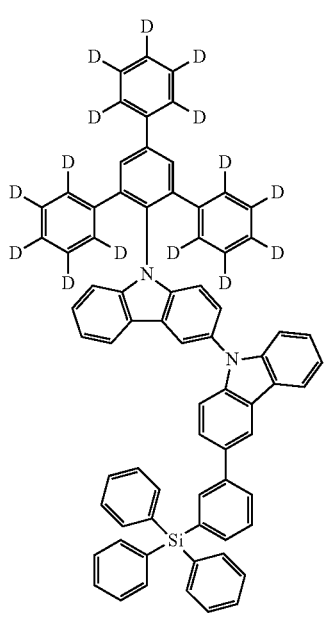

20
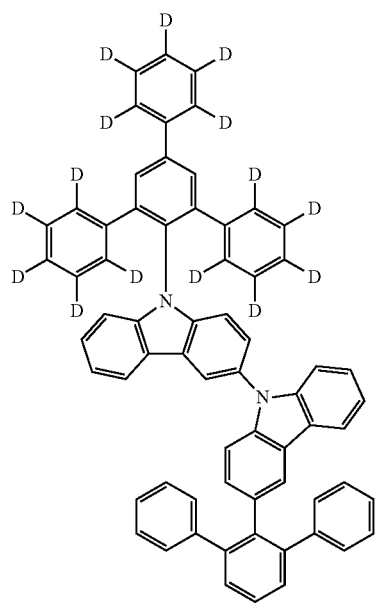
21
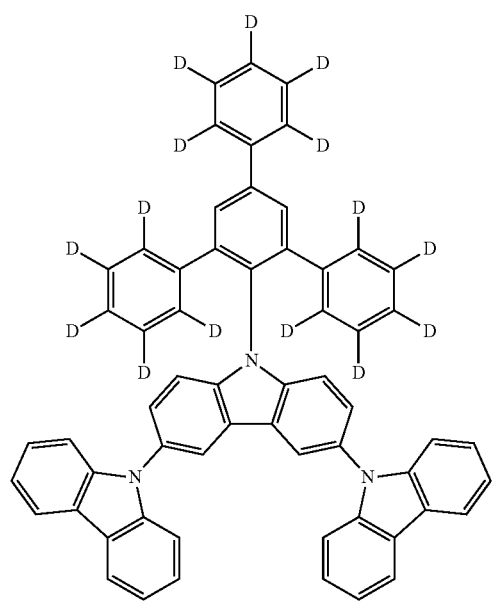
22
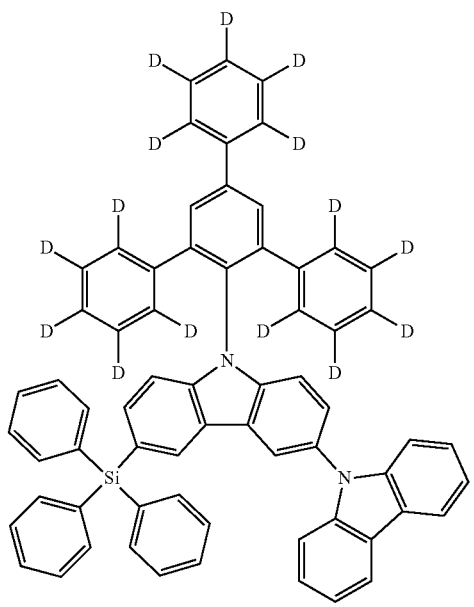
23
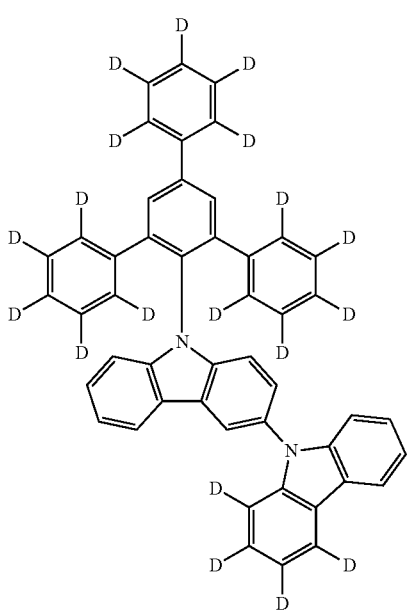

24
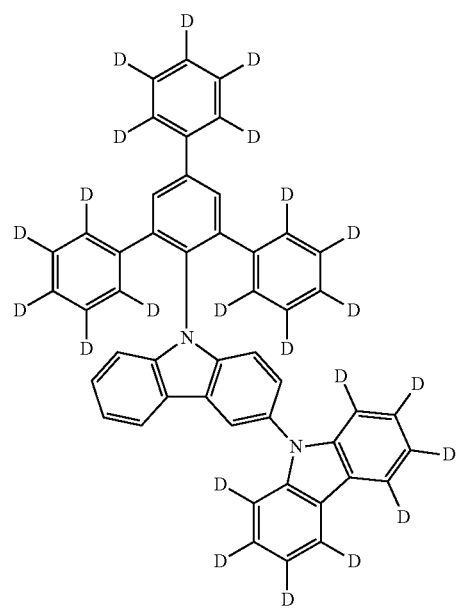
25
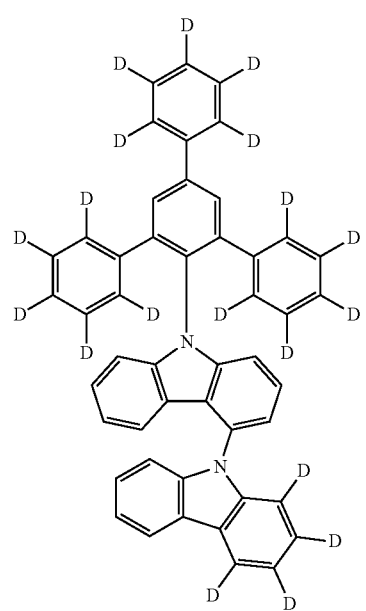
26
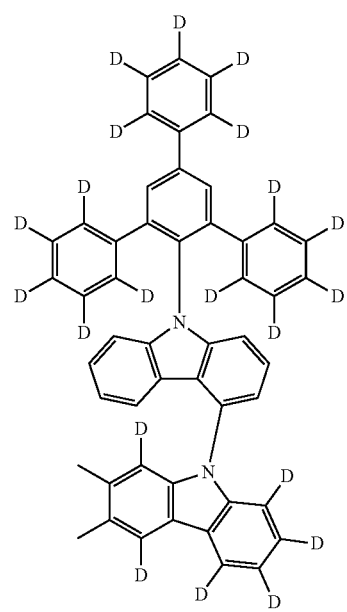
27
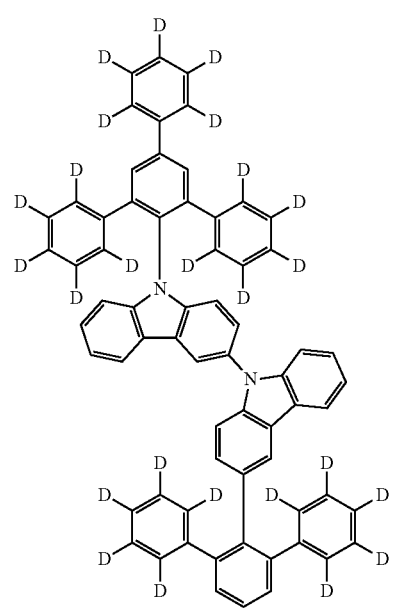

28
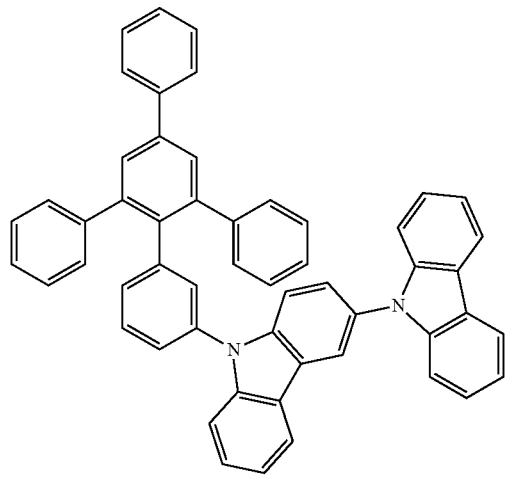
29
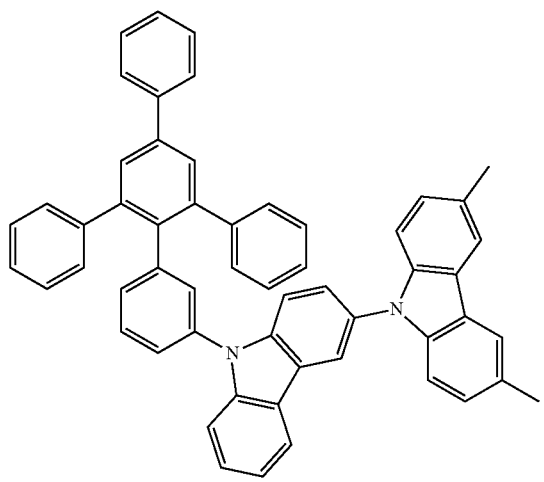
30
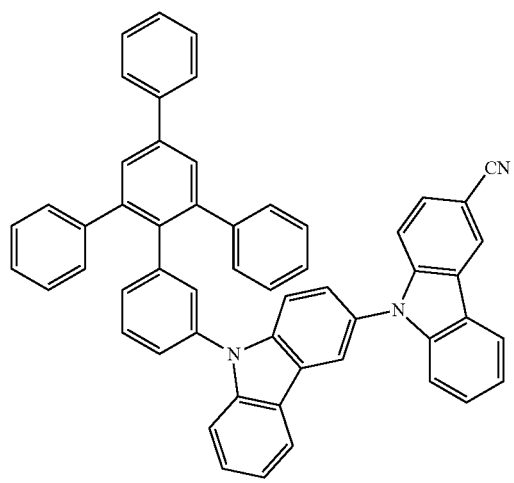
31
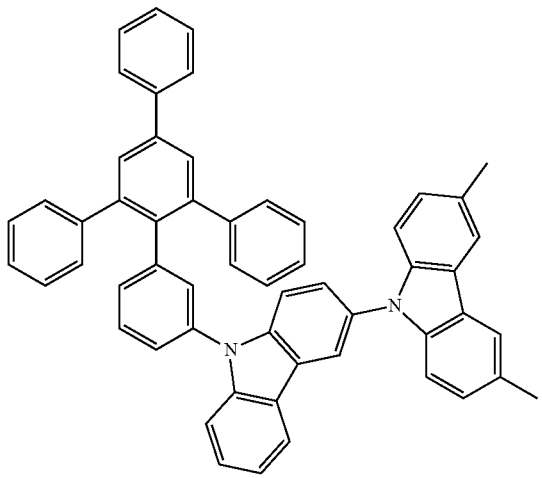
32
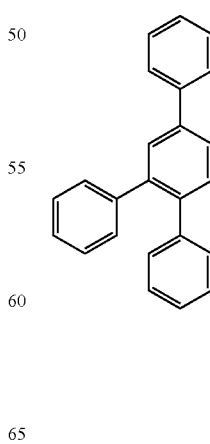
33

34
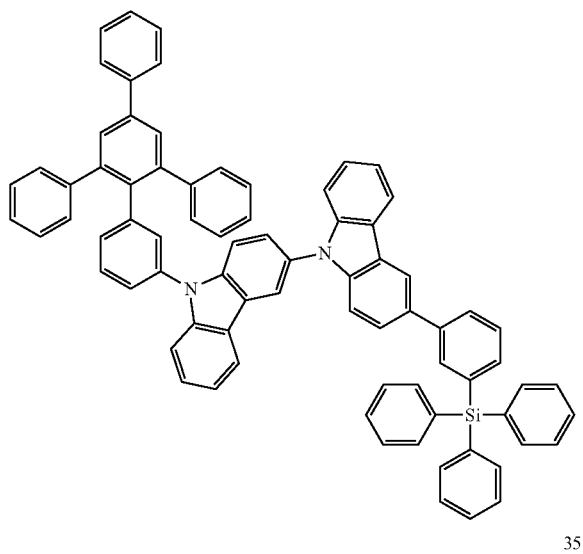
35
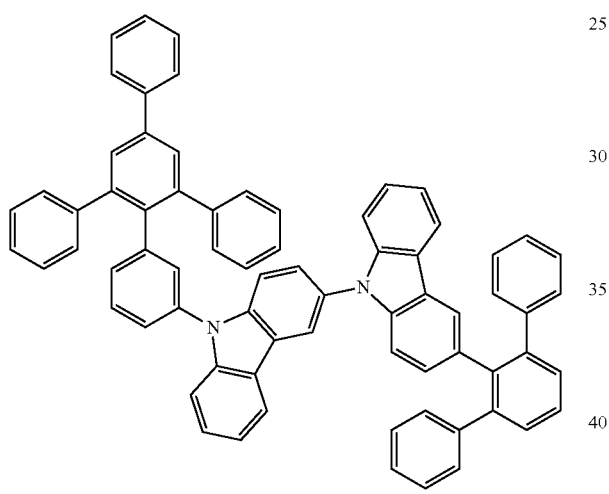
36
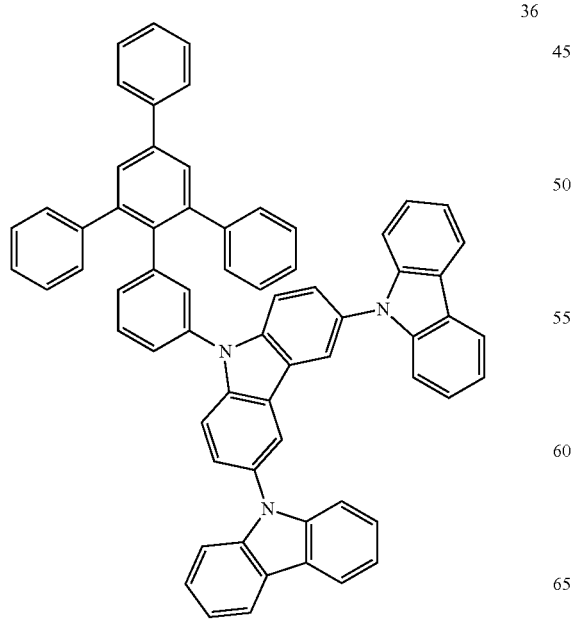
37
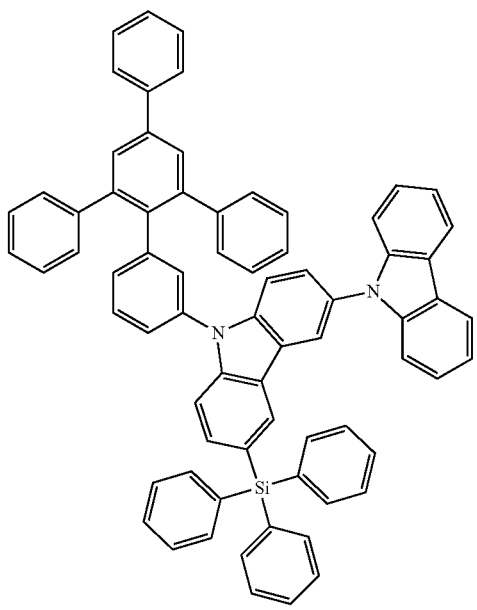
38
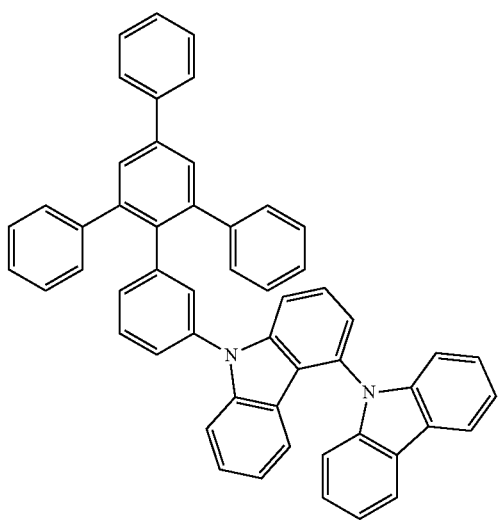

39
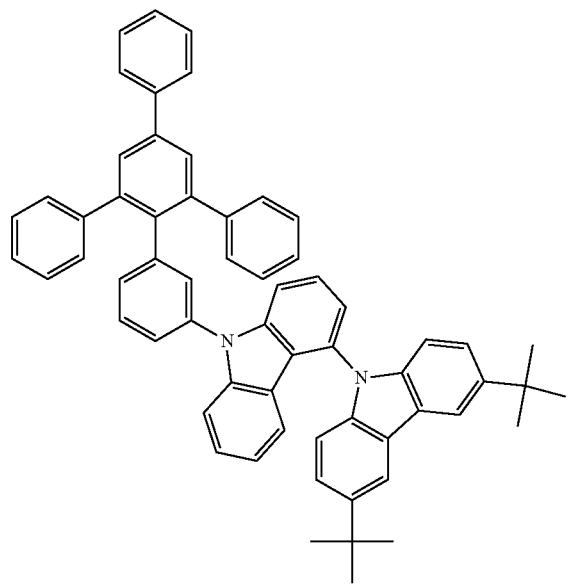
41
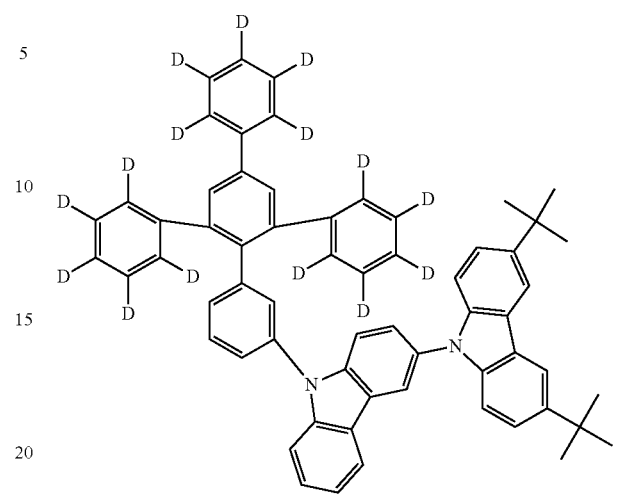
42
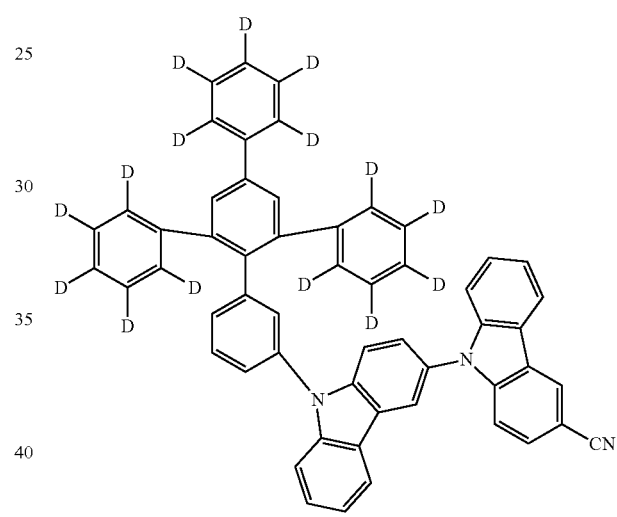
40
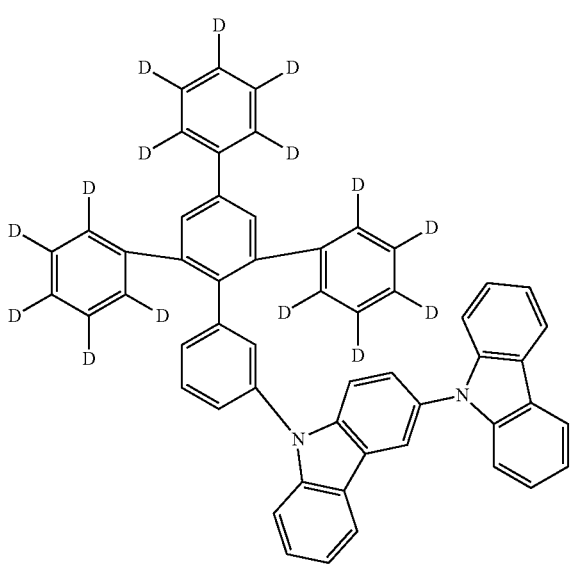
43
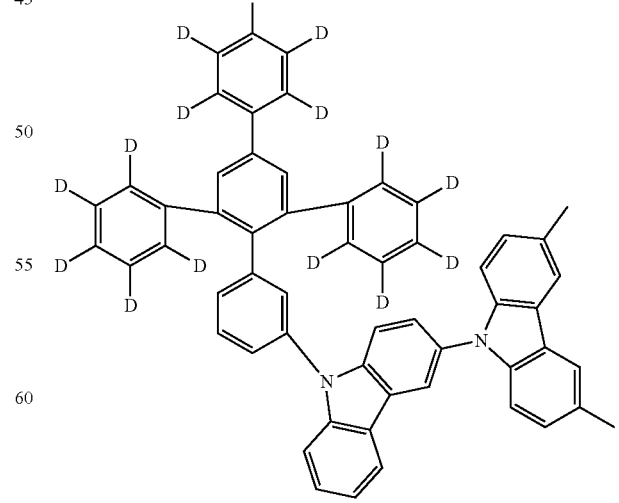

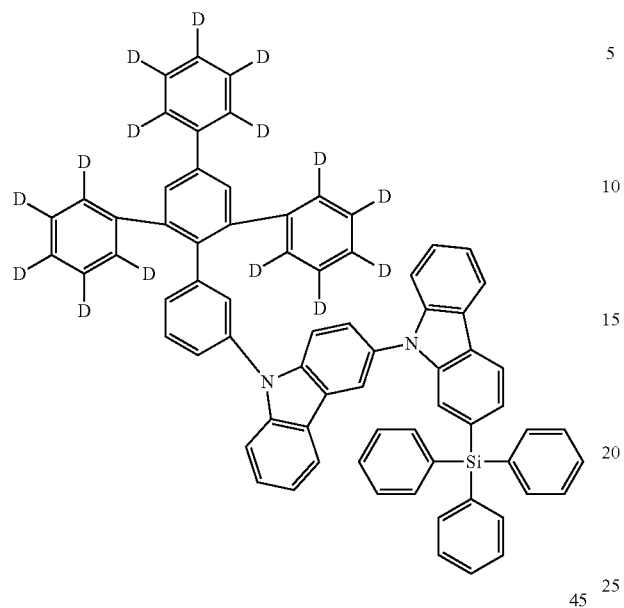
44
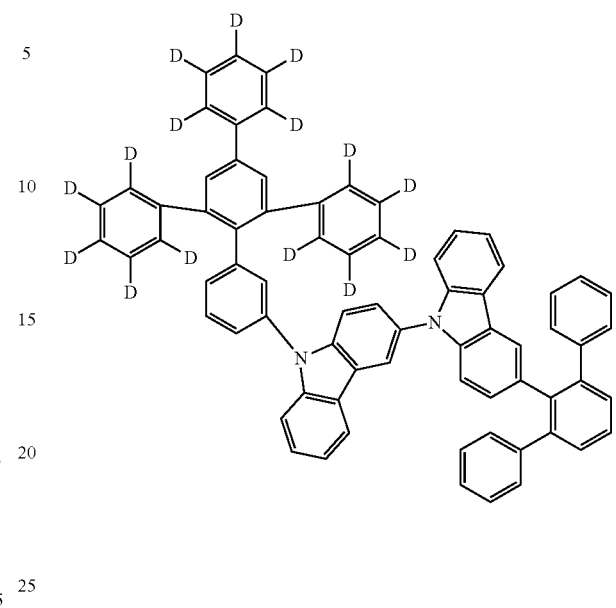
47
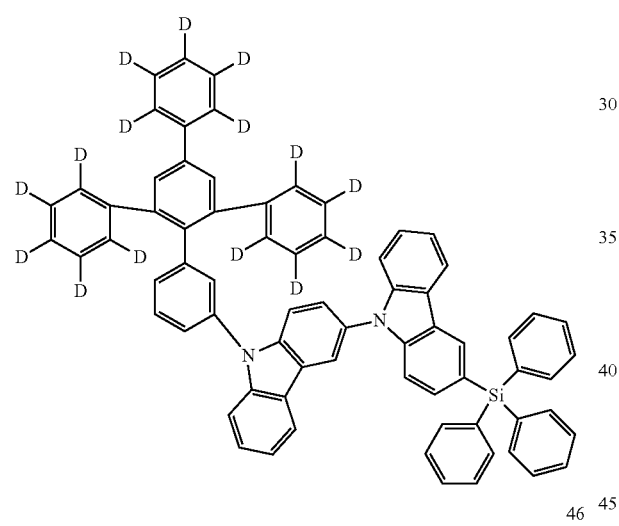
45
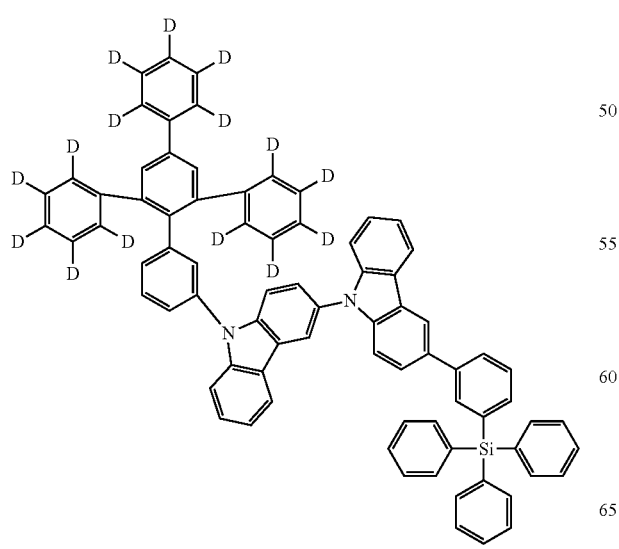
46
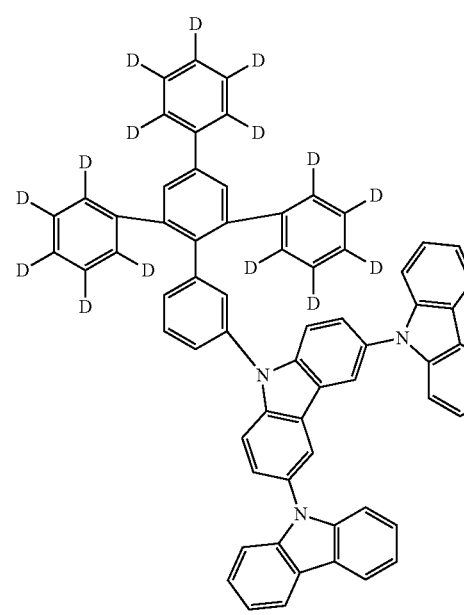
48

49
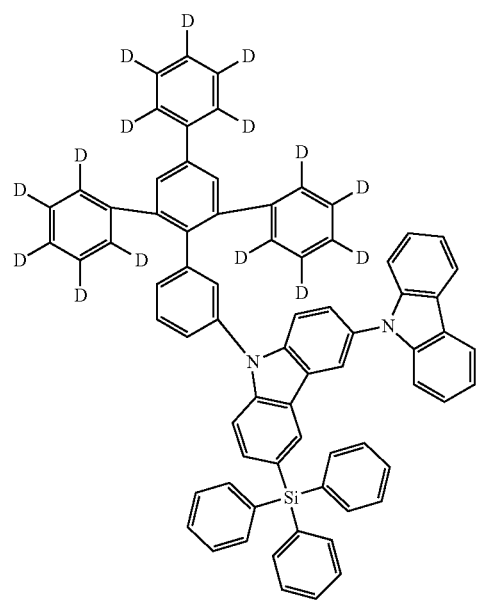
51
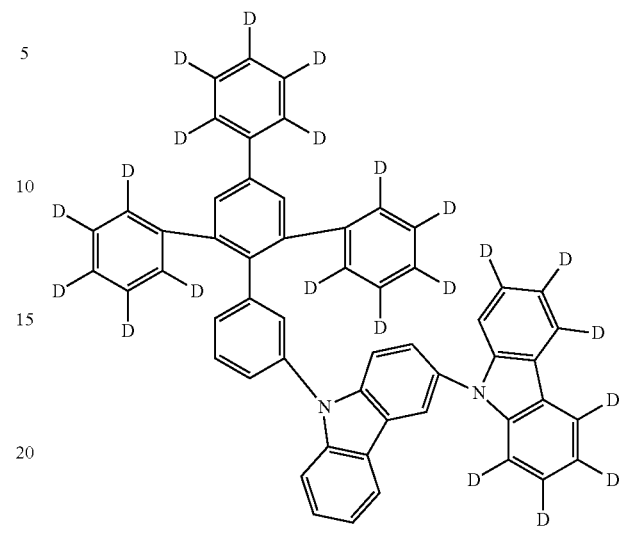
52
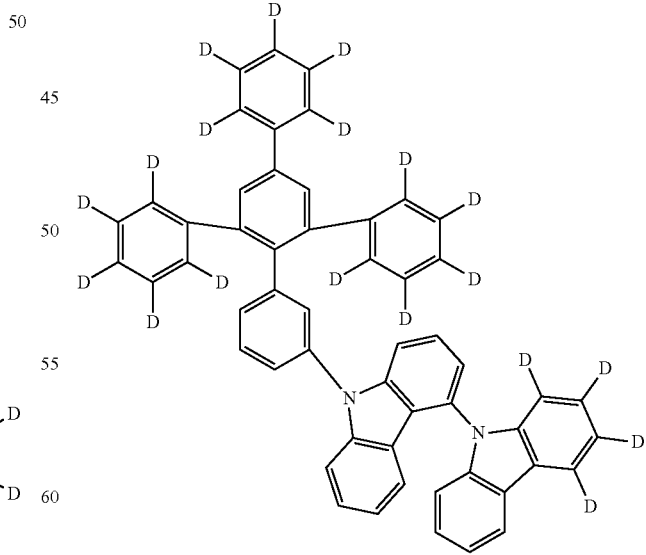

53
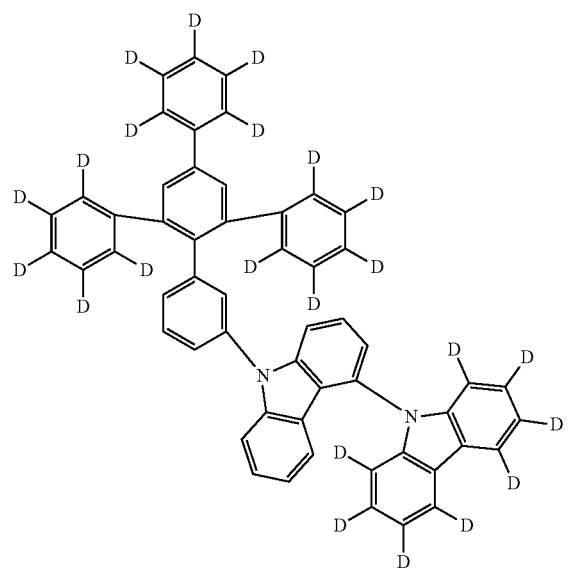
54
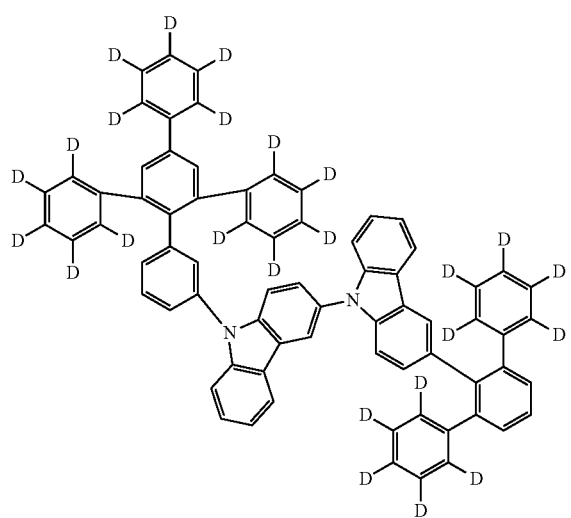
55
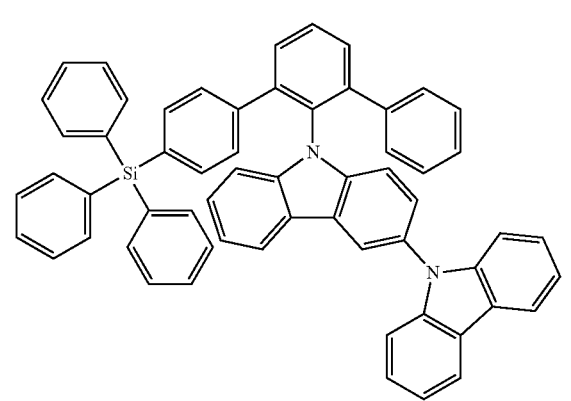
56
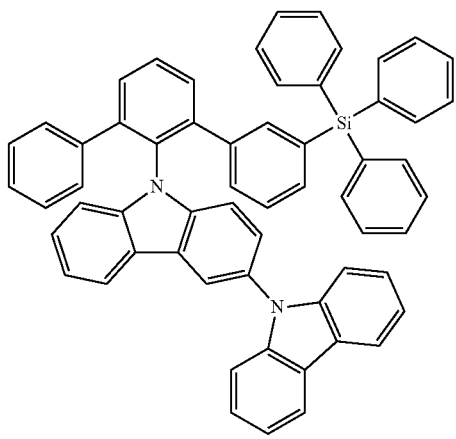
57
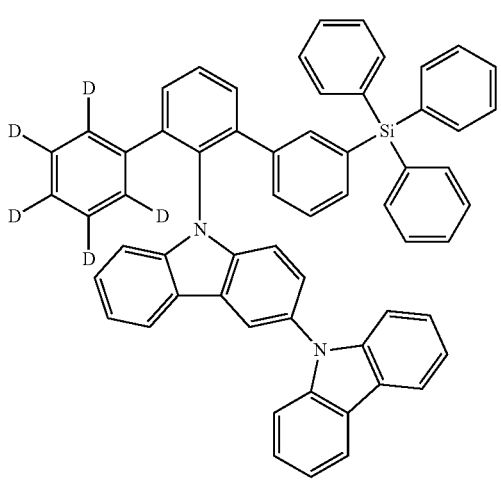
58
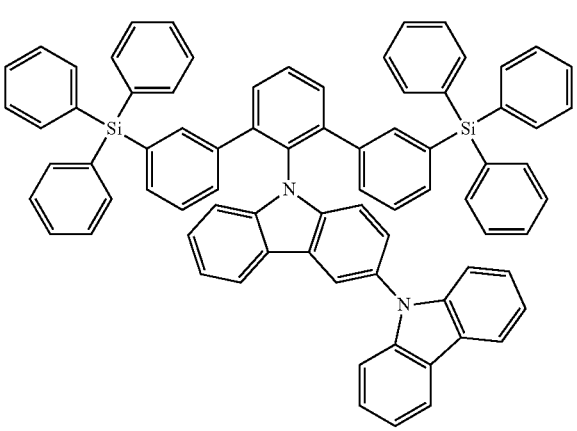

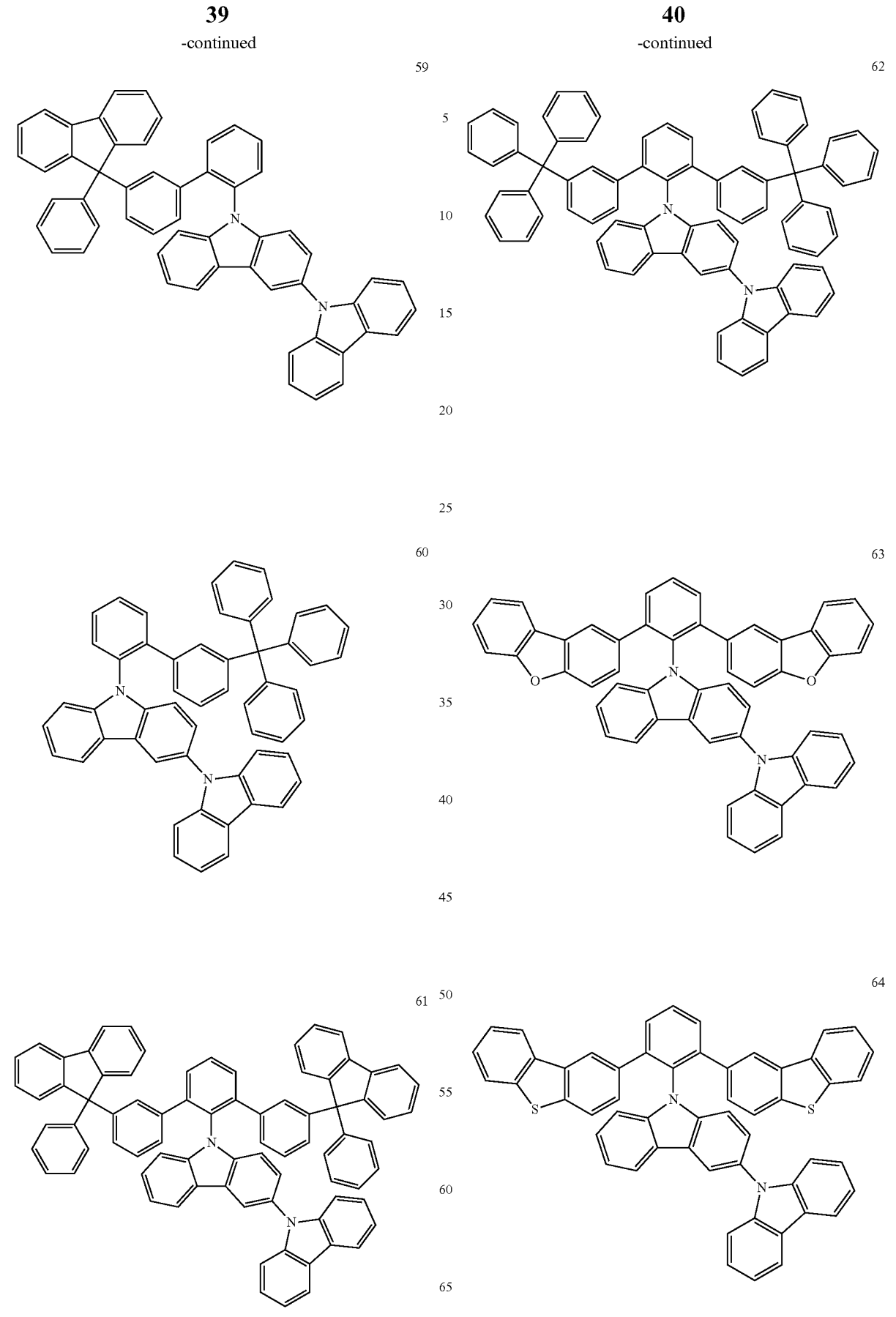

72
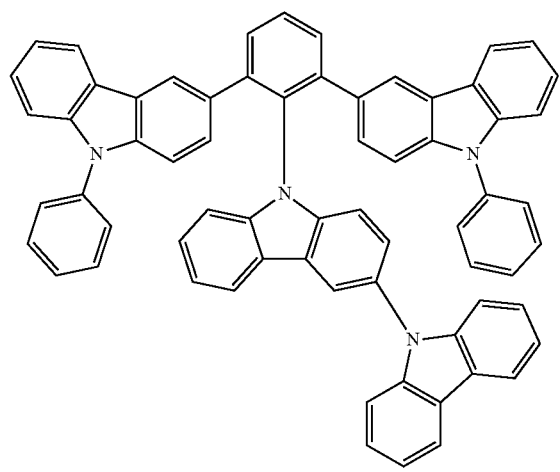
73
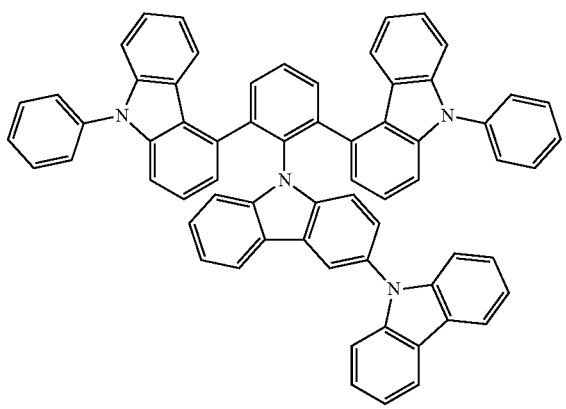
74
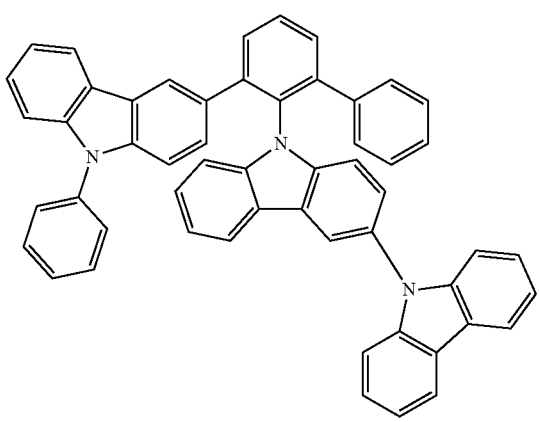
75
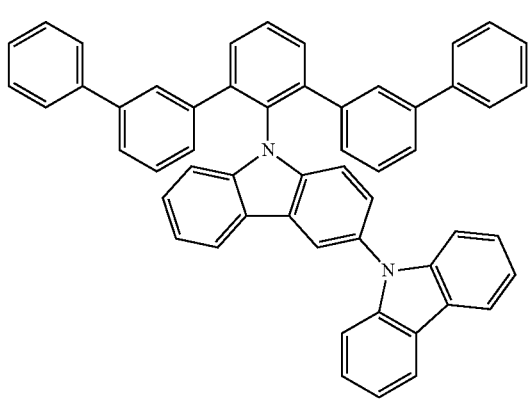
76
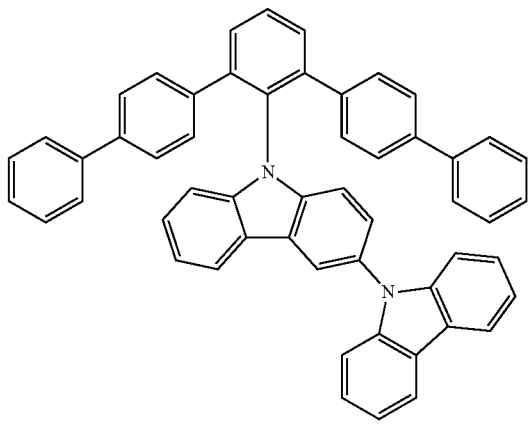
77
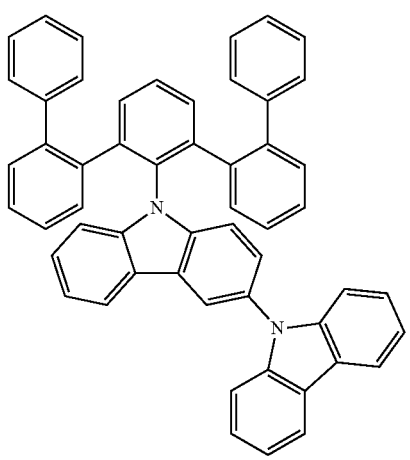

78
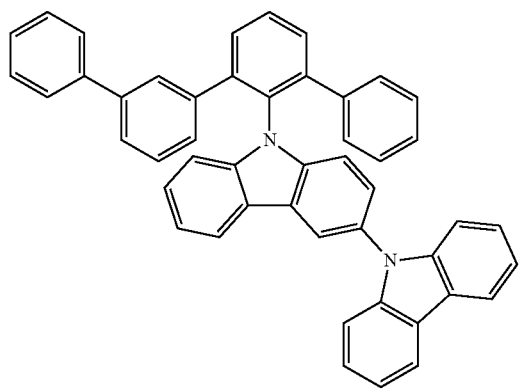
79
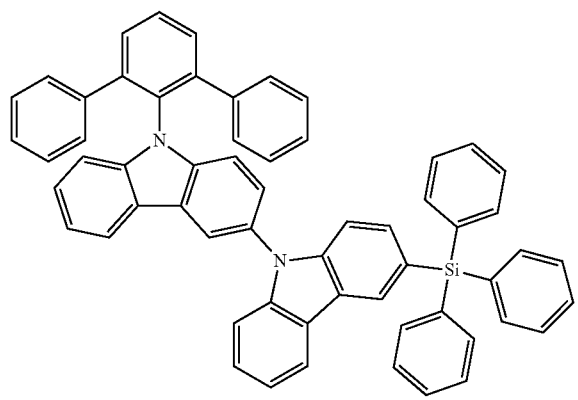
80
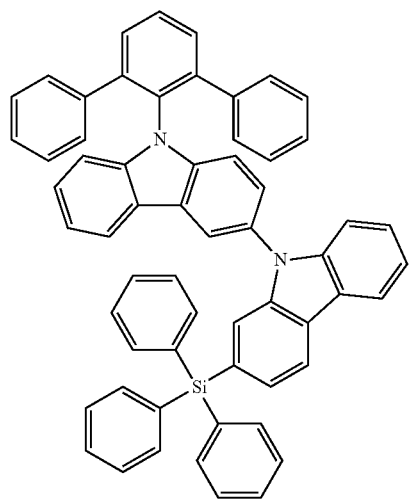
81
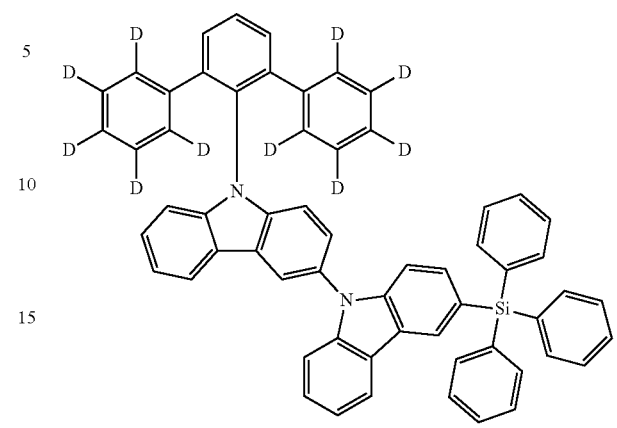
82
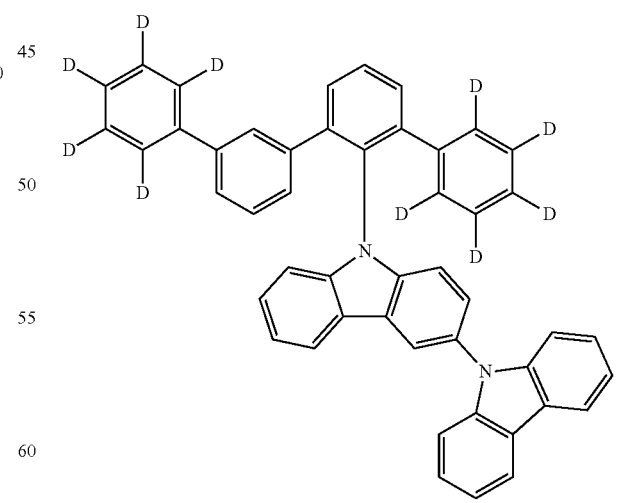
83

84
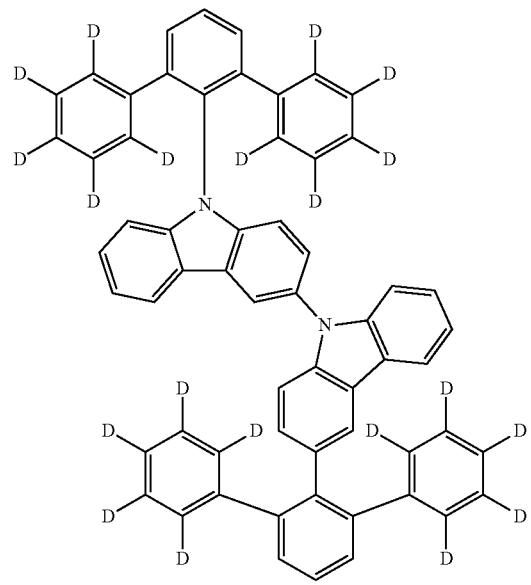
85
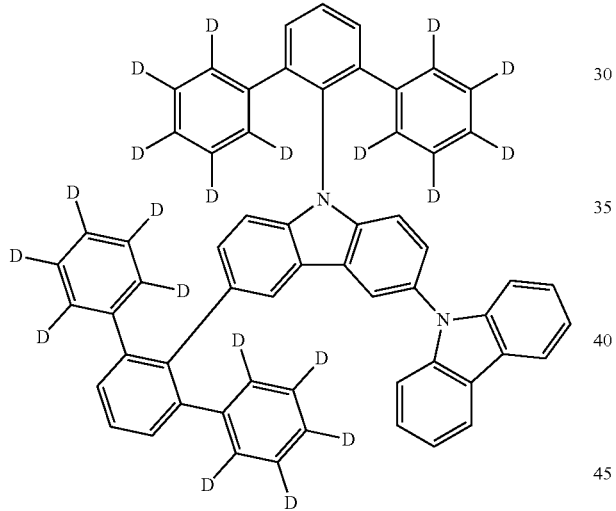
86
87
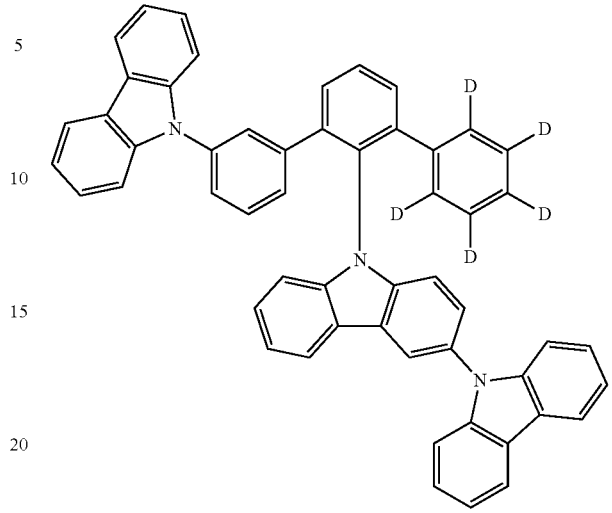
88
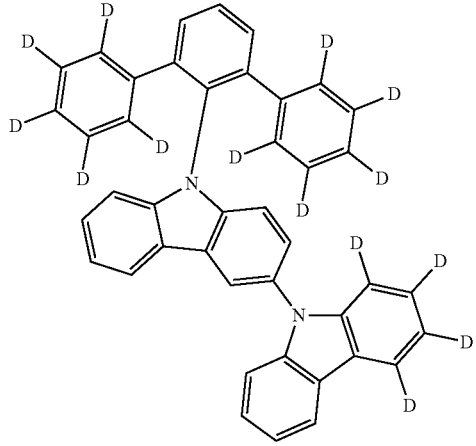
89
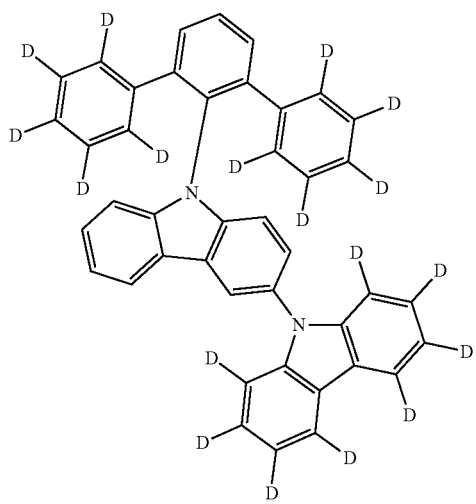

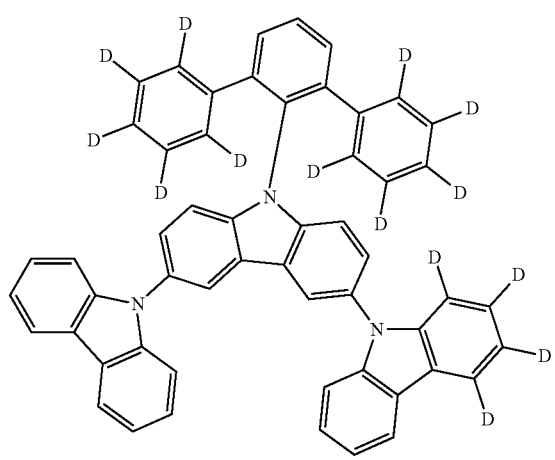
90
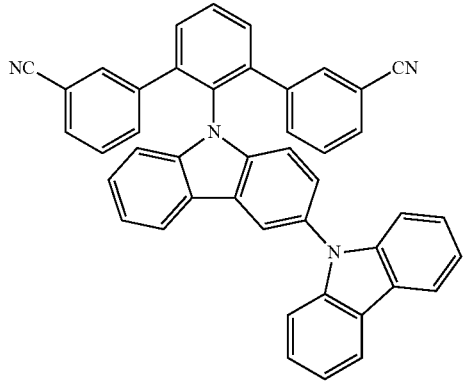
94
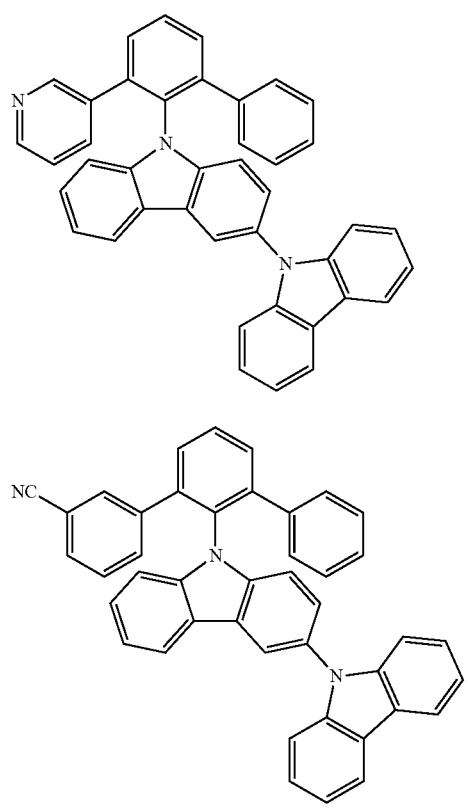
91
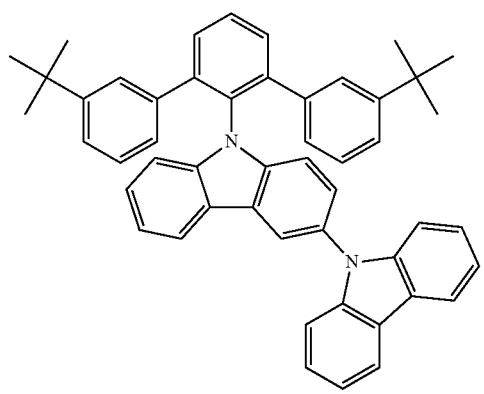
95
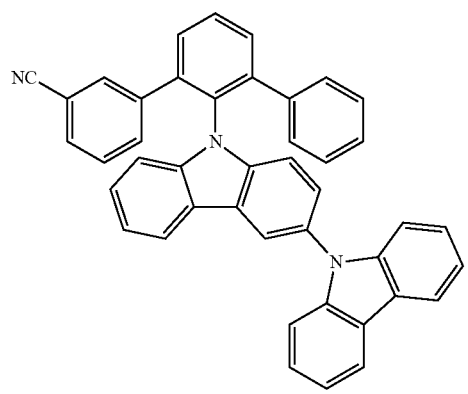
92
93
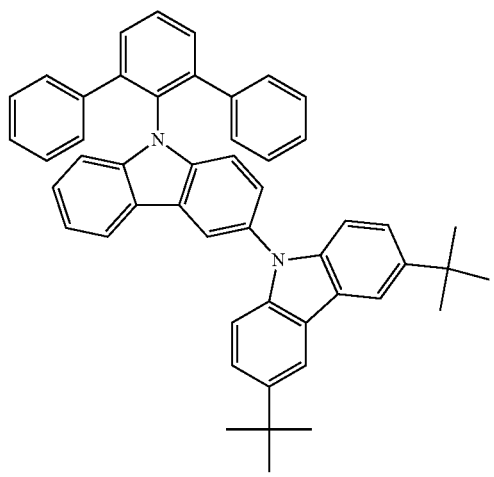
96

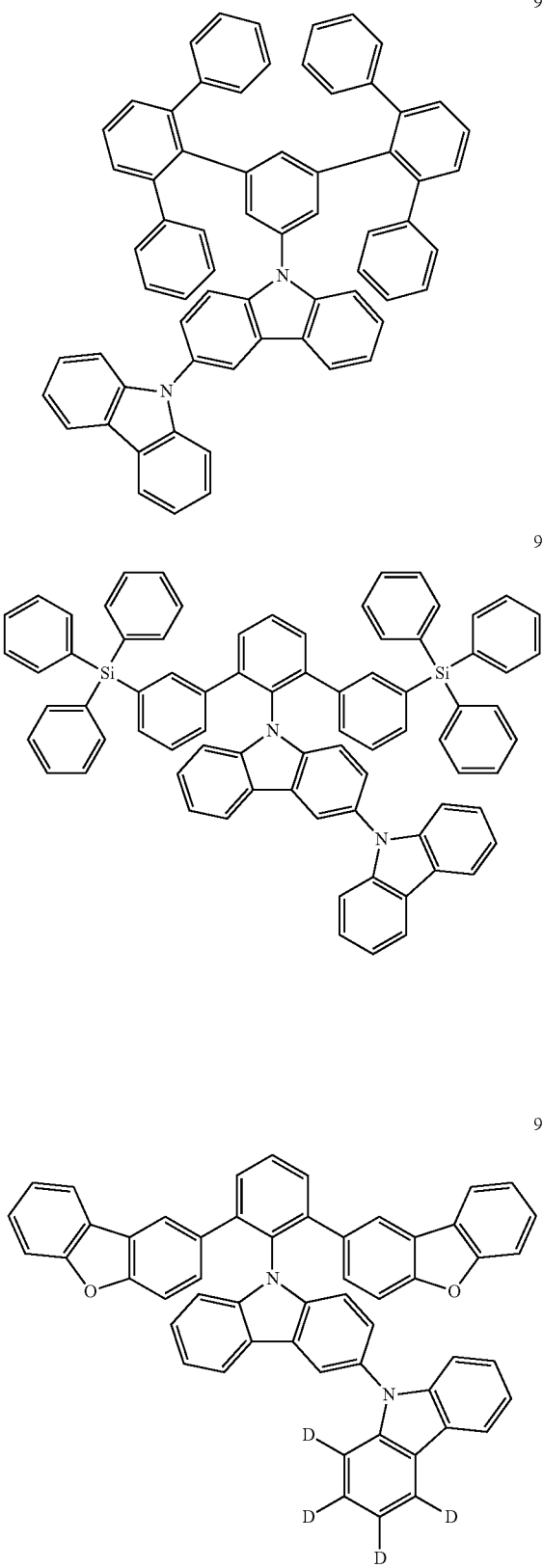
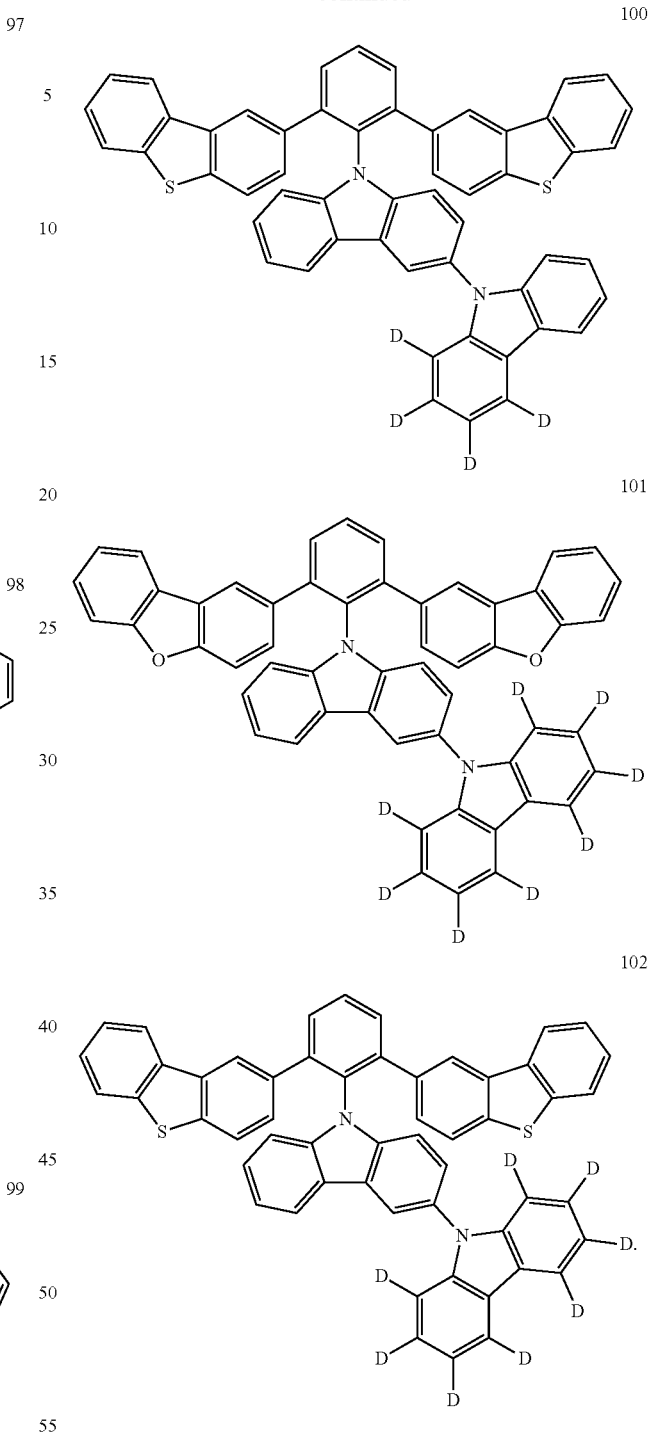

In the heterocyclic compound, i) Ar₃ in Formula 1 may be represented by one of Formulae 3A-1 to 3A-4 and 31B-1 to 3B3-4, and thus, at least one of ring CY₁ and ring CY₂ may be substituted at an ortho position of a benzene ring. Accordingly, a steric hindrance effect may occur in the heterocyclic compound, and thus, light efficiency may increase and stable compound may be obtained.

Also, the heterocyclic compound ii) may satisfy at least one of Condition 1 to Condition 5, and thus, the steric hindrance effect may be enhanced and a d-orbital and a pi-conjugated system of the heterocyclic compound may interact with each other to thereby stabilize an energy level of the heterocyclic compound. Accordingly, quenching of a $T_1$ energy level may be prevented or reduced, and formation of an excimer may be prevented or reduced. Thus, the heterocyclic compound may be used as a highly efficient luminescent material, and an electronic device, for example, an organic light-emitting device, including the heterocyclic compound may have low driving voltage, excellent light efficiency, and long lifespan.

A synthesis method of the heterocyclic compound represented by Formula 1 and satisfying at least one of Condition 1 to Condition 5 may be recognized by those skilled in the art with reference to the following Synthesis Examples and/or Examples.

At least one of heterocyclic compounds represented by Formula 1 and satisfying at least one of Condition 1 to Condition 5 may be used in a light-emitting device (for example, an organic light-emitting device). Accordingly, provided is a light-emitting device including: a first electrode; a second electrode facing the first electrode; an interlayer between the first electrode and the second electrode and including an emission layer; and the heterocyclic compound represented by Formula 1 and satisfying at least one of Condition 1 to Condition 5.

In an embodiment,
the first electrode of the light-emitting device may be an anode,
the second electrode of the light-emitting device may be a cathode,
the interlayer may further include a hole transport region between the first electrode and the emission layer and an electron transport region between the emission layer and the second electrode,
the hole transport region may include a hole injection layer, a hole transport layer, an emission auxiliary layer, an electron blocking layer, or any combination thereof, and
the electron transport region may include a hole blocking layer, an electron transport layer, an electron injection layer, or any combination thereof.

In one or more embodiments, the heterocyclic compound may be included between a pair of electrodes of the light-emitting device. Thus, the heterocyclic compound may be included in the interlayer of the light-emitting device, for example, the emission layer of the interlayer.

In one or more embodiments, the emission layer of the interlayer of the light-emitting device may include a dopant and a host, and the host may include the heterocyclic compound. For example, the heterocyclic compound may act as the host. In one or more embodiments, the dopant may include the heterocyclic compound. For example, the heterocyclic compound may act as the dopant. The emission layer may emit red light, green light, blue light, and/or white light. In an embodiment, the emission layer may emit blue light. The blue light may have a maximum emission wavelength in a range of, for example, about 450 nm to about 470 nm.

In one or more embodiments, the heterocyclic compound may be the host, and the emission layer may emit blue light.

In one or more embodiments, the light-emitting device may have a difference of 0.5 eV or less between a singlet ($S_1$) energy level and a triplet ($T_1$) energy level.

In an embodiment, the light-emitting device may further include at least one of a first capping layer outside the first electrode and a second capping layer outside the second electrode, and the heterocyclic compound may be included in at least one of the first capping layer and the second capping layer. More details on the first capping layer and/or the second capping layer are the same as described elsewhere in the present specification.

In an embodiment, the light-emitting device may include:
a first capping layer outside the first electrode and including the heterocyclic compound;
a second capping layer outside the second electrode and including the heterocyclic compound; or
the first capping layer and the second capping layer.

More details on the first capping layer and/or the second capping layer are the same as described elsewhere in the present specification.

The expression "(an interlayer and/or a capping layer) includes at least one heterocyclic compound," as used herein, may include a case in which "(an interlayer and/or a capping layer) includes identical heterocyclic compounds represented by Formula 1" and a case in which "(an organic layer) includes two or more different heterocyclic compounds represented by Formula 1."

In an embodiment, the interlayer and/or the capping layer may include Compound 1 only as the heterocyclic compound. In this regard, Compound 1 may exist in the emission layer of the light-emitting device. In one or more embodiments, the interlayer may include Compounds 1 and 2 as the heterocyclic compounds. In this regard, Compound 1 and Compound 2 may exist in an identical layer (for example, Compound 1 and Compound 2 may all exist in an emission layer), or different layers (for example, Compound 1 may exist in an emission layer and Compound 2 may exist in an electron transport region).

The term "interlayer," as used herein, refers to a single layer and/or all of a plurality of layers between the first electrode and the second electrode of the light-emitting device.

According to another aspect of an embodiment, an electronic apparatus including the light-emitting device is provided. The electronic apparatus may further include a thin-film transistor. In one or more embodiments, the electronic apparatus may further include a thin-film transistor including a source electrode and a drain electrode, and the first electrode of the light-emitting device may be electrically coupled to the source electrode or the drain electrode. In an embodiment, the electronic apparatus may further include a color filter, a color conversion layer, a touch screen layer, a polarizing layer, or any combination thereof. More details on the electronic apparatus are the same as described elsewhere in the present specification.

Description of FIG. 1

FIG. 1 is a schematic cross-sectional view of a light-emitting device 10 according to an embodiment. The light-emitting device 10 includes a first electrode 110, an interlayer 130, and a second electrode 150.

Hereinafter, a structure of the light-emitting device 10 according to an embodiment and a method of manufacturing the light-emitting device 10 will be described in connection with FIG. 1.

First Electrode 110

In FIG. 1, a substrate may be additionally under the first electrode 110 and/or above the second electrode 150. The substrate may be a glass substrate and/or a plastic substrate. The substrate may be a flexible substrate. In one or more embodiments, the substrate may include plastics having excellent heat resistance and/or durability, such as polyimide, polyethylene terephthalate (PET), polycarbonate, polyethylene naphthalate, polyarylate (PAR), polyetherimide, or any combination thereof.

The first electrode 110 may be formed by, for example, depositing and/or sputtering a material for forming the first electrode 110 on the substrate. When the first electrode 110 is an anode, a high work function material that can easily inject holes may be used as a material for forming the first electrode 110.

The first electrode 110 may be a reflective electrode, a semi-transmissive electrode, or a transmissive electrode. When the first electrode 110 is a transmissive electrode, a material for forming the first electrode 110 may include indium tin oxide (ITO), indium zinc oxide (IZO), tin oxide ($SnO_2$), zinc oxide (ZnO), or any combination thereof. In one or more embodiments, when the first electrode 110 is a semi-transmissive electrode or a reflective electrode, magnesium (Mg), silver (Ag), aluminum (Al), aluminum-lithium (Al—Li), calcium (Ca), magnesium-indium (Mg—In), magnesium-silver (Mg—Ag), or any combination thereof may be used as a material for forming the first electrode 110.

The first electrode 110 may have a single-layered structure including (e.g., consisting of) a single layer or a multi-layered structure including a plurality of layers. In an embodiment, the first electrode 110 may have a three-layered structure of ITO/Ag/ITO.

Interlayer 130

The interlayer 130 is on the first electrode 110. The interlayer 130 includes an emission layer.

The interlayer 130 may further include a hole transport region between the first electrode 110 and the emission layer and an electron transport region between the emission layer and the second electrode 150.

The interlayer 130 may further include metal-containing compounds such as organometallic compounds, inorganic materials such as quantum dots, and/or the like, in addition to various suitable organic materials.

In one or more embodiments, the interlayer 130 may include, i) two or more emitting units sequentially stacked between the first electrode 110 and the second electrode 150 and ii) a charge generation layer between the two emitting units. When the interlayer 130 includes the emitting unit and the charge generation layer as described above, the light-emitting device 10 may be a tandem light-emitting device.

Hole Transport Region in Interlayer 130

The hole transport region may have i) a single-layered structure including (e.g., consisting of) a single layer including (e.g., consisting of) a single material, ii) a single-layered structure including (e.g., consisting of) a single layer including a plurality of different materials, or iii) a multi-layered structure including a plurality of layers including different materials.

The hole transport region may include a hole injection layer, a hole transport layer, an emission auxiliary layer, an electron blocking layer, or any combination thereof.

In an embodiment, the hole transport region may have a multi-layered structure including a hole injection layer/hole transport layer structure, a hole injection layer/hole transport layer/emission auxiliary layer structure, a hole injection layer/emission auxiliary layer structure, a hole injection layer/hole transport layer/emission auxiliary layer structure, or a hole injection layer/hole transport layer/electron blocking layer structure, wherein, in each structure, layers are stacked sequentially from the first electrode 110.

The hole transport region may include a compound represented by Formula 201, a compound represented by Formula 202, or any combination thereof:

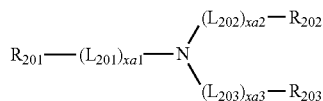

Formula 201

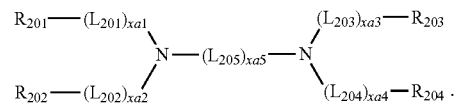

Formula 202

In Formulae 201 and 202, $L_{201}$ to $L_{204}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, $L_{205}$ may be *—O—*', *—S—*', *—N($Q_{201}$)-*', a $C_1$-$C_{20}$ alkylene group unsubstituted or substituted with at least one $R_{10a}$, a $C_2$-$C_{20}$ alkenylene group unsubstituted or substituted with at least one $R_{10a}$, a $C_3$-$C_{60}$ carbocyclic group unsubstituted or substituted with at least one $R_{10a}$, or a $C_1$-$C_{60}$ heterocyclic group unsubstituted or substituted with at least one $R_{10a}$, xa1 to xa4 may each independently be an integer from 0 to 5, xa5 may be an integer from 1 to 10, $R_{201}$ to $R_{204}$ and $O_{201}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, $R_{201}$ and $R_{202}$ may optionally be linked to each other via a single bond, a $C_1$-$C_5$ alkylene group unsubstituted or substituted with at least one $R_{10a}$, or a $C_2$-$C_5$ alkenylene group unsubstituted or substituted with at least one $R_{10a}$, to form a $C_8$-$C_{60}$ polycyclic group unsubstituted or substituted with at least one $R_{10a}$ (for example, a carbazole group) (for example, see Compound HT16 and/or the like), $R_{203}$ and $R_{204}$ may optionally be linked to each other via a single bond, a $C_1$-$C_5$ alkylene group unsubstituted or substituted with at least one $R_{10a}$, or a $C_2$-$C_5$ alkenylene group unsubstituted or substituted with at least one $R_{10a}$, to form a $C_8$-$C_{60}$ polycyclic group unsubstituted or substituted with at least one $R_{10a}$, and na1 may be an integer from 1 to 4.

In an embodiment, Formulae 201 and 202 may each include at least one of the groups represented by Formulae CY201 to CY217:

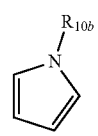

CY201

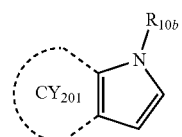

CY202

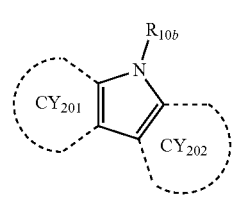

CY203

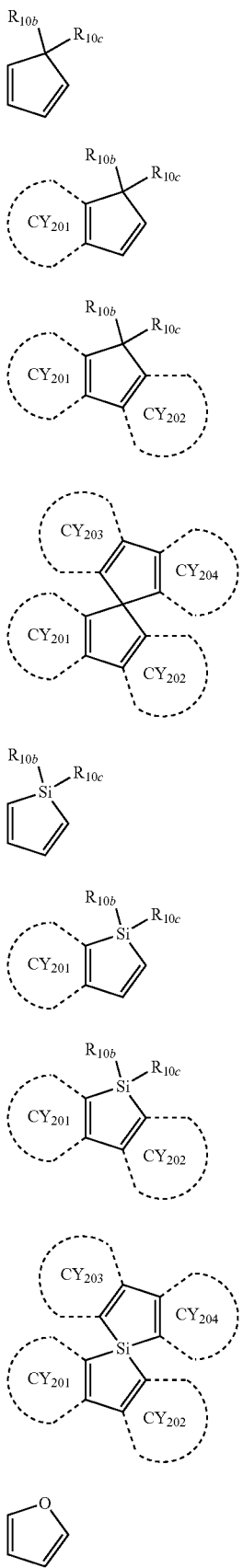
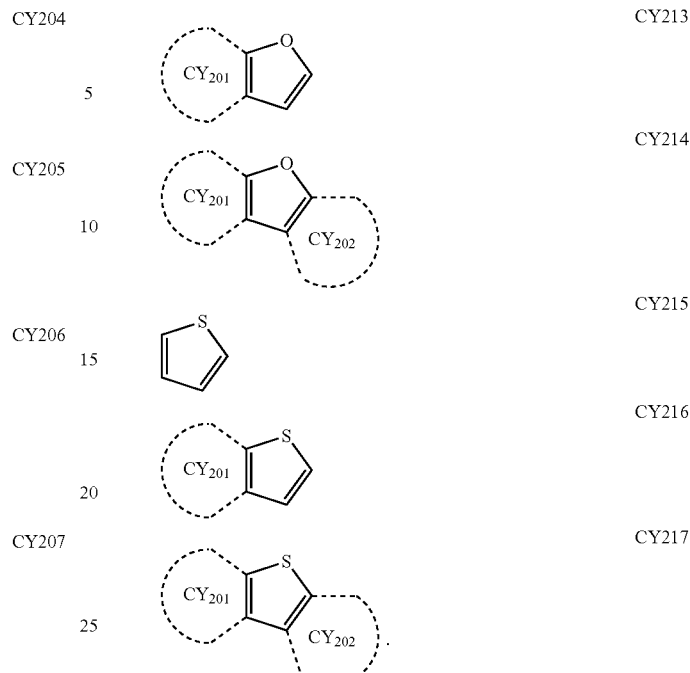

Regarding Formulae CY201 to CY217, $R_{10b}$ and $R_{10c}$ are the same as described in connection with $R_{10a}$, ring $CY_{201}$ to ring $CY_{204}$ may each independently be a $C_3$-$C_{20}$ carbocyclic group or a $C_1$-$C_{20}$ heterocyclic group, and at least one hydrogen in Formula CY201 to CY217 may be unsubstituted or substituted with at least one $R_{10a}$ described herein.

In an embodiment, ring $CY_{201}$ to ring $CY_{204}$ in Formulae CY201 to CY217 may each independently be a benzene group, a naphthalene group, a phenanthrene group, or an anthracene group.

In an embodiment, Formulae 201 and 202 may each include at least one of the groups represented by Formulae CY201 to CY203.

In an embodiment, Formula 201 may include at least one of the groups represented by Formulae CY201 to CY203 and at least one of the groups represented by Formulae CY204 to CY217.

In one or more embodiments, in Formula 201, xa1 is 1, $R_{201}$ is a group represented by one of Formulae CY201 to CY203, xa2 is 0, and $R_{202}$ is a group represented by one of Formulae CY204 to CY207.

In one or more embodiments, each of Formulae 201 and 202 may not include groups represented by Formulae CY201 to CY203.

In one or more embodiments, each of Formulae 201 and 202 may not include groups represented by Formulae CY201 to CY203 and may include at least one of the groups represented by Formulae CY204 to CY217.

In an embodiment, each of Formulae 201 and 202 may not include groups represented by Formulae CY201 to CY217.

In an embodiment, the hole transport region may include one of Compounds HT1 to HT46, m-MTDATA, TDATA, 2-TNATA, NPB(NPD), β-NPB, TPD, Spiro-TPD, Spiro-NPB, methylated-NPB, TAPC, HMTPD, 4,4′,4″-tris(N-carbazolyl)triphenylamine (TCTA), polyaniline/dodecylbenzenesulfonic acid (PANI/DBSA), poly(3,4-ethylenedioxythiophene)/poly(4-styrenesulfonate) (PEDOT/PSS), polyaniline/camphor sulfonic acid (PANI/CSA), polyaniline/poly(4-styrenesulfonate) (PANI/PSS), or any combination thereof:

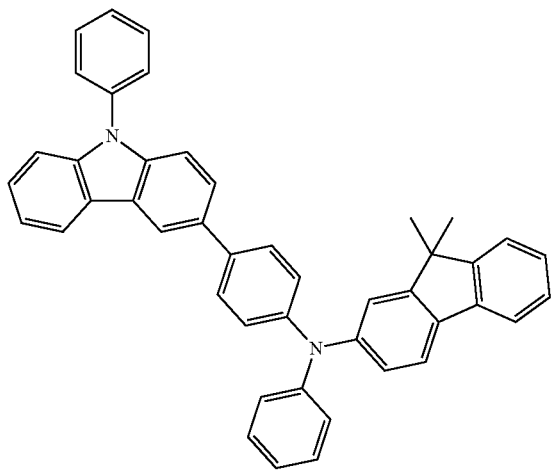
HT1
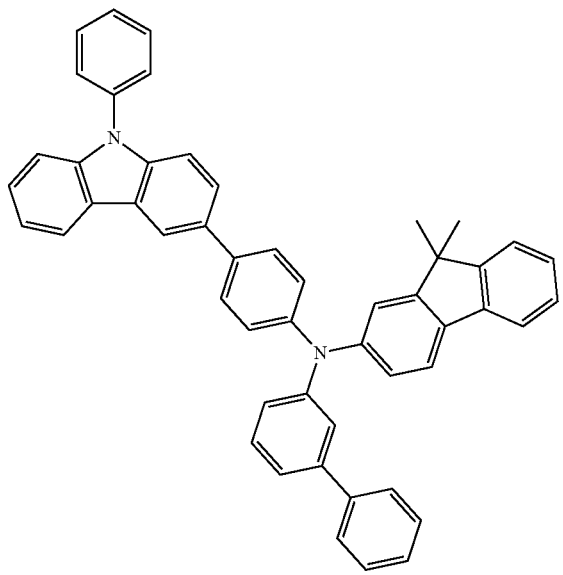
HT2
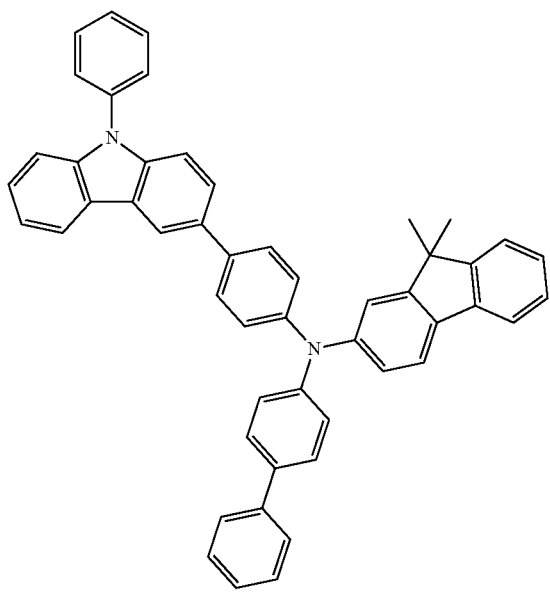
HT3
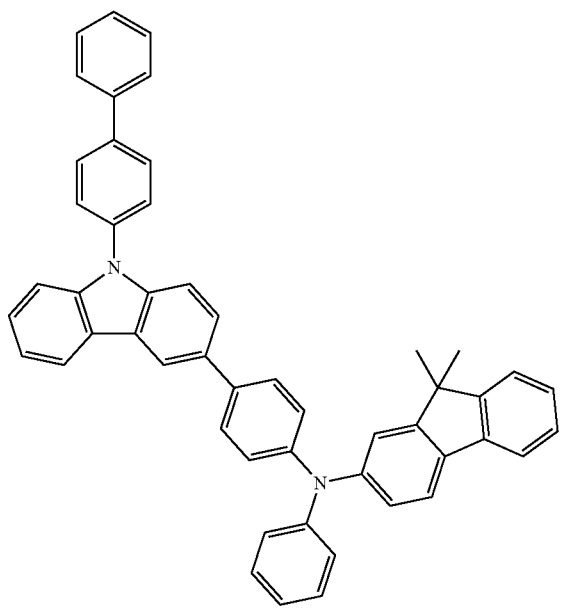
HT4

HT5
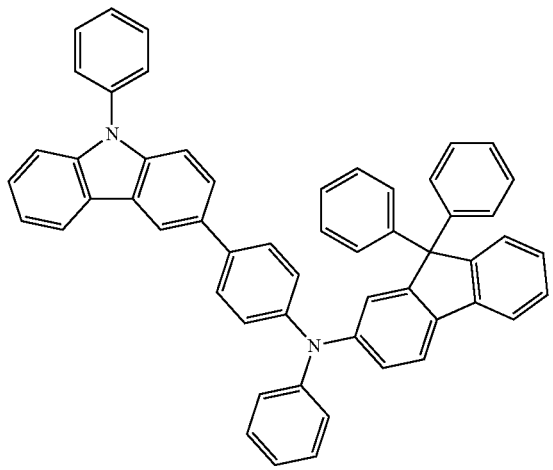
HT6
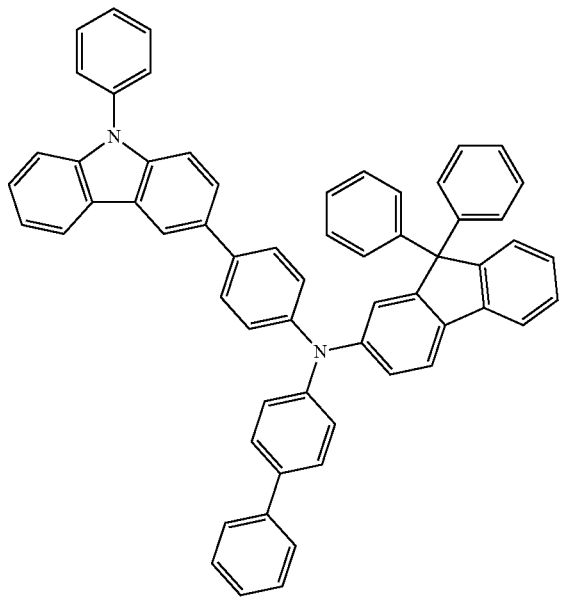
HT7
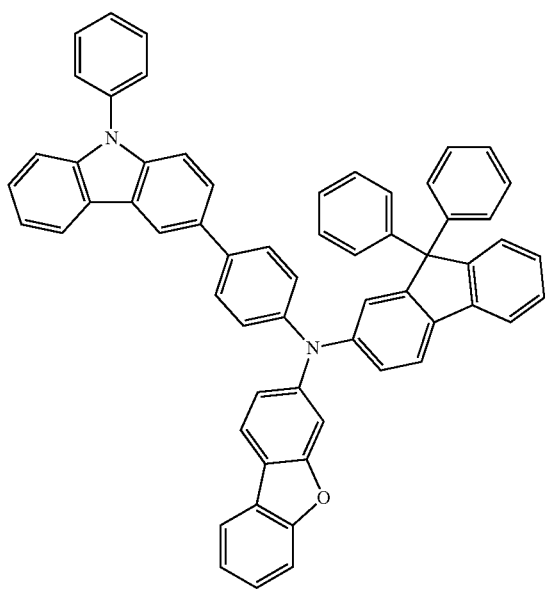
HT8
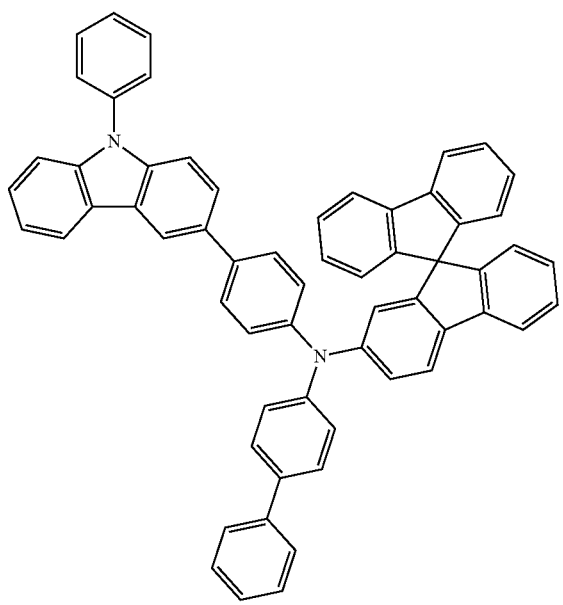

HT9
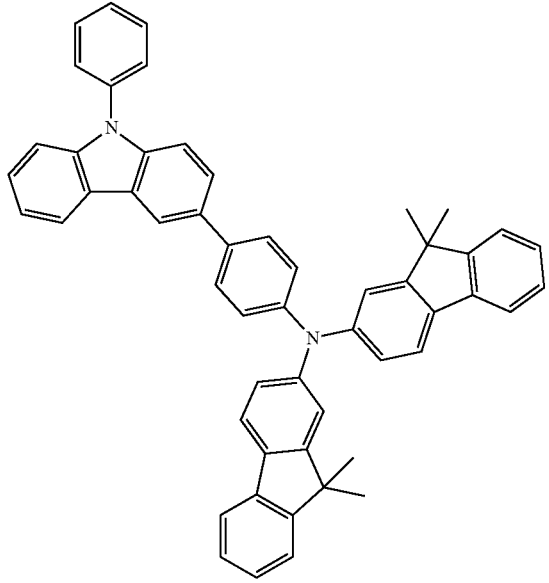
HT10
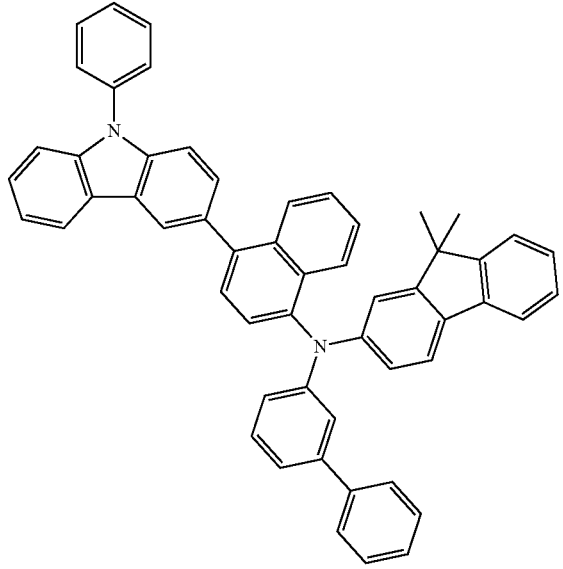
HT11
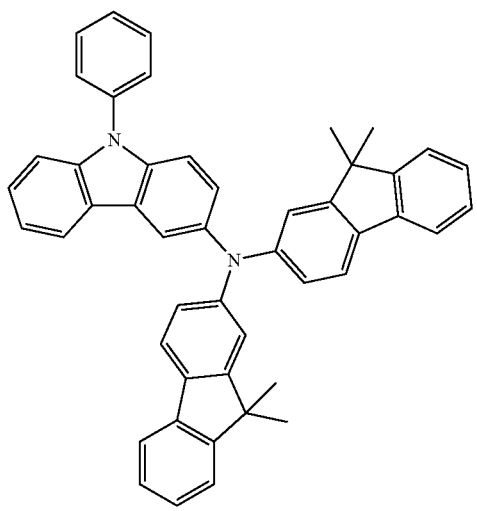
HT12
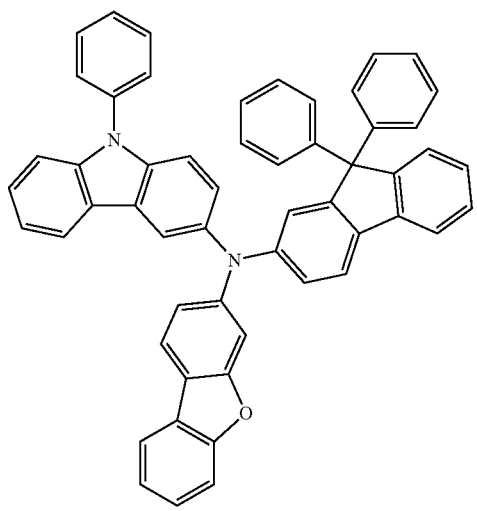

-continued
HT13
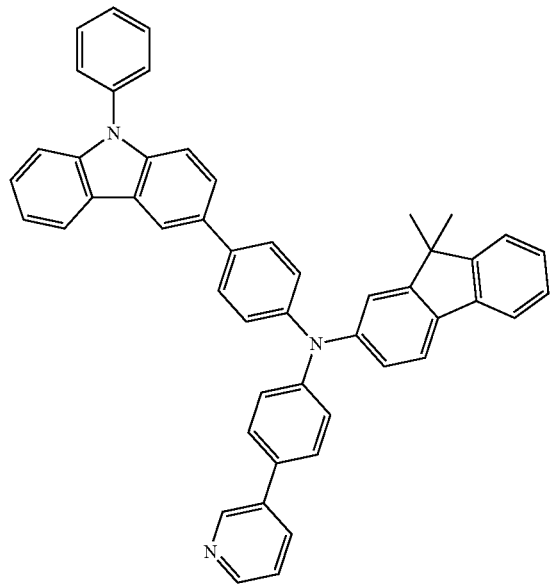
HT14
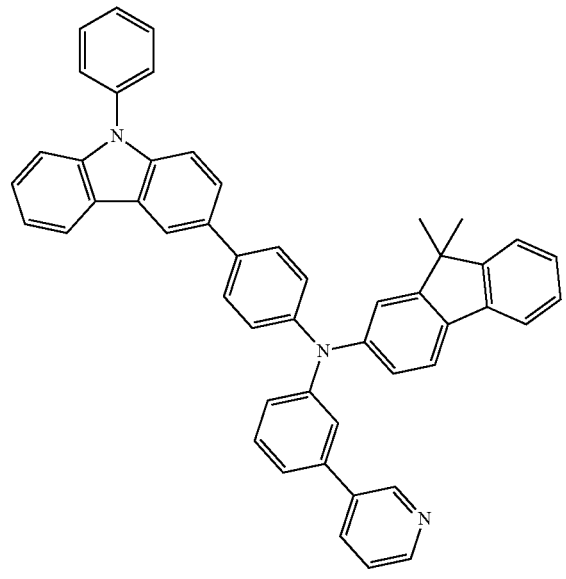
HT15
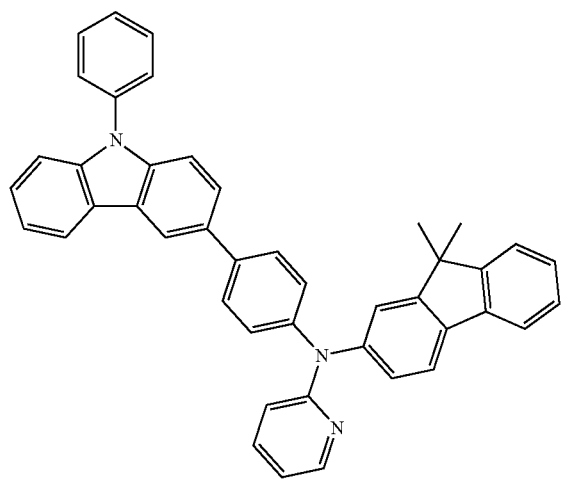
HT16
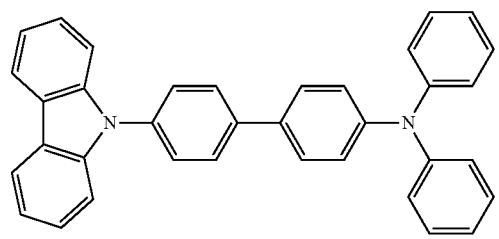
HT17
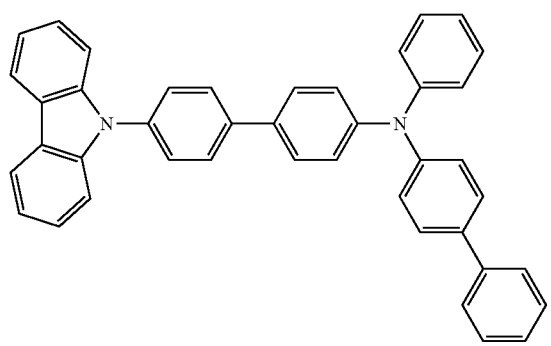
HT18
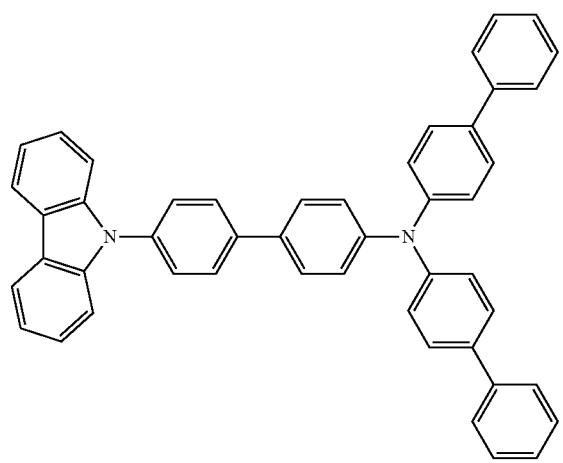

-continued
HT19
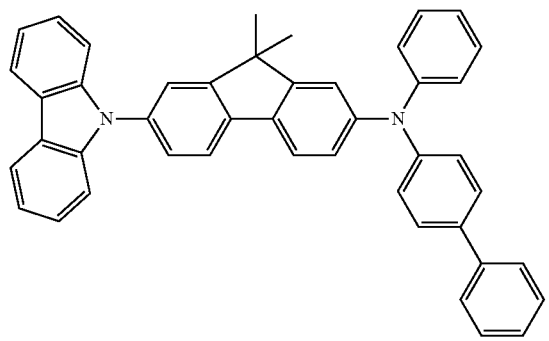
HT20
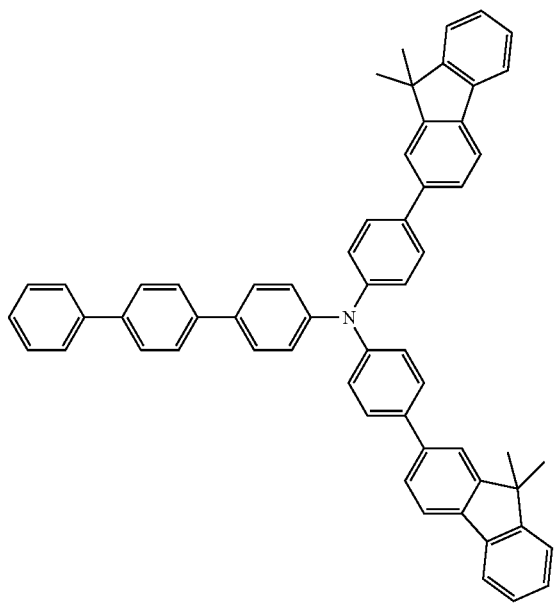
HT21
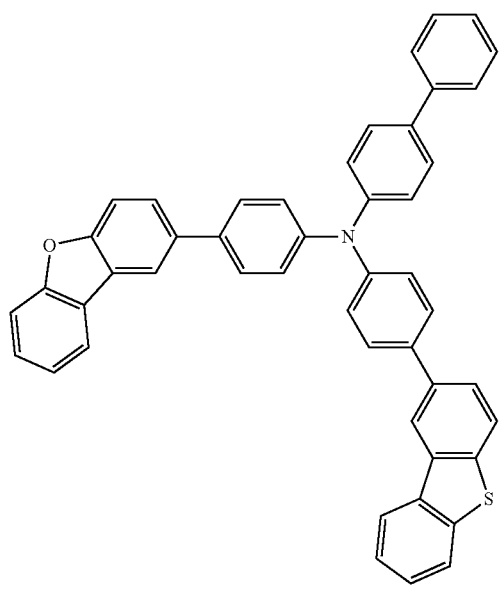
HT22
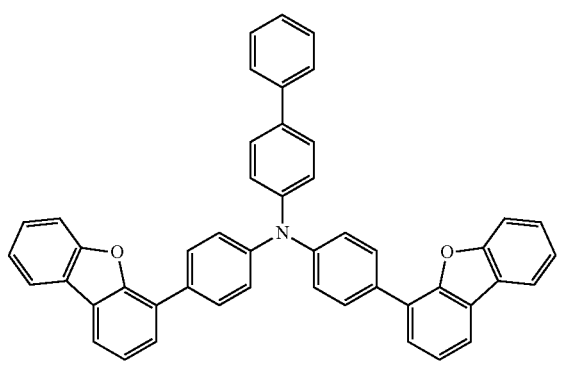

-continued
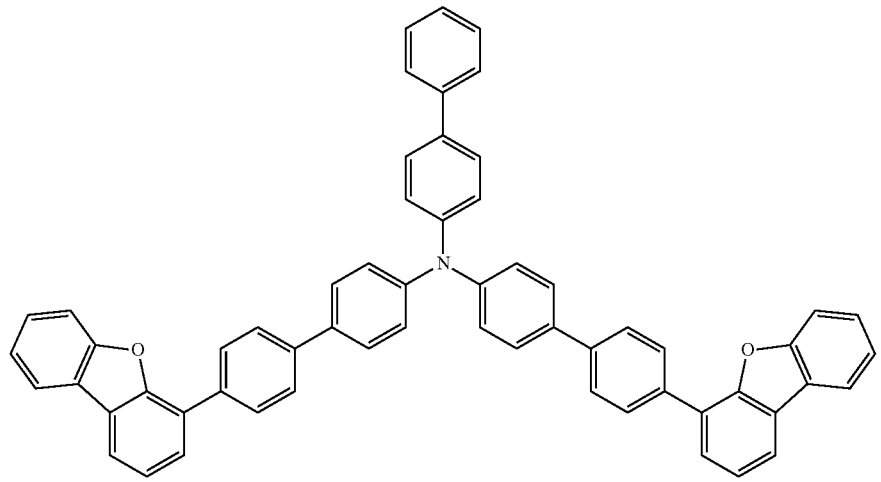
HT23
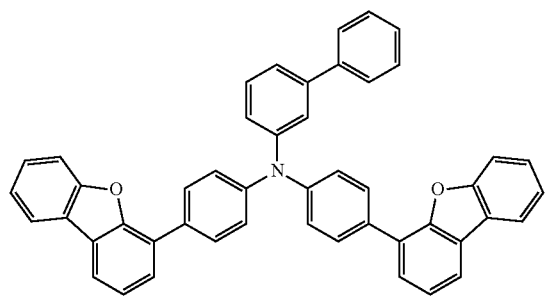
HT24
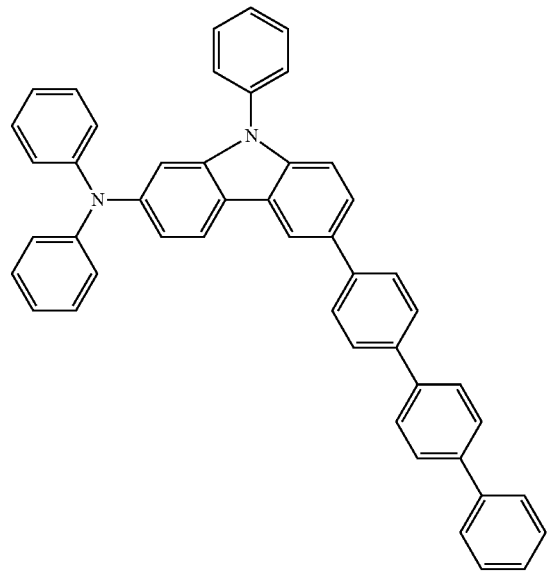
HT25
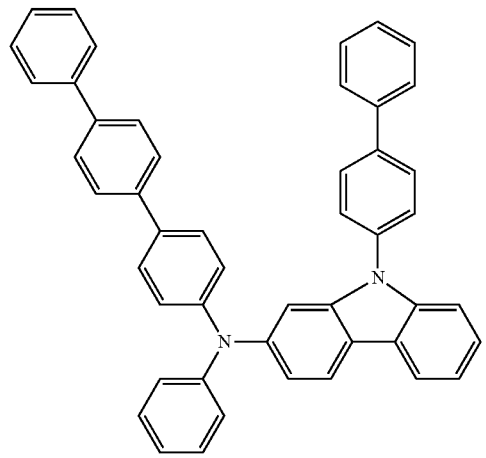
HT26
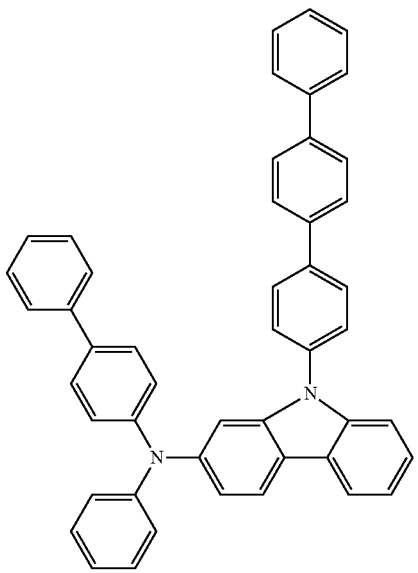
HT27

-continued
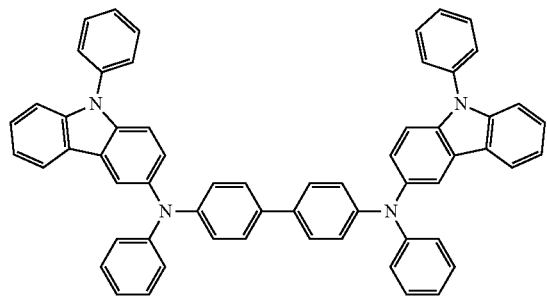
HT28
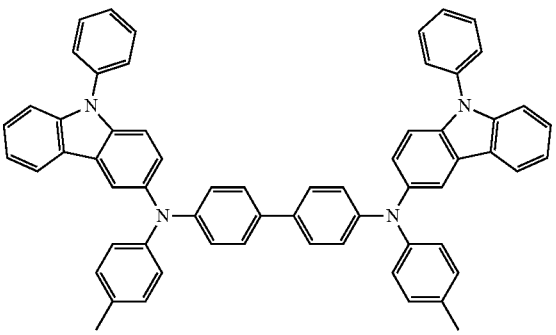
HT29
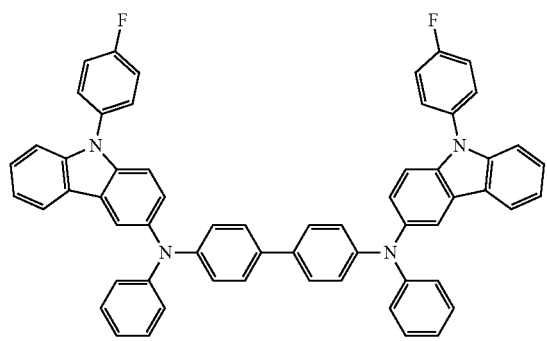
HT30
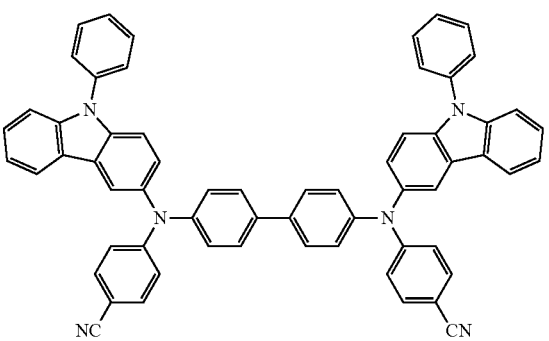
HT31
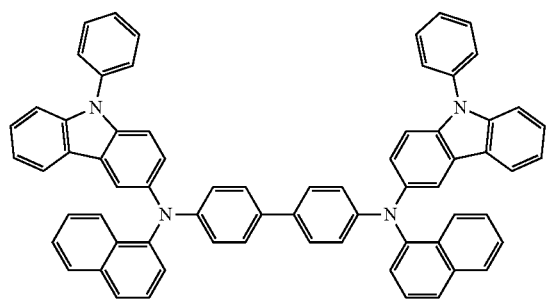
HT32
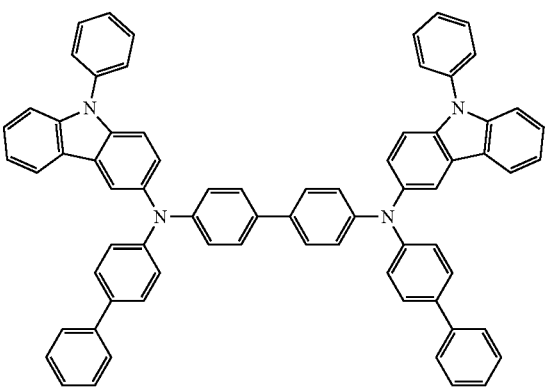
HT33
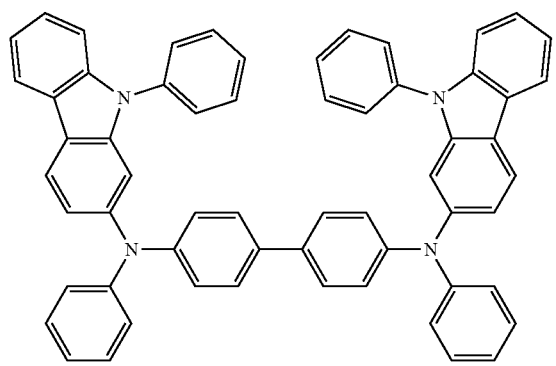
HT34
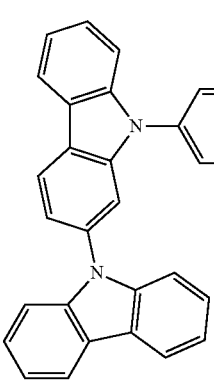
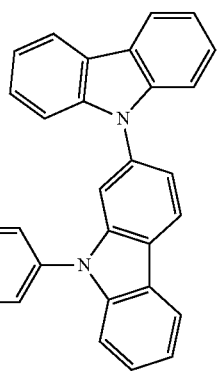
HT35

-continued
HT36
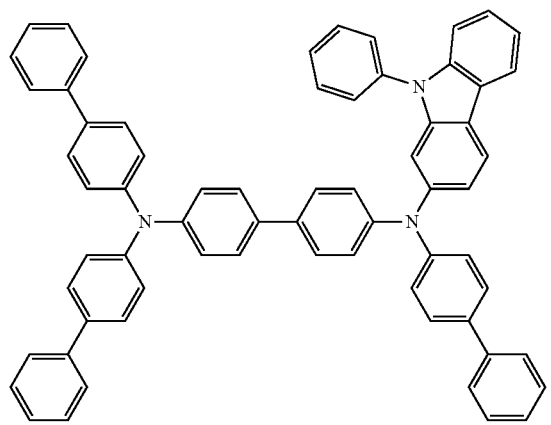
HT37
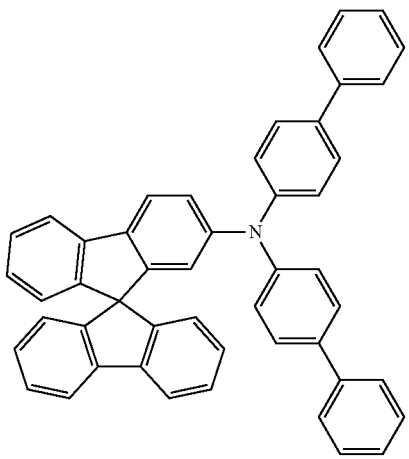
HT38
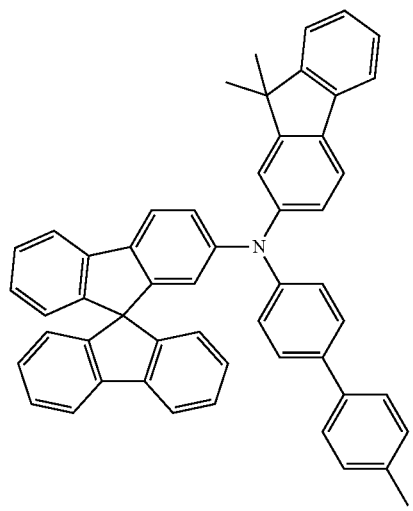
HT39
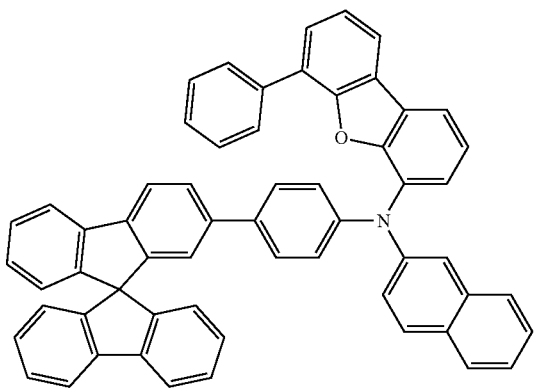
HT40
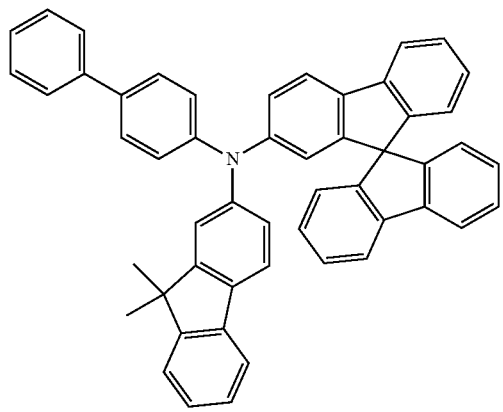
HT41
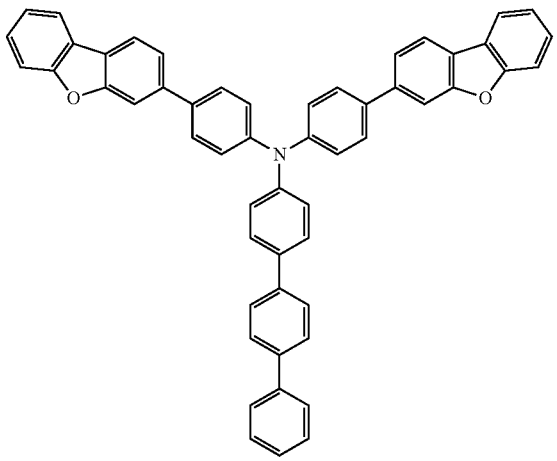

-continued
HT42
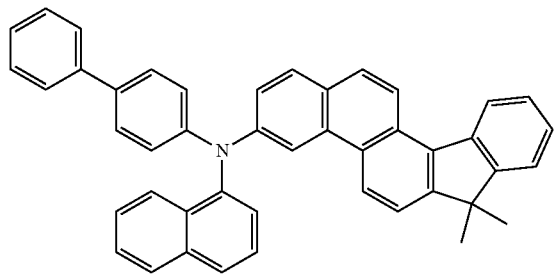
HT43
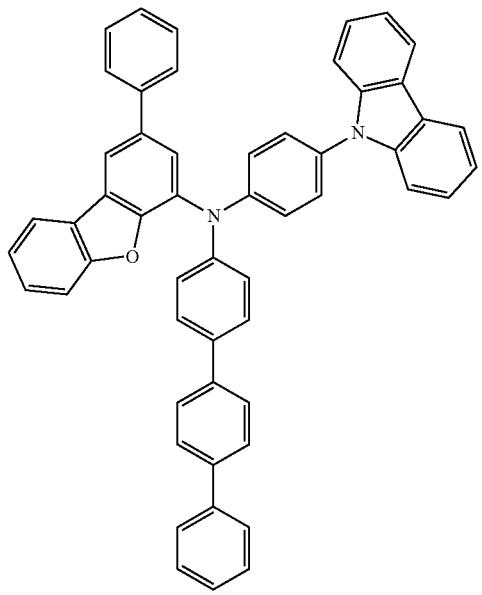
HT44
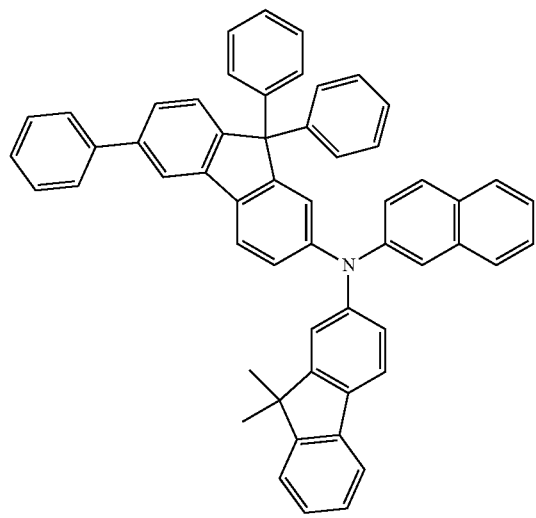
HT45
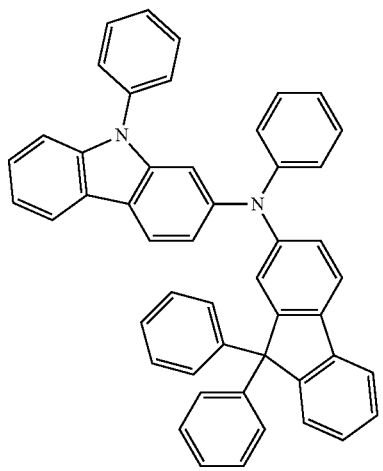

-continued
HT46
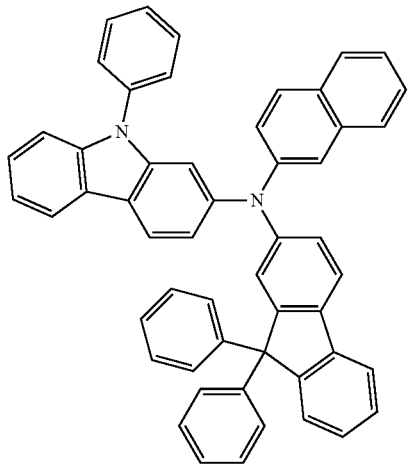
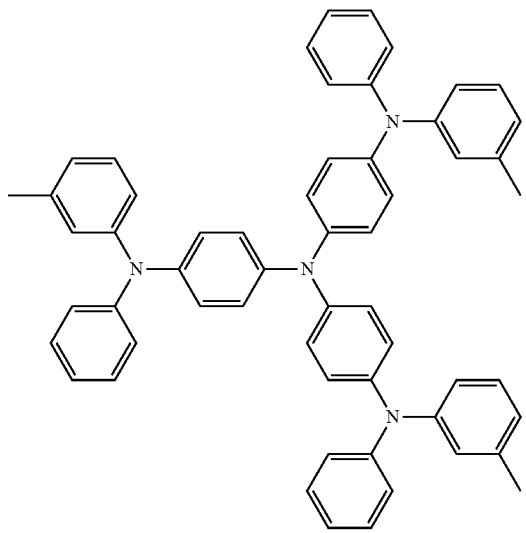
m-MTDATA
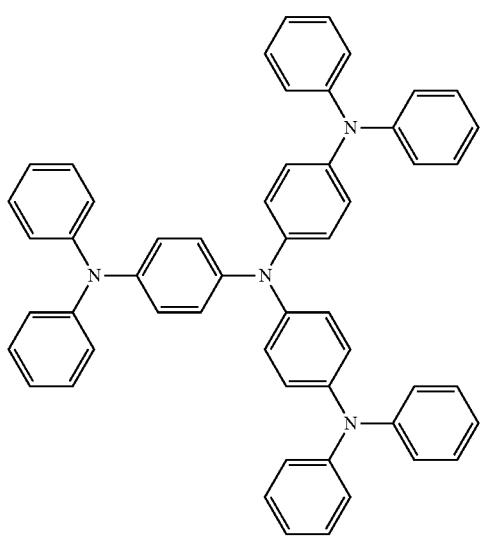
TDATA
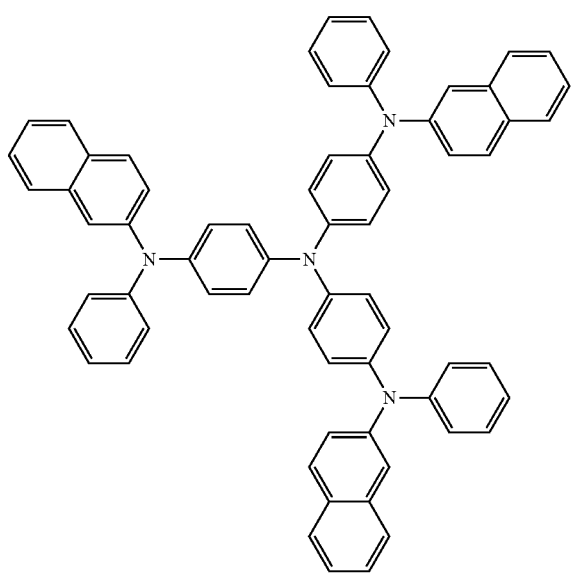
2-TNATA
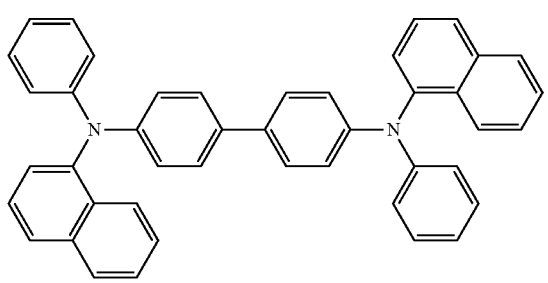
NPB
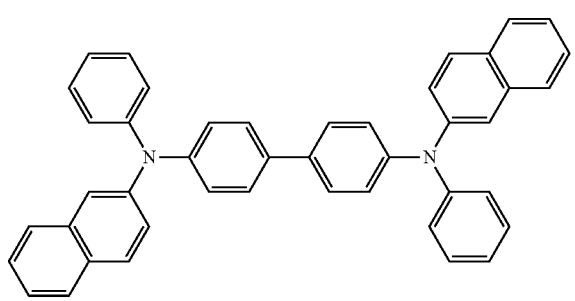
β-NPB

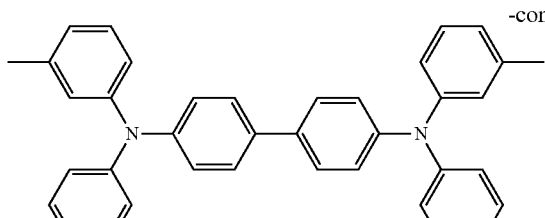
TPD

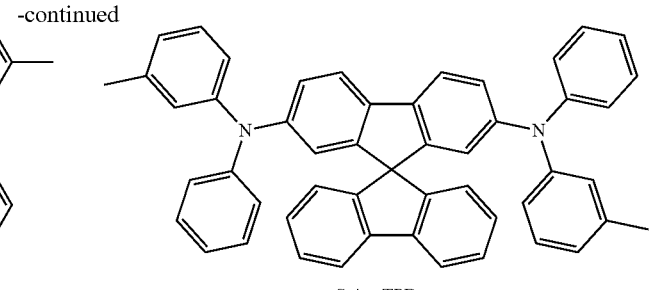
Spiro-TPD

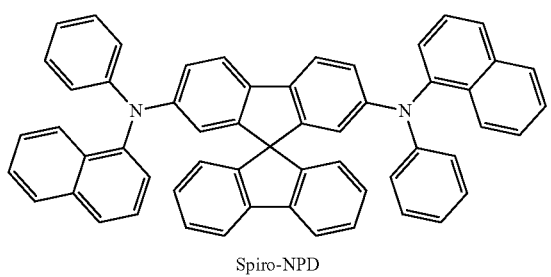
Spiro-NPD

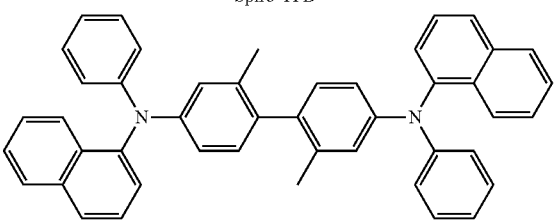
methylated NPB

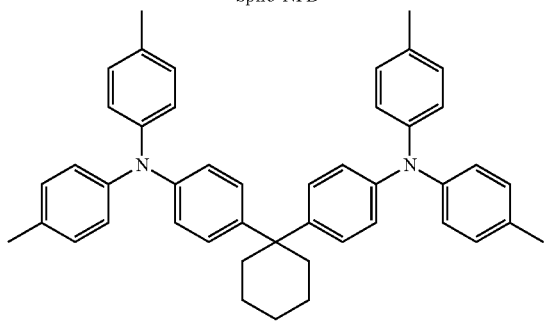
TAPC

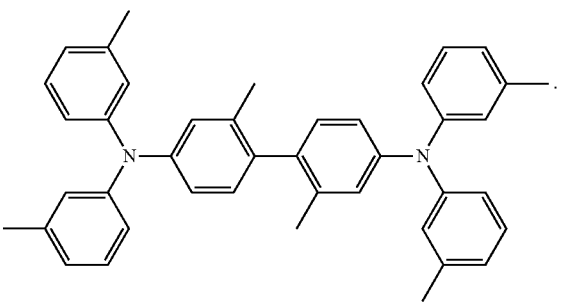
HMTPD

A thickness of the hole transport region may be in a range of about 50 Å to about 10,000 Å, for example, about 100 Å to about 4,000 Å. When the hole transport region includes a hole injection layer, a hole transport layer, or any combination thereof, a thickness of the hole injection layer may be in a range of about 100 Å to about 9,000 Å, for example, about 100 Å to about 1,000 Å, and a thickness of the hole transport layer may be in a range of about 50 Å to about 2,000 Å, for example, about 100 Å to about 1,500 Å. When the thicknesses of the hole transport region, the hole injection layer, and the hole transport layer are within these ranges, suitable or satisfactory hole transporting characteristics may be obtained without a substantial increase in driving voltage.

The emission auxiliary layer may increase light-emission efficiency by compensating for an optical resonance distance according to the wavelength of light emitted by an emission layer, and the electron blocking layer may block or reduce the flow of electrons from an electron transport region. The emission auxiliary layer and the electron blocking layer may include the materials as described above.

p-Dopant

The hole transport region may further include, in addition to these materials, a charge-generating material for the improvement of conductive properties (e.g., electrically conductive properties). The charge-generating material may be uniformly or non-uniformly dispersed in the hole transport region (for example, in the form of a single layer of a charge-generating material).

The charge-generating material may be, for example, a p-dopant.

In an embodiment, a lowest unoccupied molecular orbital (LUMO) energy level of the p-dopant may be −3.5 eV or less.

In an embodiment, the p-dopant may include a quinone derivative, a cyano group-containing compound, a compound containing element EL1 and element EL2, or any combination thereof.

Examples of the quinone derivative may include TCNQ and F4-TCNQ.

Examples of the cyano group-containing compound may include HAT-CN and a compound represented by Formula 221 below.

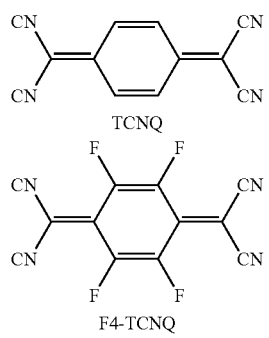
TCNQ

F4-TCNQ

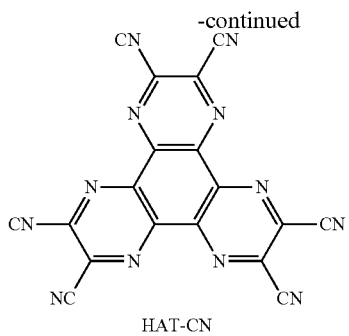

HAT-CN

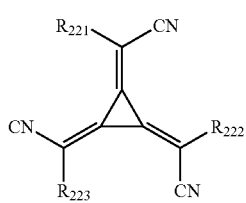

Formula 221

In Formula 221, $R_{221}$ to $R_{223}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, at least one of $R_{221}$ to $R_{223}$ may each independently be a $C_3$-$C_{60}$ carbocyclic group or a $C_1$-$C_{60}$ heterocyclic group, each substituted with: a cyano group; —F; —Cl; —Br; —I; a $C_1$-$C_{20}$ alkyl group substituted with a cyano group, —F, —Cl, —Br, —I, or any combination thereof; or any combination thereof.

Regarding the compound containing element EL1 and element EL2, element EL1 may be metal, metalloid, or a combination thereof, and element EL2 may be a non-metal, metalloid, or a combination thereof.

Examples of the metal may include: an alkali metal (for example, lithium (Li), sodium (Na), potassium (K), rubidium (Rb), cesium (Cs), and/or the like); an alkaline earth metal (for example, beryllium (Be), magnesium (Mg), calcium (Ca), strontium (Sr), barium (Ba), and/or the like); a transition metal (for example, titanium (Ti), zirconium (Zr), hafnium (Hf), vanadium (V), niobium (Nb), tantalum (Ta), chromium (Cr), molybdenum (Mo), tungsten (W), manganese (Mn), technetium (Tc), rhenium (Re), iron (Fe), ruthenium (Ru), osmium (Os), cobalt (Co), rhodium (Rh), iridium (Ir), nickel (Ni), palladium (Pd), platinum (Pt), copper (Cu), silver (Ag), gold (Au), and/or the like); a post-transition metal (for example, zinc (Zn), indium (In), tin (Sn), and/or the like); and a lanthanide metal (for example, lanthanum (La), cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), ytterbium (Yb), lutetium (Lu), and/or the like).

Examples of the metalloid may include silicon (Si), antimony (Sb), and tellurium (Te).

Examples of the non-metal may include oxygen (O) and halogen (for example, F, Cl, Br, I, etc.).

In an embodiment, examples of the compound containing element EL1 and element EL2 may include metal oxide, metal halide (for example, metal fluoride, metal chloride, metal bromide, and/or metal iodide), metalloid halide (for example, metalloid fluoride, metalloid chloride, metalloid bromide, and/or metalloid iodide), metal telluride, and any combination thereof.

Examples of the metal oxide may include tungsten oxide (for example, WO, $W_2O_3$, $WO_2$, $WO_3$, and/or $W_2O_5$), vanadium oxide (for example, VO, $V_2O_3$, $VO_2$, and/or $V_2O_5$), molybdenum oxide (MoO, $Mo_2O_3$, $MoO_2$, $MoO_3$, and/or $Mo_2O_5$), and rhenium oxide (for example, $ReO_3$).

Examples of the metal halide may include alkali metal halide, alkaline earth metal halide, transition metal halide, post-transition metal halide, and lanthanide metal halide.

Examples of the alkali metal halide may include LiF, NaF, KF, RbF, CsF, LiCl, NaCl, KCl, RbCl, CsCl, LiBr, NaBr, KBr, RbBr, CsBr, LiI, NaI, KI, RbI, and CsI.

Examples of the alkaline earth metal halide may include $BeF_2$, $MgF_2$, $CaF_2$, $SrF_2$, $BaF_2$, $BeCl_2$, $MgCl_2$, $CaCl_2$, $SrCl_2$, $BaCl_2$, $BeBr_2$, $MgBr_2$, $CaBr_2$, $SrBr_2$, $BaBr_2$, $BeI_2$, $MgI_2$, $CaI_2$, $SrI_2$, and $BaI_2$.

Examples of the transition metal halide may include titanium halide (for example, $TiF_4$, $TiCl_4$, $TiBr_4$, and/or $TiI_4$), zirconium halide (for example, $ZrF_4$, $ZrCl_4$, $ZrBr_4$, and/or $ZrI_4$), hafnium halide (for example, $HfF_4$, $HfCl_4$, $HfBr_4$, and/or $HfI_4$), vanadium halide (for example, $VF_3$, $VCl_3$, $VBr_3$, and/or $VI_3$), niobium halide (for example, $NbF_3$, $NbCl_3$, $NbBr_3$, and/or $NbI_3$), tantalum halide (for example, $TaF_3$, $TaCl_3$, $TaBr_3$, and/or $TaI_3$), chromium halide (for example, $CrF_3$, $CrCl_3$, $CrBr_3$, and/or $CrI_3$), molybdenum halide (for example, $MoF_3$, $MoCl_3$, $MoBr_3$, and/or $MoI_3$), tungsten halide (for example, $WF_3$, $WCl_3$, $WBr_3$, and/or $WI_3$), manganese halide (for example, $MnF_2$, $MnCl_2$, $MnBr_2$, and/or $MnI_2$), technetium halide (for example, $TcF_2$, $TcCl_2$, $TcBr_2$, and/or $TcI_2$), rhenium halide (for example, $ReF_2$, $ReCl_2$, $ReBr_2$, and/or $ReI_2$), iron halide (for example, $FeF_2$, $FeCl_2$, $FeBr_2$, and/or $FeI_2$), ruthenium halide (for example, $RuF_2$, $RuCl_2$, $RuBr_2$, and/or $RuI_2$), osmium halide (for example, $OsF_2$, $OsCl_2$, $OsBr_2$, and/or $OsI_2$), cobalt halide (for example, $CoF_2$, $CoCl_2$, $CoBr_2$, and/or $CoI_2$), rhodium halide (for example, $RhF_2$, $RhCl_2$, $RhBr_2$, and/or $RhI_2$), iridium halide (for example, $IrF_2$, $IrCl_2$, $IrBr_2$, and/or $IrI_2$), nickel halide (for example, $NiF_2$, $NiCl_2$, $NiBr_2$, and/or $NiI_2$), palladium halide (for example, $PdF_2$, $PdCl_2$, $PdBr_2$, and/or $PdI_2$), platinum halide (for example, $PtF_2$, $PtCl_2$, $PtBr_2$, and/or $PtI_2$), copper halide (for example, CuF, CuCl, CuBr, and/or CuI), silver halide (for example, AgF, AgCl, AgBr, and/or AgI), and gold halide (for example, AuF, AuCl, AuBr, and/or AuI).

Examples of the post-transition metal halide may include zinc halide (for example, $ZnF_2$, $ZnCl_2$, $ZnBr_2$, and/or $ZnI_2$), indium halide (for example, $InI_3$), and tin halide (for example, $SnI_2$).

Examples of the lanthanide metal halide may include YbF, $YbF_2$, $YbF_3$, $SmF_3$, YbCl, $YbCl_2$, $YbCl_3$ $SmCl_3$, YbBr, $YbBr_2$, $YbBr_3$ $SmBr_3$, YbI, $YbI_2$, $YbI_3$, and $SmI_3$.

Examples of the metalloid halide may include antimony halide (for example, $SbCl_5$).

Examples of the metal telluride may include an alkali metal telluride (for example, $Li_2Te$, $Na_2Te$, $K_2Te$, $Rb_2Te$, and/or $Cs_2Te$), alkaline earth metal telluride (for example, BeTe, MgTe, CaTe, SrTe, and/or BaTe), transition metal telluride (for example, $TiTe_2$, $ZrTe_2$, $HfTe_2$, $V_2Te_3$, $Nb_2Te_3$, $Ta_2Te_3$, $Cr_2Te_3$, $Mo_2Te_3$, $W_2Te_3$, MnTe, TcTe, ReTe, FeTe, RuTe, OsTe, CoTe, RhTe, IrTe, NiTe, PdTe, PtTe, $Cu_2Te$, CuTe, $Ag_2Te$, AgTe, and/or $Au_2Te$), post-transition metal telluride (for example, and/or ZnTe), and lanthanide metal telluride (for example, LaTe, CeTe, PrTe, NdTe, PmTe, EuTe, GdTe, TbTe, DyTe, HoTe, ErTe, TmTe, YbTe, and/or LuTe).

Emission Layer in Interlayer 130

When the light-emitting device 10 is a full-color light-emitting device, the emission layer may be patterned into a red emission layer, a green emission layer, and/or a blue emission layer, according to a sub-pixel. In one or more embodiments, the emission layer may have a stacked structure of two or more layers of a red emission layer, a green emission layer, and a blue emission layer, in which the two or more layers contact (e.g., physically contact) each other or are separated from each other to emit white light. In one or more embodiments, the emission layer may include two or more materials of a red light-emitting material, a green light-emitting material, and a blue light-emitting material, in which the two or more materials are mixed with each other in a single layer to emit white light.

The emission layer may include a host and a dopant. The dopant may include a phosphorescent dopant, a fluorescent dopant, or any combination thereof.

An amount of the dopant in the emission layer may be from about 0.01 to about 15 parts by weight based on 100 parts by weight of the host.

In one or more embodiments, the emission layer may include a quantum dot.

In an embodiment, the emission layer may include a delayed fluorescence material. The delayed fluorescence material may act as a host or a dopant in the emission layer.

A thickness of the emission layer may be in the range of about 100 Å to about 1,000 Å, for example, about 200 Å to about 600 Å. When the thickness of the emission layer is within this range, excellent luminescence characteristics may be obtained without a substantial increase in driving voltage.

Host

The host may include a compound represented by Formula 301 below:

$$[Ar_{301}]_{xb11}\text{-}[(L_{301})_{xb1}\text{-}R_{301}]_{xb21}. \quad \text{Formula 301}$$

In Formula 301,

Ar$_{301}$ and L$_{301}$ may each independently be a C$_3$-C$_{60}$ carbocyclic group unsubstituted or substituted with at least one R$_{10a}$ or a C$_1$-C$_{60}$ heterocyclic group unsubstituted or substituted with at least one R$_{10a}$, xb11 may be 1, 2, or 3, xb1 may be an integer from 0 to 5, R$_{301}$ may be hydrogen, deuterium, —F, —Cl, —Br, —I, a hydroxyl group, a cyano group, a nitro group, a C$_1$-C$_{60}$ alkyl group unsubstituted or substituted with at least one R$_{10a}$, a C$_2$-C$_{60}$ alkenyl group unsubstituted or substituted with at least one R$_{10a}$, a C$_2$-C$_{60}$ alkynyl group unsubstituted or substituted with at least one R$_{10a}$, a C$_1$-C$_{60}$ alkoxy group unsubstituted or substituted with at least one R$_{10a}$, a C$_3$-C$_{60}$ carbocyclic group unsubstituted or substituted with at least one R$_{10a}$, a C$_1$-C$_{60}$ heterocyclic group unsubstituted or substituted with at least one R$_{10a}$, —Si(Q$_{301}$)(Q$_{302}$)(Q$_{303}$), —N(Q$_{301}$)(Q$_{302}$), —B(Q$_{301}$)(Q$_{302}$), —C(=O)(Q$_{301}$), —S(=O)$_2$(Q$_{301}$), or —P(=O)(Q$_{301}$)(Q$_{302}$), xb21 may be an integer from 1 to 5, and Q$_{301}$ to Q$_{303}$ are the same as described in connection with Q$_1$.

In an embodiment, when xb11 in Formula 301 is 2 or more, two or more of Ar$_{301}$(s) may be linked to each other via a single bond.

In an embodiment, the host may include a compound represented by Formula 301-1, a compound represented by Formula 301-2, or any combination embodiment:

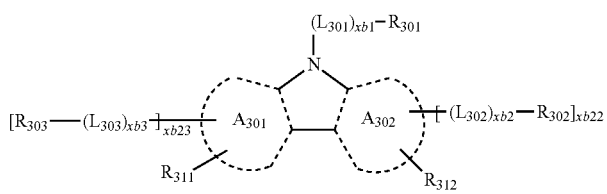

Formula 301-1

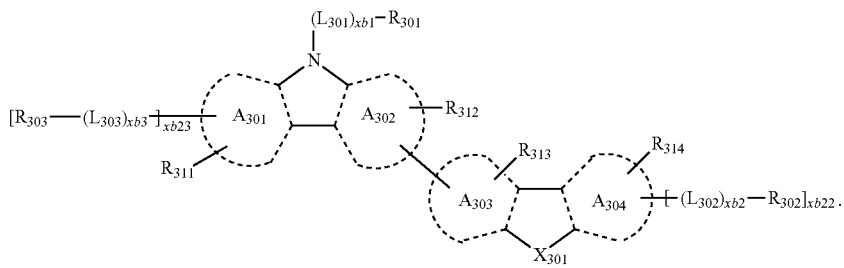

Formula 301-2

In Formulae 301-1 and 301-2, ring A$_{301}$ to ring A$_{304}$ may each independently be a C$_3$-C$_{60}$ carbocyclic group unsubstituted or substituted with at least one R$_{10a}$ or a C$_1$-C$_{60}$ heterocyclic group unsubstituted or substituted with at least one R$_{10a}$, X$_{301}$ may be O, S, N-[(L$_{304}$)$_{xb4}$-R$_{304}$], C(R$_{304}$)(R$_{305}$), or Si(R$_{304}$)(R$_{305}$), xb22 and xb23 may each independently be 0, 1, or 2, L$_{301}$, xb1, and R$_{301}$ are the same as described elsewhere in the present specification, L$_{302}$ to L$_{304}$ are each independently the same as described in connection with L$_{301}$, xb2 to xb4 are each independently the same as described in connection with xb1, and R$_{302}$ to R$_{305}$ and R$_{311}$ to R$_{314}$ are the same as described in connection with R$_{301}$.

In an embodiment, the host may include an alkaline earth-metal complex. In an embodiment, the host may include a Be complex (for example, Compound H55), a Mg complex, a Zn complex, or any combination thereof.

In an embodiment, the host may include one of Compounds H1 to H124, 9,10-di(2-naphthyl)anthracene (ADN), 2-methyl-9,10-bis(naphthalen-2-yl)anthracene (MADN), 9,10-di-(2-naphthyl)-2-t-butyl-anthracene (TBADN), 4,4'-bis(N-carbazolyl)-1,1'-biphenyl (CBP), 1,3-di-9-carbazolyl-benzene (mCP), 1,3,5-tri(carbazol-9-yl)benzene (TCP), or any combination thereof:

H1
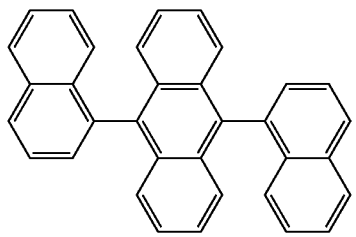

H2
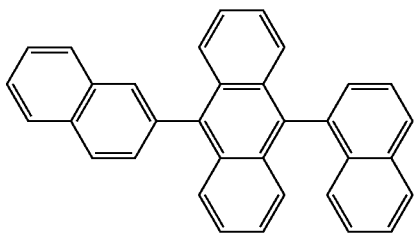

H3
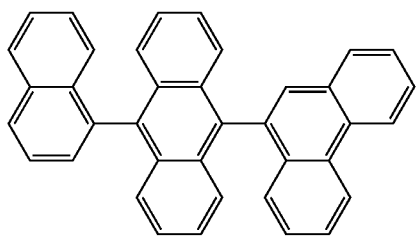

H4
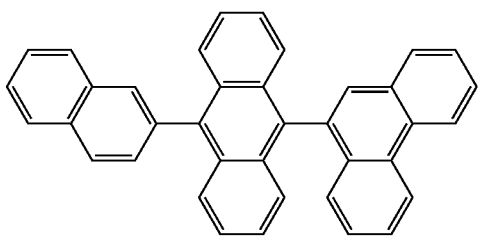

H5
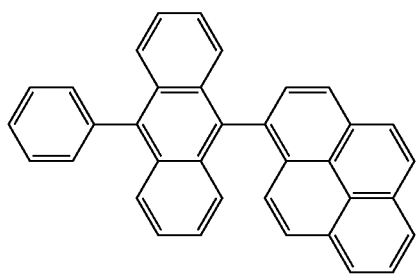

H6
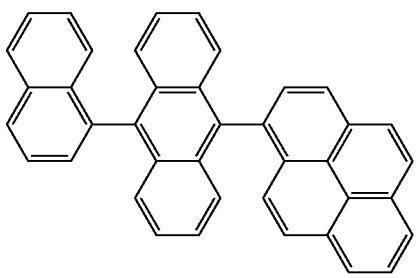

H7
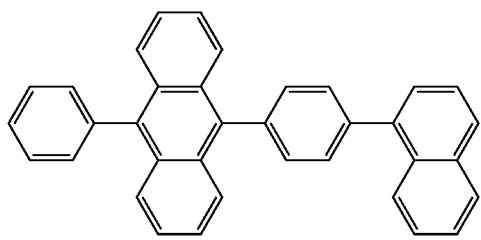

H8
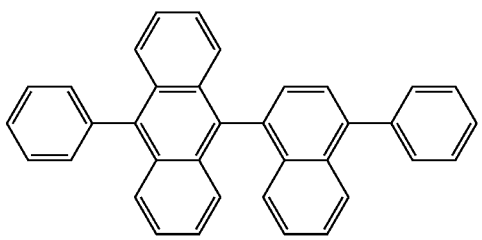

H9
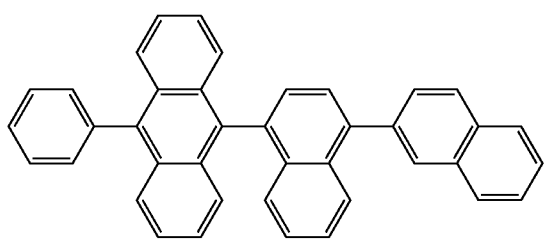

H10
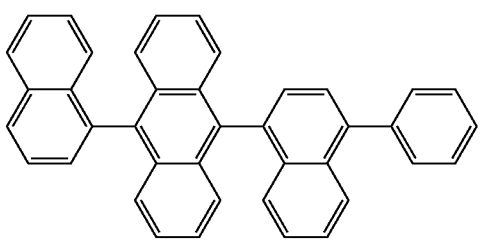

-continued
H11
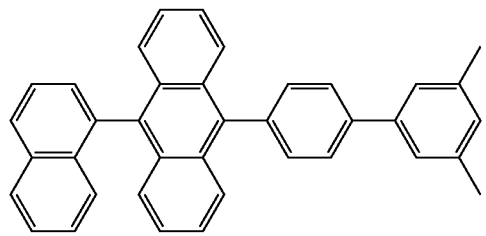
H12
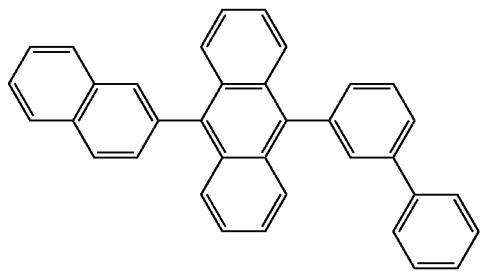
H13
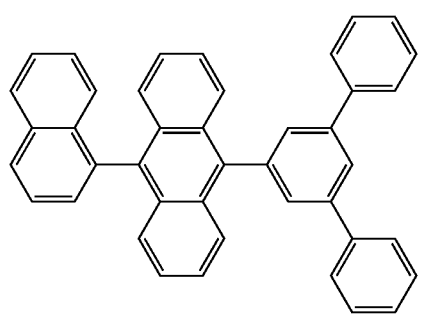
H14
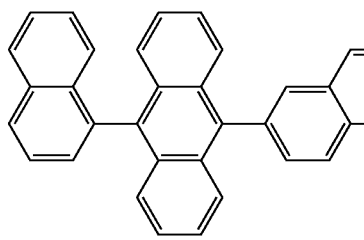
H15
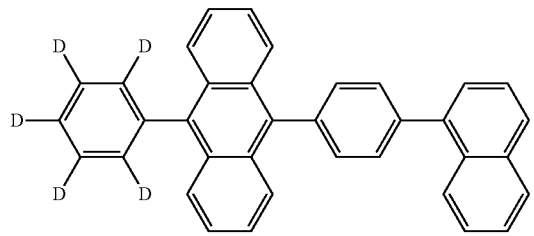
H16
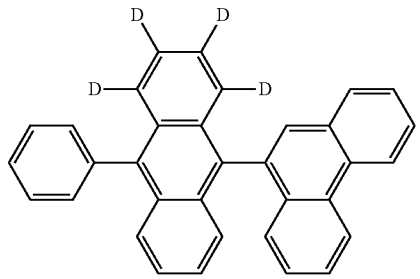
H17
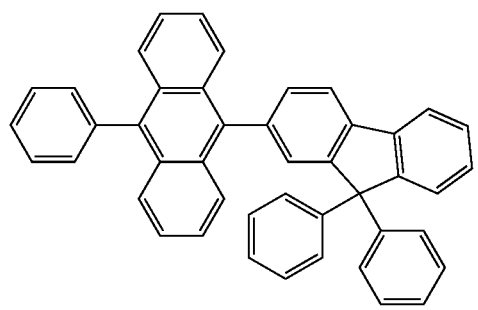
H18
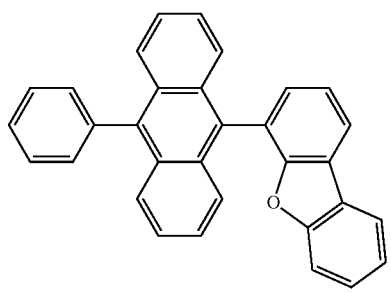
H19
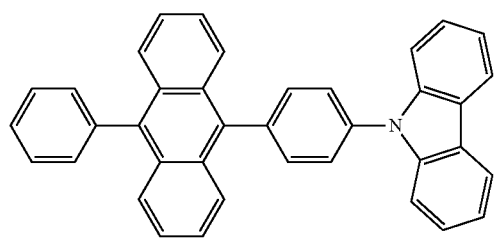
H20
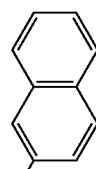

-continued
H21
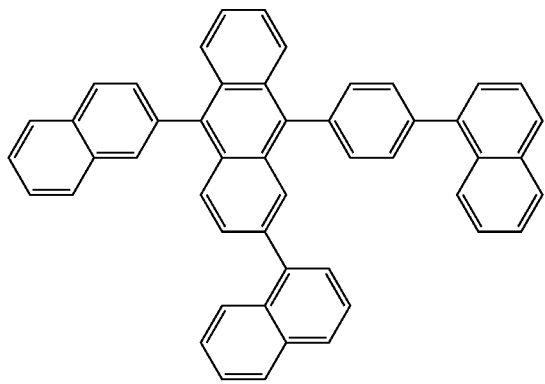
H22
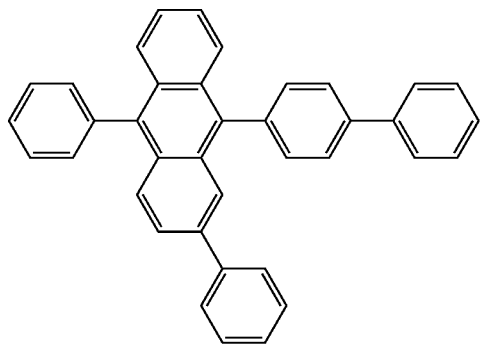
H23
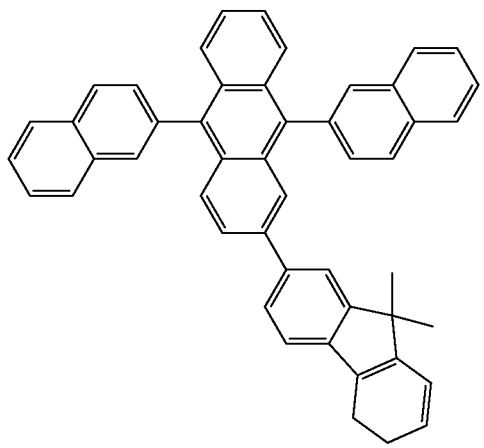
H24
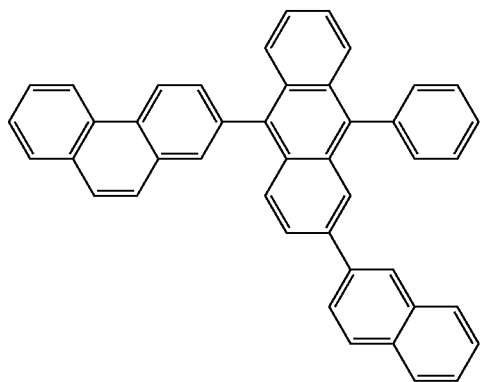
H25
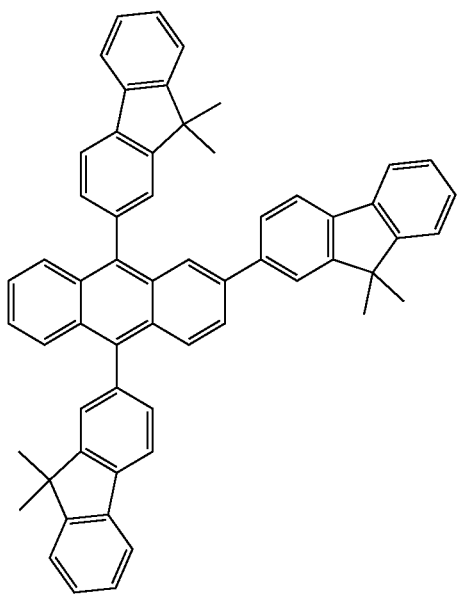
H26
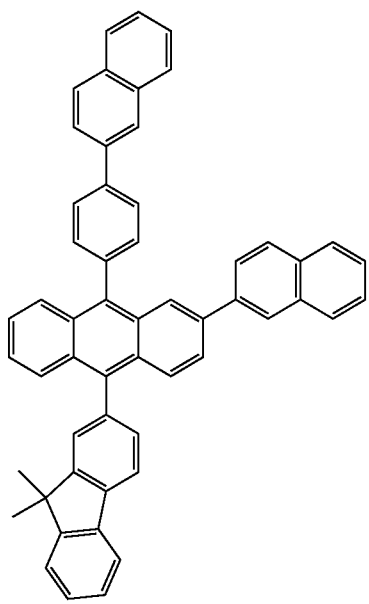

-continued
H27
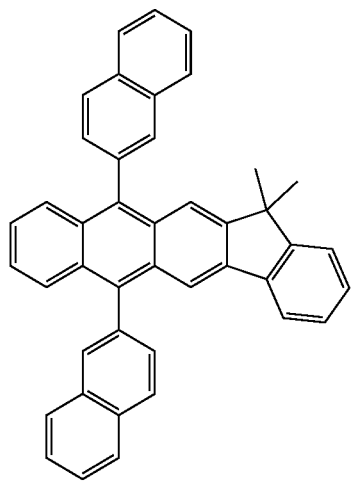
H28
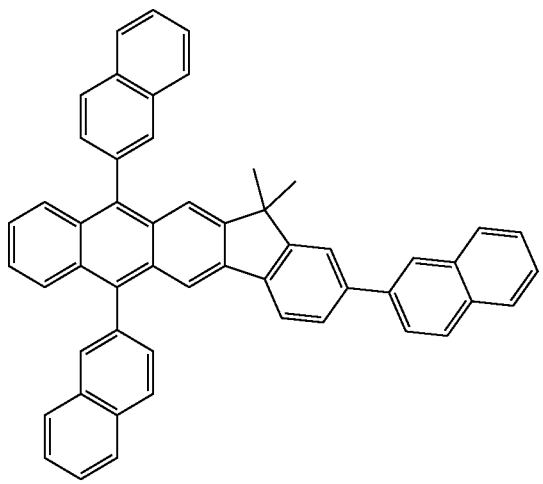
H29
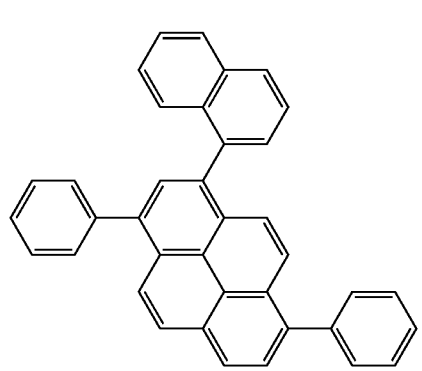
H30
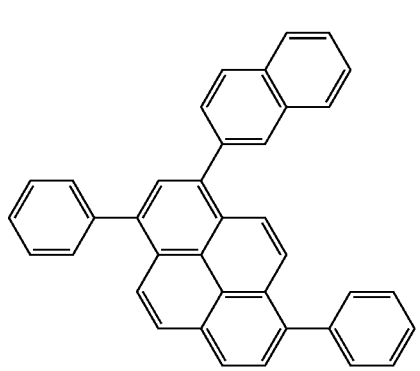
H31
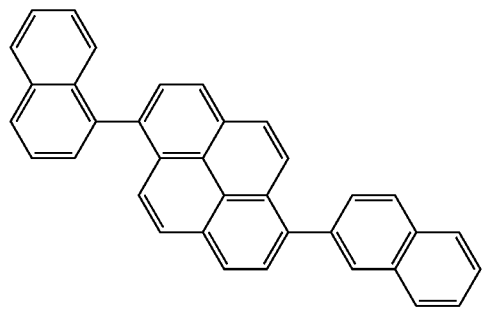
H32
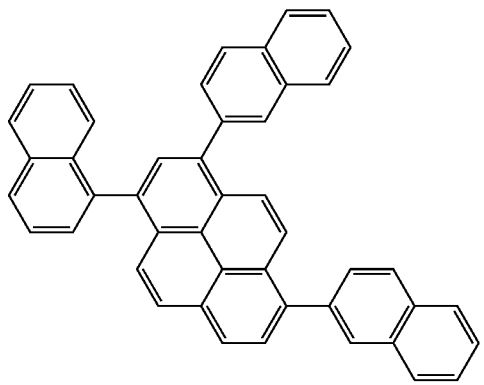
H33
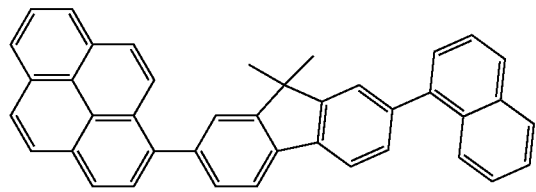
H34
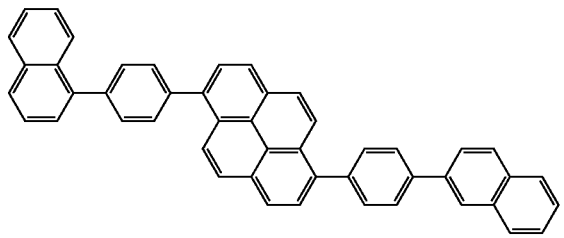

-continued
H35
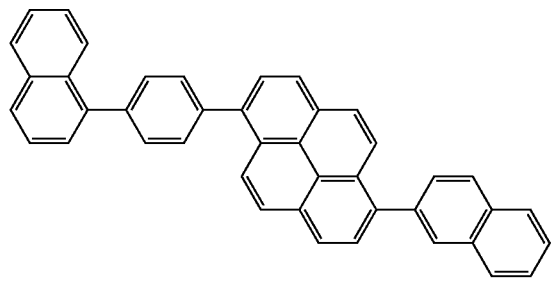
H36
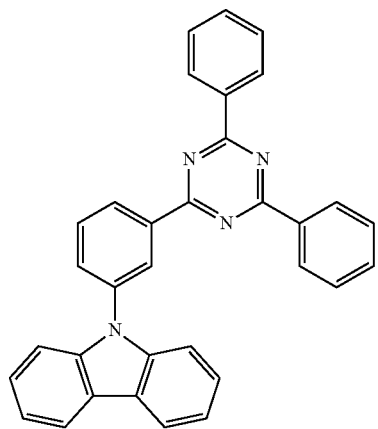
H37
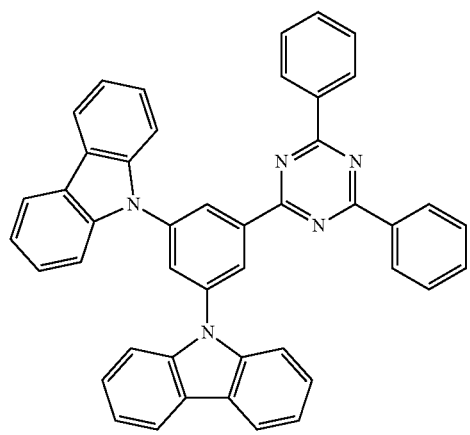
H38
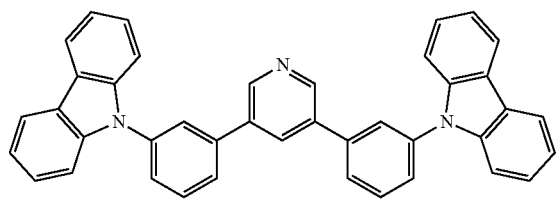
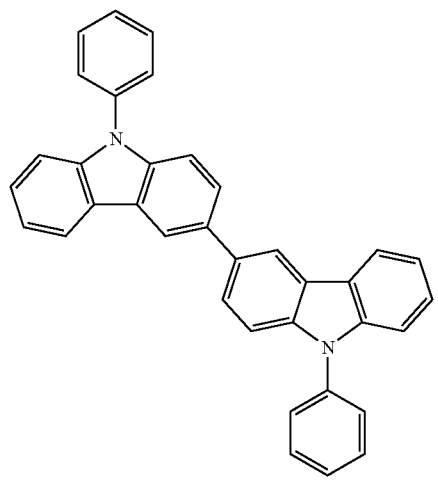
H39
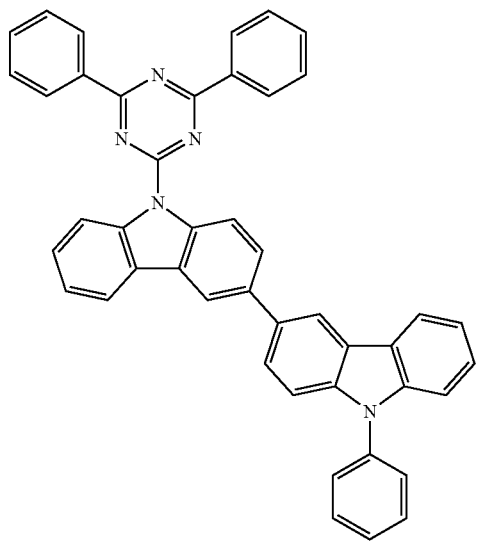
H40

-continued
| | |
|---|---|
| H41 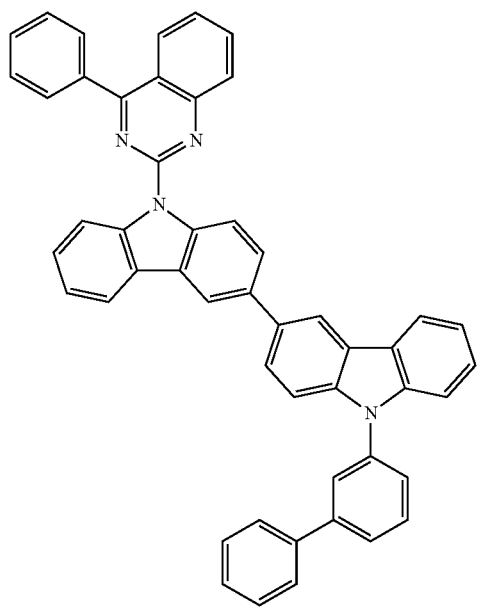 | H42 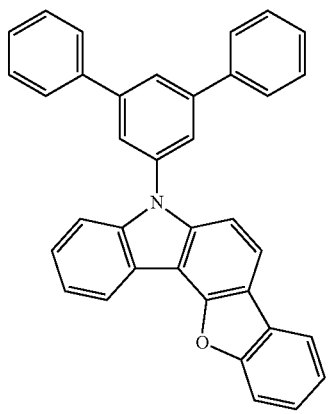 |
| H43 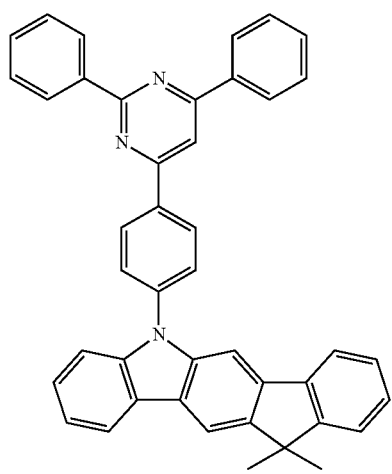 | H44 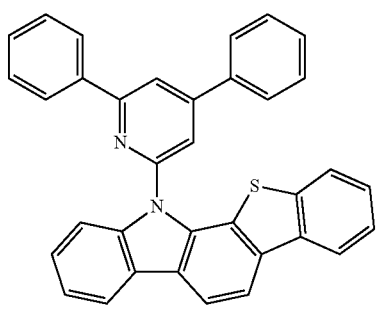 |
| H45 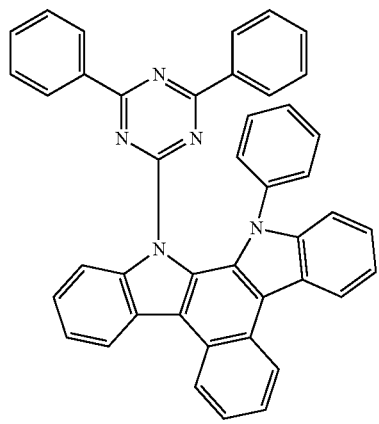 | H46 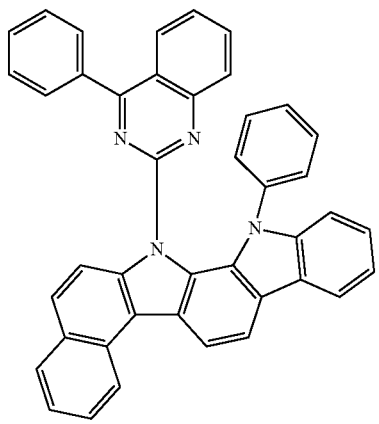 |

-continued
H47
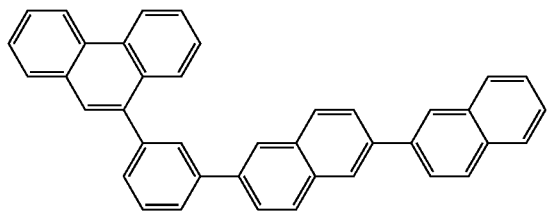
H48
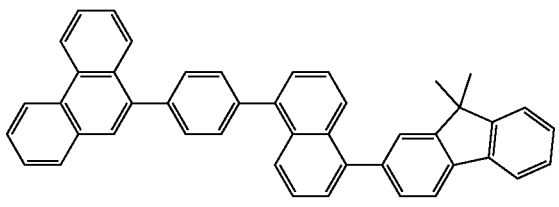
H49
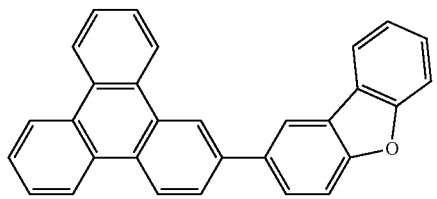
H50
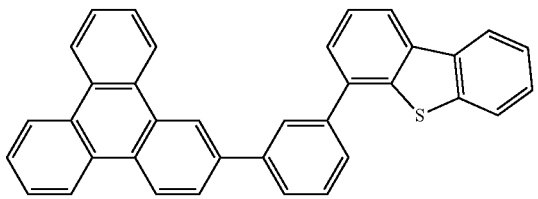
H51
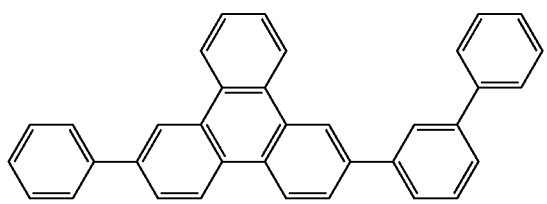
H52
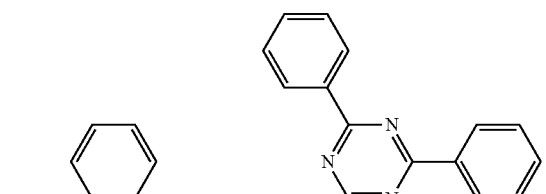
H53
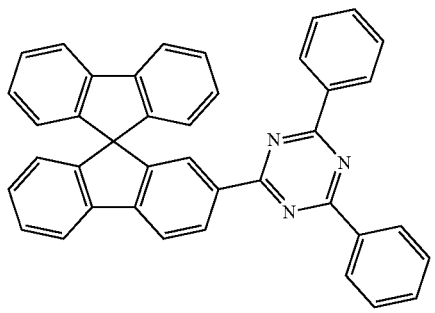
H54
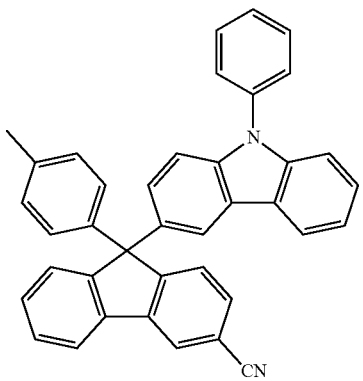
H55
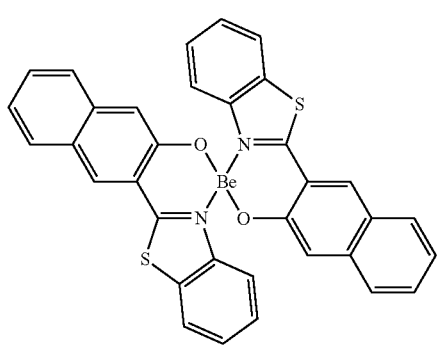
H56
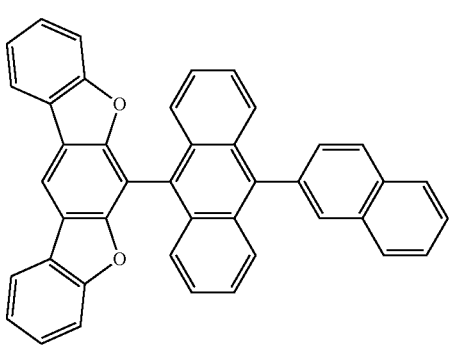

-continued
H57
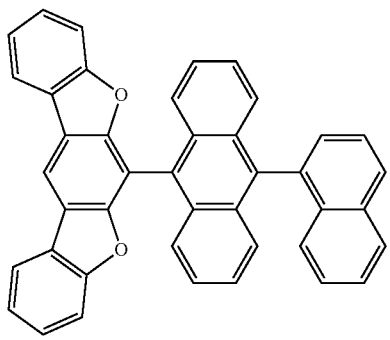
H58
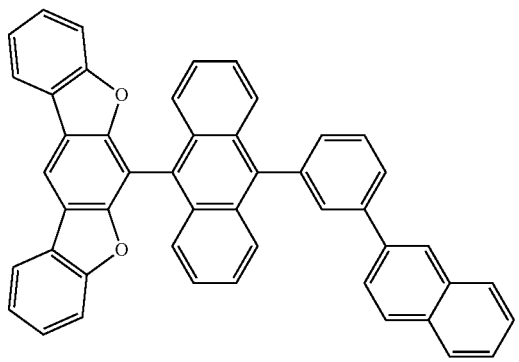
H59
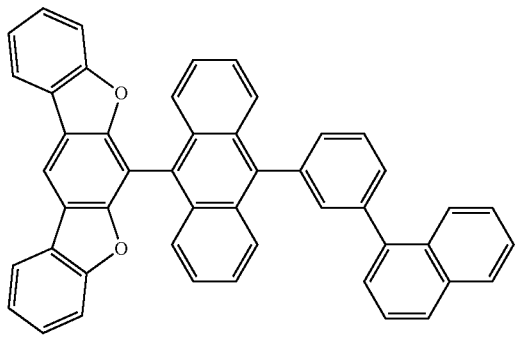
H60
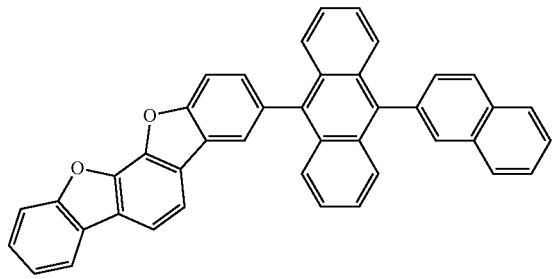
H61
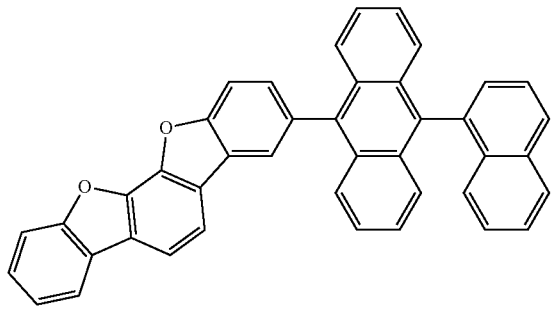
H62
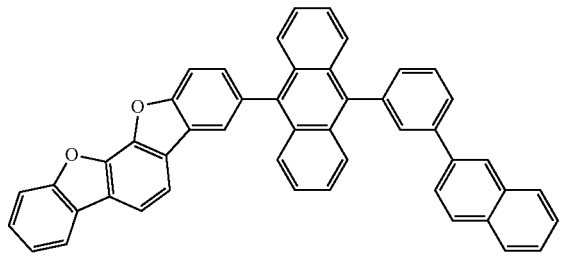
H63
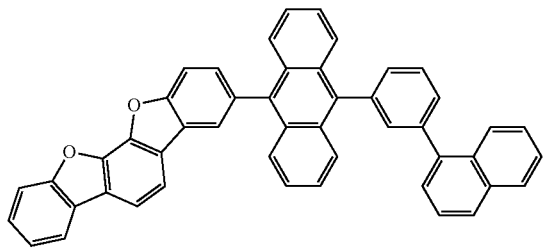
H64
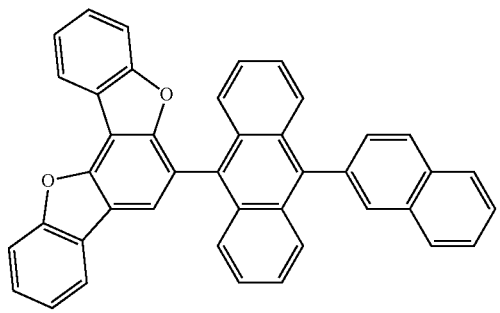

-continued
H65
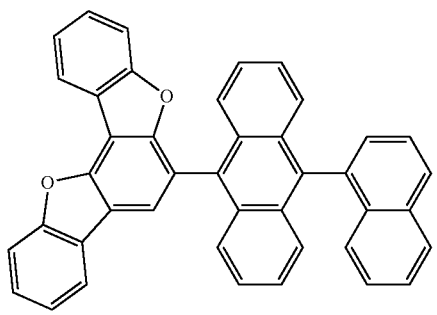
H66
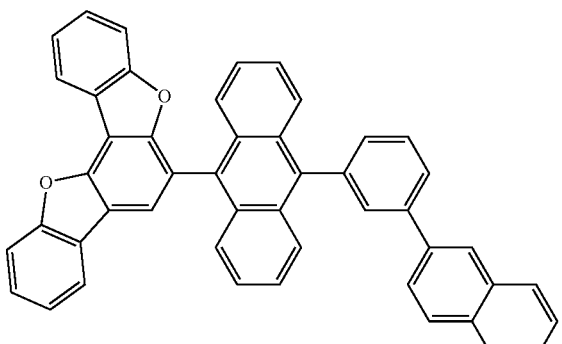
H67
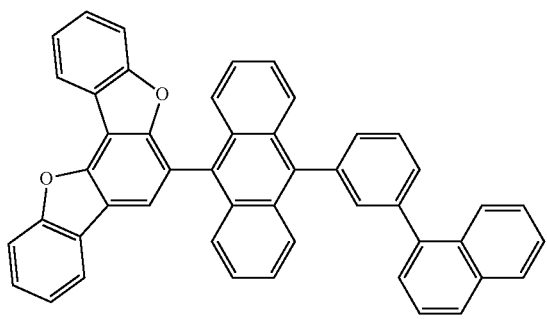
H68
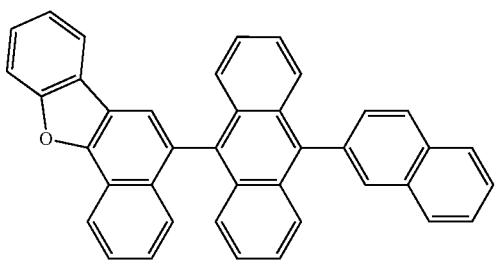
H69
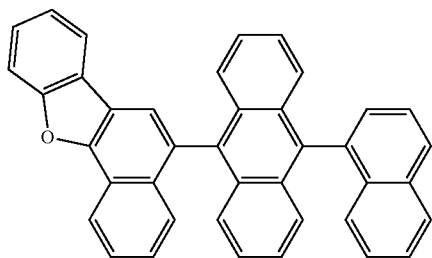
H70
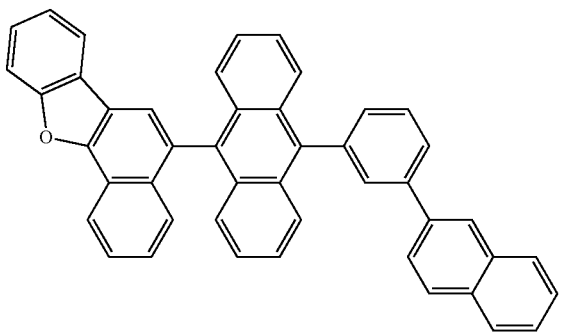
H71
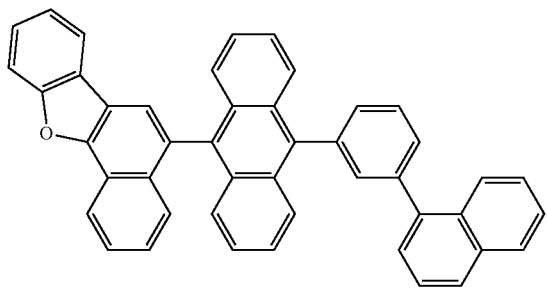
H72
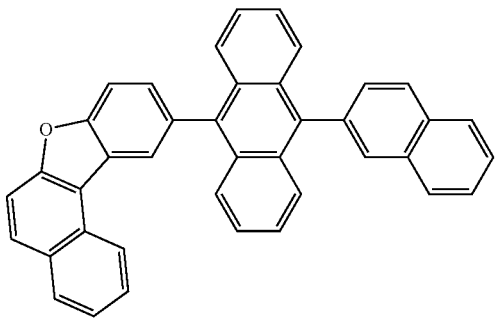

-continued
H73
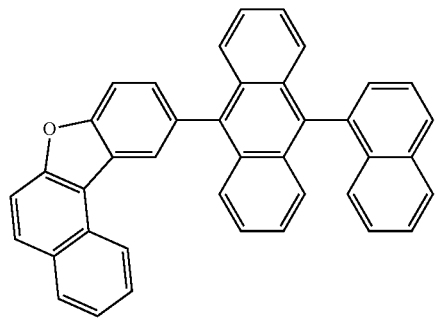
H74
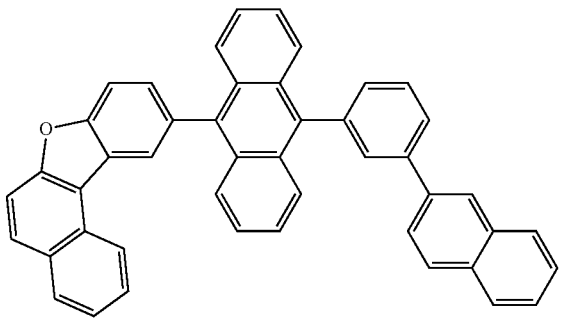
H75
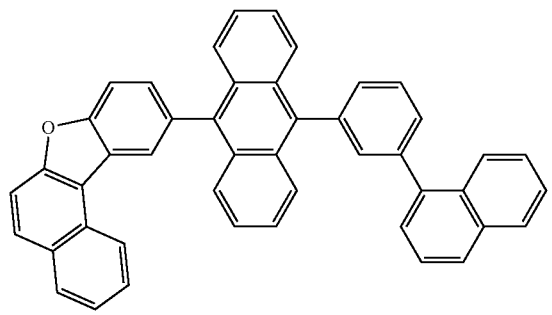
H76
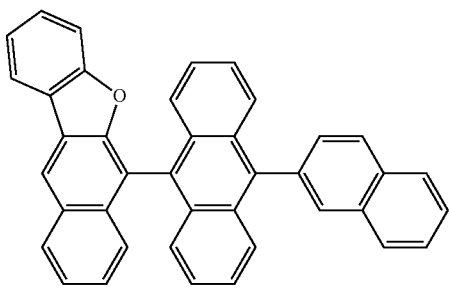
H77
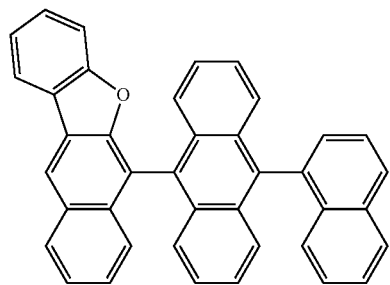
H78
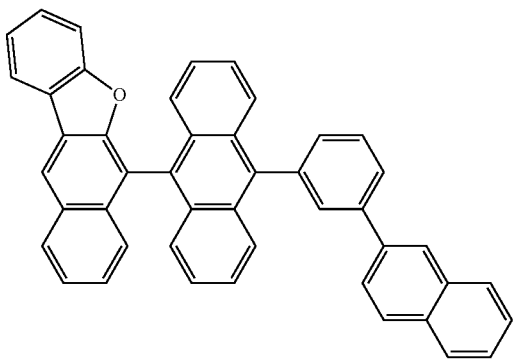
H79
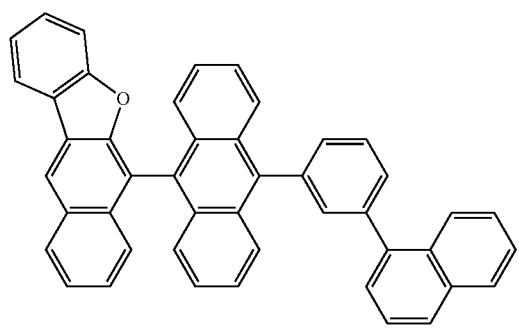
H80
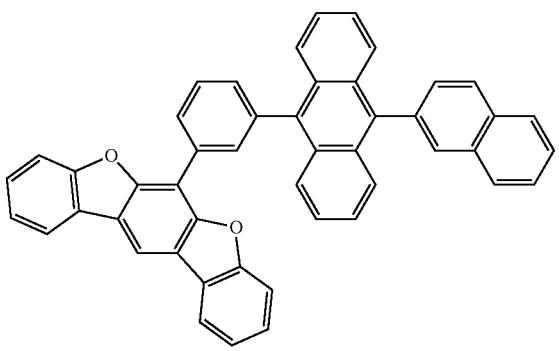

-continued
H81
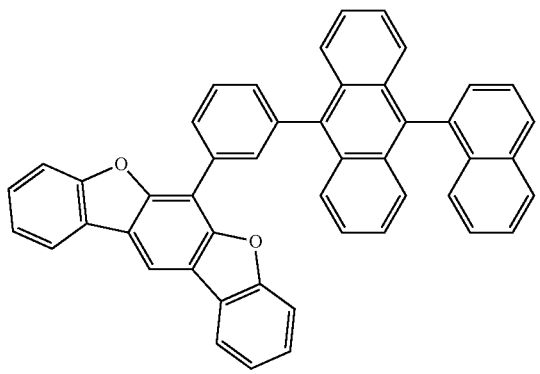
H82
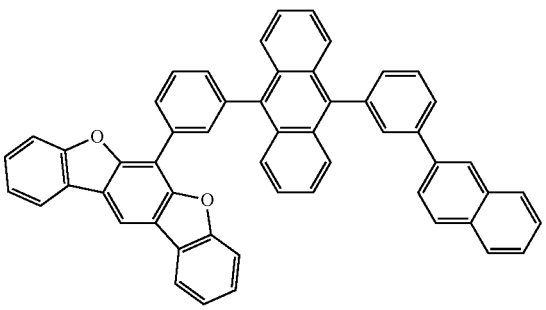
H83
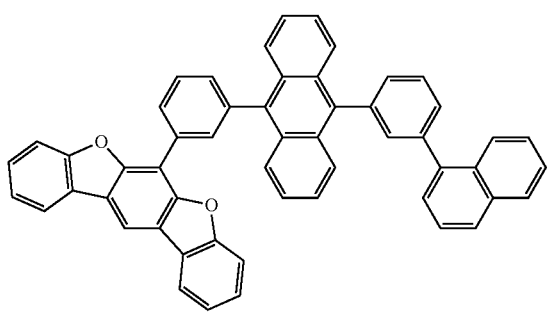
H84
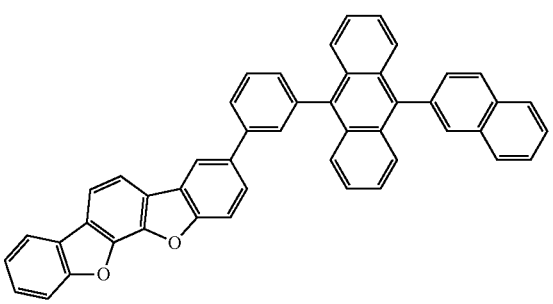
H85
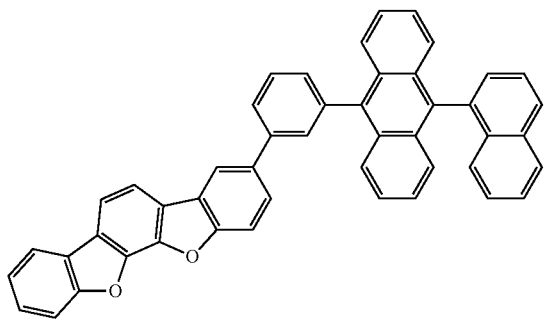
H86
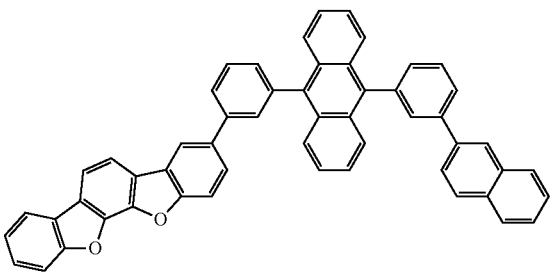
H87
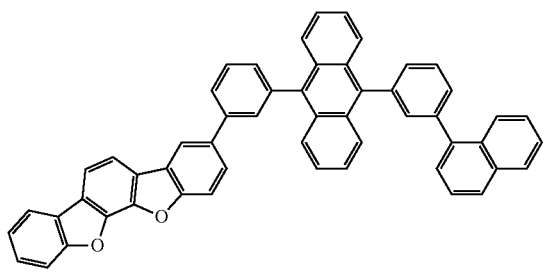
H88
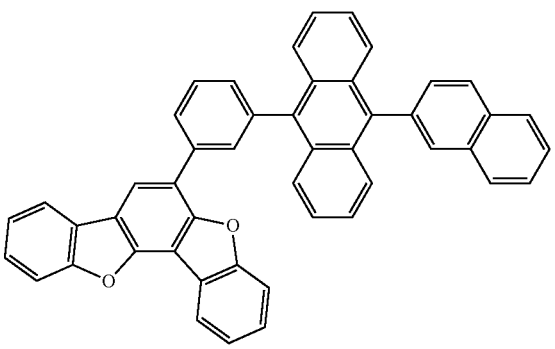

-continued
H89
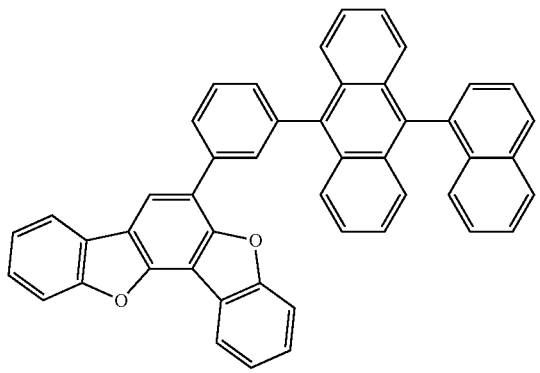
H90
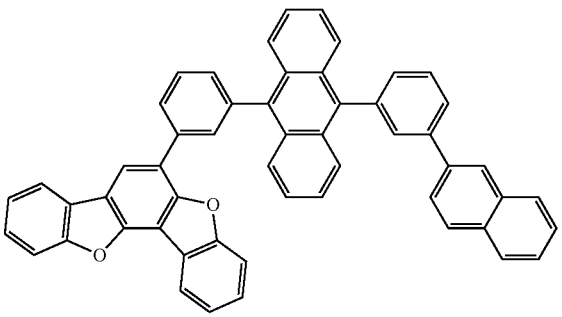
H91
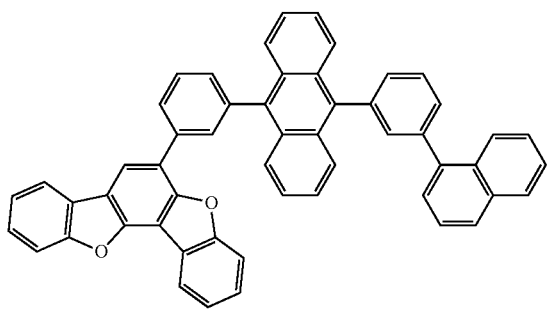
H92
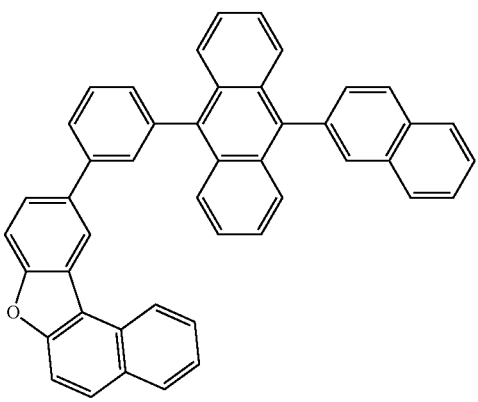
H93
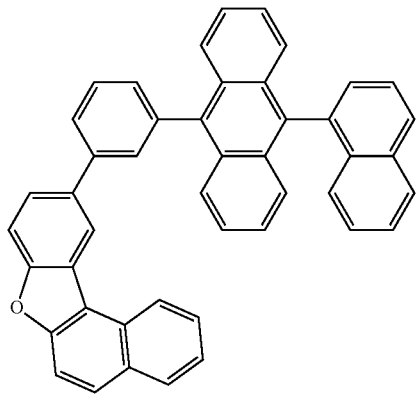
H94
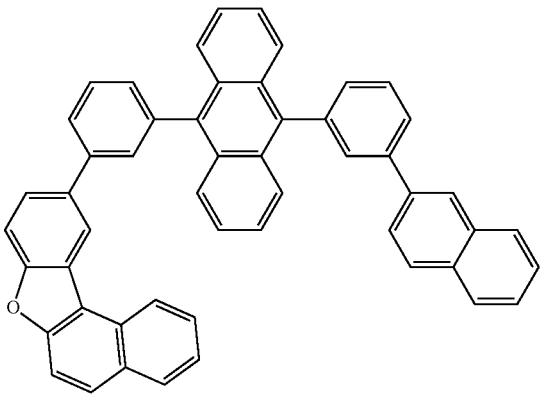
H95
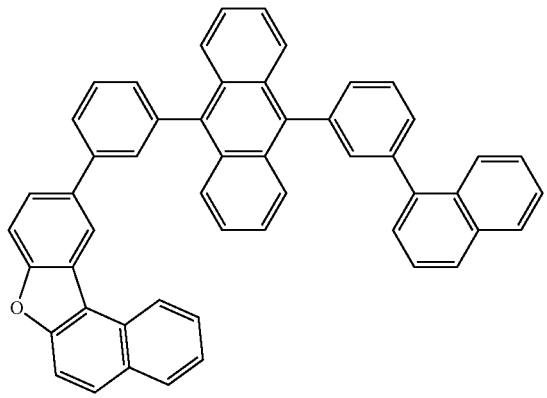
H96
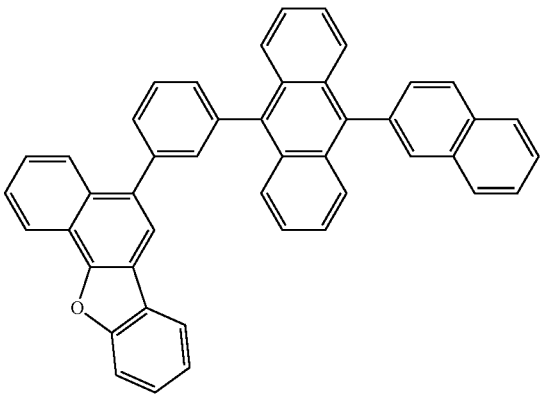

-continued
H97
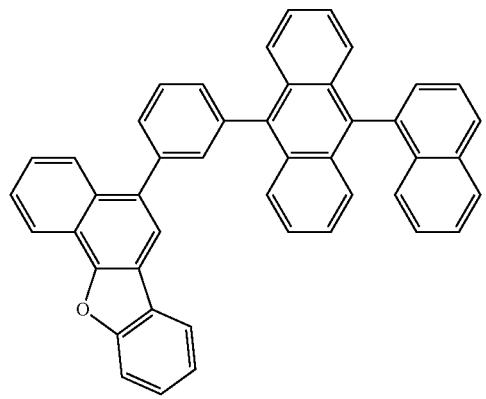
H98
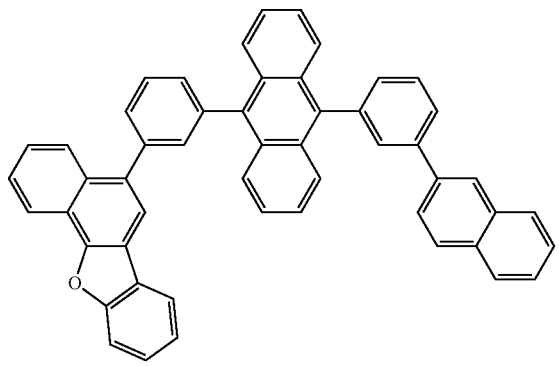
H99
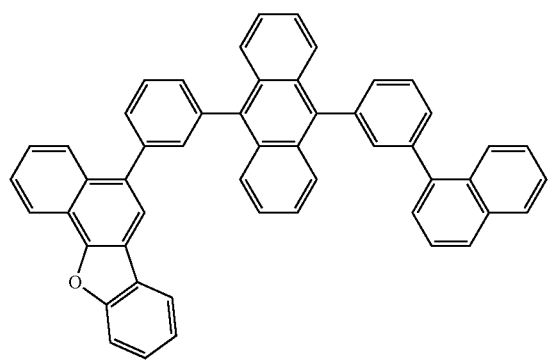
H100
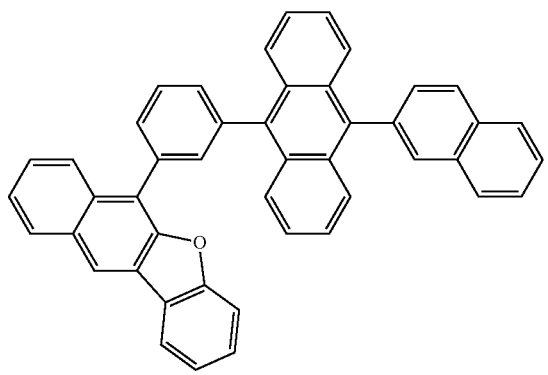
H101
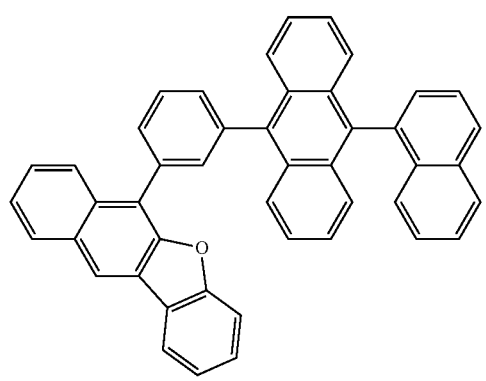
H102
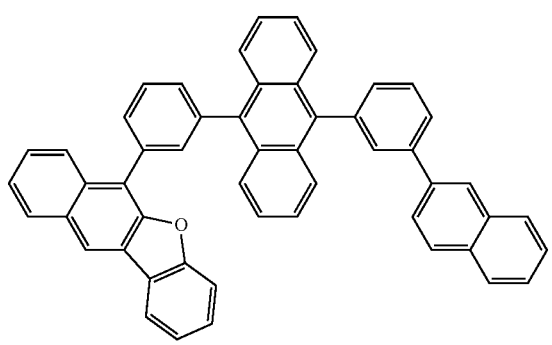

-continued
H103
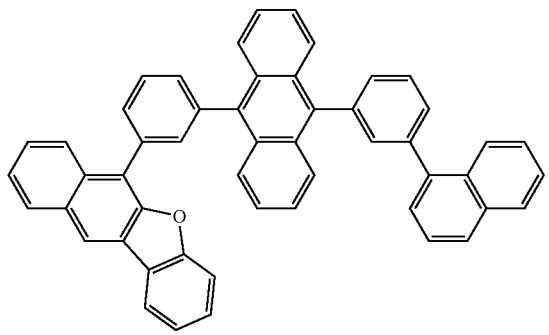
H104
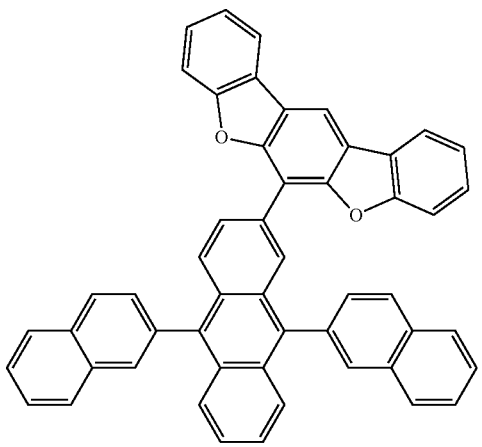
H105
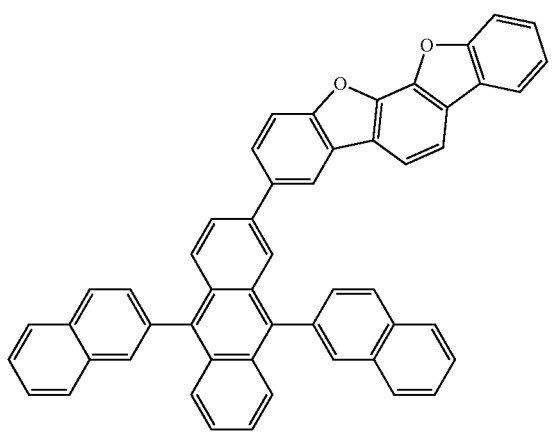
H106
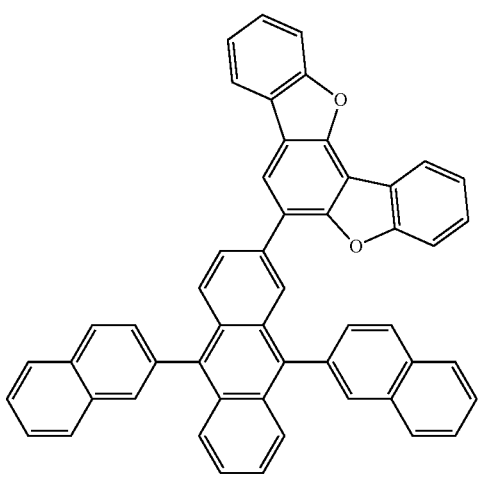
H107
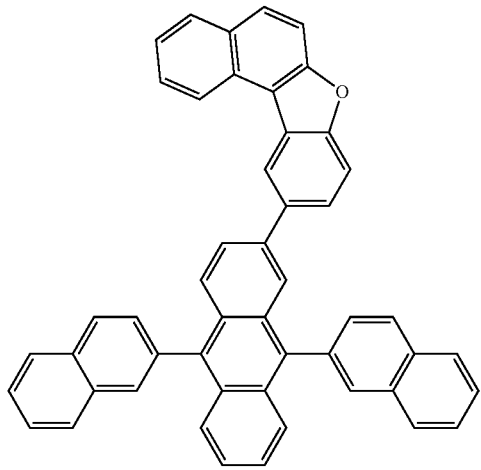
H108
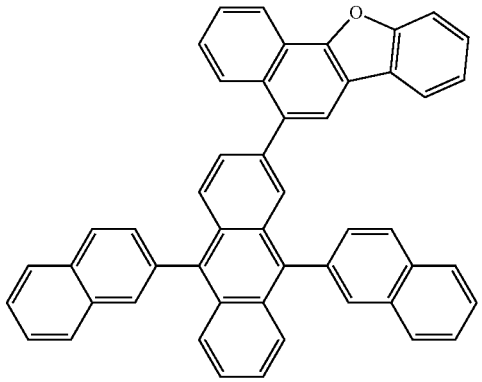

-continued
H109
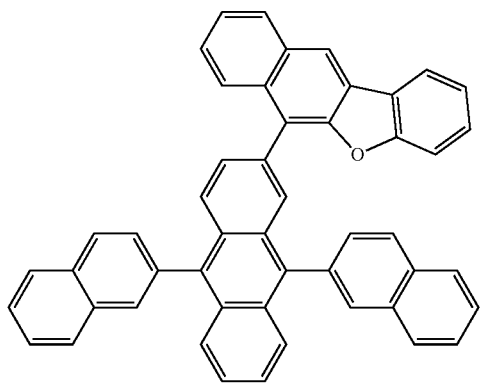
H110
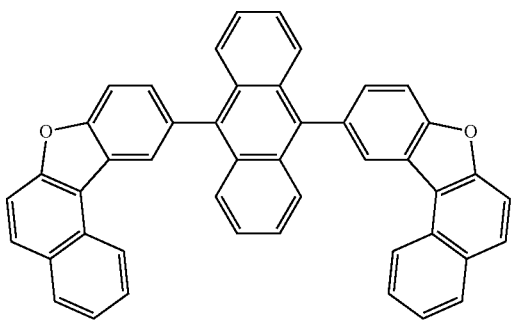
H111
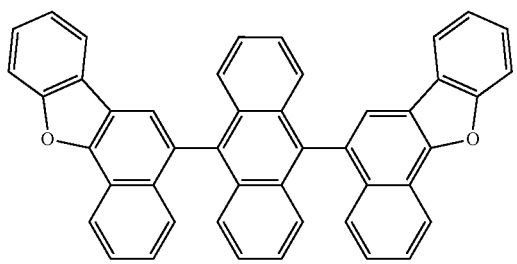
H112
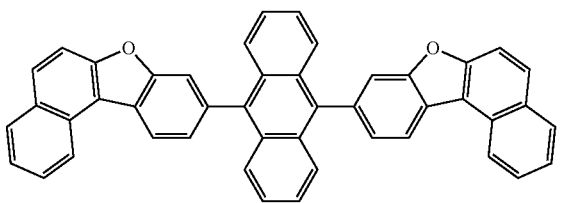
H113
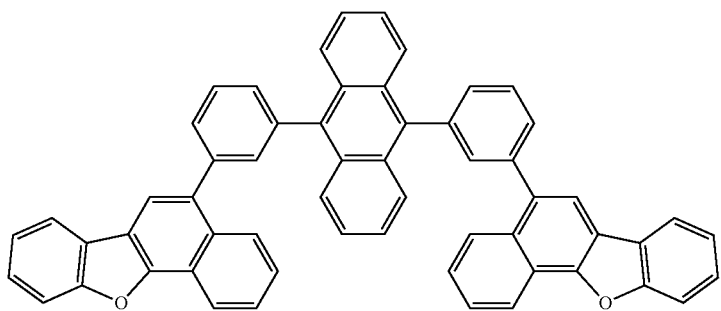
H114
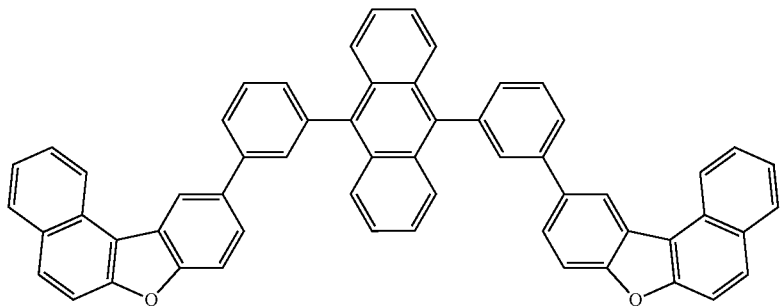

-continued
H115
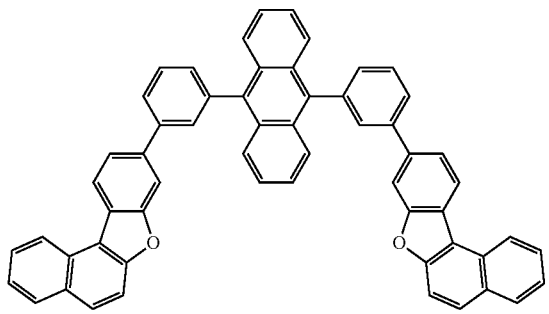
H116
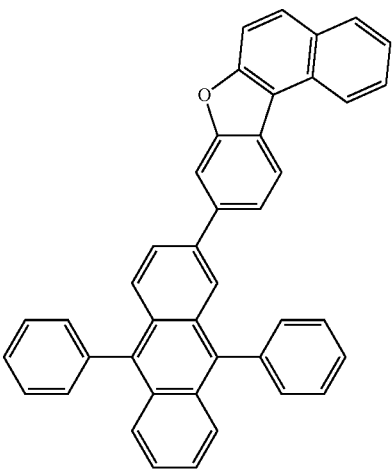
H117
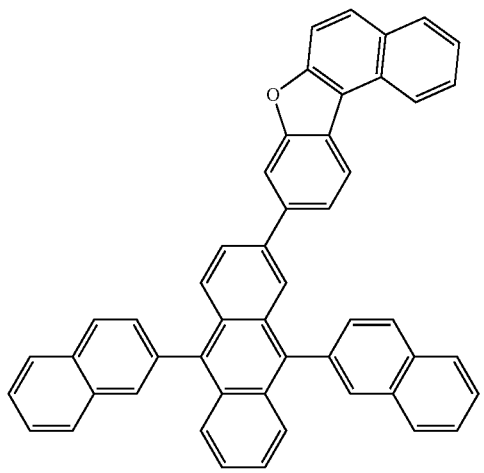
H118
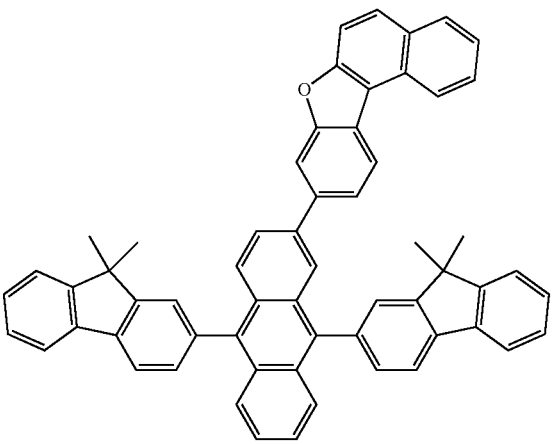
H119
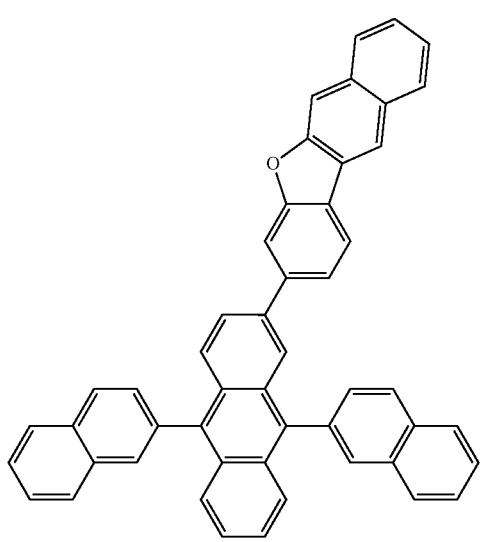
H120
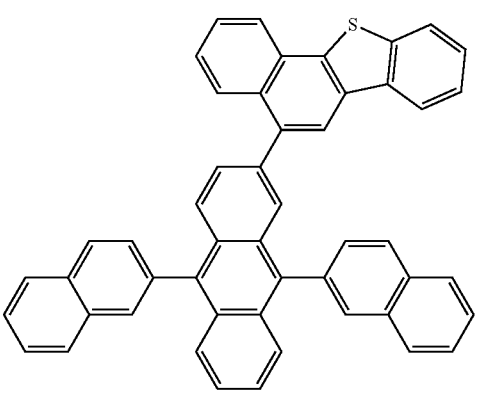

H121
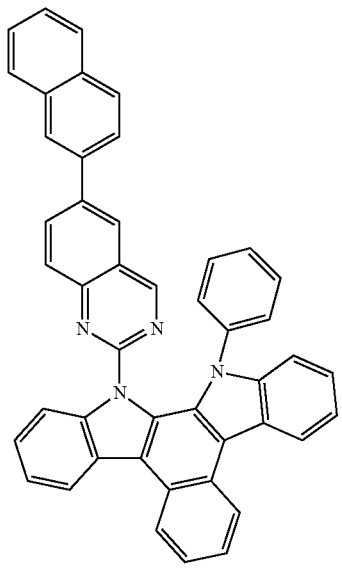

H122
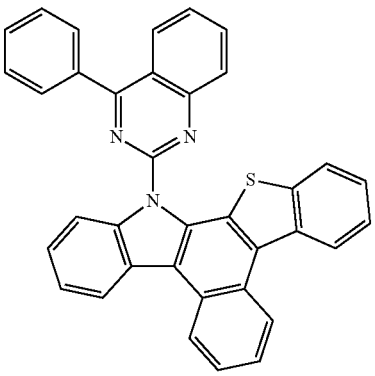

H123
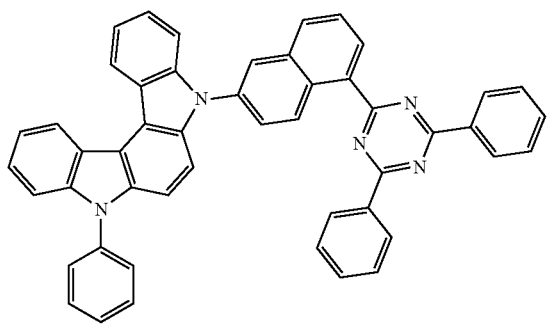

H124
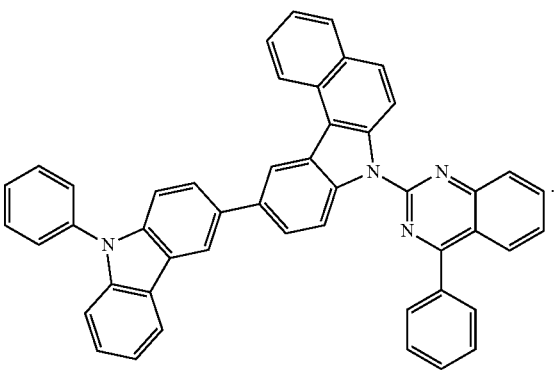

Phosphorescent Dopant

The phosphorescent dopant may include at least one transition metal as a central metal.

The phosphorescent dopant may include a monodentate ligand, a bidentate ligand, a tridentate ligand, a tetradentate ligand, a pentadentate ligand, a hexadentate ligand, or any combination thereof.

The phosphorescent dopant may be electrically neutral.

In an embodiment, the phosphorescent dopant may include an organometallic compound represented by Formula 401:

$$M(L_{401})_{xc1}(L_{402})_{xc2}$$  Formula 401

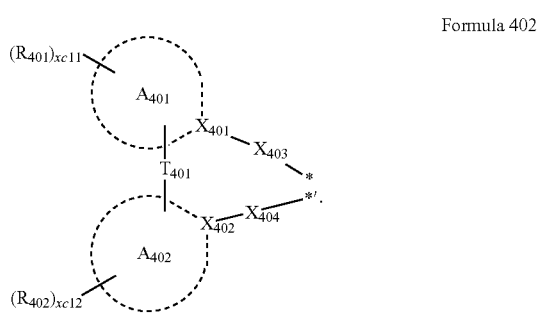

Formula 402

In Formulae 401 and 402,

M may be a transition metal (for example, iridium (Ir), platinum (Pt), palladium (Pd), osmium (Os), titanium (Ti), gold (Au), hafnium (Hf), europium (Eu), terbium (Tb), rhodium (Rh), rhenium (Re), or thulium (Tm)), $L_{401}$ may be a ligand represented by Formula 402, and xc1 may be 1, 2, or 3, wherein, when xc1 is 2 or more, two or more of $L_{401}$(s) may be identical to or different from each other, $L_{402}$ may be an organic ligand, and xc2 may be 0, 1, 2, 3, or 4, wherein, when xc2 is 2 or more, two or more of $L_{402}$(s) may be identical to or different from each other, $X_{401}$ and $X_{402}$ may each independently be nitrogen or carbon, ring $A_{401}$ and ring $A_{402}$ may each independently be a $C_3$-$C_{60}$ carbocyclic group or a $C_1$-$C_{60}$ heterocyclic group, $T_{401}$ may be a single bond, *—O—*', *—S—*', *—C(=O)—*', *—N($Q_{411}$)-*', *—C($Q_{411}$)($Q_{412}$)-*', *—C($Q_{411}$)=C($Q_{412}$)-*' *—C($Q_{411}$)=*', or *=C($Q_{411}$)=*'

$X_{403}$ and $X_{404}$ may each independently a chemical bond (for example, a covalent bond or a coordinate bond), O, S, N($Q_{413}$), B($Q_{413}$), P($Q_{413}$), C($Q_{413}$)($Q_{414}$), or Si($Q_{413}$)($Q_{414}$), $Q_{411}$ to $Q_{414}$ are the same as described in connection with $Q_1$ in the present specification, $R_{401}$ and $R_{402}$ may each independently be hydrogen, deuterium, —F, —Cl, —Br, —I, a hydroxyl group, a cyano group, a nitro group, a $C_1$-$C_{20}$ alkyl group unsubstituted or substituted with at least one $R_{10a}$, a $C_1$-$C_{20}$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, —Si($Q_{401}$)($Q_{402}$)($Q_{403}$), —N($Q_{401}$)($Q_{402}$), —B($Q_{401}$)($Q_{402}$), —C(=O)($Q_{401}$), —S(=O)$_2$($Q_{401}$), or —P(=O)($Q_{401}$)($Q_{402}$), $Q_{401}$ to $Q_{403}$ are the same as described in connection with $Q_1$ in the present specification, xc11 and xc12 may each independently be an integer from 0 to 10, and

* and *' in Formula 402 may each indicate a binding site to M in Formula 401.

In an embodiment, in Formula 402, i) $X_{401}$ may be nitrogen, and $X_{402}$ may be carbon, or ii) both $X_{401}$ and $X_{402}$ may be nitrogen.

In an embodiment, when xc1 in Formula 402 is 2 or more, two ring $A_{401}$(s) in two or more $L_{401}$(s) may optionally be linked to each other via $T_{402}$, which is a linking group, or two ring $A_{402}$(s) in two or more $L_{401}$(s) may optionally be linked to each other via $T_{403}$, which is a linking group (see Compounds PD1 to PD4 and PD7). $T_{402}$ and $T_{403}$ are the same as described in connection with $T_{401}$ in the present specification.

$L_{402}$ in Formula 401 may be an organic ligand. In one or more embodiments, $L_{402}$ may be a halogen group, a diketone group (for example, an acetylacetonate group), a carboxylic acid group (for example, a picolinate group), —C(=O), an isonitrile group, a —CN group, a phosphorus group (for example, a phosphine group or a phosphite group), or any combination thereof.

The phosphorescent dopant may include, for example, one of following Compounds PD1 to PD25 or any combination thereof:

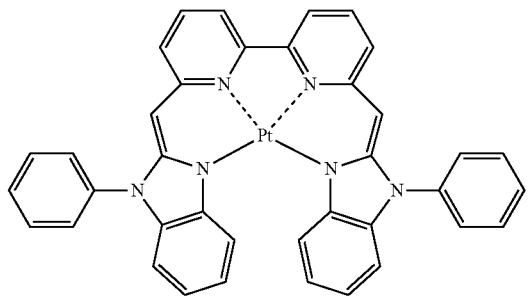
PD1

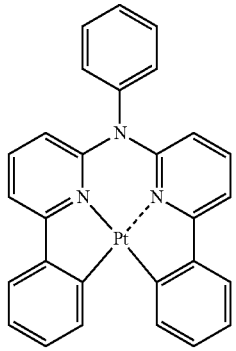
PD2

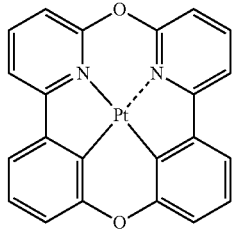
PD3

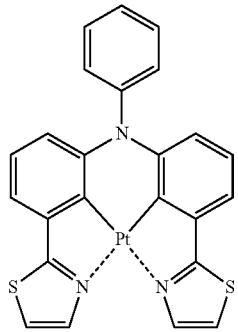
PD4

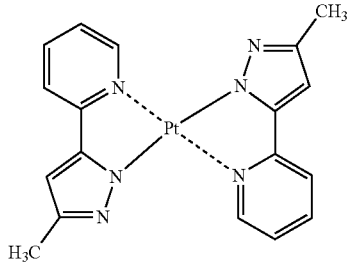
PD5

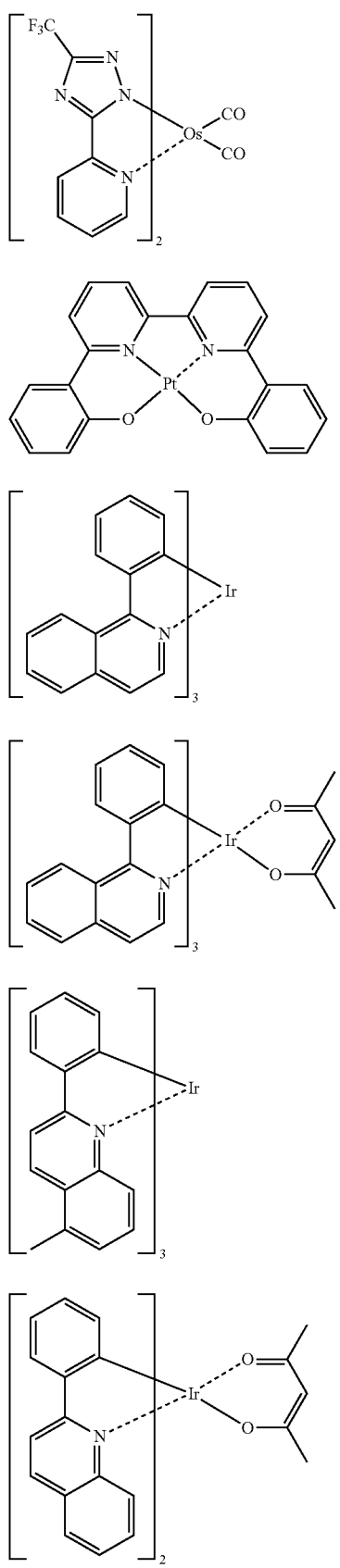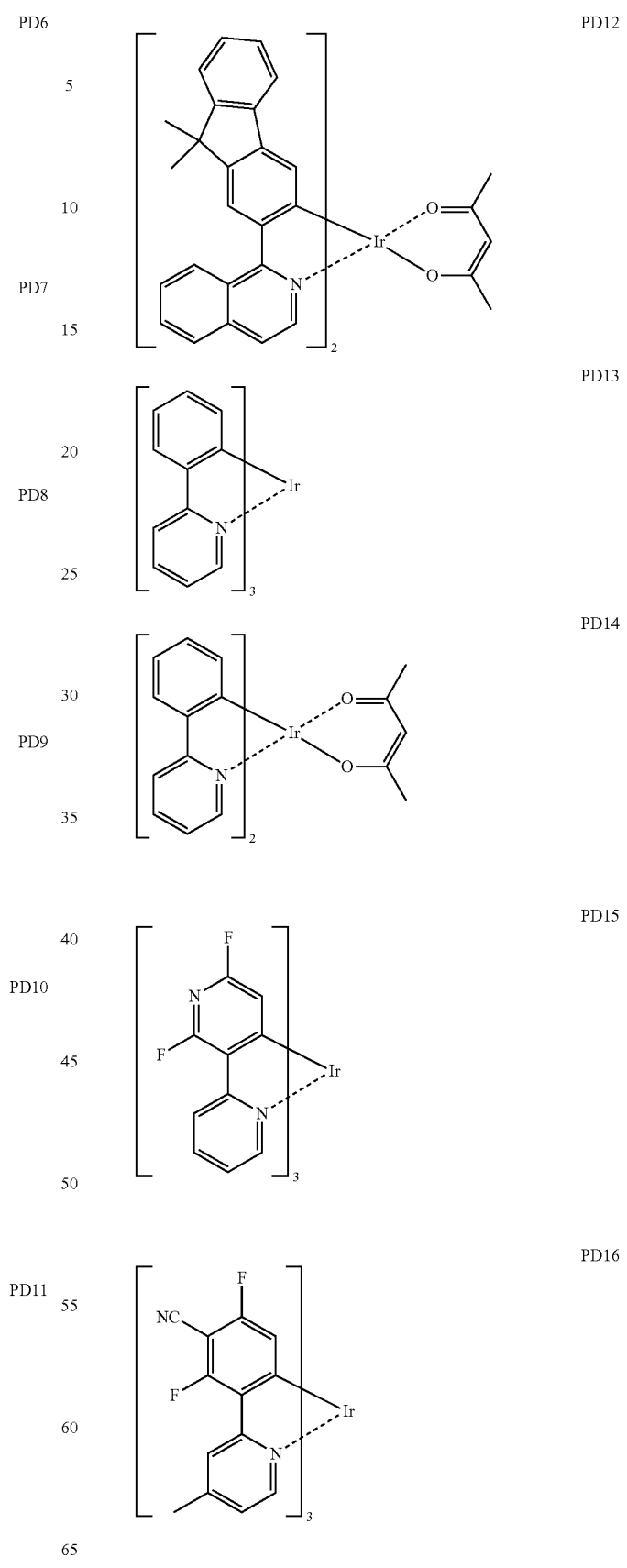

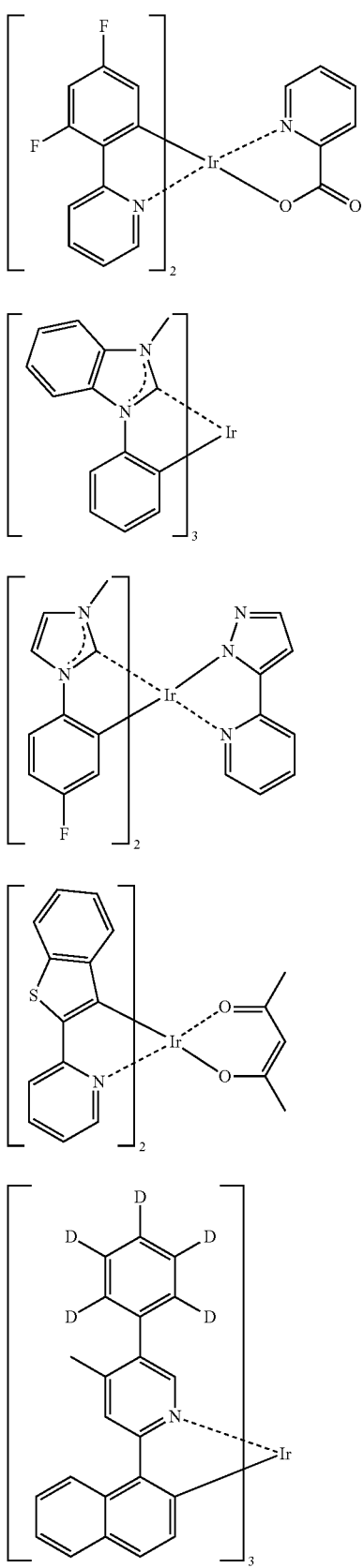
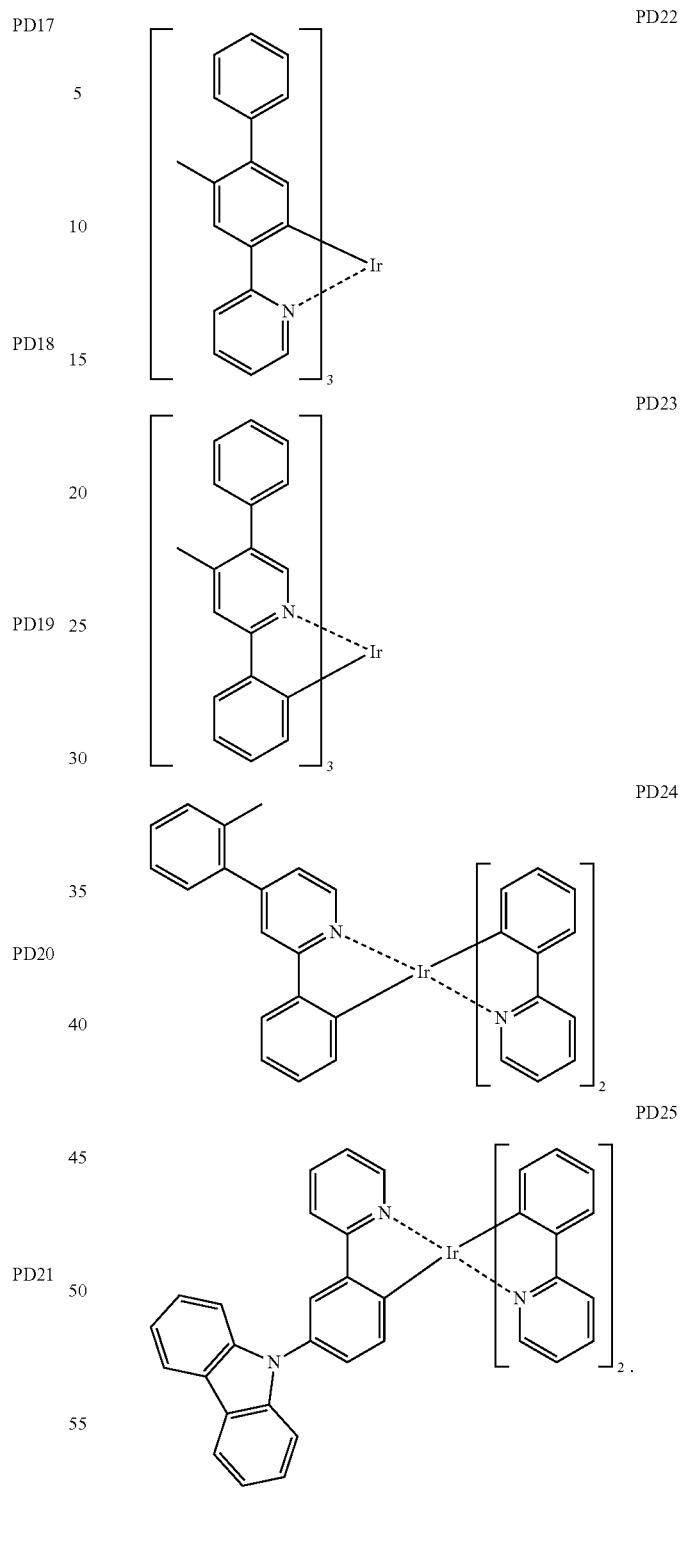
Fluorescent Dopant
The fluorescent dopant may include an amine group-containing compound, a styryl group-containing compound, or any combination thereof.
In an embodiment, the fluorescent dopant may include a compound represented by Formula 501:

Formula 501

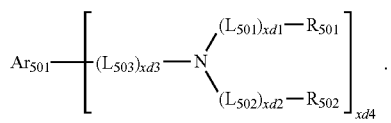

In Formula 501,

Ar$_{501}$, L$_{501}$ to L$_{503}$, R$_{501}$ and R$_{502}$ may each independently be a C$_3$-C$_{60}$ carbocyclic group unsubstituted or substituted with at least one R$_{10a}$ or a C$_1$-C$_{60}$ heterocyclic group unsubstituted or substituted with at least one R$_{10a}$, xd1 to xd3 may each independently be 0, 1, 2, or 3, and xd4 may be 1, 2, 3, 4, 5, or 6.

In an embodiment, Ar$_{501}$ in Formula 501 may include a condensed cyclic group (for example, an anthracene group, a chrysene group, or a pyrene group) in which three or more monocyclic groups are condensed with each other (e.g., combined together with each other).

In an embodiment, xd4 in Formula 501 may be 2.

In an embodiment, the fluorescent dopant may include one of following Compounds FD1 to FD36, DPVBi, DPAVBi, or any combination thereof:

FD1
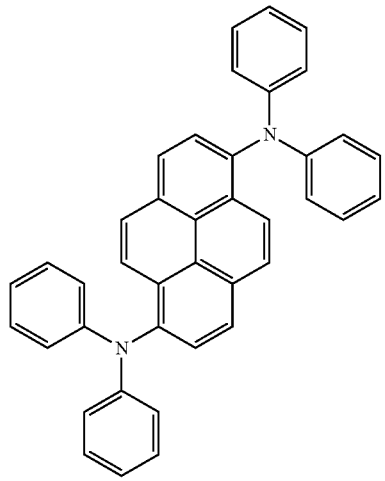

FD2
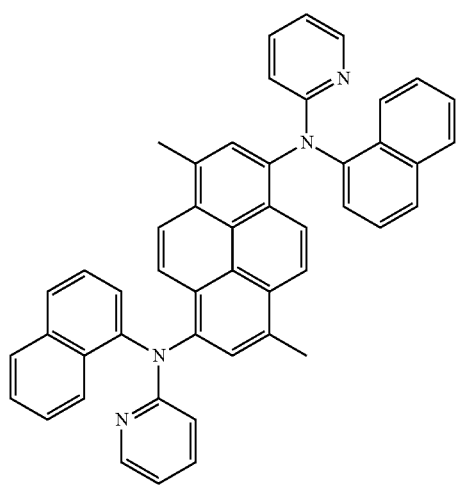

FD3
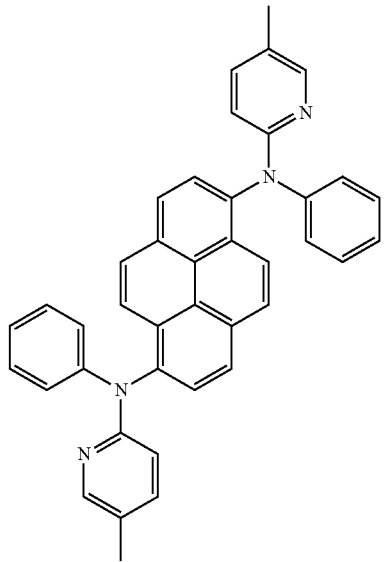

FD4
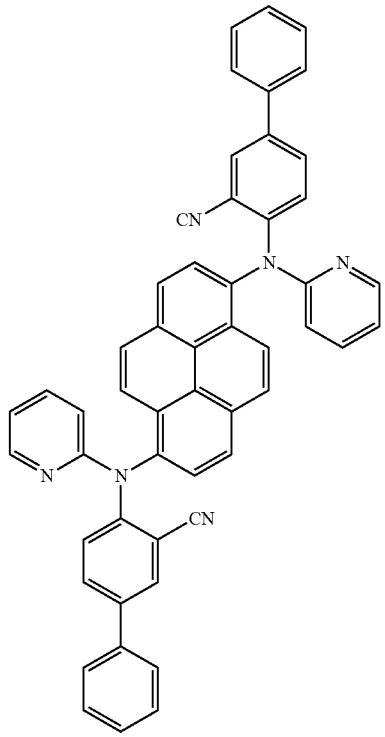

-continued
FD5
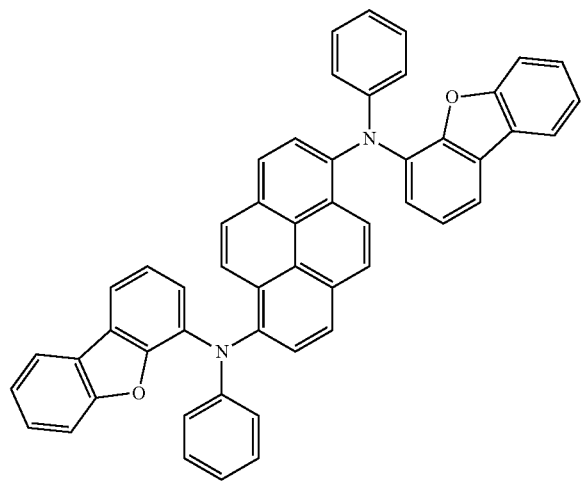
FD6
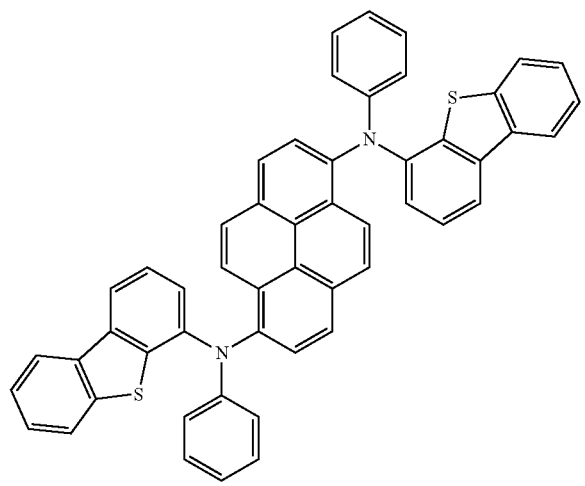
FD7
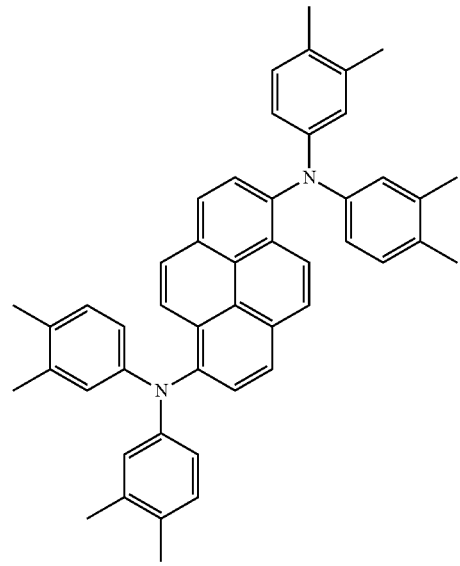
FD8
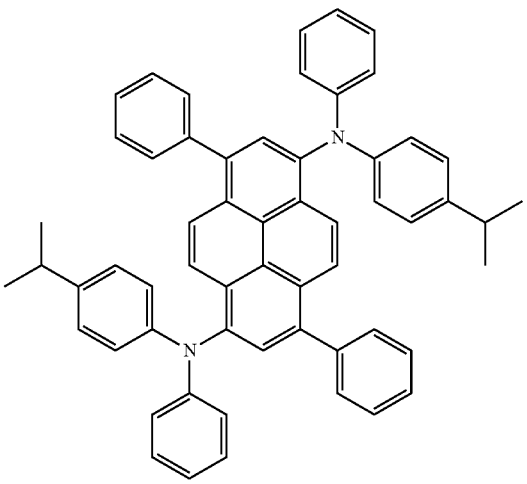
FD9
FD10
FD11
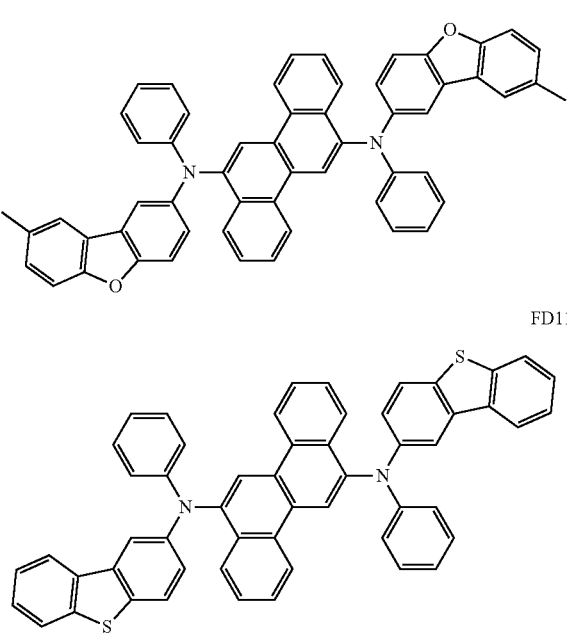

FD12
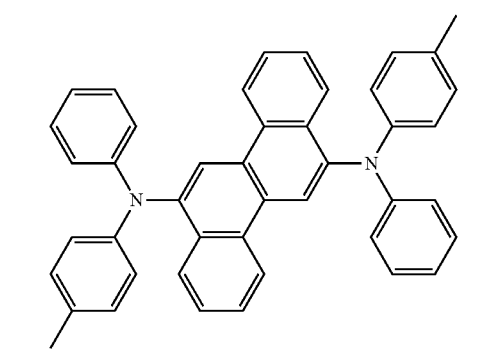
FD13
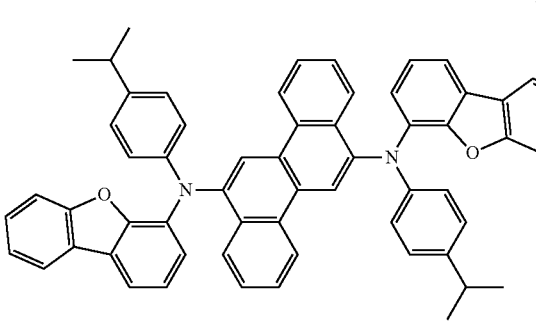
FD14
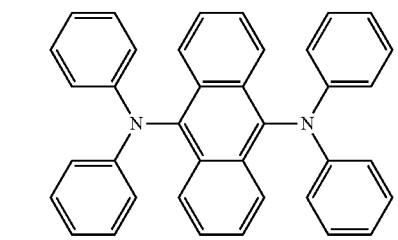
FD15
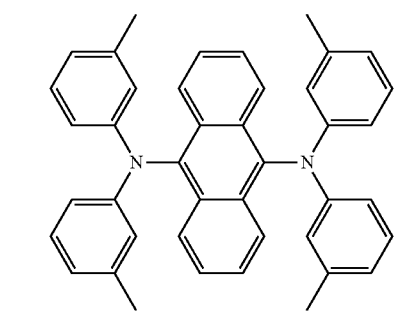
FD16
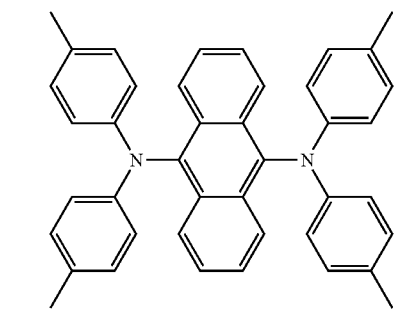
FD17
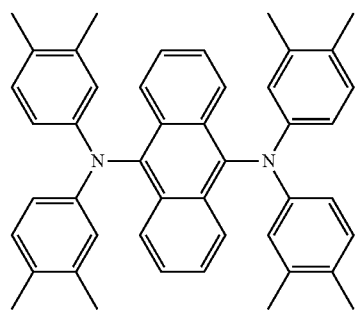
FD18
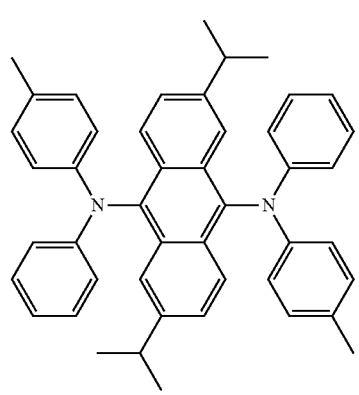
FD19
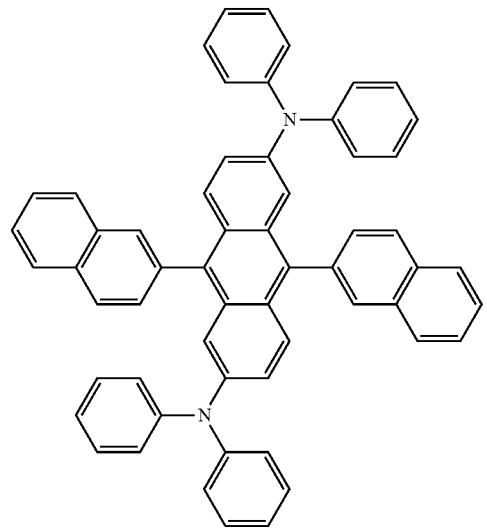
FD20
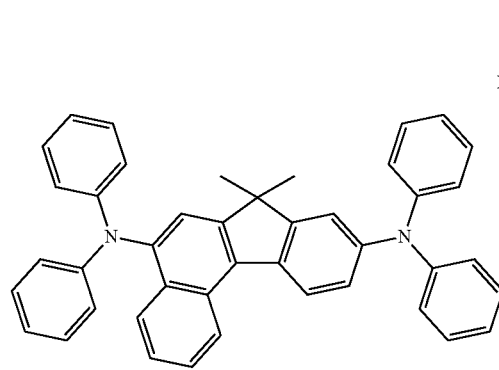

FD21
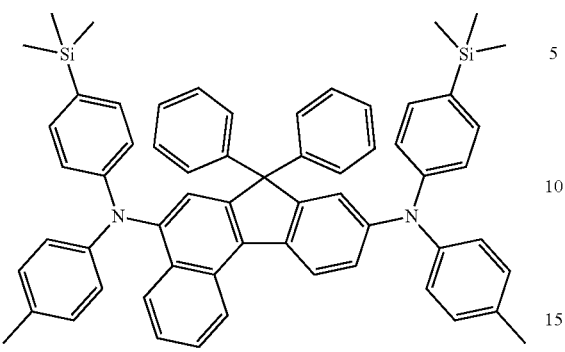
FD22
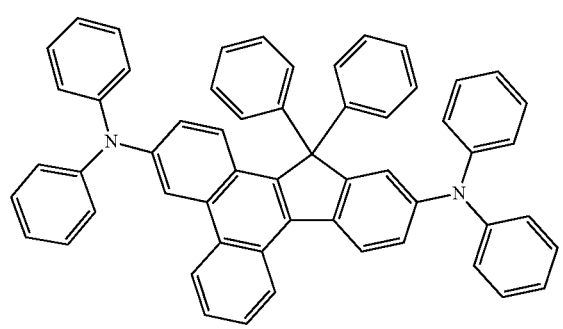
FD23
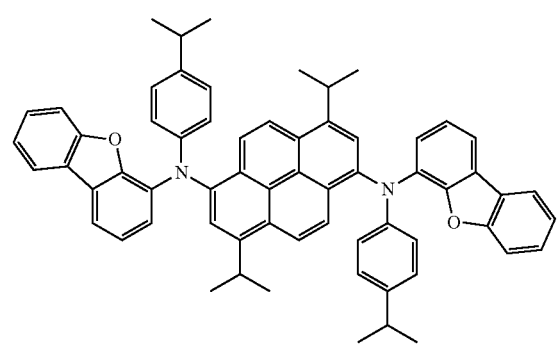
FD24
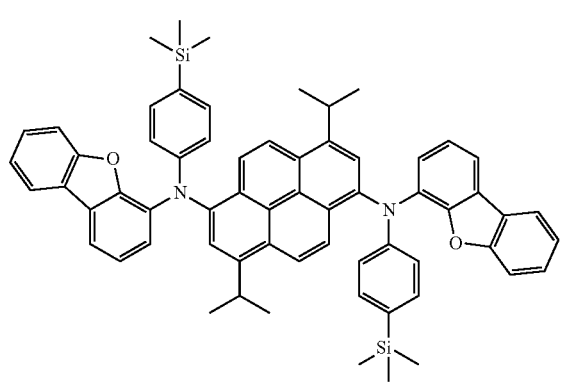
FD25
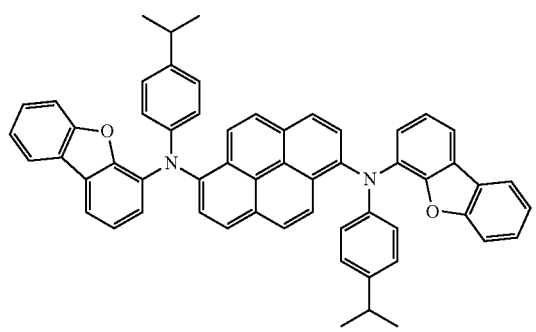
FD26
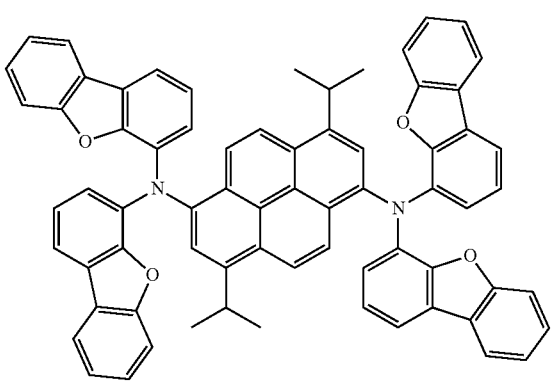
FD27
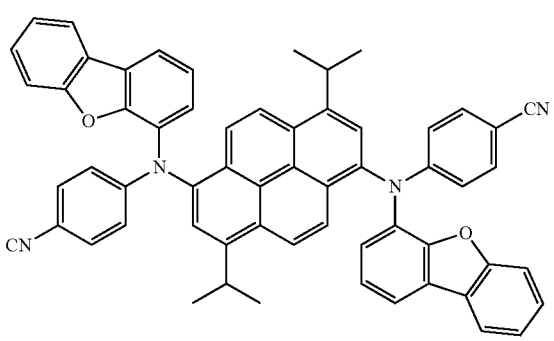
FD28
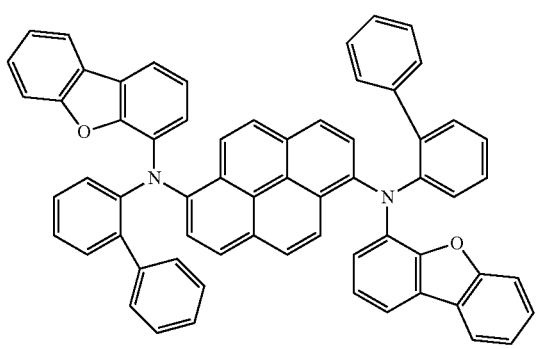

FD29
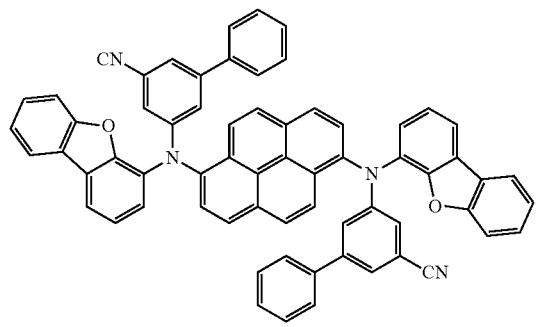
FD33
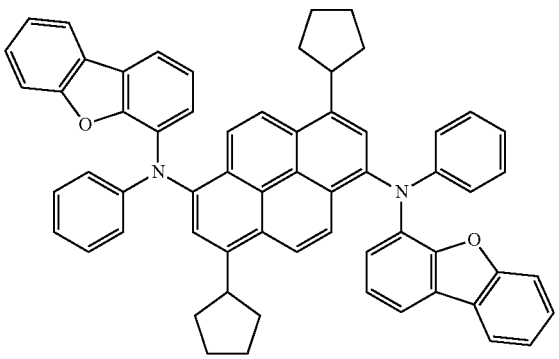
FD30
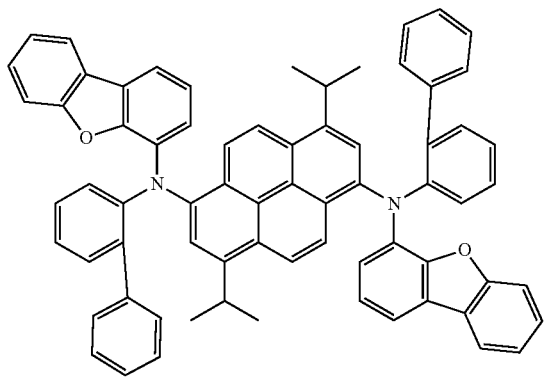
FD34
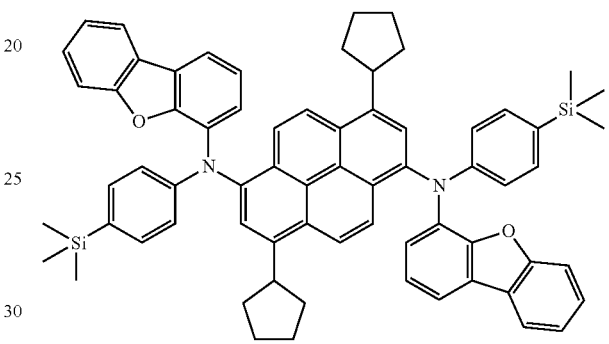
FD31
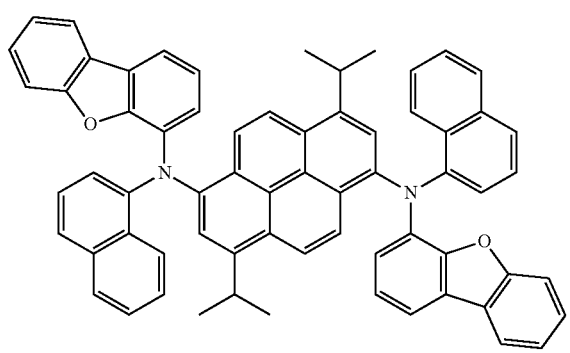
FD35
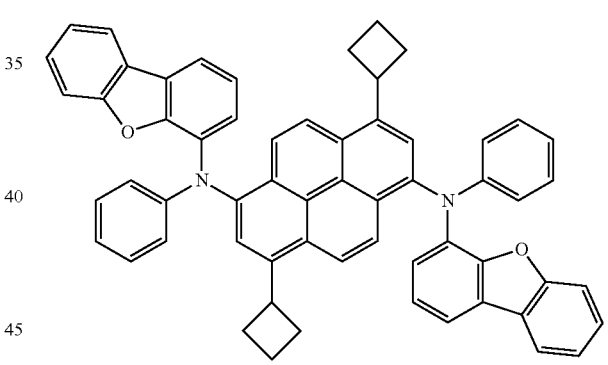
FD32
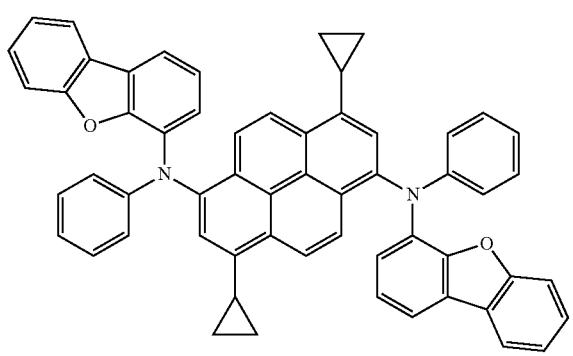
FD36
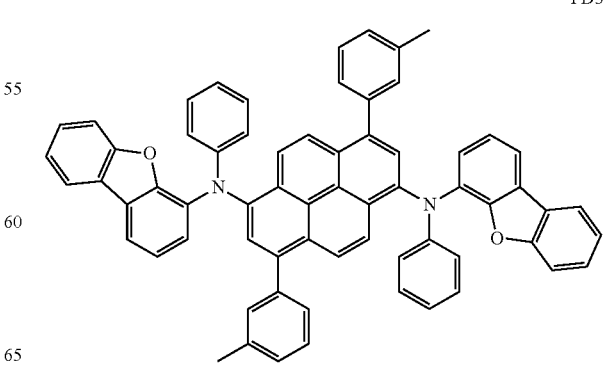

DPVBi

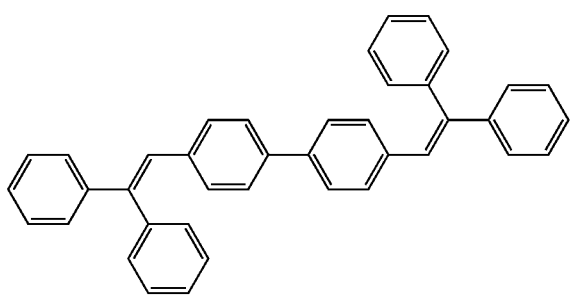

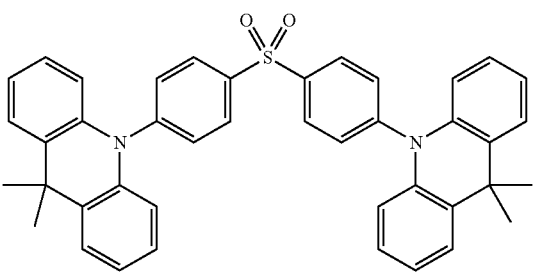
(DMAC-DPS)

DPAVBi

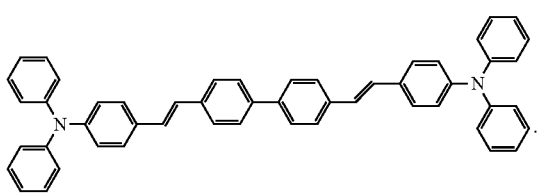

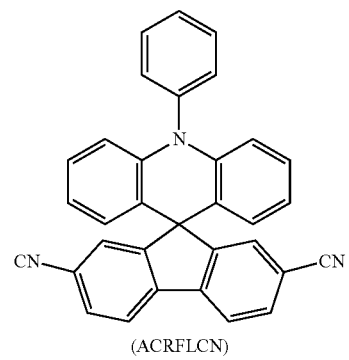
(ACRFLCN)

Delayed Fluorescence Material

The emission layer may include a delayed fluorescence material.

The delayed fluorescence material used herein may be selected from any suitable compound that is capable of emitting delayed fluorescent light based on a delayed fluorescent emission mechanism.

The delayed fluorescence material included in the emission layer may act as a host or a dopant depending on the type or kind of other materials included in the emission layer.

In an embodiment, the difference between the triplet energy level (eV) of the delayed fluorescence material and the singlet energy level (eV) of the delayed fluorescence material may be 0 eV or more and 0.5 eV or less. When the difference between the triplet energy level (eV) of the delayed fluorescence material and the singlet energy level (eV) of the delayed fluorescence material satisfies the above-described range, up-conversion from the triplet state to the singlet state of the delayed fluorescence materials may effectively occur, and thus, the luminescence efficiency of the light-emitting device 10 may be improved.

In an embodiment, the delayed fluorescence material may include i) a material that includes at least one electron donor (for example, a π electron-rich $C_3$-$C_{60}$ cyclic group, such as a carbazole group) and at least one electron acceptor (for example, a sulfoxide group, a cyano group, or a π-electron-deficient nitrogen-containing $C_1$-$C_{60}$ cyclic group), ii) a material including a $C_8$-$C_{60}$ polycyclic group in which two or more cyclic groups share boron (B) and are condensed with each other (e.g., combined together with each other).

The delayed fluorescence material may include at least one of Compounds DF1 to DF9:

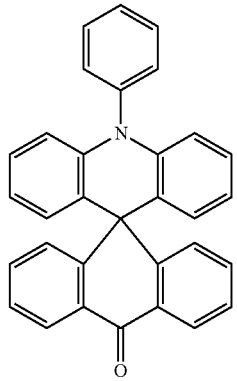
(ACRSA)

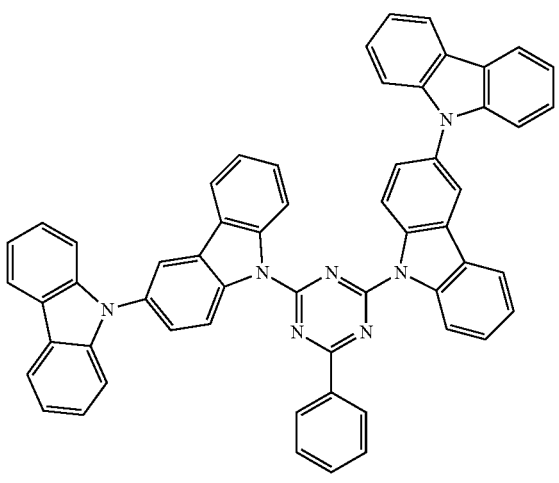
(CC2TA)

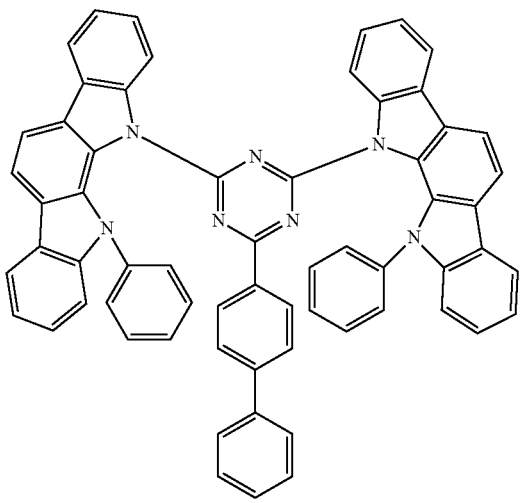

(PIC-TRZ)

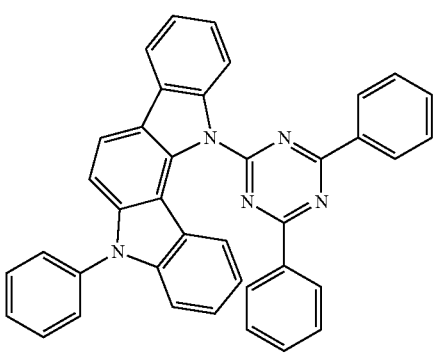

(PIC-TRZ2)

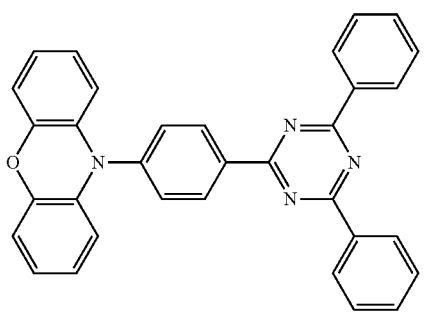

(PXZ-TRZ)

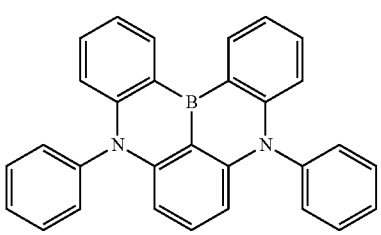

(DABNA-1)

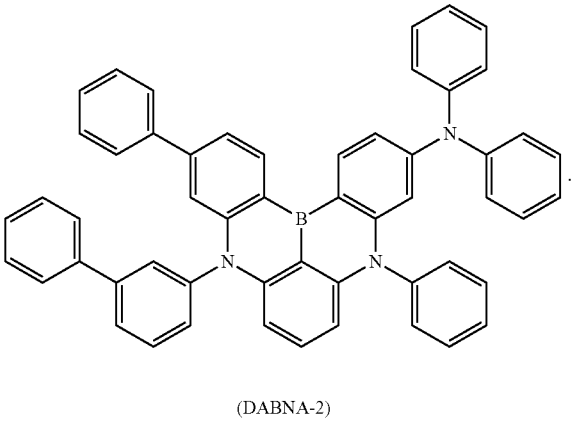

(DABNA-2)

Quantum Dot

The emission layer may include a quantum dot.

The term "quantum dot," as used herein, refers to a crystal of a semiconductor compound, and may include any suitable material that is capable of emitting light of various suitable emission wavelengths depending on a size of the crystal.

A diameter of the quantum dot may be, for example, about 1 nm to 10 nm.

The quantum dot may be synthesized by a wet chemical process, an organometallic chemical vapor deposition process, a molecular beam epitaxy process, and/or a process that is similar to these processes.

The wet chemical process refers to a method in which an organic solvent and a precursor material are mixed, and then, a quantum dot particle crystal is grown. When the crystal grows, the organic solvent acts as a dispersant naturally coordinated on the surface of the quantum dot crystal and controls the growth of the crystal. Accordingly, by using a process that is easily performed at low costs compared to a vapor deposition process, such as a metal organic chemical vapor deposition (MOCVD) process and a molecular beam epitaxy (MBE) process, the growth of quantum dot particles may be controlled.

The quantum dot may include a Group III-VI semiconductor compound, a Group II-VI semiconductor compound, a Group III-V semiconductor compound, a Group I-III-VI semiconductor compound, a Group IV-VI semiconductor compound, a Group IV element or compound, or any combination thereof.

Examples of the Group III-VI semiconductor compound may include: a binary compound, such as $In_2S_3$; a ternary compound, such as $AgInS$, $AgInS_2$, $CuInS$, and/or $CuInS_2$; or any combination thereof.

Examples of the Group II-VI semiconductor compound may include: a binary compound, such as CdSe, CdTe, ZnS, ZnSe, ZnTe, ZnO, HgS, HgSe, HgTe, MgSe, and/or MgS; a ternary compound, such as CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, and/or MgZnS; a quaternary compound, such as CdZnSeS, CdZnSeTe, CdZnSTe, CdHgSeS, CdHgSeTe, CdHgSTe, HgZnSeS, HgZnSeTe, and/or HgZnSTe; or any combination thereof.

Examples of the Group III-V semiconductor compound may include: a binary compound, such as GaN, GaP, GaAs, GaSb, AlN, AlP, AlAs, AlSb, InN, InP, InAs, and/or InSb; a ternary compound, such as GaNP, GaNAs, GaNSb, GaPAs, GaPSb, AlNP, AlNAs, AlNSb, AlPAs, AlPSb, InGaP, InNP, InAlP, InNAs, InNSb, InPAs, InPSb, and/or GaAlNP; a quaternary compound, such as GaAlNAs, GaAlNSb, GaAl-PAs, GaAlPSb, GaInNP, GaInNAs, GaInNSb, GaInPAs, GaInPSb, InAlNP, InAlNAs, InAlNSb, InAlPAs, and/or InAlPSb; or any combination thereof. In an embodiment, the Group III-V semiconductor compound may further include a Group II element. Examples of the Group III-V semiconductor compound further including a Group II element may include InZnP, InGaZnP, and/or InAlZnP.

Examples of the Group III-VI semiconductor compound may include: a binary compound, such as GaS, GaSe, $Ga_2Se_3$, GaTe, InS, InSe, $In_2Se_3$, and/or InTe; a ternary compound, such as $InGaS_3$ and/or $InGaSe_3$; or any combination thereof.

Examples of the Group I-III-VI semiconductor compound may include: a ternary compound such as AgInS, $AgInS_2$, CuInS, $CuInS_2$, $CuGaO_2$, $AgGaO_2$, and/or $AgAlO_2$; or any combination thereof.

Examples of the Group IV-VI semiconductor compound may include: a binary compound, such as SnS, SnSe, SnTe, PbS, PbSe, and/or PbTe; a ternary compound, such as SnSeS, SnSeTe, SnSTe, PbSeS, PbSeTe, PbSTe, SnPbS, SnPbSe, and/or SnPbTe; a quaternary compound, such as SnPbSSe, SnPbSeTe, and/or SnPbSTe; or any combination thereof.

The Group IV element or compound may include a single element compound, such as Si or Ge; a binary compound, such as SiC and/or SiGe; or any combination thereof.

Each element included in the multi-element compound such as the binary compound, the ternary compound, and the quaternary compound may be present in a particle at a uniform concentration or a non-uniform concentration.

In one or more embodiments, the quantum dot may have a single structure having a uniform (e.g., substantially uniform) concentration of each element included in the corresponding quantum dot or a dual structure of a core-shell. In an embodiment, a material included in the core may be different from a material included in the shell.

The shell of the quantum dot may function as a protective layer for maintaining semiconductor characteristics by preventing or reducing chemical degeneration of the core and/or may function as a charging layer for imparting electrophoretic characteristics to the quantum dot. The shell may be a single layer or a multilayer. An interface between the core and the shell may have a concentration gradient in which the concentration of elements existing in the shell decreases along a direction toward the center.

Examples of the shell of the quantum dot are an oxide of a metal and/or a non-metal, a semiconductor compound, or any combination thereof. Examples of the oxide of metal and/or non-metal may include a binary compound, such as $SiO_2$, $Al_2O_3$, $TiO_2$, ZnO, MnO, $Mn_2O_3$, $Mn_3O_4$, CuO, FeO, $Fe_2O_3$, $Fe_3O_4$, CoO, $CO_3O_4$, and/or NiO; a ternary compound, such as $MgAl_2O_4$, $CoFe_2O_4$, $NiFe_2O_4$, and/or $CoMn_2O_4$; or any combination thereof. Examples of the semiconductor compound are, as described herein, a Group III-VI semiconductor compound, a Group II-VI semiconductor compound, a Group III-V semiconductor compound, a Group I-III-VI semiconductor compound, a Group IV-VI semiconductor compound, or any combination thereof. In an embodiment, the semiconductor compound may include CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, AlSb; or any combination thereof.

A full width at half maximum (FWHM) of an emission wavelength spectrum of the quantum dot may be about 45 nm or less, for example, about 40 nm or less, for example, about 30 nm or less. When the FWHM of the emission wavelength spectrum of the quantum dot is within this range, color purity and/or color reproduction may be improved. In addition, light emitted through such quantum dot is irradiated in omnidirection (e.g., substantially every direction). Accordingly, a wide viewing angle may be increased.

In addition, the quantum dot may be, for example, a spherical, pyramidal, multi-arm, and/or cubic nanoparticle, a nanotube, a nanowire, a nanofiber, and/or a nanoplate particle.

By adjusting a size of the quantum dot, the energy band gap may also be adjusted, and thus the quantum dot emission layer may obtain light of various suitable wavelengths. Therefore, by using quantum dots of different sizes, a light-emitting device that emits light of various suitable wavelengths may be implemented. In an embodiment, the size of the quantum dot may be selected to emit red, green and/or blue light. In addition, the size of the quantum dot may be adjusted such that light of various suitable colors are combined to emit white light.

Electron Transport Region in Interlayer 130

The electron transport region may have: i) a single-layered structure including (e.g., consisting of) a single layer including (e.g., consisting of) a single material, ii) a single-layered structure including (e.g., consisting of) a single layer including a plurality of different materials, or iii) a multi-layered structure including a plurality of layers including different materials.

The electron transport region may include a buffer layer, a hole blocking layer, an electron control layer, an electron transport layer, an electron injection layer, or any combination thereof.

For example, the electron transport region may have an electron transport layer/electron injection layer structure, a hole blocking layer/electron transport layer/electron injection layer structure, an electron control layer/electron transport layer/electron injection layer structure, or a buffer layer/electron transport layer/electron injection layer structure, wherein, for each structure, constituting layers are sequentially stacked from an emission layer.

The electron transport region (for example, the buffer layer, the hole blocking layer, the electron control layer, and/or the electron transport layer in the electron transport region) may include a metal-free compound including at least one π-electron-deficient nitrogen-containing $C_1$-$C_{60}$ cyclic group.

In an embodiment, the electron transport region may include a compound represented by Formula 601.

$$[Ar_{601}]_{xe11}\text{-}[(L_{601})_{xe1}\text{-}R_{601}]_{xe21} \qquad \text{Formula 601}$$

In Formula 601, $Ar_{601}$ and $L_{601}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, xe11 may be 1, 2, or 3, xe1 may be 0, 1, 2, 3, 4, or 5, $R_{601}$ may be a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, —Si($Q_{601}$)($Q_{602}$)($Q_{603}$), —C(=O)($Q_{601}$), —S(=O)$_2$($Q_{601}$), or —P(=O)($Q_{601}$)($Q_{602}$), $Q_{601}$ to $Q_{603}$ are the same as described in connection with $Q_1$ in the present specification, xe21 may be 1, 2, 3, 4, or 5, and at least one of $Ar_{601}$, $L_{601}$ and $R_{601}$ may each independently be a π-electron-deficient nitrogen-containing $C_1$-$C_{60}$ cyclic group unsubstituted or substituted with at least one $R_{10a}$.

In an embodiment, when xe11 in Formula 601 is 2 or more, two or more of $Ar_{601}$(s) may be linked to each other via a single bond.

In an embodiment, $Ar_{601}$ in Formula 601 may be a substituted or unsubstituted anthracene group.

In an embodiment, the electron transport region may include a compound represented by Formula 601-1:

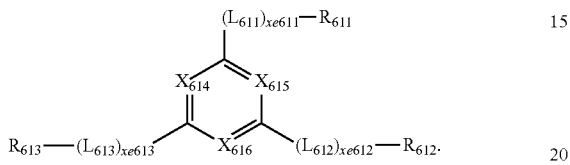

Formula 601-1

In Formula 601-1, $X_{614}$ may be N or $C(R_{614})$, $X_{615}$ may be N or $C(R_{615})$, $X_{616}$ may be N or $C(R_{616})$, at least one of $X_{614}$ to $X_{616}$ may be N, $L_{611}$ to $L_{613}$ are the same as described in connection with $L_{601}$, xe611 to xe613 are the same as described in connection with xe1, $R_{611}$ to $R_{613}$ are the same as described in connection with $R_{601}$, and $R_{614}$ to $R_{616}$ may each independently be hydrogen, deuterium, —F, —Cl, —Br, —I, a hydroxyl group, a cyano group, a nitro group, a $C_1$-$C_{20}$ alkyl group, a $C_1$-$C_{20}$ alkoxy group, a $C_3$-$C_{60}$ carbocyclic group unsubstituted or substituted with at least one $R_{10a}$, or a $C_1$-$C_{60}$ heterocyclic group unsubstituted or substituted with at least one $R_{10a}$.

In an embodiment, xe1 and xe611 to xe613 in Formulae 601 and 601-1 may each independently be 0, 1, or 2.

The electron transport region may include one of Compounds ET1 to ET45, 2,9-dimethyl-4,7-diphenyl-1,10-phenanthroline (BCP), 4,7-diphenyl-1,10-phenanthroline (Bphen), $Alq_3$, BAlq, TAZ, NTAZ, or any combination thereof:

ET1

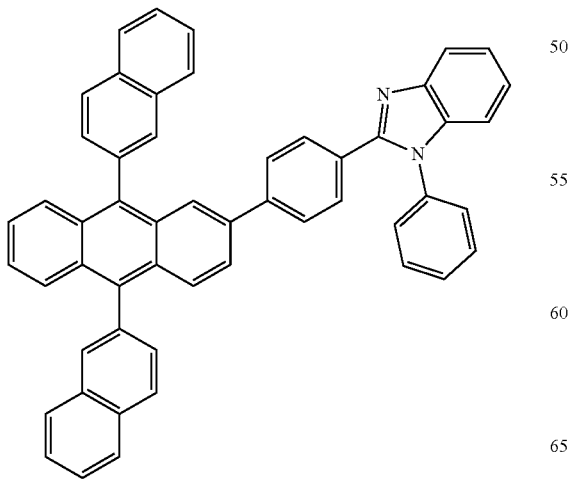

ET2

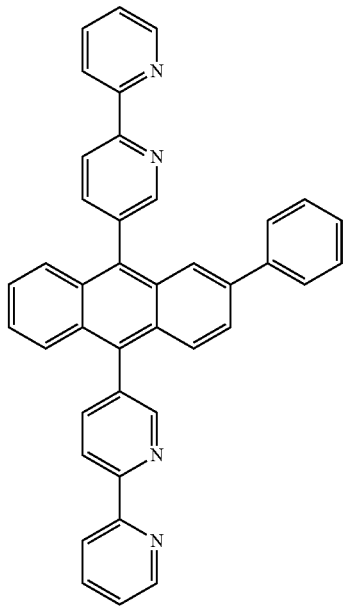

ET3

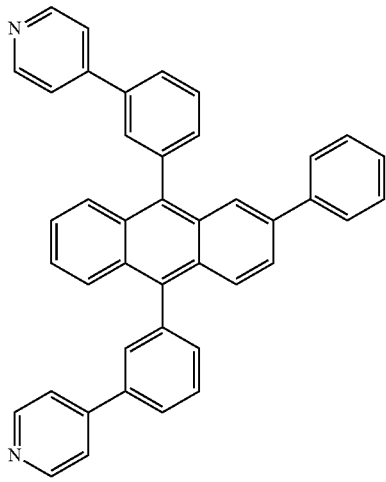

ET4

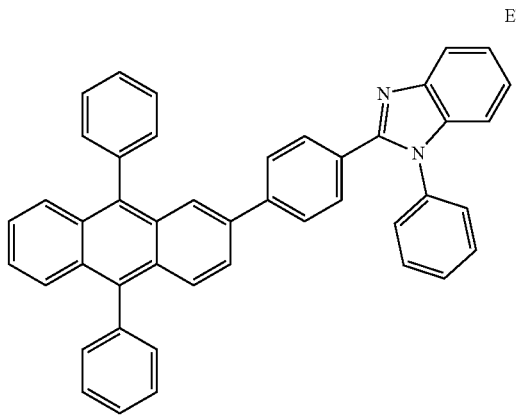

ET5
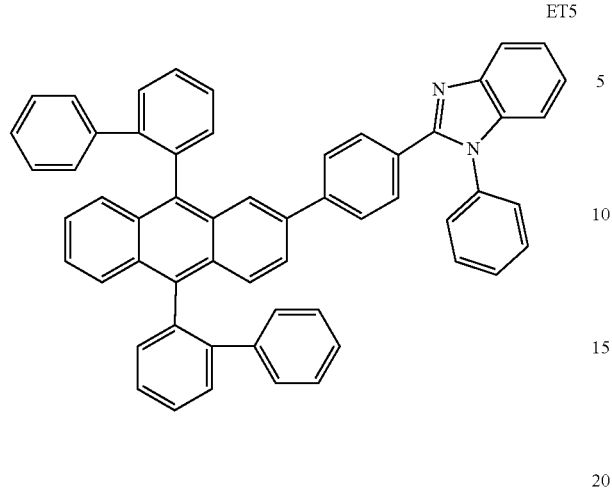
ET8
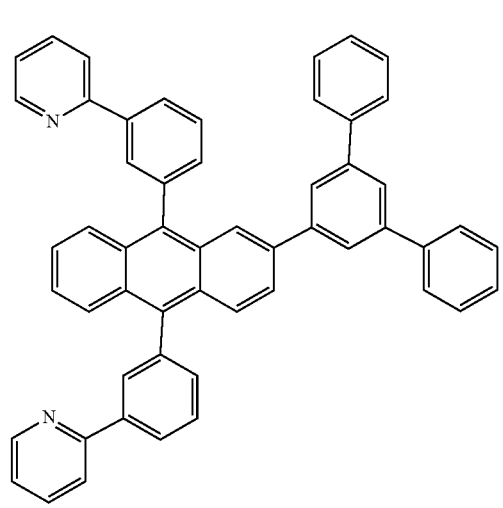
ET6
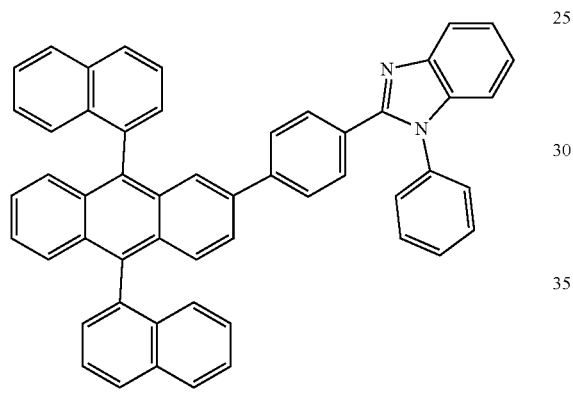
ET7
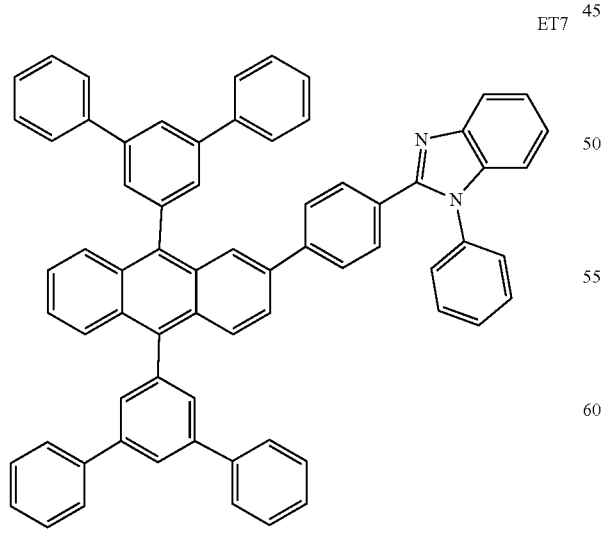
ET9
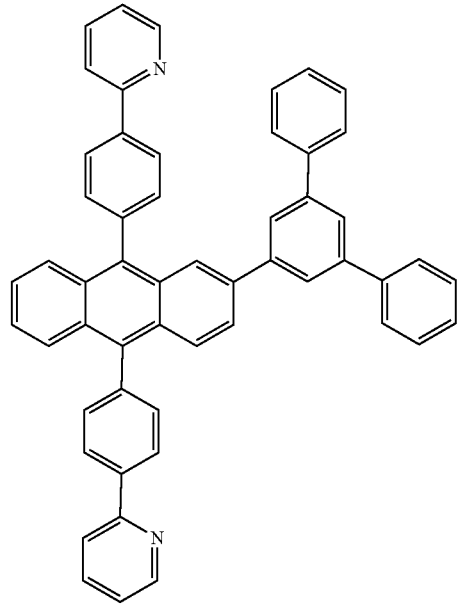

ET10
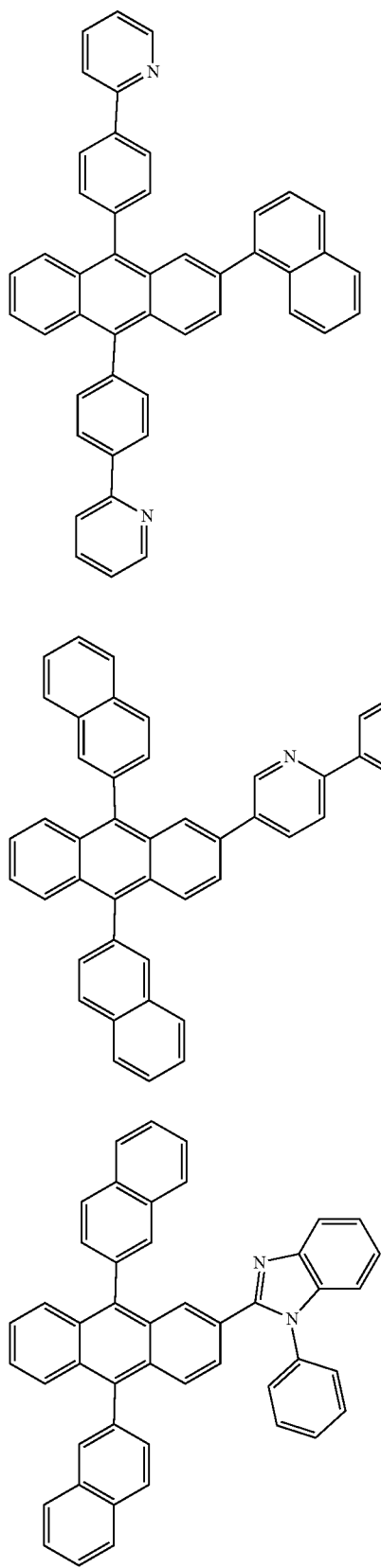
ET11
ET12
ET13
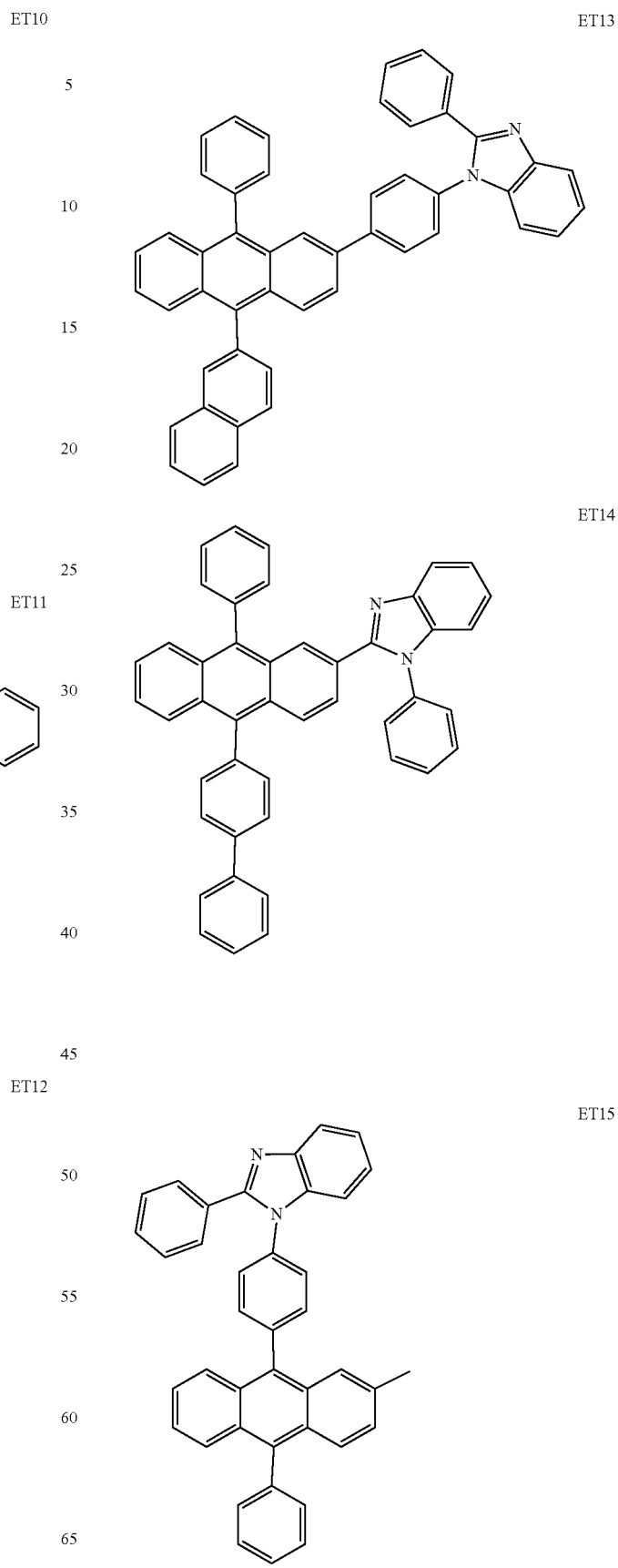
ET14
ET15

ET16
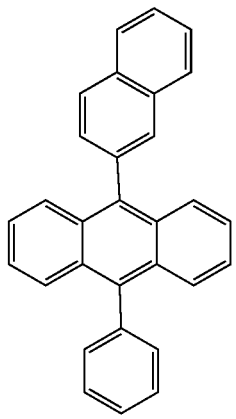
ET17
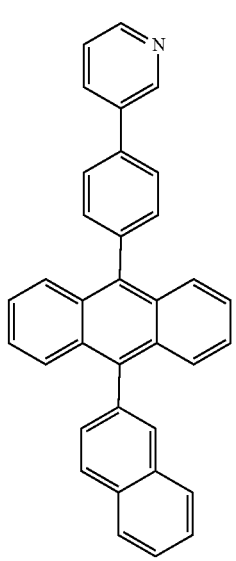
ET18
ET19
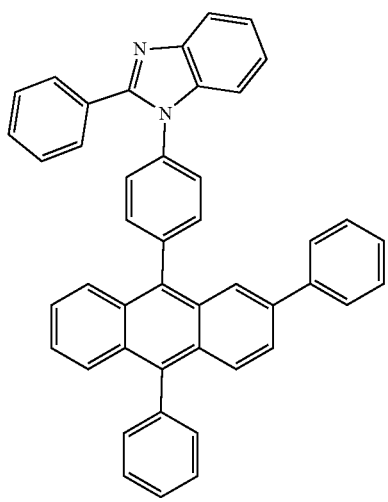
ET20
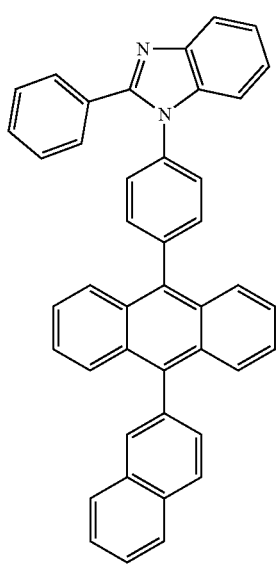
ET21
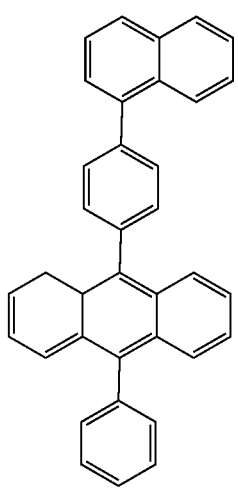
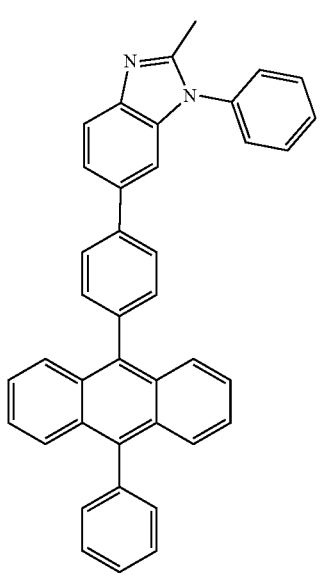

ET22
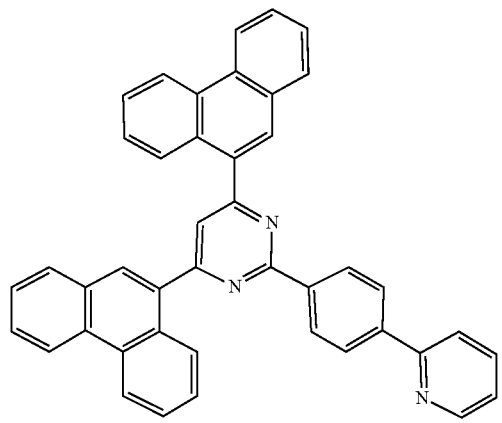
ET25
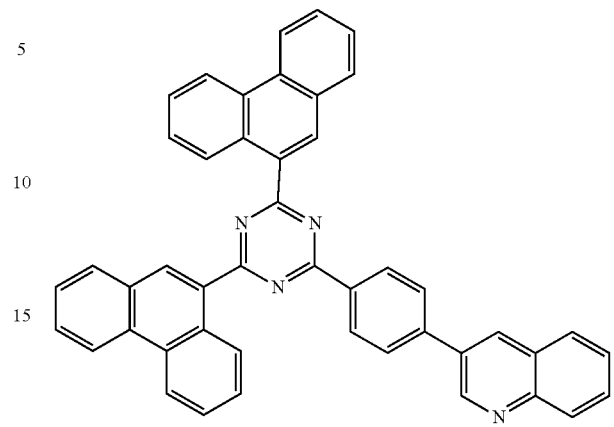
ET23
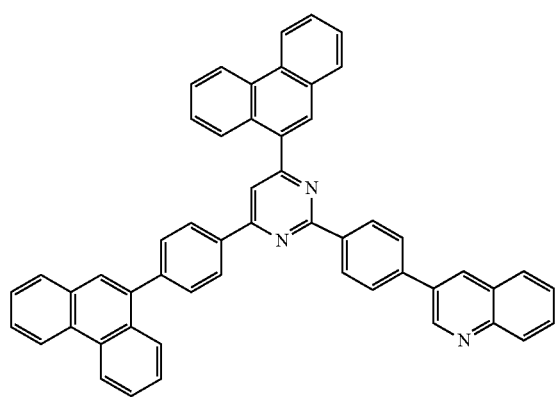
ET26
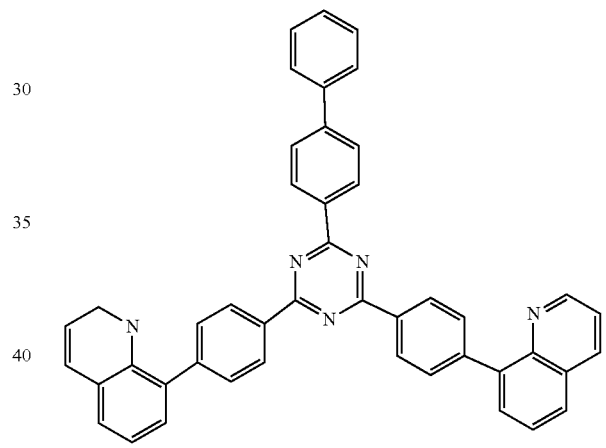
ET24
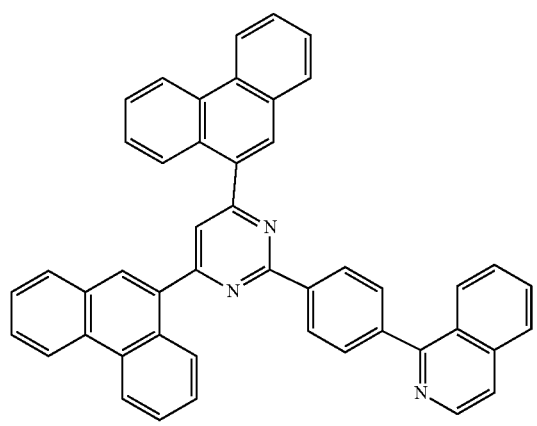
ET27
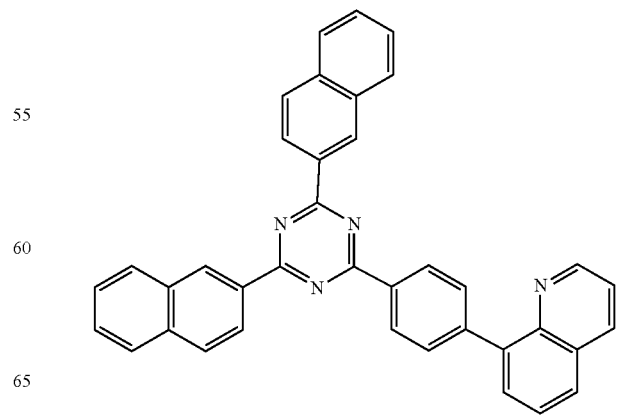

ET28
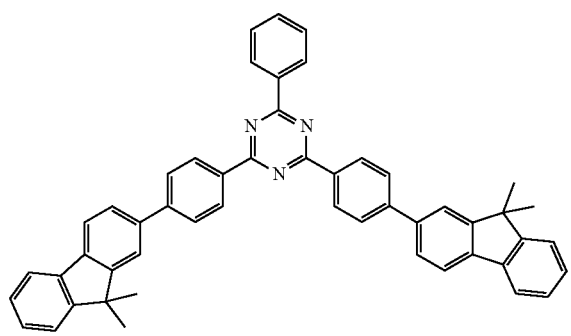
ET29
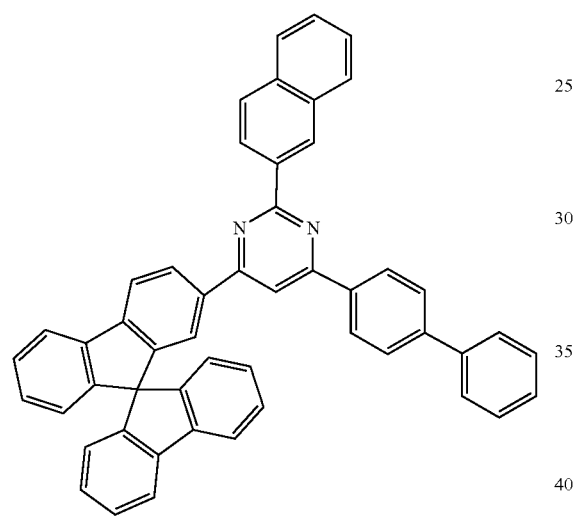
ET30
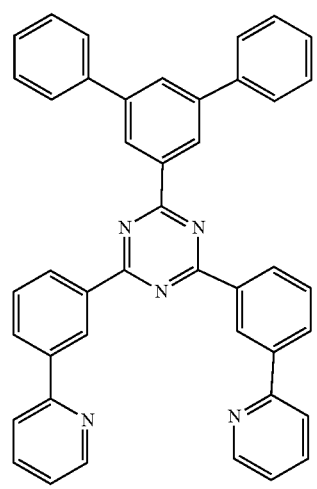
ET31
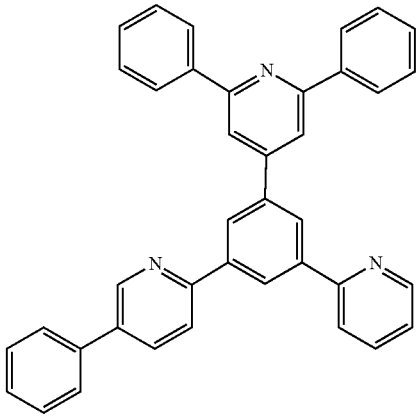
ET32
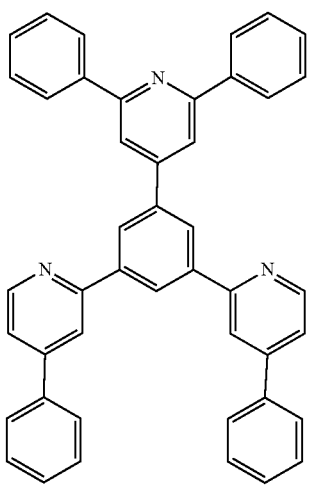
ET33
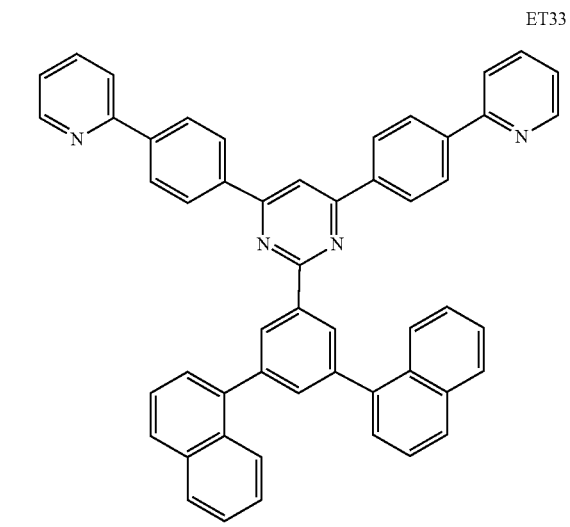

ET34
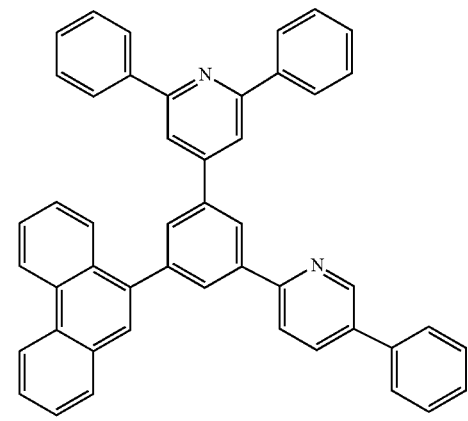
ET35
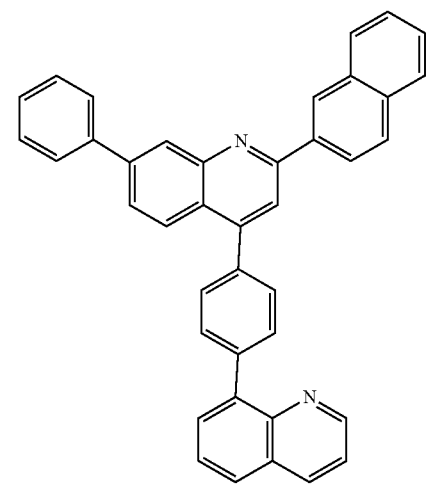
ET36
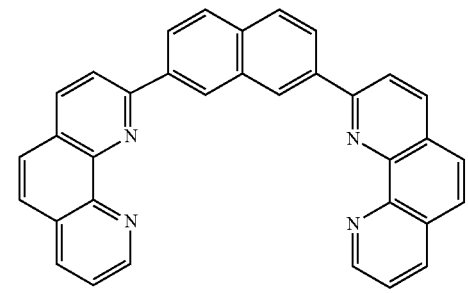
ET37
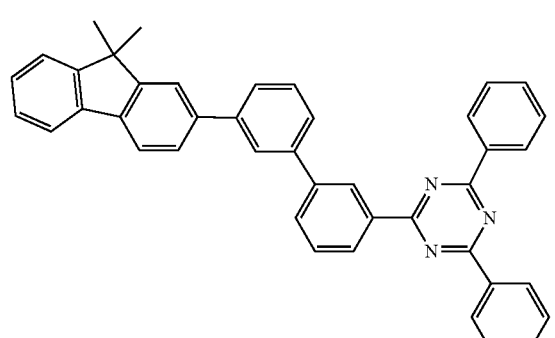
ET38
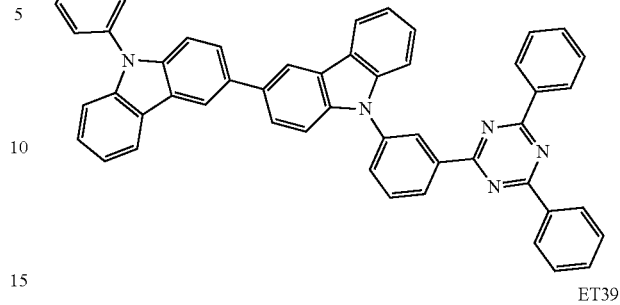
ET39
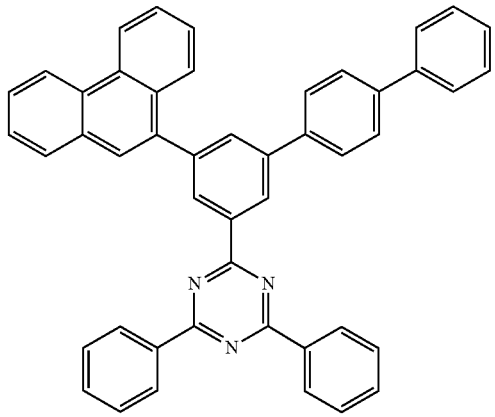
ET40
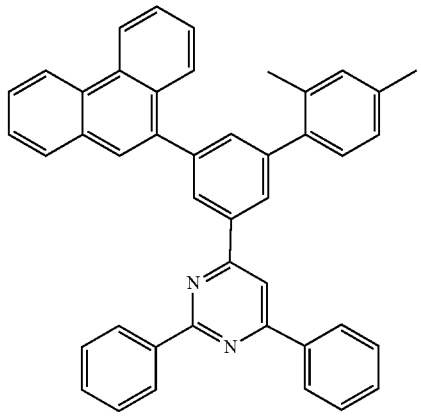
ET41
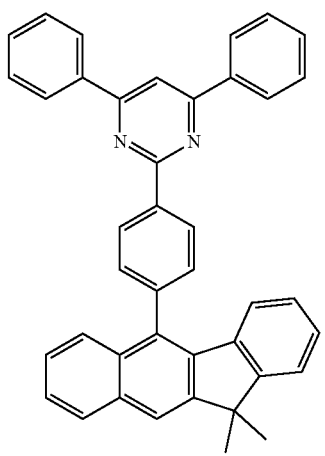

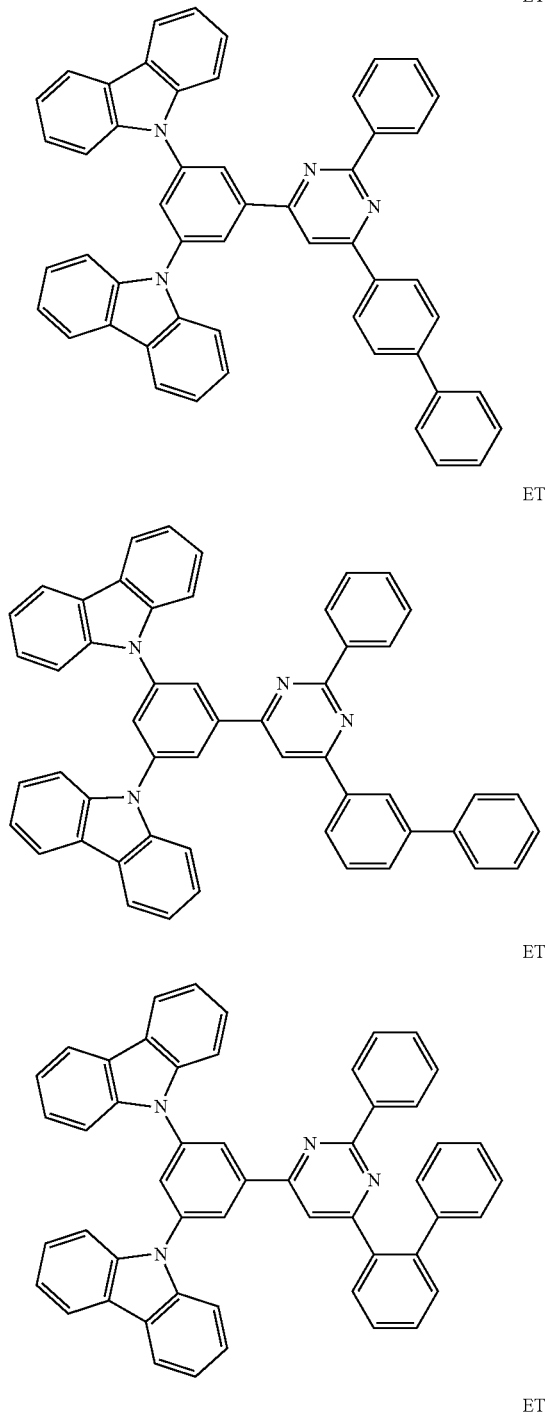

ET42

ET43

ET44

ET45

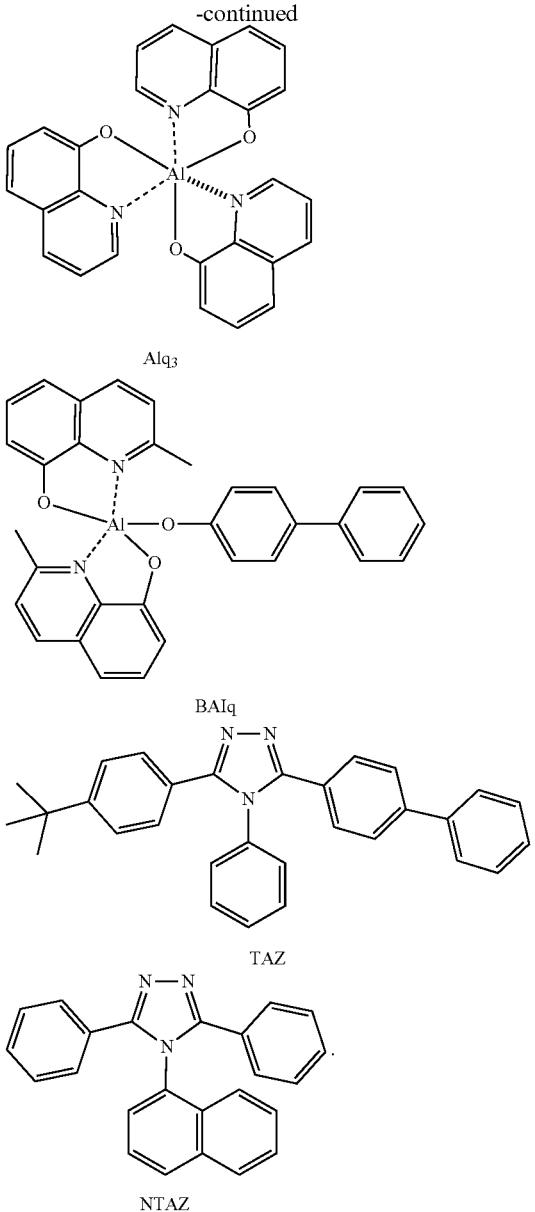

Alq₃

BAlq

TAZ

NTAZ

A thickness of the electron transport region may be from about 160 Å to about 5,000 Å, for example, about 100 Å to about 4,000 Å. When the electron transport region includes a buffer layer, a hole blocking layer, an electron control layer, an electron transport layer, or any combination thereof, a thickness of the buffer layer, the hole blocking layer, or the electron control layer may each independently be from about 20 Å to about 1,000 Å, for example, about 30 Å to about 300 Å, and the thickness of the electron transport layer may be from about 100 Å to about 1,000 Å, for example, about 150 Å to about 500 Å. When the thickness of the buffer layer, the hole blocking layer, the electron control layer, the electron transport layer, and/or the electron transport layer are within these ranges, suitable or satisfactory hole transporting characteristics may be obtained without a substantial increase in driving voltage.

The electron transport region (for example, the electron transport layer in the electron transport region) may further include, in addition to the materials described above, a metal-containing material.

The metal-containing material may include an alkali metal complex, an alkaline earth-metal complex, or any combination thereof. A metal ion of the alkali metal complex may be a Li ion, a Na ion, a K ion, a Rb ion, and/or a Cs ion, and a metal ion of the alkaline earth-metal complex may be a Be ion, a Mg ion, a Ca ion, a Sr ion, and/or a Ba ion. A ligand coordinated with the metal ion of the alkali metal complex or the alkaline earth-metal complex may be a hydroxy quinoline, a hydroxy isoquinoline, a hydroxy benzoquinoline, a hydroxy acridine, a hydroxy phenanthridine, a hydroxy phenyloxazole, a hydroxy phenylthiazole, a hydroxy diphenyloxadiazole, a hydroxy diphenylthiadiazole, a hydroxy phenylpyridine, a hydroxy phenylbenzimidazole, a hydroxy phenylbenzothiazole, a bipyridine, a phenanthroline, a cyclopentadiene, or any combination thereof.

In an embodiment, the metal-containing material may include a Li complex. The Li complex may include, for example, Compound ET-D1 (LiQ) and/or ET-D2:

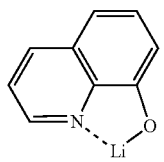
ET-D1

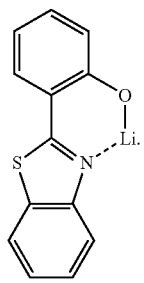
ET-D2

The electron transport region may include an electron injection layer that facilitates the injection of electrons from the second electrode 150. The electron injection layer may directly contact (e.g., physically contact) the second electrode 150.

The electron injection layer may have: i) a single-layered structure including (e.g., consisting of) a single layer including (e.g., consisting of) a single material, ii) a single-layered structure including (e.g., consisting of) a single layer including a plurality of different materials, or iii) a multi-layered structure including a plurality of layers including different materials.

The electron injection layer may include an alkali metal, an alkaline earth metal, a rare earth metal, an alkali metal-containing compound, an alkaline earth metal-containing compound, a rare earth metal-containing compound, an alkali metal complex, an alkaline earth-metal complex, a rare earth metal complex, or any combination thereof.

The alkali metal may include Li, Na, K, Rb, Cs, or any combination thereof. The alkaline earth metal may include Mg, Ca, Sr, Ba, or any combination thereof. The rare earth metal may include Sc, Y, Ce, Tb, Yb, Gd, or any combination thereof.

The alkali metal-containing compound, the alkaline earth metal-containing compound, and the rare earth metal-containing compound may include oxides and/or halides (for example, fluorides, chlorides, bromides, and/or iodides) of the alkali metal, the alkaline earth metal, and the rare earth metal, telluride, or any combination thereof.

The alkali metal-containing compound may include alkali metal oxides, such as $Li_2O$, $Cs_2O$, and/or $K_2O$, and alkali metal halides, such as LiF, NaF, CsF, KF, LiI, NaI, CsI, and/or KI, or any combination thereof. The alkaline earth metal-containing compound may include an alkaline earth metal compound, such as BaO, SrO, CaO, $Ba_xSr_{1-x}O$ (x is a real number that satisfies the condition of 0<x<1), and/or $Ba_xCa_{1-x}O$ (x is a real number that satisfies the condition of 0<x<1). The rare earth metal-containing compound may include $YbF_3$, $ScF_3$, $Sc_2O_3$, $Y_2O_3$, $Ce_2O_3$, $GdF_3$, $TbF_3$, $YbI_3$, $ScI_3$, $TbI_3$, or any combination thereof. In an embodiment, the rare earth metal-containing compound may include lanthanide metal telluride. Examples of the lanthanide metal telluride may include LaTe, CeTe, PrTe, NdTe, PmTe, SmTe, EuTe, GdTe, TbTe, DyTe, HoTe, ErTe, TmTe, YbTe, LuTe, $La_2Te_3$, $Ce_2Te_3$, $Pr_2Te_3$, $Nd_2Te_3$, $Pm_2Te_3$, $Sm_2Te_3$, $Eu_2Te_3$, $Gd_2Te_3$, $Tb_2Te_3$, $Dy_2Te_3$, $Ho_2Te_3$, $Er_2Te_3$, $Tm_2Te_3$, $Yb_2Te_3$, and $Lu_2Te_3$.

The alkali metal complex, the alkaline earth-metal complex, and the rare earth metal complex may include i) one of ions of the alkali metal, the alkaline earth metal, and the rare earth metal and ii) as a ligand linked to the metal ion, for example, hydroxyquinoline, hydroxyan isoquinoline, hydroxybenzoquinoline, hydroxyacridine, hydroxyphenanthridine, hydroxyphenyloxazole, hydroxyphenylthiazole, hydroxydiphenyloxadiazole, hydroxydiphenylthiadiazole, hydroxyphenylpyridine, hydroxyphenyl benzimidazole, hydroxyphenylbenzothiazole, bipyridine, phenanthroline, cyclopentadiene, or any combination thereof.

The electron injection layer may include (e.g., consist of) an alkali metal, an alkaline earth metal, a rare earth metal, an alkali metal-containing compound, an alkaline earth metal-containing compound, a rare earth metal-containing compound, an alkali metal complex, an alkaline earth-metal complex, a rare earth metal complex, or any combination thereof, or may further include an organic material (for example, a compound represented by Formula 601).

In an embodiment, the electron injection layer may include (e.g., consist of) i) an alkali metal-containing compound (for example, an alkali metal halide), or ii) a) an alkali metal-containing compound (for example, an alkali metal halide); and b) an alkali metal, an alkaline earth metal, a rare earth metal, or any combination thereof. In an embodiment, the electron injection layer may be a KI:Yb co-deposited layer and/or a RbI:Yb co-deposited layer.

When the electron injection layer further includes an organic material, an alkali metal, an alkaline earth metal, a rare earth metal, an alkali metal-containing compound, an alkaline earth metal-containing compound, a rare earth metal-containing compound, an alkali metal complex, an alkaline earth-metal complex, a rare earth metal complex, or any combination thereof may be homogeneously or non-homogeneously dispersed in a matrix including the organic material.

A thickness of the electron injection layer may be in the range of about 1 Å to about 100 Å, for example, about 3 Å to about 90 Å. When the thickness of the electron injection layer is within the range described above, the electron injection layer may have suitable or satisfactory electron injection characteristics without a substantial increase in driving voltage.

Second Electrode 150

The second electrode 150 may be on the interlayer 130 having such a structure. The second electrode 150 may be a cathode, which is an electron injection electrode, and as the material for forming the second electrode 150, a metal, an alloy, an electrically conductive compound, or any combination thereof, each having a low work function, may be used.

The second electrode 150 may include lithium (Li), silver (Ag), magnesium (Mg), aluminum (Al), aluminum-lithium (Al—Li), calcium (Ca), magnesium-indium (Mg—In), magnesium-silver (Mg—Ag), ytterbium (Yb), silver-ytterbium (Ag—Yb), ITO, IZO, or any combination thereof. The second electrode 150 may be a transmissive electrode, a semi-transmissive electrode, or a reflective electrode.

The second electrode 150 may have a single-layered structure or a multi-layered structure including two or more layers.

Capping Layer

A first capping layer may be outside the first electrode 110, and/or a second capping layer may be outside the second electrode 150. In more detail, the light-emitting device 10 may have a structure in which the first capping layer, the first electrode 110, the interlayer 130, and the second electrode 150 are sequentially stacked in this stated order, a structure in which the first electrode 110, the interlayer 130, the second electrode 150, and the second capping layer are sequentially stacked in this stated order, or a structure in which the first capping layer, the first electrode 110, the interlayer 130, the second electrode 150, and the second capping layer are sequentially stacked in this stated order.

Light generated in an emission layer of the interlayer 130 of the light-emitting device 10 may be extracted toward the outside through the first electrode 110, which is a semi-transmissive electrode or a transmissive electrode, and the first capping layer, and light generated in an emission layer of the interlayer 130 of the light-emitting device 10 may be extracted toward the outside through the second electrode 150, which is a semi-transmissive electrode or a transmissive electrode, and the second capping layer.

The first capping layer and the second capping layer may increase external luminescence efficiency according to the principle of constructive interference. Accordingly, light extraction efficiency of the light-emitting device 10 is increased, so that the luminescence efficiency of the light-emitting device 10 may be improved.

Each of the first capping layer and the second capping layer may include a material having a refractive index of 1.6 or more (at a wavelength of 589 nm).

The first capping layer and the second capping layer may each independently include an organic capping layer including an organic material, an inorganic capping layer including an inorganic material, or a composite capping layer including an organic material and an inorganic material.

At least one selected from the first capping layer and the second capping layer may each independently include a carbocyclic compound, a heterocyclic compound, an amine group-containing compound, a porphyrine derivative, a phthalocyanine derivative, a naphthalocyanine derivative, an alkali metal complex, an alkaline earth-metal complex, or any combination thereof. The carbocyclic compound, the heterocyclic compound, and the amine group-containing compound may be optionally substituted with a substituent containing O, N, S, Se, Si, F, Cl, Br, I, or any combination thereof. In an embodiment, at least one selected from the first capping layer and the second capping layer may each independently include an amine group-containing compound.

In an embodiment, at least one of the first capping layer and second capping layer may each independently include a compound represented by Formula 201, a compound represented by Formula 202, or any combination thereof.

In an embodiment, at least one of the first capping layer and the second capping layer may each independently include one of Compounds HT28 to HT33, one of Compounds CP1 to CP6, β-NPB, or any combination thereof:

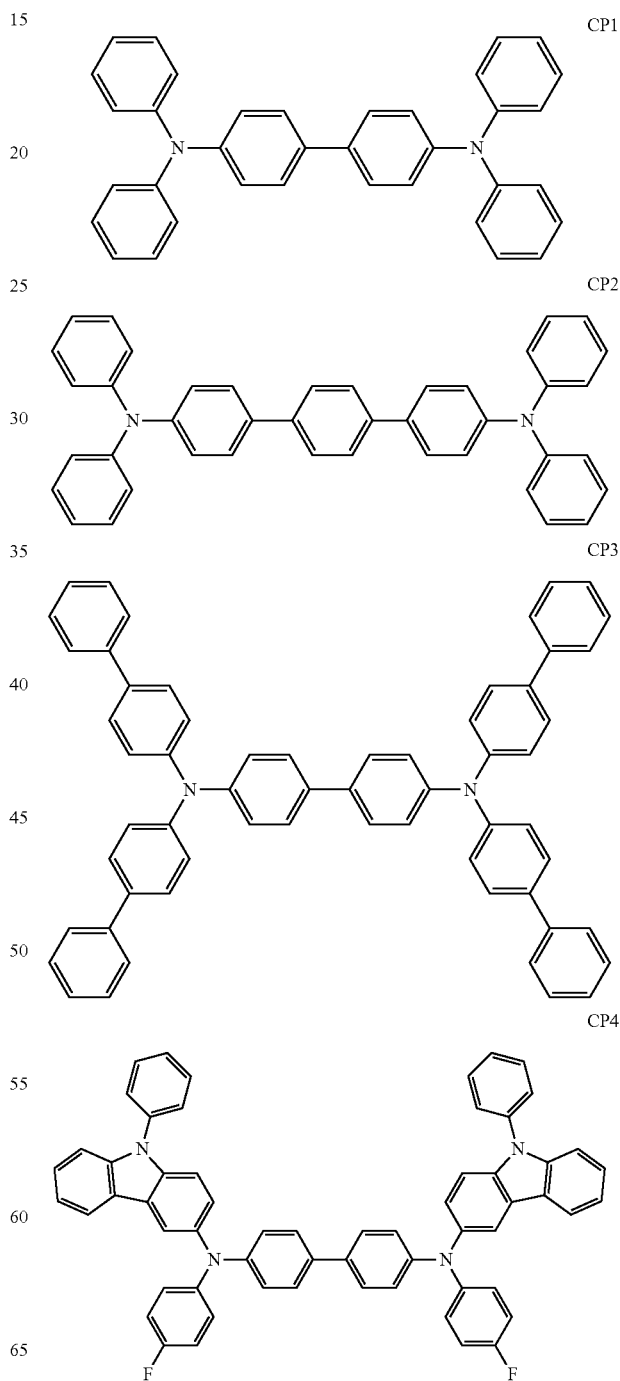

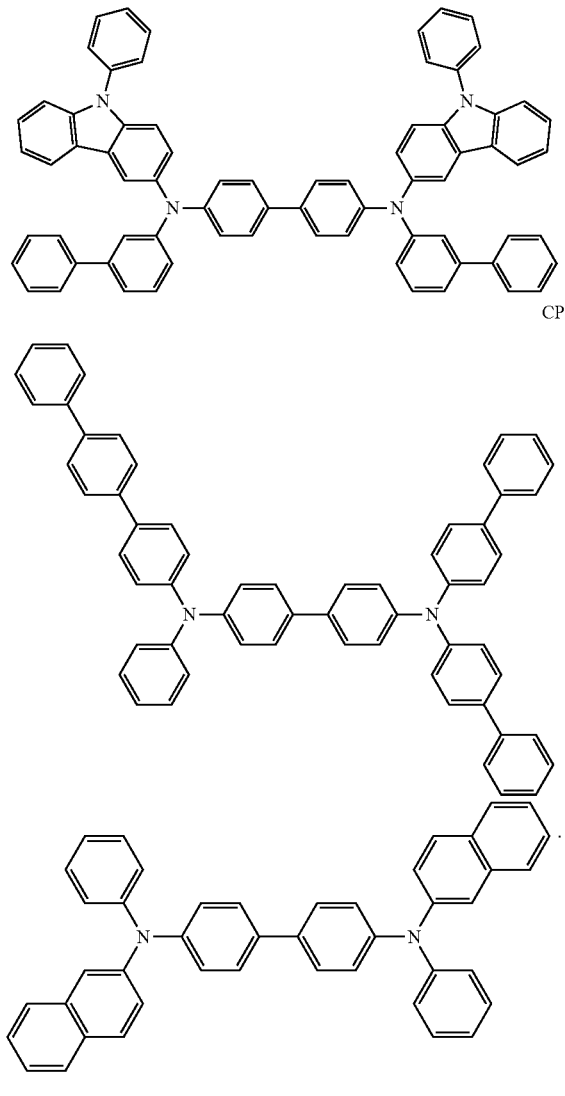

β-NPB

Electronic Apparatus

The light-emitting device may be included in various suitable electronic apparatuses. In an embodiment, an electronic apparatus including the light-emitting device may be a light-emitting apparatus, an authentication apparatus, and/or the like.

The electronic apparatus (for example, light-emitting apparatus) may further include, in addition to the light-emitting device, i) a color filter, ii) a color conversion layer, or iii) a color filter and a color conversion layer. The color filter and/or the color conversion layer may be in at least one traveling direction of light emitted from the light-emitting device. In an embodiment, light emitted from the light-emitting device may be blue light and/or white light. The light-emitting device may be the same as described above. In an embodiment, the color conversion layer may include a quantum dot. The quantum dot may be, for example, a quantum dot as described elsewhere herein.

The electronic apparatus may include a first substrate. The first substrate may include a plurality of subpixel areas, the color filter may include a plurality of color filter areas respectively corresponding to the plurality of subpixel areas, and the color conversion layer may include a plurality of color conversion areas respectively corresponding to the plurality of subpixel areas.

A pixel-defining film may be between the plurality of subpixel areas to define each of the subpixel areas.

The color filter may further include a plurality of color filter areas and light-blocking patterns between the plurality of color filter areas, and the color conversion layer may further include a plurality of color conversion areas and light-blocking patterns between the plurality of color conversion areas.

The plurality of color filter areas (or the plurality of color conversion areas) may include a first area emitting first-color light, a second area emitting second-color light, and/or a third area emitting third-color light, and the first-color light, the second-color light, and/or the third-color light may have different maximum emission wavelengths from one another. In an embodiment, the first-color light may be red light, the second-color light may be green light, and the third-color light may be blue light. In an embodiment, the plurality of color filter areas (or the plurality of color conversion areas) may include quantum dots. In more detail, the first area may include a red quantum dot, the second area may include a green quantum dot, and the third area may not include a quantum dot. The quantum dot is the same as described elsewhere in the present specification. Each of the first area, the second area and/or the third area may further include a scattering body.

In an embodiment, the light-emitting device may emit a first light, the first area may absorb the first light to emit a first first-color light, the second area may absorb the first light to emit a second first-color light, and the third area may absorb the first light to emit a third first-color light. In this regard, the first first-color light, the second first-color light, and the third first-color light may have different maximum emission wavelengths from one another. In more detail, the first light may be blue light, the first first-color light may be red light, the second first-color light may be green light, and the third first-color light may be blue light.

The electronic apparatus may further include a thin-film transistor in addition to the light-emitting device as described above. The thin-film transistor may include a source electrode, a drain electrode, and an activation layer (also referred to as an active layer), wherein any one selected from the source electrode and the drain electrode may be electrically coupled to any one selected from the first electrode and the second electrode of the light-emitting device.

The thin-film transistor may further include a gate electrode, a gate insulation layer, and/or the like.

The active layer may include crystalline silicon, amorphous silicon, an organic semiconductor, an oxide semiconductor, and/or the like.

The electronic apparatus may further include a sealing portion for sealing the light-emitting device. The sealing portion may be between the color filter and/or the color conversion layer and the light-emitting device. The sealing portion allows light from the light-emitting device to be extracted to the outside, while concurrently (e.g., simultaneously) preventing or reducing penetration of ambient air and/or moisture into the light-emitting device. The sealing portion may be a sealing substrate including a transparent glass substrate and/or a plastic substrate. The sealing portion may be a thin film encapsulation layer including one or more organic layers and/or one or more inorganic layers. When the sealing portion is a thin film encapsulation layer, the electronic apparatus may be flexible.

On the sealing portion, in addition to the color filter and/or the color conversion layer, various suitable functional layers may be further included according to the use of the electronic apparatus. Examples of the functional layers may include a touch screen layer, a polarizing layer, and the like. The touch screen layer may be a pressure-sensitive touch screen layer, a capacitive touch screen layer, and/or an infrared touch screen layer. The authentication apparatus may be, for example, a biometric authentication apparatus for authenticating an individual by using biometric information of a biometric body (for example, a fingertip, a pupil, and/or the like).

The authentication apparatus may further include, in addition to the light-emitting device, a biometric information collector.

The electronic apparatus may be applied to various suitable displays, light sources, lighting, personal computers (for example, a mobile personal computer), mobile phones, digital cameras, electronic organizers, electronic dictionaries, electronic game machines, medical instruments (for example, electronic thermometers, sphygmomanometers, blood glucose meters, pulse measurement devices, pulse wave measurement devices, electrocardiogram displays, ultrasonic diagnostic devices, and/or endoscope displays), fish finders, various suitable measuring instruments, meters (for example, meters for a vehicle, an aircraft, and/or a vessel), projectors, and/or the like.

Figure 2:
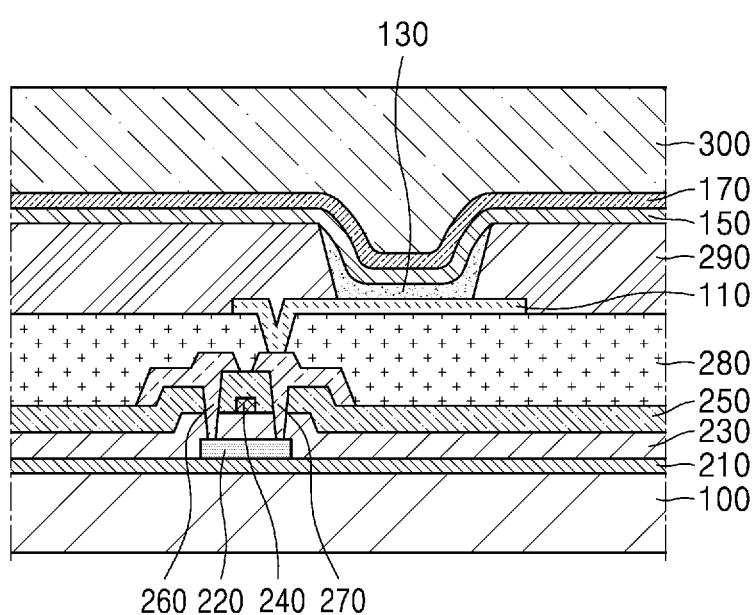
Figure 3:
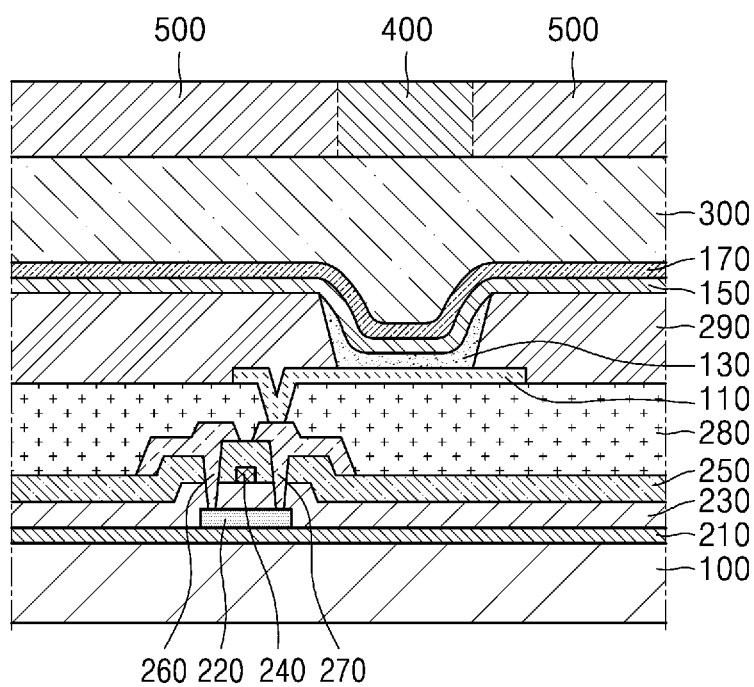

Description of FIGS. 2 and 3

FIG. 2 is a cross-sectional view of a light-emitting apparatus according to an embodiment.

The light-emitting apparatus of FIG. 2 includes a substrate 100, a thin-film transistor (TFT), a light-emitting device, and an encapsulation portion 300 that seals the light-emitting device.

The substrate 100 may be a flexible substrate, a glass substrate, and/or a metal substrate. A buffer layer 210 may be on the substrate 100. The buffer layer 210 prevents or reduces penetration of impurities through the substrate 100 and may provide a flat surface on the substrate 100.

The TFT may be on the buffer layer 210. The TFT may include an activation layer 220, a gate electrode 240, a source electrode 260, and a drain electrode 270.

The activation layer 220 may include an inorganic semiconductor such as silicon and/or polysilicon, an organic semiconductor, and/or an oxide semiconductor, and may include a source region, a drain region, and a channel region.

A gate insulating film 230 for insulating the activation layer 220 from the gate electrode 240 may be on the activation layer 220, and the gate electrode 240 may be on the gate insulating film 230.

An interlayer insulating film 250 may be on the gate electrode 240. The interlayer insulating film 250 is between the gate electrode 240 and the source electrode 260 to insulate the gate electrode 240 from the source electrode 260 and between the gate electrode 240 and the drain electrode 270 to insulate the gate electrode 240 from the drain electrode 270.

The source electrode 260 and the drain electrode 270 may be on the interlayer insulating film 250. The interlayer insulating film 250 and the gate insulating film 230 may expose the source region and the drain region of the activation layer 220, and the source electrode 260 and the drain electrode 270 may be in contact (e.g., physical contact) with the exposed portions of the source region and the drain region of the activation layer 220.

The TFT may be electrically coupled to the light-emitting device to drive the light-emitting device and may be protected by being covered with a passivation layer 280. The passivation layer 280 may include an inorganic insulating film, an organic insulating film, or a combination thereof. The light-emitting device is provided on the passivation layer 280. The light-emitting device includes the first electrode 110, the interlayer 130, and the second electrode 150.

The first electrode 110 may be on the passivation layer 280. The passivation layer 280 does not completely cover the drain electrode 270 and exposes a certain portion of the drain electrode 270, and the first electrode 110 may be connected to the exposed portion of the drain electrode 270.

A pixel defining layer 290 including an insulating material may be on the first electrode 110. The pixel defining layer 290 may expose a certain region of the first electrode 110, and the interlayer 130 may be formed in the exposed region of the first electrode 110. The pixel defining layer 290 may include a polyimide and/or polyacryl-based organic film. In one or more embodiments, at least some layers of the interlayer 130 may extend beyond the upper portion of the pixel defining layer 290 and may thus be in the form of a common layer.

The second electrode 150 may be on the interlayer 130, and a capping layer 170 may be additionally formed on the second electrode 150. The capping layer 170 may cover the second electrode 150.

The encapsulation portion 300 may be on the capping layer 170. The encapsulation portion 300 may be on the light-emitting device and protects the light-emitting device from moisture and/or oxygen. The encapsulation portion 300 may include: an inorganic film including silicon nitride (SiNx), silicon oxide (SiOx), indium tin oxide, indium zinc oxide, or a combination thereof; an organic film including polyethylene terephthalate, polyethylene naphthalate, polycarbonate, polyimide, polyethylene sulfonate, polyoxymethylene, polyarylate, hexamethyldisiloxane, an acrylic resin (for example, polymethyl methacrylate and/or polyacrylic acid), an epoxy-based resin (for example, aliphatic glycidyl ether (AGE), or any combination thereof; or a combination of an inorganic film and an organic film.

FIG. 3 is a cross-sectional view of a light-emitting apparatus according to another embodiment.

The light-emitting apparatus of FIG. 3 is the same as the light-emitting apparatus of FIG. 2, except that a light-blocking pattern 500 and a functional region 400 are additionally on the encapsulation portion 300. The functional region 400 may be i) a color filter area, ii) a color conversion area, or iii) a combination of the color filter area and the color conversion area. In an embodiment, the light-emitting device included in the light-emitting apparatus of FIG. 3 may be a tandem light-emitting device.

Preparation Method

Layers constituting the hole transport region, an emission layer, and layers constituting the electron transport region may be formed in a certain region by using one or more suitable methods selected from vacuum deposition, spin coating, casting, Langmuir-Blodgett (LB) deposition, ink-jet printing, laser-printing, and laser-induced thermal imaging.

When layers constituting the hole transport region, the emission layer, and layers constituting the electron transport region are formed by vacuum deposition, the deposition may be performed at a deposition temperature of about 100° C. to about 500° C., a vacuum degree of about $10^{-8}$ torr to about $10^{-3}$ torr, and a deposition speed of about 0.01 Å/sec to about 100 Å/sec by taking into account a material to be included in a layer to be formed and the structure of a layer to be formed.

Definition of at Least Some Terms

The term "$C_3$-$C_{60}$ carbocyclic group," as used herein, refers to a cyclic group that consists of carbon only and has three to sixty carbon atoms, and the term "$C_1$-$C_{60}$ heterocyclic group," as used herein, refers to a cyclic group that has one to sixty carbon atoms and further includes, in addition to carbon, a heteroatom. The $C_3$-$C_{60}$ carbocyclic group and the $C_1$-$C_{60}$ heterocyclic group may each be a monocyclic group that consists of one ring or a polycyclic group in which two or more rings are condensed with each other (e.g., combined together with each other). In an embodiment, the number of ring-forming atoms of the $C_1$-$C_{60}$ heterocyclic group may be from 3 to 61.

The term "cyclic group," as used herein, includes the $C_3$-$C_{60}$ carbocyclic group and the $C_1$-$C_{60}$ heterocyclic group.

The term "π electron-rich $C_3$-$C_{60}$ cyclic group," as used herein, refers to a cyclic group that has three to sixty carbon atoms and does not include *—N=*' as a ring-forming moiety, and the term "π-electron-deficient nitrogen-containing $C_1$-$C_{60}$ cyclic group," as used herein, refers to a heterocyclic group that has one to sixty carbon atoms and includes *—N=*' as a ring-forming moiety.

In an embodiment, the $C_3$-$C_{60}$ carbocyclic group may be i) a group T1 or ii) a condensed cyclic group in which two or more groups T1 are condensed with (e.g., combined together with) each other (for example, a cyclopentadiene group, an adamantane group, a norbornane group, a benzene group, a pentalene group, a naphthalene group, an azulene group, an indacene group, acenaphthylene group, a phenalene group, a phenanthrene group, an anthracene group, a fluoranthene group, a triphenylene group, a pyrene group, a chrysene group, a perylene group, a pentaphene group, a heptalene group, a naphthacene group, a picene group, a hexacene group, a pentacene group, a rubicene group, a coronene group, an ovalene group, an indene group, a fluorene group, a spiro-bifluorene group, a benzofluorene group, an indenophenanthrene group, or an indenoanthracene group), the $C_1$-$C_{60}$ heterocyclic group may be i) a group T2, ii) a condensed cyclic group in which two or more groups T2 are condensed with (e.g., combined together with) each other, or iii) a condensed cyclic group in which at least one group T2 and at least one group T1 are condensed with (e.g., combined together with) each other (for example, a pyrrole group, a thiophene group, a furan group, an indole group, a benzoindole group, a naphthoindole group, an isoindole group, a benzoisoindole group, a naphthoisoindole group, a benzosilole group, a benzothiophene group, a benzofuran group, a carbazole group, a dibenzosilole group, a dibenzothiophene group, a dibenzofuran group, an indenocarbazole group, an indolocarbazole group, a benzofurocarbazole group, a benzothienocarbazole group, a benzosilolocarbazole group, a benzoindolocarbazole group, a benzocarbazole group, a benzonaphthofuran group, a benzonaphthothiophene group, a benzonaphthosilole group, a benzofurodibenzofuran group, a benzofurodibenzothiophene group, a benzothieno dibenzothiophene group, a pyrazole group, an imidazole group, a triazole group, an oxazole group, an isoxazole group, an oxadiazole group, a thiazole group, an isothiazole group, a thiadiazole group, a benzopyrazole group, a benzimidazole group, a benzoxazole group, a benzoisoxazole group, a benzothiazole group, a benzoisothiazole group, a pyridine group, a pyrimidine group, a pyrazine group, a pyridazine group, a triazine group, a quinoline group, an isoquinoline group, a benzoquinoline group, a benzoisoquinoline group, a quinoxaline group, a benzoquinoxaline group, a quinazoline group, a benzoquinazoline group, a phenanthroline group, a cinnoline group, a phthalazine group, a naphthyridine group, an imidazopyridine group, an imidazopyrimidine group, an imidazotriazine group, an imidazopyrazine group, an imidazopyridazine group, an azacarbazole group, an azafluorene group, an azadibenzosilole group, an azadibenzothiophene group, or an azadibenzofuran group), the π electron-rich $C_3$-$C_{60}$ cyclic group may be i) a group T1, ii) a condensed cyclic group in which two or more groups T1 are condensed with (e.g., combined together with) each other, iii) a group T3, iv) a condensed cyclic group in which two or more groups T3 are condensed with (e.g., combined together with) each other, or v) a condensed cyclic group in which at least one group T3 and at least one group T1 are condensed with (e.g., combined together with) each other (for example, a $C_3$-$C_{60}$ carbocyclic group, a pyrrole group, a thiophene group, a furan group, an indole group, a benzoindole group, a naphthoindole group, an isoindole group, a benzoisoindole group, a naphthoisoindole group, a benzosilole group, a benzothiophene group, a benzofuran group, a carbazole group, a dibenzosilole group, a dibenzothiophene group, a dibenzofuran group, an indenocarbazole group, an indolocarbazole group, a benzofurocarbazole group, a benzothienocarbazole group, a benzosilolocarbazole group, a benzoindolocarbazole group, a benzocarbazole group, a benzonaphthofuran group, a benzonaphthothiophene group, a benzonaphthosilole group, a benzofurodibenzofuran group, a benzofurodibenzothiophene group, or a benzothienodibenzothiophene group), the π-electron-deficient nitrogen-containing $C_1$-$C_{60}$ cyclic group may be i) a group T4, ii) a condensed cyclic group in which two or more groups T4 are condensed with (e.g., combined together with) each other, iii) a condensed cyclic group in which at least one group T4 and at least one group T1 are condensed with (e.g., combined together with) each other, iv) a condensed cyclic group in which at least one group T4 and at least one group T3 are condensed with (e.g., combined together with) each other, or v) a condensed cyclic group in which at least one group T4, at least one group T1, and at least one group T3 are condensed with (e.g., combined together with) each other (for example, a pyrazole group, an imidazole group, a triazole group, an oxazole group, an isoxazole group, an oxadiazole group, a thiazole group, an isothiazole group, a thiadiazole group, a benzopyrazole group, a benzimidazole group, a benzoxazole group, a benzoisoxazole group, a benzothiazole group, a benzoisothiazole group, a pyridine group, a pyrimidine group, a pyrazine group, a pyridazine group, a triazine group, a quinoline group, an isoquinoline group, a benzoquinoline group, a benzoisoquinoline group, a quinoxaline group, a benzoquinoxaline group, a quinazoline group, a benzoquinazoline group, a phenanthroline group, a cinnoline group, a phthalazine group, a naphthyridine group, an imidazopyridine group, an imidazopyrimidine group, an imidazotriazine group, an imidazopyrazine group, an imidazopyridazine group, an azacarbazole group, an azafluorene group, an azadibenzosilole group, an azadibenzothiophene group, or an azadibenzofuran group), the group T1 may be a cyclopropane group, a cyclobutane group, a cyclopentane group, a cyclohexane group, a cycloheptane group, a cyclooctane group, a cyclobutene group, a cyclopentene group, a cyclopentadiene group, a cyclohexene group, a cyclohexadiene group, a cycloheptene group, an adamantane group, a norbornane group (or, a bicyclo[2.2.1]heptane group), a norbornene group, a bicyclo[1.1.1]pentane group, a bicyclo[2.1.1]hexane group, a bicyclo[2.2.2]octane group, or a benzene group, the group T2 may be a furan group, a thiophene group, a 1H-pyrrole group, a silole group, a borole group, a 2H-pyrrole group, a 3H-pyrrole group, an imidazole group, a pyrazole group, a triazole group, a tetrazole group, an oxazole group, an isoxazole group, an oxadiazole group, a thiazole group, an isothiazole group, a thiadiazole group, an azasilole group, an azaborole group, a pyridine group, a pyrimidine group, a pyrazine group, a pyridazine group, a triazine group, or a tetrazine group, the group T3 may be a furan group, a thiophene group, a 1H-pyrrole group, a silole group, or a borole group, and the group T4 may be a 2H-pyrrole group, a 3H-pyrrole group, an imidazole group, a pyrazole group, a triazole group, a tetrazole group, an oxazole group, an isoxazole group, an oxadiazole group, a thiazole group, an isothiazole group, a thiadiazole group, an azasilole group, an azaborole group, a pyridine group, a pyrimidine group, a pyrazine group, a pyridazine group, a triazine group, or a tetrazine group.

The term "the cyclic group," "the $C_3$-$C_{60}$ carbocyclic group," "the $C_1$-$C_{60}$ heterocyclic group," "the π electron-rich $C_3$-$C_{60}$ cyclic group," or "the π-electron-deficient nitrogen-containing $C_1$-$C_{60}$ cyclic group," as used herein, refer to a group that is condensed with (e.g., combined together with) a cyclic group, a monovalent group, a polyvalent group (for example, a divalent group, a trivalent group, a tetravalent group, or the like), according to the structure of a formula described with corresponding terms. In an embodiment, "a benzene group" may be a benzo group, a phenyl group, a phenylene group, or the like, which may be easily understand by one of ordinary skill in the art according to the structure of a formula including the "benzene group."

In an embodiment, examples of the monovalent $C_3$-$C_{60}$ carbocyclic group and the monovalent $C_1$-$C_{60}$ heterocyclic group may include a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_1$-$C_{60}$ heteroaryl group, a monovalent non-aromatic condensed polycyclic group, and a monovalent non-aromatic condensed heteropolycyclic group, and examples of the divalent $C_3$-$C_{60}$ carbocyclic group and the divalent $C_1$-$C_{60}$ heterocyclic group may include a $C_3$-$C_{10}$ cycloalkylene group, a $C_1$-$C_{10}$ heterocycloalkylene group, a $C_3$-$C_{10}$ cycloalkenylene group, a $C_1$-$C_{10}$ heterocycloalkenylene group, a $C_6$-$C_{60}$ arylene group, a $C_1$-$C_{60}$ heteroarylene group, a divalent non-aromatic condensed polycyclic group, and a substituted or unsubstituted divalent non-aromatic condensed heteropolycyclic group.

The term "$C_1$-$C_{60}$ alkyl group," as used herein, refers to a linear or branched aliphatic hydrocarbon monovalent group having 1 to 60 carbon atoms, and examples thereof includes a methyl group, an ethyl group, an n-propyl group, an isopropyl group, an n-butyl group, a sec-butyl group, an isobutyl group, a tert-butyl group, an n-pentyl group, a tert-pentyl group, a neopentyl group, an isopentyl group, a sec-pentyl group, a 3-pentyl group, a sec-isopentyl group, an n-hexyl group, an isohexyl group, a sec-hexyl group, a tert-hexyl group, an n-heptyl group, an isoheptyl group, a sec-heptyl group, a tert-heptyl group, an n-octyl group, an isooctyl group, a sec-octyl group, a tert-octyl group, an n-nonyl group, an isononyl group, a sec-nonyl group, a tert-nonyl group, an n-decyl group, an isodecyl group, a sec-decyl group, and a tert-decyl group. The term "$C_1$-$C_{60}$ alkylene group," as used herein, refers to a divalent group having substantially the same structure as the $C_1$-$C_{60}$ alkyl group.

The term "$C_2$-$C_{60}$ alkenyl group," as used herein, refers to a monovalent hydrocarbon group having at least one carbon-carbon double bond at a main chain (e.g., in the middle) or at a terminal end (e.g., the terminus) of a $C_2$-$C_{60}$ alkyl group, and examples thereof include an ethenyl group, a propenyl group, and a butenyl group. The term "$C_2$-$C_{60}$ alkenylene group," as used herein, refers to a divalent group having substantially the same structure as the $C_2$-$C_{60}$ alkenyl group.

The term "$C_2$-$C_{60}$ alkynyl group," as used herein, refers to a monovalent hydrocarbon group having at least one carbon-carbon triple bond at a main chain (e.g., in the middle) or at a terminal end (e.g., the terminus) of a $C_2$-$C_{60}$ alkyl group, and examples thereof include an ethynyl group and a propynyl group. The term "$C_2$-$C_{60}$ alkynylene group," as used herein, refers to a divalent group having substantially the same structure as the $C_2$-$C_{60}$ alkynyl group.

The term "$C_1$-$C_{60}$ alkoxy group," as used herein, refers to a monovalent group represented by —$OA_{101}$ (wherein $A_{101}$ is the $C_1$-$C_{60}$ alkyl group), and examples thereof include a methoxy group, an ethoxy group, and an isopropyloxy group.

The term "$C_3$-$C_{10}$ cycloalkyl group," as used herein, refers to a monovalent saturated hydrocarbon cyclic group having 3 to 10 carbon atoms, and examples thereof include a cyclopropyl group, a cyclobutyl group, a cyclopentyl group, a cyclohexyl group, a cycloheptyl group, a cyclooctyl group, an adamantanyl group, a norbornanyl group (or a bicyclo[2.2.1]heptyl group), a bicyclo[1.1.1]pentyl group, a bicyclo[2.1.1]hexyl group, and a bicyclo[2.2.2]octyl group. The term "$C_3$-$C_{10}$ cycloalkylene group" as used herein refers to a divalent group having substantially the same structure as the $C_3$-$C_{10}$ cycloalkyl group.

The term "$C_1$-$C_{10}$ heterocycloalkyl group," as used herein, refers to a monovalent cyclic group that further includes, in addition to a carbon atom, at least one heteroatom as a ring-forming atom and has 1 to 10 carbon atoms, and examples thereof include a 1,2,3,4-oxatriazolidinyl group, a tetrahydrofuranyl group, and a tetrahydrothiophenyl group. The term "$C_1$-$C_{10}$ heterocycloalkylene group," as used herein, refers to a divalent group having substantially the same structure as the $C_1$-$C_{10}$ heterocycloalkyl group.

The term "$C_3$-$C_{10}$ cycloalkenyl group," as used herein, refers to a monovalent cyclic group that has 3 to 10 carbon atoms and at least one carbon-carbon double bond in the ring thereof and no aromaticity (e.g., is not aromatic), and examples thereof include a cyclopentenyl group, a cyclohexenyl group, and a cycloheptenyl group. The term "$C_3$-

$C_{10}$ cycloalkenylene group," as used herein, refers to a divalent group having substantially the same structure as the $C_3$-$C_{10}$ cycloalkenyl group.

The term "$C_1$-$C_{10}$ heterocycloalkenyl group," as used herein, refers to a monovalent cyclic group that has, in addition to a carbon atom, at least one heteroatom as a ring-forming atom, 1 to 10 carbon atoms, and at least one carbon-carbon double bond in the cyclic structure thereof. Examples of the $C_1$-$C_{10}$ heterocycloalkenyl group include a 4,5-dihydro-1,2,3,4-oxatriazolyl group, a 2,3-dihydrofuranyl group, and a 2,3-dihydrothiophenyl group. The term "$C_1$-$C_{10}$ heterocycloalkenylene group," as used herein, refers to a divalent group having substantially the same structure as the $C_1$-$C_{10}$ heterocycloalkenyl group.

The term "$C_6$-$C_{60}$ aryl group," as used herein, refers to a monovalent group having a carbocyclic aromatic system having 6 to 60 carbon atoms, and the term "$C_6$-$C_{60}$ arylene group," as used herein, refers to a divalent group having a carbocyclic aromatic system having 6 to 60 carbon atoms. Examples of the $C_6$-$C_{60}$ aryl group include a fluorenyl group, a phenyl group, a pentalenyl group, a naphthyl group, an azulenyl group, an indacenyl group, an acenaphthyl group, a phenalenyl group, a phenanthrenyl group, an anthracenyl group, a fluoranthenyl group, a triphenylenyl group, a pyrenyl group, a chrysenyl group, a perylenyl group, a pentaphenyl group, a heptalenyl group, a naphthacenyl group, a picenyl group, a hexacenyl group, a pentacenyl group, a rubicenyl group, a coronenyl group, and an ovalenyl group. When the $C_6$-$C_{60}$ aryl group and the $C_6$-$C_{60}$ arylene group each include two or more rings, the two or more rings may be condensed to each other (e.g., combined together with each other).

The term "$C_1$-$C_{60}$ heteroaryl group," as used herein, refers to a monovalent group having a heterocyclic aromatic system that has, in addition to a carbon atom, at least one heteroatom as a ring-forming atom, and 1 to 60 carbon atoms. The term "$C_1$-$C_{60}$ heteroarylene group," as used herein, refers to a divalent group having a heterocyclic aromatic system that has, in addition to a carbon atom, at least one heteroatom as a ring-forming atom, and 1 to 60 carbon atoms. Examples of the $C_1$-$C_{60}$ heteroaryl group include a carbazolyl group, a pyridinyl group, a pyrimidinyl group, a pyrazinyl group, a pyridazinyl group, a triazinyl group, a quinolinyl group, a benzoquinolinyl group, an isoquinolinyl group, a benzoisoquinolinyl group, a quinoxalinyl group, a benzoquinoxalinyl group, a quinazolinyl group, a benzoquinazolinyl group, a cinnolinyl group, a phenanthrolinyl group, a phthalazinyl group, and a naphthyridinyl group. When the $C_1$-$C_{60}$ heteroaryl group and the $C_1$-$C_{60}$ heteroarylene group each include two or more rings, the two or more rings may be condensed with (e.g., combined together with) each other.

The term "monovalent non-aromatic condensed polycyclic group," as used herein, refers to a monovalent group (for example, having 8 to 60 carbon atoms) having two or more rings condensed with (e.g., combined together with) each other, only carbon atoms as ring-forming atoms, and non-aromaticity in its entire molecular structure (e.g., is not aromatic when considered as a whole). Examples of the monovalent non-aromatic condensed polycyclic group include an indenyl group, a fluorenyl group, a spiro-bifluorenyl group, a benzofluorenyl group, an indenophenanthrenyl group, and an indenoanthracenyl group. The term "divalent non-aromatic condensed polycyclic group," as used herein, refers to a divalent group having substantially the same structure as the monovalent non-aromatic condensed polycyclic group.

The term "monovalent non-aromatic condensed heteropolycyclic group," as used herein, refers to a monovalent group (for example, having 1 to 60 carbon atoms) having two or more rings condensed to each other (e.g., combined together with each other), at least one heteroatom other than carbon atoms, as a ring-forming atom, and non-aromaticity in its entire molecular structure (e.g., is not aromatic when considered as a whole). Examples of the monovalent non-aromatic condensed heteropolycyclic group includes a pyrrolyl group, a thiophenyl group, a furanyl group, an indolyl group, a benzoindolyl group, a naphthoindolyl group, an isoindolyl group, a benzoisoindolyl group, a naphthoisoindolyl group, a benzosilolyl group, a benzothiophenyl group, a benzofuranyl group, a carbazolyl group, a dibenzosilolyl group, a dibenzothiophenyl group, a dibenzofuranyl group, an azacarbazolyl group, an azafluorenyl group, an azadibenzosilolyl group, an azadibenzothiophenyl group, an azadibenzofuranyl group, a pyrazolyl group, an imidazolyl group, a triazolyl group, a tetrazolyl group, an oxazolyl group, an isoxazolyl group, a thiazolyl group, an isothiazolyl group, an oxadiazolyl group, a thiadiazolyl group, a benzopyrazolyl group, a benzimidazolyl group, a benzoxazolyl group, a benzothiazolyl group, a benzoxadiazolyl group, a benzothiadiazolyl group, an imidazopyridinyl group, an imidazopyrimidinyl group, an imidazotriazinyl group, an imidazopyrazinyl group, an imidazopyridazinyl group, an indenocarbazolyl group, an indolocarbazolyl group, a benzofurocarbazolyl group, a benzothienocarbazolyl group, a benzosilolocarbazolyl group, a benzoindolocarbazolyl group, a benzocarbazolyl group, a benzonaphthofuranyl group, a benzonaphthothiophenyl group, a benzonaphthosilolyl group, a benzofurodibenzofuranyl group, a benzofurodibenzothiophenyl group, and a benzothienodibenzothiophenyl group. The term "divalent non-aromatic condensed heteropolycyclic group," as used herein, refers to a divalent group having substantially the same structure as the monovalent non-aromatic condensed heteropolycyclic group.

The term "$C_6$-$C_{60}$ aryloxy group," as used herein, refers to —$OA_{102}$ (wherein $A_{102}$ is the $C_6$-$C_{60}$ aryl group), and the term "$C_6$-$C_{60}$ arylthio group," as used herein, refers to —$SA_{103}$ (wherein $A_{103}$ is the $C_6$-$C_{60}$ aryl group).

The term "$R_{10a}$," as used herein, refers to:
deuterium (-D), —F, —Cl, —Br, —I, a hydroxyl group, a cyano group, or a nitro group;
a $C_1$-$C_{60}$ alkyl group, a $C_2$-$C_{60}$ alkenyl group, a $C_2$-$C_{60}$ alkynyl group, or a $C_1$-$C_{60}$ alkoxy group, each unsubstituted or substituted with deuterium, —F, —Cl, —Br, —I, a hydroxyl group, a cyano group, a nitro group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, —Si$(Q_{11})(Q_{12})(Q_{13})$, —N$(Q_{11})(Q_{12})$, —B$(Q_{11})(Q_{12})$, —C(=O)$(Q_{11})$, —S(=O)$_2$$(Q_{11})$, —P(=O)$(Q_{11})(Q_{12})$, or any combination thereof;
a $C_3$-$C_{60}$ carbocyclic group, a $C_1$-$C_{60}$ heterocyclic group, a $C_6$-$C_{60}$ aryloxy group, or a $C_6$-$C_{60}$ arylthio group, each unsubstituted or substituted with deuterium, —F, —Cl, —Br, —I, a hydroxyl group, a cyano group, a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, —Si$(Q_{21})(Q_{22})(Q_{23})$, —N$(Q_{21})(Q_{22})$, —B$(Q_{21})(Q_{22})$, —C(=O)$(Q_{21})$, —S(=O)$_2$$(Q_{21})$, —P(=O)$(Q_{21})(Q_{22})$, or any combination thereof; or
—Si$(Q_{31})(Q_{32})(Q_{33})$, —N$(Q_{31})(Q_{32})$, —B$(Q_{31})(Q_{32})$, —C(=O)$(Q_{31})$, —S(=O)$_2$$(Q_{31})$, or —P(=O)$(Q_{31})(Q_{32})$.

$Q_1$ to $Q_3$, $Q_{11}$ to $Q_{13}$, $Q_{21}$ to $Q_{23}$ and $Q_{31}$ to $Q_{33}$ used herein may each independently be: hydrogen; deuterium; —F; —Cl; —Br; —I; a hydroxyl group; a cyano group; a nitro group; a $C_1$-$C_{60}$ alkyl group; a $C_2$-$C_{60}$ alkenyl group; a $C_2$-$C_{60}$ alkynyl group; a $C_1$-$C_{60}$ alkoxy group; or a $C_3$-$C_{60}$ carbocyclic group or a $C_1$-$C_{60}$ heterocyclic group, each unsubstituted or substituted with deuterium, —F, a cyano group, a $C_1$-$C_{60}$ alkyl group, a $C_1$-$C_{60}$ alkoxy group, a phenyl group, a biphenyl group, or any combination thereof.

The term "heteroatom," as used herein, refers to any atom other than a carbon atom. Examples of the heteroatom include O, S, N, P, Si, B, Ge, Se, or any combination thereof.

The term "Ph," as used herein, refers to a phenyl group, the term "Me," as used herein, refers to a methyl group, the term "Et," as used herein, refers to an ethyl group, the term "ter-Bu" or "Bu$^t$," as used herein, refers to a tert-butyl group, and the term "OMe," as used herein, refers to a methoxy group.

The term "biphenyl group," as used herein, refers to "a phenyl group substituted with a phenyl group." In other words, the "biphenyl group" is a substituted phenyl group having a $C_6$-$C_{60}$ aryl group as a substituent.

The term "terphenyl group," as used herein, refers to "a phenyl group substituted with a biphenyl group." In other words, the "terphenyl group" is a substituted phenyl group having, as a substituent, a $C_6$-$C_{60}$ aryl group substituted with a $C_6$-$C_{60}$ aryl group.

* and *', as used herein, unless defined otherwise, each refer to a binding site to a neighboring atom in a corresponding formula.

Hereinafter, a compound according to embodiments and a light-emitting device according to embodiments will be described in more detail with reference to Synthesis Examples and Examples. The wording "B was used instead of A" used in describing Synthesis Examples refers to that an identical molar equivalent of B was used in place of A.

EXAMPLES

Synthesis Example 1: Synthesis of Compound 1

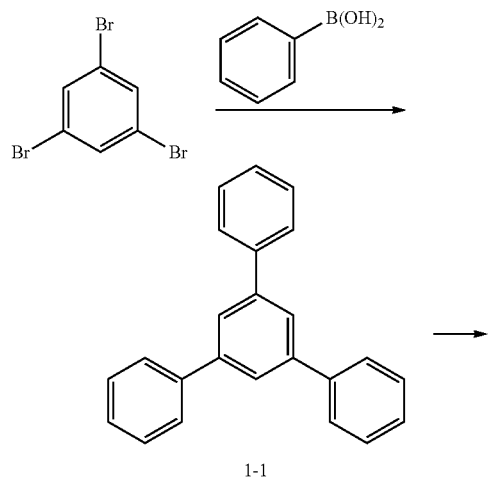

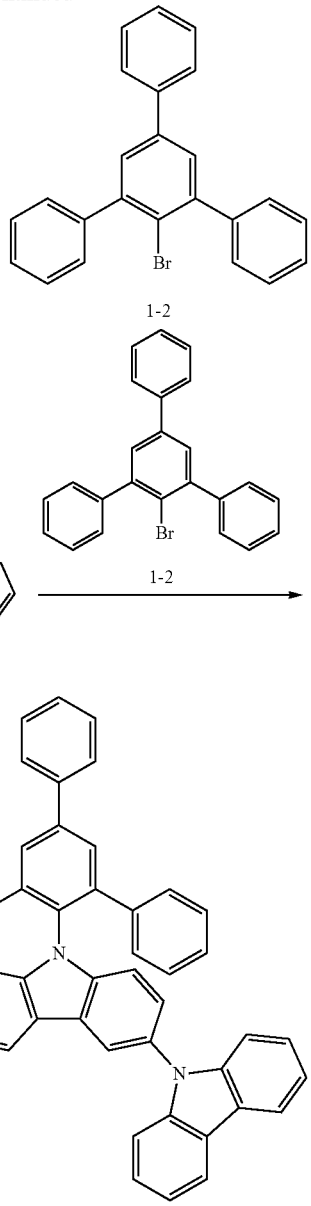

Synthesis of Intermediate 1-1

1,3,5-tribromobenzene (20 g), phenylboronic acid (22 g), and tetrakis(triphenylphosphine)palladium (0) (Pd(PPh$_3$)$_4$) (3.67 g) were added to a 2M K$_2$CO$_3$ solution (130 mL) and a tetrahydrofuran (THF) solution (400 mL), and then stirred at 90° C. for 12 hours. After completion of the reaction, the resultant reaction solution was extracted to thereby obtain an organic layer, which was then dried. A residue was separated and purified by column chromatography, followed by a sublimation purification to thereby obtain 18 g (yield of 92%) of Intermediate 1-1. Compound 1-1 was confirmed by LC-MS. (C24H18: M+1 306.41)

Synthesis of Intermediate 1-2

Intermediate 1-1 (18 g) was dissolved in a mixed solvent containing dichloromethane and acetic acid in a ratio of 1:1, and then Br$_2$ (2.88 mL) was added dropwise thereto at 0° C. and then stirred at room temperature for 12 hours. After completion of the reaction, an aqueous solution containing Na$_2$S$_2$O$_3$ and NaOH was used to perform quenching on the remaining Br$_2$ and HBr, and then an organic layer obtained by extracting the resultant solution was dried. A residue was separated and purified by column chromatography to thereby obtain Intermediate 1-2 (20 g, yield of 88%). Intermediate 1-2 was confirmed by LC-MS. (C24H17Br: M+1 385.30)

Synthesis of Compound 1

Intermediate 1-2 (2.32 g) and 3,9'-bi-9H-carbazole (CAS=18628-07-4) (2 g), sodium tert-butoxide (1.16 g), tris(dibenzylideneacetone)dipalladium (0) (Pd$_2$(dba)$_3$) (0.28 g), and rac-BI-DIME (CAS=1246888-90-3) (0.19 g) were dissolved in a toluene solvent (30 mL), and then stirred at 110° C. for 12 hours. After completion of the reaction, the resultant reaction solution was extracted to thereby obtain an organic layer, which was then dried. A residue was separated and purified by column chromatography, followed by a recrystallization and a sublimation purification to thereby obtain a high-purity Compound 1 (2 g, yield of 50%). Compound 1 was confirmed by LC-MS and 1H-NMR.

Synthesis Example 2: Synthesis of Compound 5

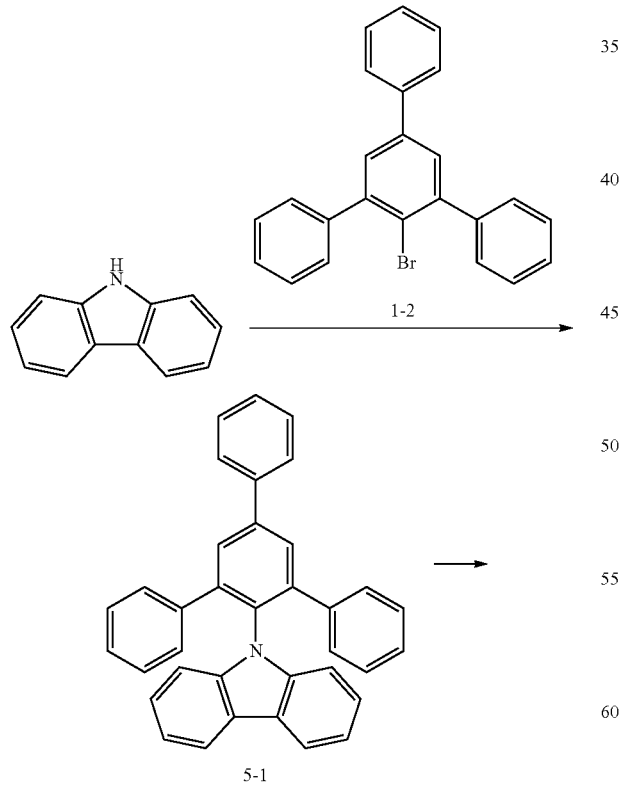

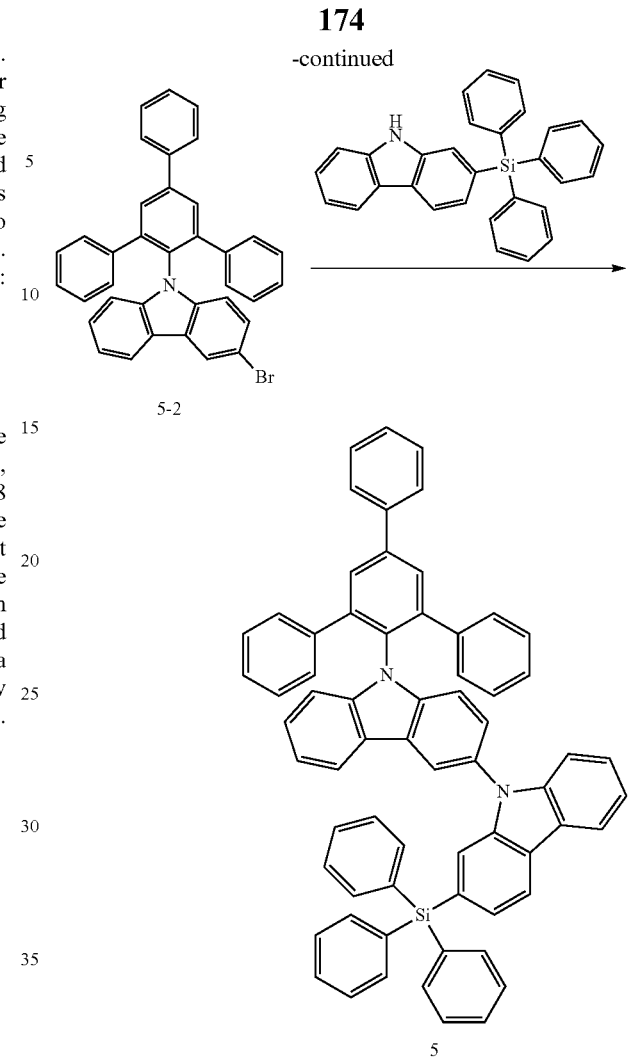

1) Synthesis of Intermediate 5-1

Carbazole (10 g), Intermediate 1-2 (23 g), sodium tert-butoxide (11.5 g), Pd$_2$(dba)$_3$ (2.7 g), and rac-BI-DIME (CAS=1246888-90-3) (1.98 g) were dissolved in a toluene solvent (300 mL), and then stirred at 110° C. for 12 hours. After completion of the reaction, the resultant reaction solution was extracted to thereby obtain an organic layer, which was then dried. A residue was separated and purified by column chromatography to thereby obtain Intermediate 5-1 (23 g, yield of 82%). Compound 5-1 was confirmed by LC-MS. (C36H25N: M+1 471.60)

2) Synthesis of Intermediate 5-2

Intermediate 5-1 (23 g) was dissolved in a dimethylformamide (DMF) solvent, and then N-bromosuccinimide (NBS) (8.68 g) was added dropwise thereto at 0° C. and then stirred at room temperature for 12 hours. After completion of the reaction, the resultant reaction solution was extracted to thereby obtain an organic layer, which was then dried. A residue was separated and purified by column chromatography to thereby obtain Intermediate 5-2 (26 g, yield of 97%). Intermediate 5-2 was confirmed by LC-MS. (C36H24BrN: M+1 550.50)

3) Synthesis of Compound 5

Intermediate 5-2 (2 g), 2-(triphenylsilyl)-9H-carbazole (CAS=1262866-95-4) (1.55 g), sodium tert-butoxide (0.7 g), Pd$_2$(dba)$_3$ (0.17 g), and rac-BI-DIME (CAS=1246888-90-3) (0.12 g) were dissolved in a toluene solvent (30 mL), and then stirred at 110° C. for 12 hours. After completion of the reaction, the resultant reaction solution was extracted to thereby obtain an organic layer, which was then dried. A residue was separated and purified by column chromatography, followed by a recrystallization and a sublimation purification to thereby obtain a high-purity Compound 5 (2.5 g, yield of 77%). Compound 5 was confirmed by LC-MS and 1H-NMR.

Synthesis Example 3: Synthesis of Compound 8

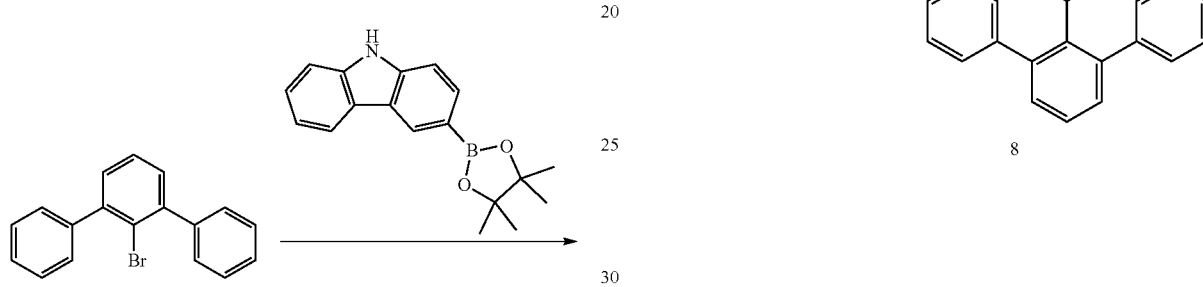

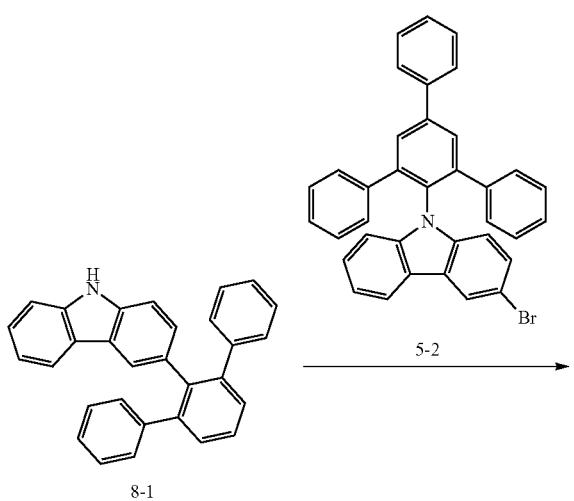

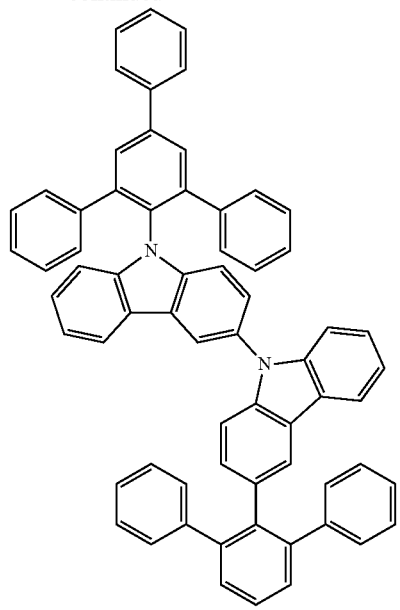

8

1) Synthesis of Intermediate 8-1

2'-bromo-1,1':3',1''-terphenyl (CAS=126866-29-3) (10 g) and 3-(4,4,5,5-tetramethyl-1,3,2-dioxaborolan-2-yl)-9H-carbazole (CAS=855738-89-5) (9.48 g) were added to a 2M K$_3$PO$_4$ aqueous solution (32 mL), Pd$_2$(dba)$_3$ (1.48 g), rac-BI-DIME (CAS=1246888-90-3) (1.07 g), toluene (130 mL), and ethanol (32 mL), and then stirred at 110° C. for 12 hours. After completion of the reaction, the resultant reaction solution was extracted to thereby obtain an organic layer, which was then dried. A residue was separated and purified by column chromatography, followed by a sublimation purification to thereby obtain Intermediate 8-1 (10 g, yield of 78%). Compound 8-1 was confirmed by LC-MS. (C30H21N: M+1 395.51)

2) Synthesis of Compound 8

Intermediate 8-1 (2 g), Intermediate 5-2 (2.78 g), sodium tert-butoxide (0.97 g), Pd$_2$(dba)$_3$ (0.23 g), and rac-BI-DIME (CAS=1246888-90-3) (0.17 g) were dissolved in a toluene solvent (30 mL), and then stirred at 110° C. for 12 hours. After completion of the reaction, the resultant reaction solution was extracted to thereby obtain an organic layer, which was then dried. A residue was separated and purified by column chromatography, followed by a recrystallization and a sublimation purification to thereby obtain a high-purity Compound 8 (2 g, yield of 45%). Compound 8 was confirmed by LC-MS and 1H-NMR.

Synthesis Example 4: Synthesis of Compound 28

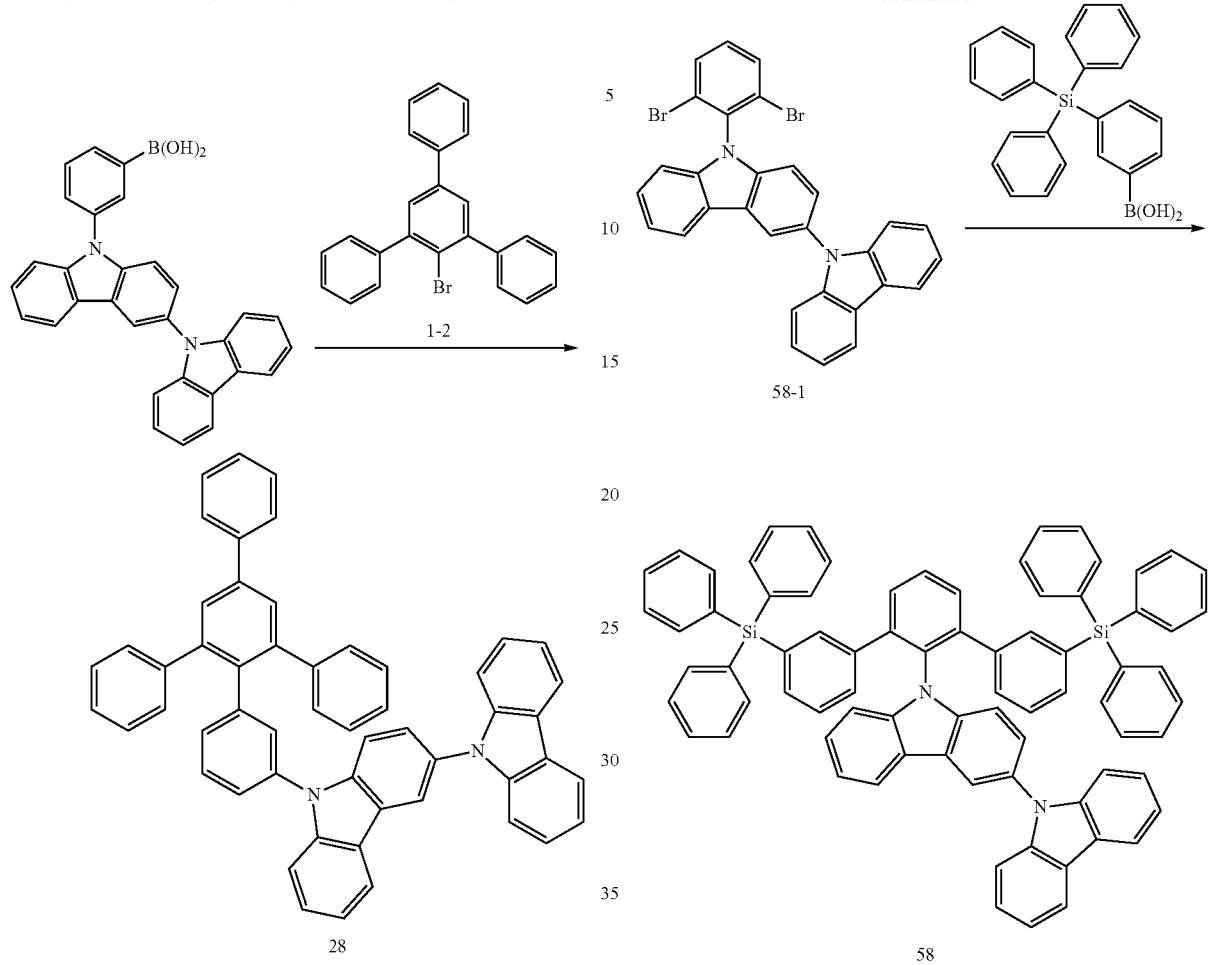

28

(3-(9H-[3,9'-bicarbazol]-9-yl)phenyl)boronic acid (CAS=1480890-44-5) (2 g), Intermediate 1-2 (1.7 g), a 2M $K_3PO_4$ aqueous solution (4 mL), $Pd_2(dba)_3$ (0.2 g), and rac-BI-DIME (CAS=1246888-90-3) (0.15 g) were dissolved in toluene (20 mL) and an ethanol solvent (4 mL), and then stirred at 110° C. for 12 hours. After completion of the reaction, the resultant reaction solution was extracted to thereby obtain an organic layer, which was then dried. A residue was separated and purified by column chromatography, followed by a recrystallization and a sublimation purification to thereby obtain a high-purity Compound 28 (2.9 g, yield of 92%). Compound 28 was confirmed by LC-MS and 1H-NMR.

Synthesis Example 5: Synthesis of Compound 58

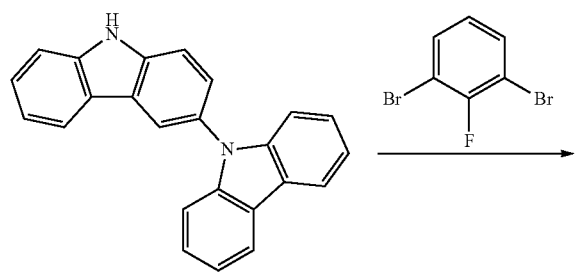

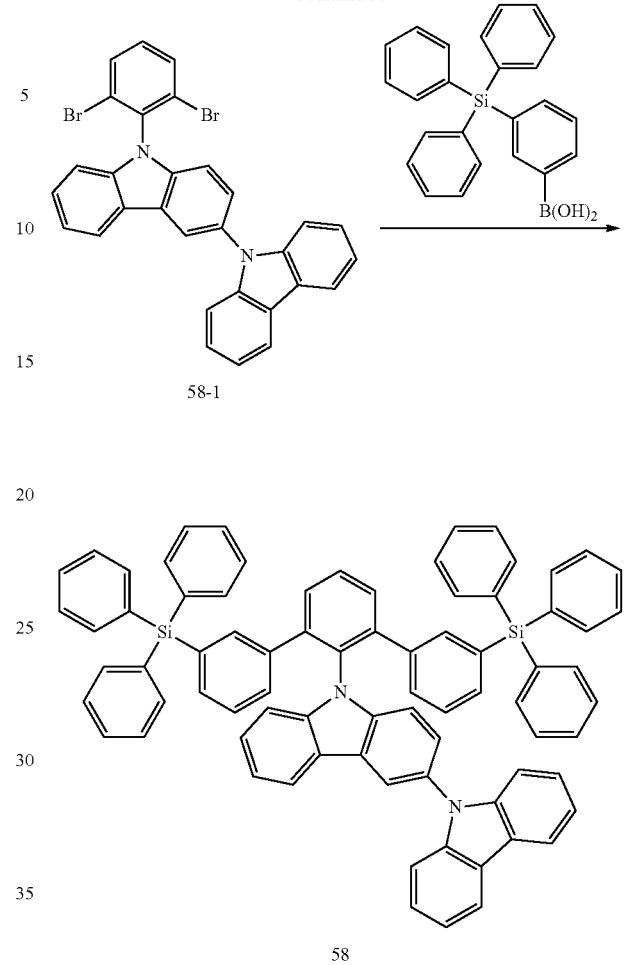

58

1) Synthesis of Intermediate 58-1

3,9'-Bi-9H-carbazole (CAS=18628-07-4) (5 g), 1,3-dibromo-2-fluorobenzene (3.82 g), and $Cs_2CO_3$ (9.8 g) were added to DMF (70 mL), and then stirred at 160° C. for 12 hours. After completion of the reaction, the resultant reaction solution was extracted to thereby obtain an organic layer, which was then dried. A residue was separated and purified by column chromatography, followed by a sublimation purification to thereby obtain Intermediate 58-1 (8 g, yield of 94%). Compound 58-1 was confirmed by LC-MS. (C30H18Br2N2: M+1 566.3)

2) Synthesis of Compound 58

Intermediate 58-1 (2 g), (3-(Triphenylsilyl)phenyl)boronic acid (CAS=1253912-58-1) (2.96 g), and $Pd(PPh_3)_4$ (0.2 g) were dissolved in a 2M $K_2CO_3$ aqueous solution (3.53 mL) and a THF solvent (20 mL), and then stirred at 90° C. for 12 hours. After completion of the reaction, the resultant reaction solution was extracted to thereby obtain an organic layer, which was then dried. A residue was separated and purified by column chromatography, followed by a recrystallization and a sublimation purification to thereby obtain a high-purity Compound 58 (2.8 g, yield of 66%). Compound 58 was confirmed by LC-MS and 1H-NMR.

Synthesis Example 6: Synthesis of Compound 63

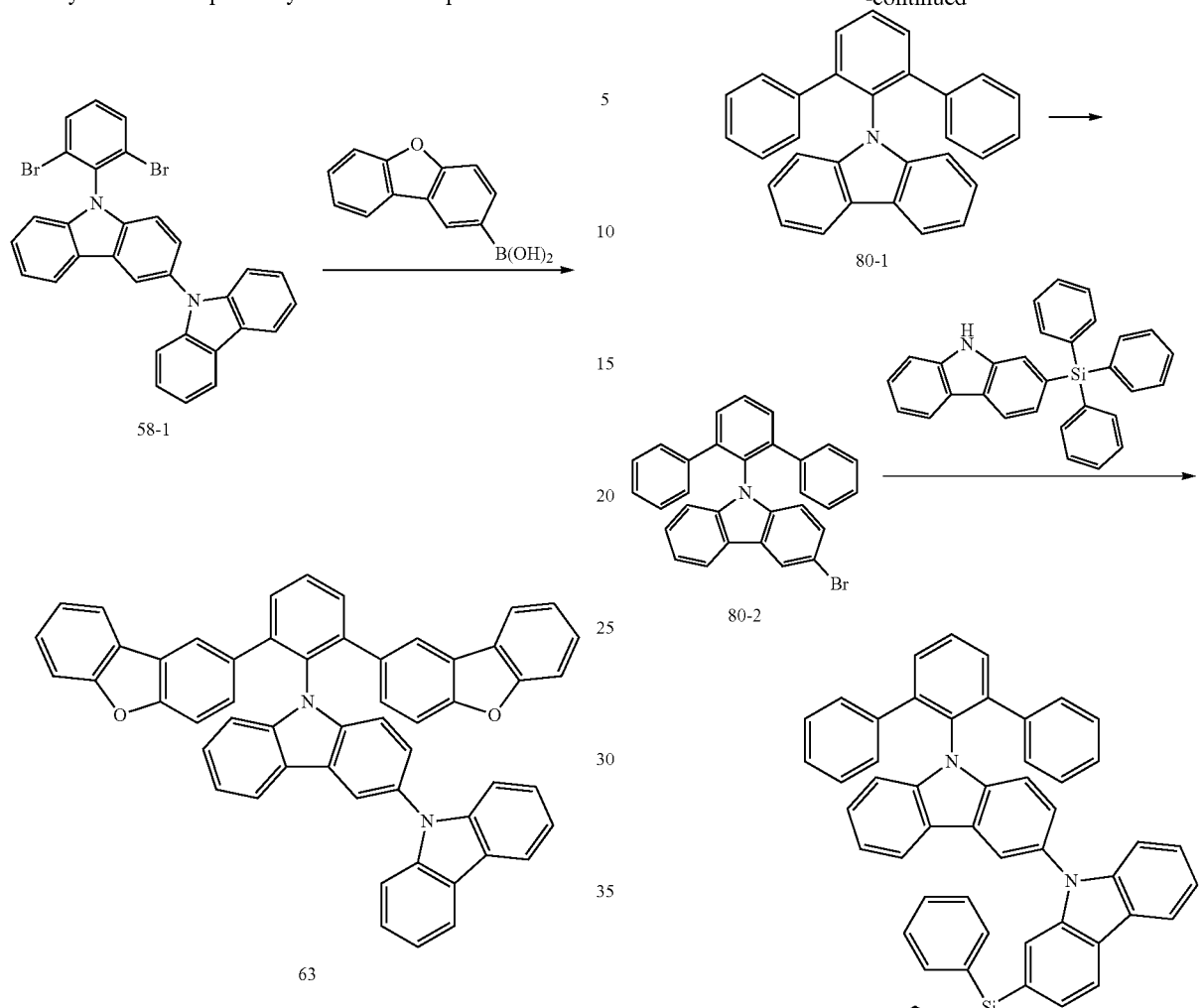

Intermediate 58-1 (2 g), dibenzo[b,d]furan-2-ylboronic acid (CAS=402936-15-6) (1.64 g), and Pd(PPh$_3$)$_4$ (0.2 g) were dissolved in a 2M K$_2$CO$_3$ aqueous solution (3.53 mL) and a THF solvent (20 mL), and then stirred at 90° C. for 12 hours. After completion of the reaction, the resultant reaction solution was extracted to thereby obtain an organic layer, which was then dried. A residue was separated and purified by column chromatography, followed by a recrystallization and a sublimation purification to thereby obtain a high-purity Compound 63 (1.9 g, yield of 73%). Compound 63 was confirmed by LC-MS and 1H-NMR.

Synthesis Example 7: Synthesis of Compound 80

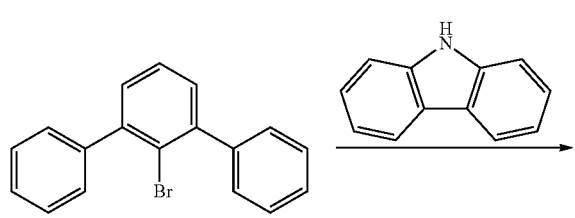

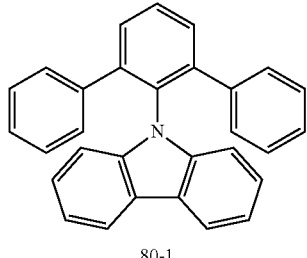

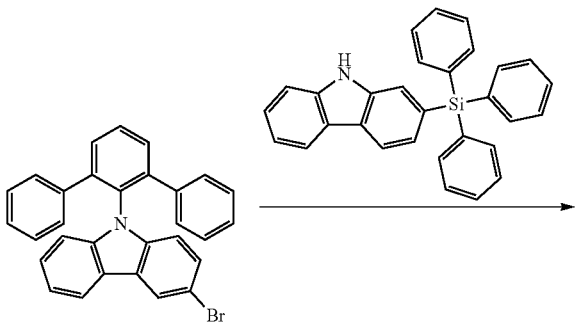

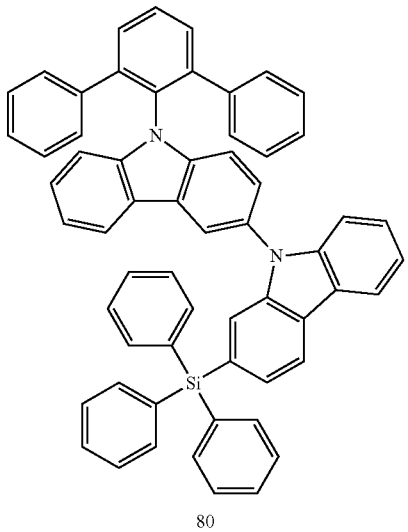

1) Synthesis of Intermediate 80-1

2'-bromo-1,1:3',1''-terphenyl (CAS=126866-29-3) (10 g), carbazole (5.41 g), sodium tert-butoxide (6.22 g), Pd$_2$(dba)$_3$ (1.48 g), and rac-BI-DIME (CAS=1246888-90-3) (1.07 g) were dissolved in a toluene solvent (30 mL), and then stirred at 110° C. for 12 hours. After completion of the reaction, the resultant reaction solution was extracted to thereby obtain an organic layer, which was then dried. A residue was separated and purified by column chromatography, followed by a sublimation purification to thereby obtain Intermediate 80-1 (10 g, yield of 78%). Compound 80-1 was confirmed by LC-MS. (C30H21N: M+1 395.51)

2) Synthesis of Intermediate 80-2

Intermediate 80-2 (10 g) was dissolved in a DMF solvent, and then NBS (4.5 g) was added dropwise thereto at 0° C. and then stirred at room temperature for 12 hours. After completion of the reaction, the resultant reaction solution was extracted to thereby obtain an organic layer, which was then dried. A residue was separated and purified by column chromatography to thereby obtain Intermediate 80-2 (11 g, yield of 92%). Intermediate 80-2 was confirmed by LC-MS. (C30H20BrN: M+1 474.4)

3) Synthesis of Compound 80

Intermediate 80-2 (2 g), 2-(triphenylsilyl)-9H-carbazole (CAS=1262866-95-4) (1.79 g), sodium tert-butoxide (0.81 g), Pd$_2$(dba)$_3$ (0.19 g), and rac-BI-DIME (CAS=1246888-90-3) (0.14 g) were dissolved in a toluene solvent (20 mL), and then stirred at 110° C. for 12 hours. After completion of the reaction, the resultant reaction solution was extracted to thereby obtain an organic layer, which was then dried. A residue was separated and purified by column chromatography, followed by a recrystallization and a sublimation purification to thereby obtain a high-purity Compound 80 (2.9 g, yield of 84%). Compound 80 was confirmed by LC-MS and 1H-NMR.

$^1$H NMR and MS/FAB of Compounds synthesized in Synthesis Examples 1 to 7 are shown in the following Table 1. Even compounds other than the compounds shown in Table 1 may be easily recognized by those skilled in the art by referring to the above synthesis routes and source materials.

TABLE 1

| Compound | H NMR (δ) | MS/FAB Calc | found |
|---|---|---|---|
| 1 | 8.55(d, 2H), 8.19(d, 1H), 8.18(s, 2H), 7.94(d, 2H), 7.75(d, 2H), 7.72(d, 1H), 7.67(s, 1H), 7.16-7.58(m, 21H) | 636.26 | 636.80 |
| 5 | 8.55(d, 2H), 8.22(d, 1H), 8.18(s, 2H), 7.94(d, 2H), 7.75(d, 2H), 7.72(d, 1H), 7.68(d, 2H), 7.16-7.49(m, 34H) | 894.34 | 895.19 |
| 8 | 8.55(d, 2H), 8.18(s, 2H), 8.06(d, 2H), 7.90-7.99(m, 4H), 7.72-7.83(m, 9H), 7.16-7.49(m, 25H) | 864.35 | 865.09 |
| 28 | 8.55(d, 2H), 8.23(s, 2H), 8.20(d, 2H), 7.94(d, 2H), 7.16-7.72(m, 28H) | 712.29 | 712.90 |
| 58 | 8.55(d, 2H), 8.19(d, 1H), 8.01(d, 2H), 7.94(d, 2H), 7.88(s, 2H), 7.16-7.72(m, 47H) | 1076.40 | 1077.49 |
| 63 | 8.55(d, 2H), 8.19(d, 1H), 8.01(d, 2H), 7.94-7.98(d, 4H), 7.16-7.88(m, 23H) | 740.25 | 740.86 |
| 80 | 8.55(d, 2H), 8.22(d, 1H), 8.01(d, 2H), 7.94(d, 2H), 7.16-7.69(m, 35H) | 818.31 | 819.10 |

EXAMPLES

Example 1

As an anode, an ITO/Ag/ITO substrate (hereinafter, referred to as "ITO substrate") was cut to a size of 50 mm×50 mm×0.7 mm, sonicated by using isopropyl alcohol and pure water for 5 minutes each, and then, cleaned by irradiation of ultraviolet rays and exposure of ozone thereto for 30 minutes. Then, the ITO substrate was loaded onto a vacuum deposition apparatus.

NPB was vacuum deposited on the ITO substrate to form a hole injection layer having a thickness of 30 nm, and TCTA was vacuum deposited on the hole injection layer to form a hole transport layer having a thickness of 20 nm.

Compound 1 (host) and Ir(pmp)$_3$ (dopant) were co-deposited on the hole transport layer at a weight ratio of 92:8 to form an emission layer having a thickness of 25 nm. Subsequently, TSPO1 was deposited on the emission layer to form an electron transport layer having a thickness of 30 nm, LiF, which is an alkali metal halide, was deposited on the electron transport layer to form an electron injection layer having a thickness of 1 nm, and Al was vacuum-deposited thereon to form an LiF/Al cathode having a thickness of 300 nm, thereby completing manufacture of a light-emitting device.

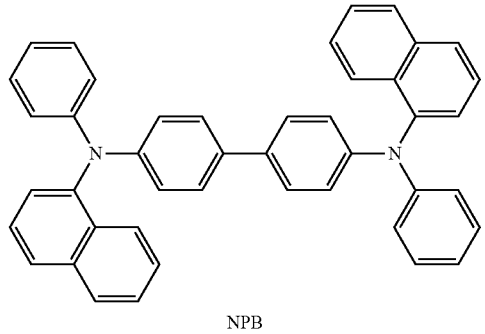

NPB

-continued

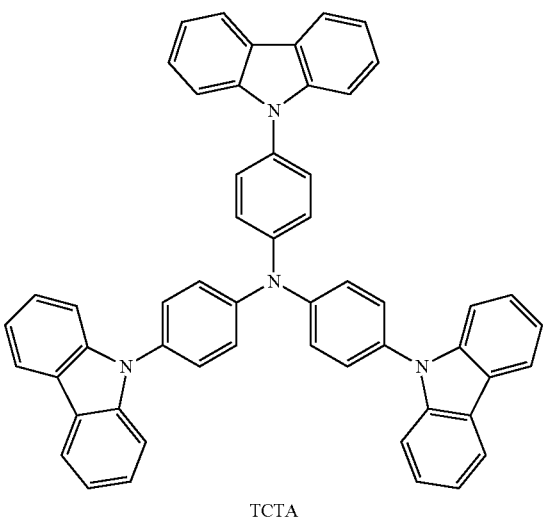

TCTA

-continued

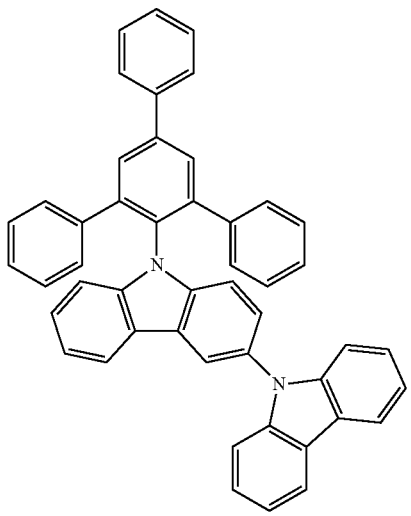

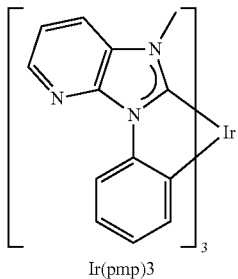
Ir(pmp)3

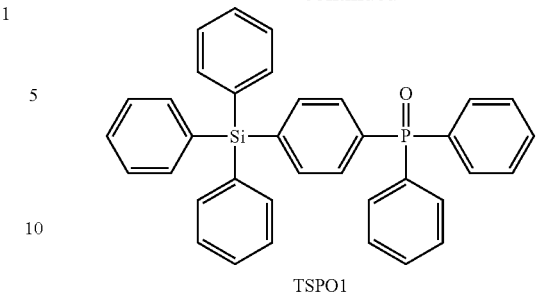
TSPO1

Examples 2 to 7 and Comparative Examples 1 to 4

Light-emitting devices were manufactured in substantially the same manner as in Example 1, except that, compounds shown in Table 2 were used instead of Compound 1 in Example 1, in forming an emission layer.

Evaluation Example 1

With respect to each of the light-emitting devices manufactured in Examples 1 to 7 and Comparative Examples 1 to 4, a driving voltage (V), a luminescence efficiency (cd/A), a maximum emission wavelength (nm), a maximum quantum efficiency (%), and a relative lifespan $T_{95}$ were measured using Keithley MU 236 and a luminance meter PR650, and results thereof are shown in Table 2. In table 2, the lifespan ($T_{95}$) is a value obtained by measuring the amount of time that was taken until luminance was reduced to 95% of the initial luminance, and the relative lifespan is a value obtained by dividing $T_{95}$ of Examples 1 to 7 and Comparative Examples 1 to 4 by $T_{95}$ of Example 1.

TABLE 2

| No. | Host | Driving voltage (V) | Luminescence efficiency (cd/A) | Maximum emission wavelength (nm) | Maximum quantum efficiency (%) | Relative lifespan ($T_{95}$) |
|---|---|---|---|---|---|---|
| Example 1 | Compound 1 | 4.3 | 22.5 | 459 | 22.0 | 1.0 |
| Example 2 | Compound 5 | 4.5 | 21.7 | 457 | 21.5 | 0.76 |
| Example 3 | Compound 8 | 4.6 | 19.3 | 460 | 20.7 | 0.74 |
| Example 4 | Compound 28 | 5.0 | 20.1 | 462 | 20.1 | 0.73 |
| Example 5 | Compound 58 | 4.8 | 19.3 | 458 | 21.2 | 0.76 |
| Example 6 | Compound 63 | 4.8 | 18.5 | 463 | 21.4 | 0.95 |
| Example 7 | Compound 80 | 4.7 | 21.0 | 461 | 20.0 | 0.87 |
| Comparative Example 1 | Compound A | 5.8 | 16.2 | 461 | 16.7 | 0.42 |
| Comparative Example 2 | Compound B | 6.0 | 17.8 | 460 | 17.5 | 0.45 |
| Comparative Example 3 | Compound C | 5.7 | 17.5 | 462 | 17.2 | 0.48 |
| Comparative Example 4 | Compound D | 5.9 | 16.2 | 464 | 16.5 | 0.58 |

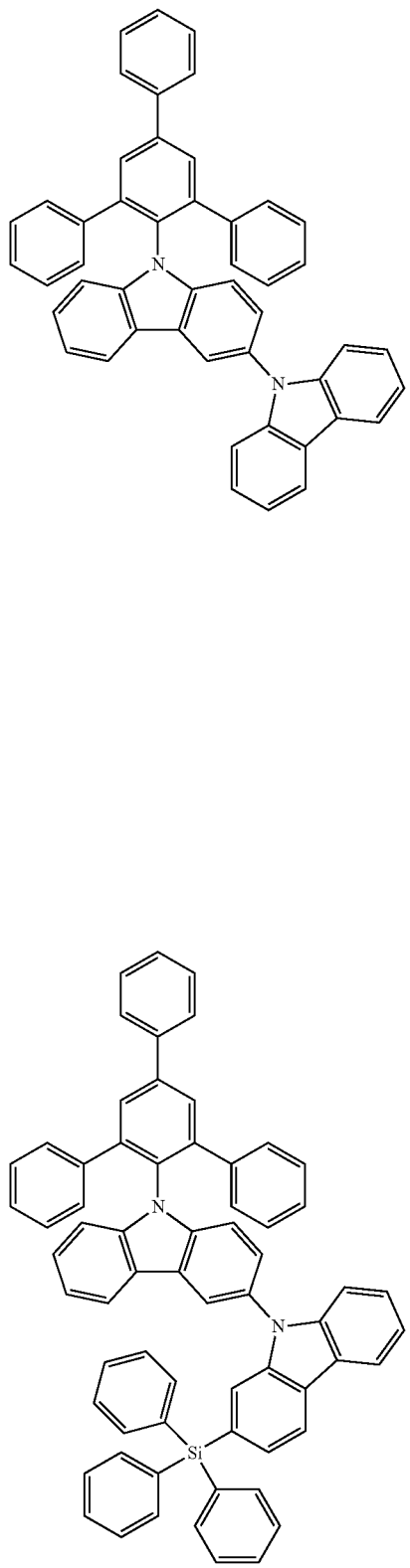
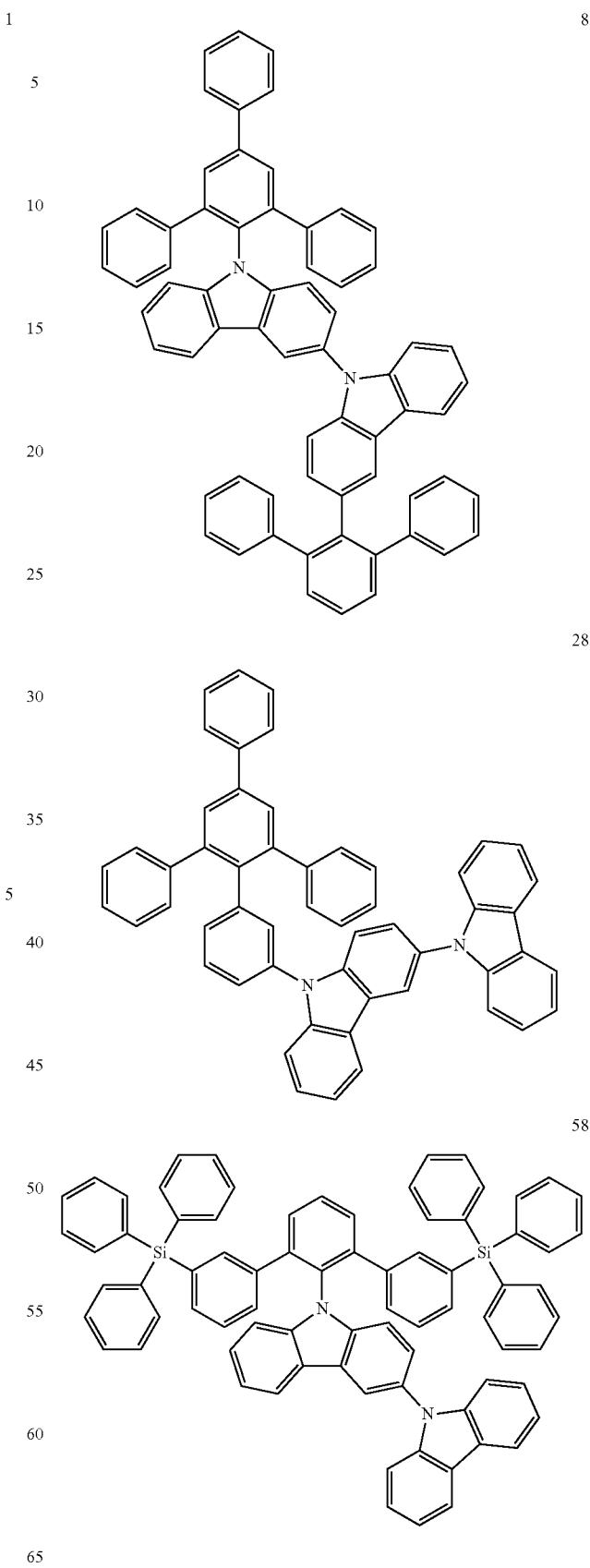

63
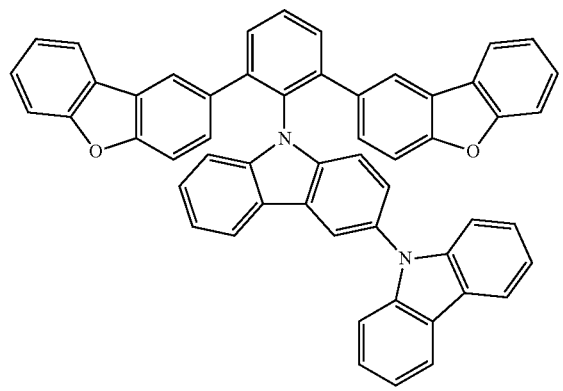
80
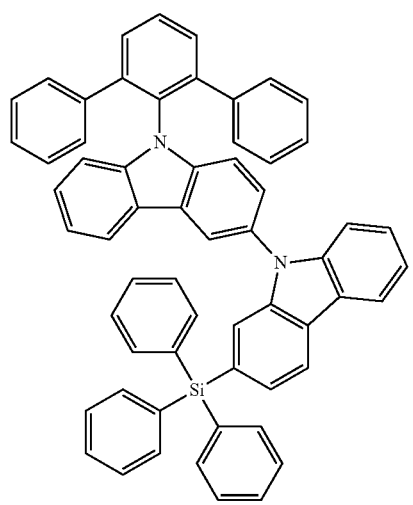
A
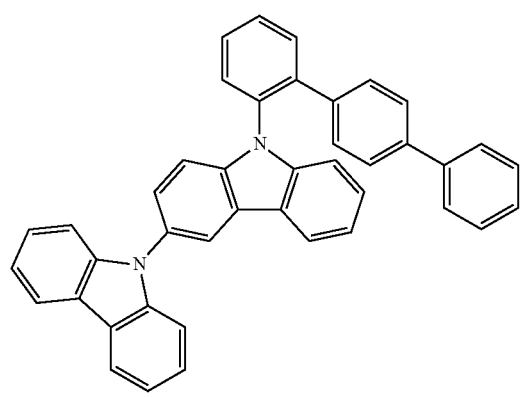
B
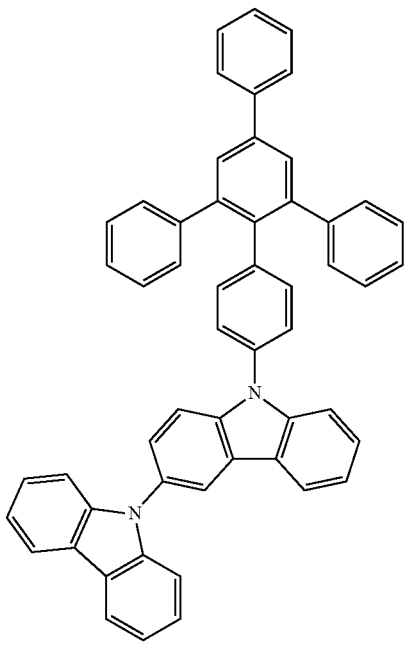
C
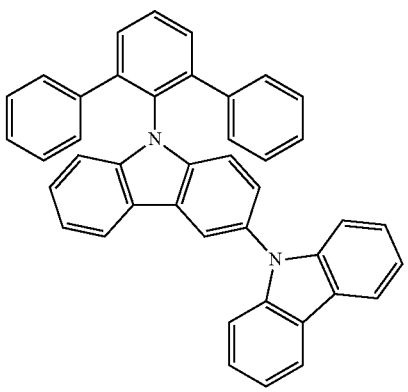
D
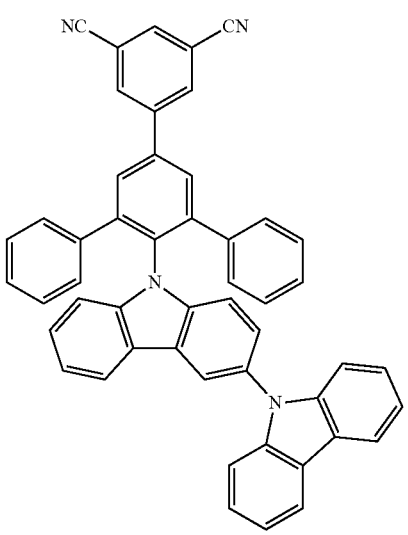
From Table 2, it can be seen that the light-emitting devices of Examples 1 to 7 have higher efficiency or a longer lifespan than the light-emitting devices of Comparative Examples 1 to 4.

The heterocyclic compound may be used in manufacturing a light-emitting device having high efficiency and long lifespan, and the light-emitting device may be used in manufacturing a high-quality electronic apparatus having excellent light efficiency and long lifespan.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope of the present disclosure as defined by the following claims, and equivalents thereof.

What is claimed is:

1. A heterocyclic compound represented by Formula 1 and satisfying at least one of Condition 1 and Condition 3 to Condition 5:

Formula 1

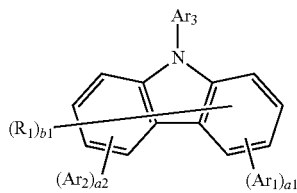

wherein, $Ar_1$ n Formula 1 is a group represented by Formula 2A, $Ar_2$ in Formula 1 is a group represented by Formula 2B, a1 and a2 in Formula 1 are each independently an integer from 0 to 4, wherein a sum of a1 and a2 is 1 or more, $Ar_3$ in Formula 1 is a group represented by one of Formulae 3A-1 and 3B-1,

2A

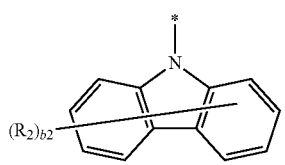

2B

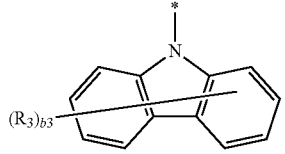

3A-1

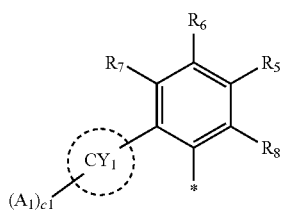

3B-1

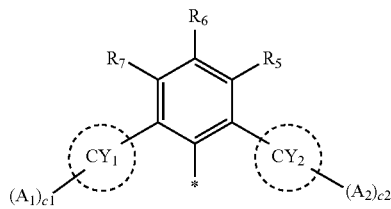

ring $CY_1$ and ring $CY_2$ in Formulae 3A-1 and 3B-1 are each independently a π-electron-rich $C_3$-$C_{60}$ cyclic group or a pyridine group, $R_1$ to $R_3$, $A_1$, and $A_2$ in Formulae 1, 2A, 2B, 3A-1, and 3B-1 are each independently hydrogen, deuterium, —F, —Cl, —Br, —I, a hydroxyl group, a cyano group, a nitro group, a $C_1$-$C_{60}$ alkyl group unsubstituted or substituted with at least one $R_{10a}$, a $C_2$-$C_{60}$ alkenyl group unsubstituted or substituted with at least one $R_{10a}$, a $C_2$-$C_{60}$ alkynyl group unsubstituted or substituted with at least one $R_{10a}$, a $C_1$-$C_{60}$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, a $C_6$-$C_{60}$ aryloxy group unsubstituted or substituted with at least one $R_{10a}$, a $C_6$-$C_{60}$ arylthio group unsubstituted or substituted with at least one $R_{10a}$, —C($Q_{51}$)($Q_{52}$)($Q_{53}$), —Si($Q_{51}$)($Q_{52}$)($Q_{53}$), —Si($Q_1$)($Q_2$)($Q_3$), —N($Q_1$)($Q_2$), —B($Q_1$)($Q_2$), —C(=O)($Q_1$), —S(=O)$_2$($Q_1$), —P(=O)($Q_1$)($Q_2$), or —C($Q_1$)($Q_2$)($Q_3$), wherein $Q_{51}$ to $Q_{53}$ are each independently a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, $R_5$ to $R_7$ are each independently hydrogen, deuterium, a hydroxyl group, a $C_1$-$C_{60}$ alkyl group unsubstituted or substituted with at least one $R_{10a}$, a $C_2$-$C_{60}$ alkenyl group unsubstituted or substituted with at least one $R_{10a}$, a $C_2$-$C_{60}$ alkynyl group unsubstituted or substituted with at least one $R_{10a}$, a $C_1$-$C_{60}$ alkoxy group unsubstituted or substituted with at least one $R_{10a}$, a $C_3$-$C_{60}$ carbocyclic group unsubstituted or substituted with at least one $R_{10a}$, a $C_6$-$C_{60}$ aryloxy group unsubstituted or substituted with at least one $R_{10a}$, a $C_6$-$C_{60}$ arylthio group unsubstituted or substituted with at least one $R_{10a}$, two neighboring groups of $Q_{51}$ to $Q_{53}$ are optionally linked to form a $C_5$-$C_{30}$ carbocyclic group unsubstituted or substituted with at least one $R_{10a}$ or a $C_2$-$C_{30}$ heterocyclic group unsubstituted or substituted with at least one $R_{10a}$, $R_8$ in Formula 3A-1 is hydrogen, deuterium, or a $C_1$-$C_{60}$ alkyl group unsubstituted or substituted with at least one deuterium, b1 in Formula 1 is an integer from 1 to 7, b2 and b3 in Formulae 2A and 2B are each independently an integer from 1 to 8, c1 and c2 in Formulae 3A-1 to 3A-4 and 3B-1 to 3B-4 are each independently an integer from 1 to 10,

* indicates a binding site to a neighboring atom, and $R_{10a}$ is:

deuterium (-D), —F, —Cl, —Br, —I, a hydroxyl group, a cyano group, or a nitro group;

a $C_1$-$C_{60}$ alkyl group, a $C_2$-$C_{60}$ alkenyl group, a $C_2$-$C_{60}$ alkynyl group, or a $C_1$-$C_{60}$ alkoxy group, each unsubstituted or substituted with deuterium, —F, —Cl, —Br, —I, a hydroxyl group, a cyano group, a nitro group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, —Si($Q_{11}$)($Q_{12}$)($Q_{13}$), —N($Q_{11}$)($Q_{12}$), —B($Q_{11}$)($Q_{12}$), —C(=O)($Q_{11}$), —S(=O)$_2$($Q_{11}$), —P(=O)($Q_{11}$)($Q_{12}$), or any combination thereof;

a $C_3$-$C_{60}$ carbocyclic group, a $C_1$-$C_{60}$ heterocyclic group, a $C_6$-$C_{60}$ aryloxy group, or a $C_6$-$C_{60}$ arylthio group, each unsubstituted or substituted with deuterium, —F, —Cl, —Br, —I, a hydroxyl group, a cyano group, a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, —Si($Q_{21}$)($Q_{22}$)($Q_{23}$), —N($Q_{21}$)($Q_{22}$), —B($Q_{21}$)($Q_{22}$), —C(=O)($Q_{21}$), —S(=O)$_2$($Q_{21}$), —P(=O)($Q_{21}$)($Q_{22}$), or any combination thereof; or —Si($Q_{31}$)($Q_{32}$)($Q_{33}$), —N($Q_{31}$)($Q_{32}$), —B($Q_{31}$)($Q_{32}$), —C(=O)($Q_{31}$), —S(=O)$_2$($Q_{31}$), —P(=O)($Q_{31}$)($Q_{32}$), or —C($Q_{31}$)($Q_{32}$)($Q_{33}$), wherein $Q_1$ to $Q_3$, $Q_{11}$ to $Q_{13}$, $Q_{21}$ to $Q_{23}$, and $Q_{31}$ to $Q_{33}$ are each independently: hydrogen; deuterium; —F; —Cl; —Br; —I; a hydroxyl group; a cyano group; a nitro group; a $C_1$-$C_{60}$ alkyl group; a $C_2$-$C_{60}$ alkenyl group; a $C_2$-$C_{60}$ alkynyl group; a $C_1$-$C_{60}$ alkoxy group; or a $C_3$-$C_{60}$ carbocyclic group or a $C_1$-$C_{60}$ heterocyclic group, each unsubstituted or substituted with deuterium, —F, a cyano group, a $C_1$-$C_{60}$ alkyl group, a $C_1$-$C_{60}$ alkoxy group, a phenyl group, a biphenyl group, or any combination thereof, wherein Condition 1 to Condition 5 are as follows:

Condition 1 when $Ar_3$ in Formula 1 is a group represented by Formula 3A-1, at least one $A_1$ in Formula 3A-1 is a group represented by —C($Q_{51}$)($Q_{52}$)($Q_{53}$) or a group represented by —Si($Q_{51}$)($Q_{52}$)($Q_{53}$), Condition 3 when $Ar_3$ in Formula 1 is a group represented by Formula 3B-1, each of ring $CY_1$ and ring $CY_2$ in Formula 3B-1 is not a benzene group, Condition 4 i) $Ar_3$ in Formula 1 is a group represented by Formula 3B-1, and ii) when each of ring $CY_1$ and ring $CY_2$ in Formulae 3B-1 and 3B-4 is a benzene group, in Formulae 2A, 2B, and 3B-1, at least one of $R_2$, $R_3$, $A_1$, and $A_2$ is not hydrogen, and Condition 5 i) $Ar_3$ in Formula 1 is a group represented by Formula 3B-1, and ii) when each of ring $CY_1$ and ring $CY_2$ in Formula 3B-1 is a benzene group, $R_6$ in Formula 3B-1 is a phenyl group unsubstituted or substituted with at least one $R_{11a}$, wherein $R_{11a}$ is: deuterium, —F, —Cl, —Br, —I, a hydroxyl group, or a nitro group; or a $C_1$-$C_{20}$ alkyl group unsubstituted or substituted with deuterium, —F, —Cl, —Br, —I, a hydroxyl group, a nitro group, or any combination thereof, wherein:

1) One of Condition 1, Condition 3, or Condition 4 is satisfied, and $R_5$ to $R_7$ in Formulae 3A-1 and 3B-1 are each independently hydrogen, deuterium, or a $C_1$-$C_{60}$ alkyl group unsubstituted or substituted with at least one deuterium, 2) Condition 3 is satisfied, and ring $CY_1$ and ring $CY_2$ are each independently a benzene group, a naphthalene group, a fluorene group, a spiro-bifluorene group, a benzofluorene group, a dibenzofluorene group, a phenanthrene group, an anthracene group, a fluoranthene group, a triphenylene group, a pyrene group, a chrysene group, a naphthacene group, a furan group, a thiophene group, an isoindole group, an indole group, an indene group, a benzofuran group, a benzothiophene group, a benzosilole group, a naphtho pyrrole group, a naphthofuran group, a naphthothiophene group, a naphtho silole group, a benzocarbazole group, a dibenzocarbazole group, a dibenzofuran group, a dibenzothiophene group, a carbazole group, a dibenzosilole group, or a pyridine group, or 3) Condition 5 is satisfied, and, in Formulae 1, 2A, 2B, and 3B-1, $R_1$, $R_2$, $R_3$, $A_1$, and $A_2$ are each independently:

hydrogen, deuterium, —F, —Cl, —Br, —I, a hydroxyl group, a cyano group, or a nitro group;

a $C_1$-$C_{20}$ alkyl group, a $C_2$-$C_{20}$ alkenyl group, a $C_2$-$C_{20}$ alkynyl group, or a $C_1$-$C_{20}$ alkoxy group, each unsubstituted or substituted with deuterium, —F, —Cl, —Br, —I, —CD$_3$, —CD$_2$H, —CDH$_2$, —CF$_3$, —CF$_2$H, —CFH$_2$, a hydroxyl group, a cyano group, a nitro group, a phenyl group, a naphthyl group, —Si($Q_{31}$)($Q_{32}$)($Q_{33}$), —N($Q_{31}$)($Q_{32}$), —B($Q_{31}$)($Q_{32}$), —C(=O)($Q_{31}$), —S(=O)$_2$($Q_{31}$), —P(=O)($Q_{31}$)($Q_{32}$), or any combination thereof;

a phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, a pyridinyl group, an isoindolyl group, an indolyl group, an indazolyl group, a purinyl group, a carbazolyl group, a phenanthrolinyl group, a benzofuranyl group, a benzothiophenyl group, a dibenzofuranyl group, a dibenzothiophenyl group, a benzocarbazolyl group, or a dibenzocarbazolyl group, each unsubstituted or substituted with deuterium, —F, —Cl, —Br, —I, —CD$_3$, —CD$_2$H, —CDH$_2$, —CF$_3$, —CF$_2$H, —CFH$_2$, a hydroxyl group, a cyano group, a nitro group, a $C_1$-$C_{20}$ alkyl group, a $C_2$-$C_{20}$ alkenyl group, a $C_2$-$C_{20}$ alkynyl group, a $C_1$-$C_{20}$ alkoxy group, a phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, a pyridinyl group, an isoindolyl group, an indolyl group, an indazolyl group, a purinyl group, a carbazolyl group, a phenanthrolinyl group, a benzofuranyl group, a benzothiophenyl group, a dibenzofuranyl group, a dibenzothiophenyl group, a benzocarbazolyl group, a dibenzocarbazolyl group, —Si($Q_{31}$)($Q_{32}$)($Q_{33}$), —N($Q_{31}$)($Q_{32}$), —B($Q_{31}$)($Q_{32}$), —C(=O)($Q_{31}$), —S(=O)$_2$($Q_{31}$), —P(=O)($Q_{31}$)($Q_{32}$), or any combination thereof; or —C($Q_{51}$)($Q_{52}$)($Q_{53}$), —Si($Q_{51}$)($Q_{52}$)($Q_{53}$), —Si($Q_1$)($Q_2$)($Q_3$), —N($Q_1$)($Q_2$), —B($Q_1$)($Q_2$), —C(=O)($Q_1$), —S(=O)$_2$($Q_1$), —P(=O)($Q_1$)($Q_2$), or —C($Q_1$)($Q_2$)($Q_3$).

2. The heterocyclic compound of claim 1, wherein in Formula 1, a1 is 1 and a2 is 0 or 1.

3. The heterocyclic compound of claim 1, wherein ring $CY_1$ and ring $CY_2$ in Formulae 3A-1 and 3B-1 are each independently a benzene group, a heptalene group, an indene group, a naphthalene group, an azulene group, an indacene group, an acenaphthylene group, a fluorene group, a spiro-bifluorene group, a benzofluorene group, a dibenzofluorene group, a phenalene group, a phenanthrene group, an anthracene group, a fluoranthene group, a triphenylene group, a pyrene group, a chrysene group, a naphthacene group, a picene group, a perylene group, a pentacene group, a hexacene group, a pentaphene group, a rubicene group, a coronene group, an ovalene group, a pyrrole group, a furan group, a thiophene group, an isoindole group, an indole group, an indene group, a benzofuran group, a benzothiophene group, a benzosilole group, a naphtho pyrrole group, a naphthofuran group, a naphthothiophene group, a naphtho silole group, a benzocarbazole group, a dibenzocarbazole group, a dibenzofuran group, a dibenzothiophene group, a carbazole group, a dibenzosilole group, an indenocarbazole group, an indolocarbazole group, a benzofurocarbazole group, a benzothienocarbazole group, a benzosilolocarbazole group, a triindolobenzene group, a pyrrolo phenanthrene group, a furano phenanthrene group, a thienophenanthrene group, a benzonaphthofuran group, a benzonaphthothiophene group, a (indolo) phenanthrene group, a (benzofurano) phenanthrene group, a (benzothieno) phenanthrene group, or a pyridine group.

4. The heterocyclic compound of claim 1, wherein Condition 4 is satisfied,
and in Formulae 2A, 2B, and 3B-1, $R_2$, $R_3$, $A_1$, and $A_2$ are each independently:
hydrogen, deuterium, —F, —Cl, —Br, —I, a hydroxyl group, a cyano group, or a nitro group;
a $C_1$-$C_{20}$ alkyl group, a $C_2$-$C_{20}$ alkenyl group, a $C_2$-$C_{20}$ alkynyl group, or a $C_1$-$C_{20}$ alkoxy group, each unsubstituted or substituted with deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, a phenyl group, a naphthyl group, —Si($Q_{31}$)($Q_{32}$)($Q_{33}$), —N($Q_{31}$)($Q_{32}$), —B($Q_{31}$)($Q_{32}$), —C(=O)($Q_{31}$), —S(=O)$_2$($Q_{31}$), —P(=O)($Q_{31}$)($Q_{32}$), or any combination thereof;
a phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, a pyridinyl group, an isoindolyl group, an indolyl group, an indazolyl group, a purinyl group, a carbazolyl group, a phenanthrolinyl group, a benzofuranyl group, a benzothiophenyl group, a dibenzofuranyl group, a dibenzothiophenyl group, a benzocarbazolyl group, or a dibenzocarbazolyl group, each unsubstituted or substituted with deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, a $C_1$-$C_{20}$ alkyl group, a $C_2$-$C_{20}$ alkenyl group, a $C_2$-$C_{20}$ alkynyl group, a $C_1$-$C_{20}$ alkoxy group, a phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, a pyridinyl group, an isoindolyl group, an indolyl group, an indazolyl group, a purinyl group, a carbazolyl group, a phenanthrolinyl group, a benzofuranyl group, a benzothiophenyl group, a dibenzofuranyl group, a dibenzothiophenyl group, a benzocarbazolyl group, a dibenzocarbazolyl group, —Si($Q_{31}$)($Q_{32}$)($Q_{33}$), —N($Q_{31}$)($Q_{32}$), —B($Q_{31}$)($Q_{32}$), —C(=O)($Q_{31}$), —S(=O)$_2$($Q_{31}$), —P(=O)($Q_{31}$)($Q_{32}$), or any combination thereof; or
—C($Q_{51}$)($Q_{52}$)($Q_{53}$), —Si($Q_{51}$)($Q_{52}$)($Q_{53}$), —Si($Q_1$)($Q_2$)($Q_3$), —N($Q_1$)($Q_2$), —B($Q_1$)($Q_2$), —C(=O)($Q_1$), —S(=O)$_2$($Q_1$), —P(=O)($Q_1$)($Q_2$), or —C($Q_1$)($Q_2$)($Q_3$).

5. A heterocyclic compound selected from Compounds 1 to 27 and 55 to 102:

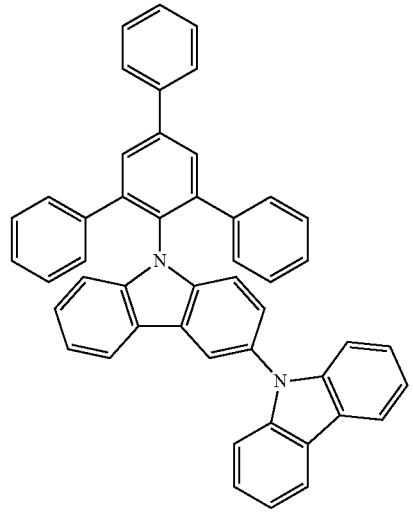

1

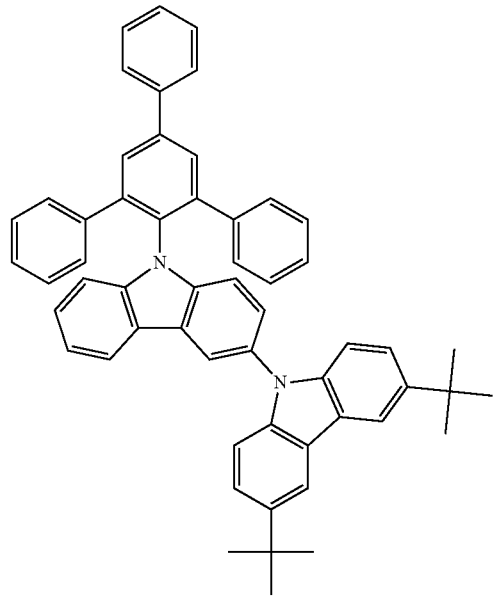

2

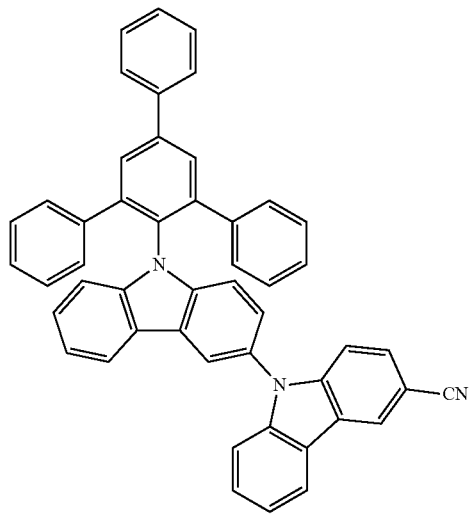
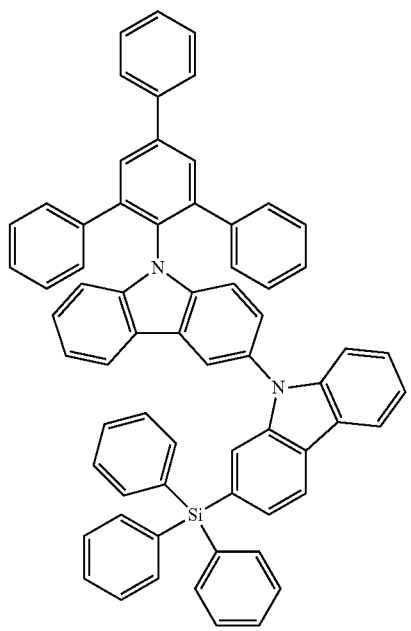
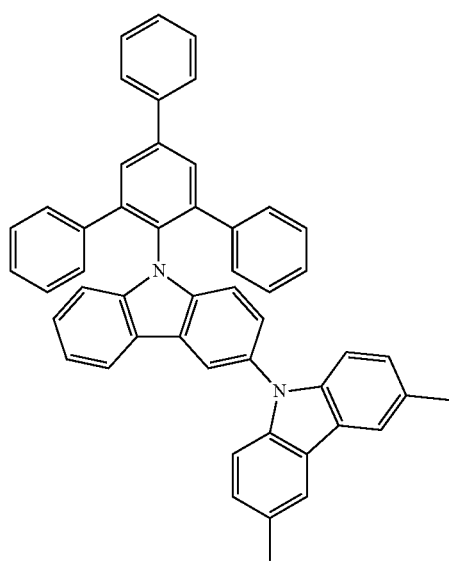
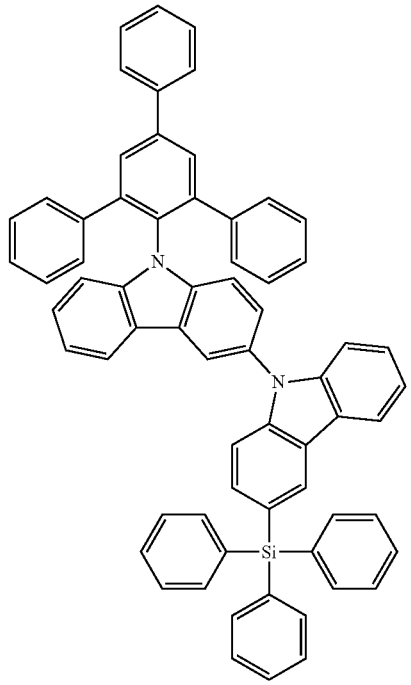

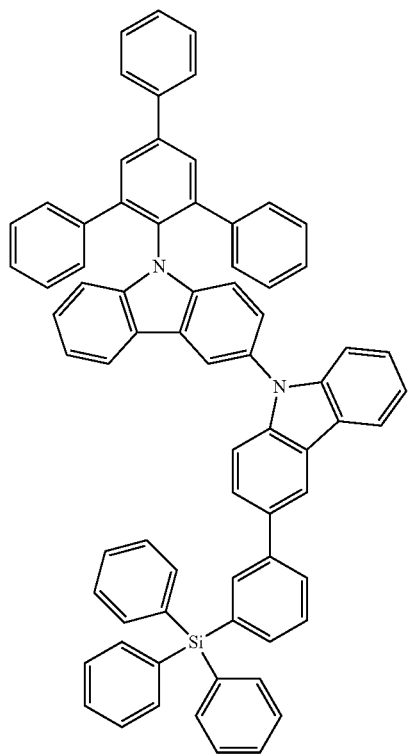
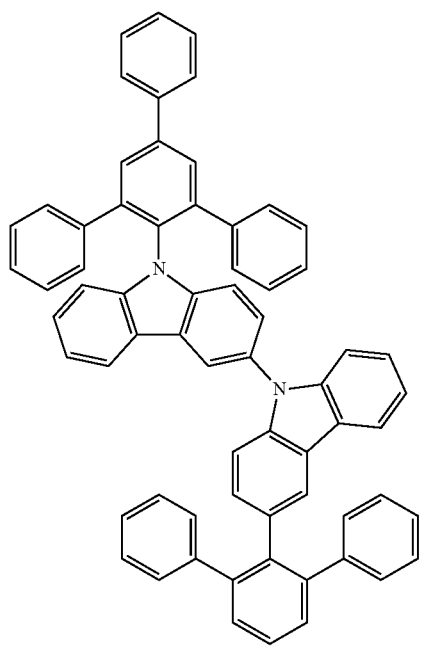
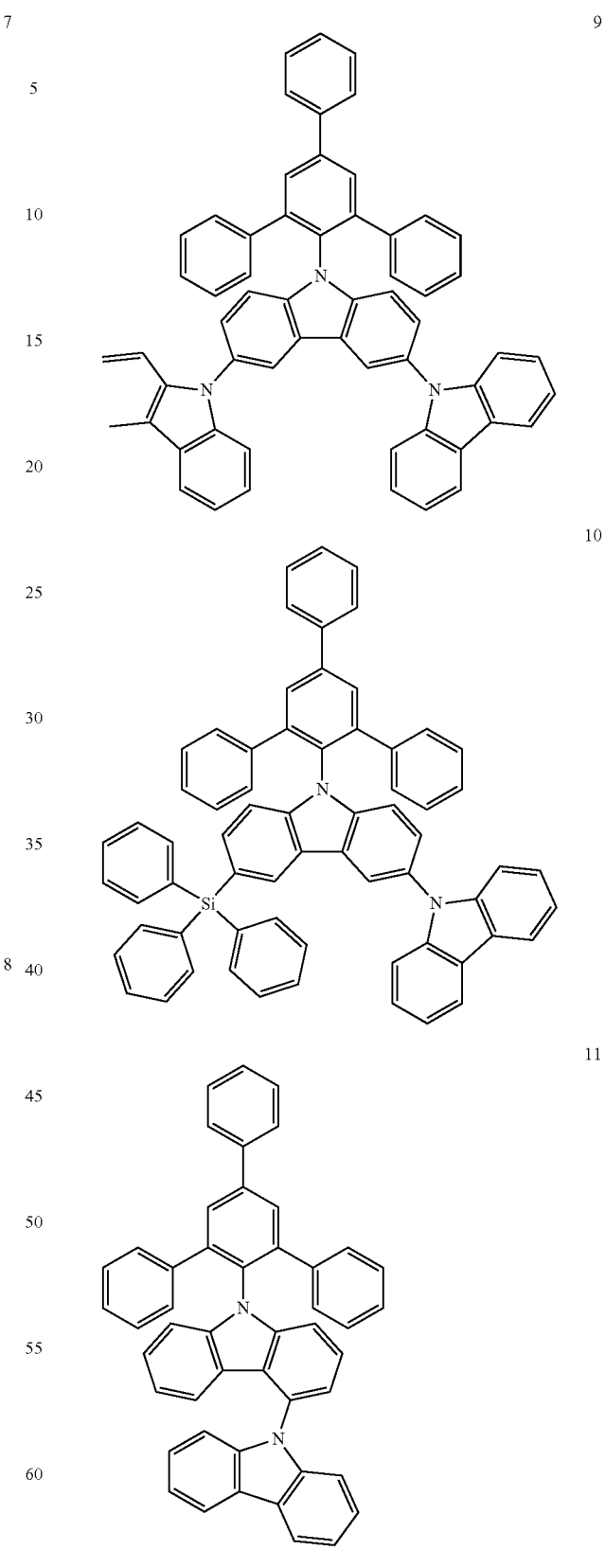

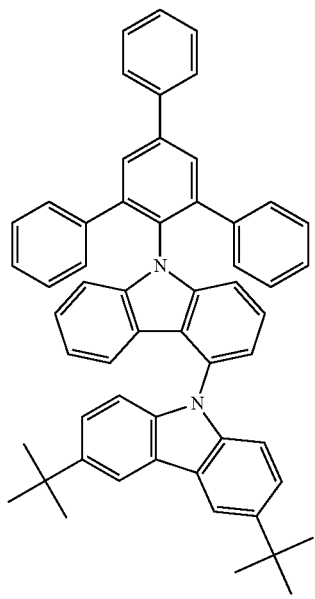
12
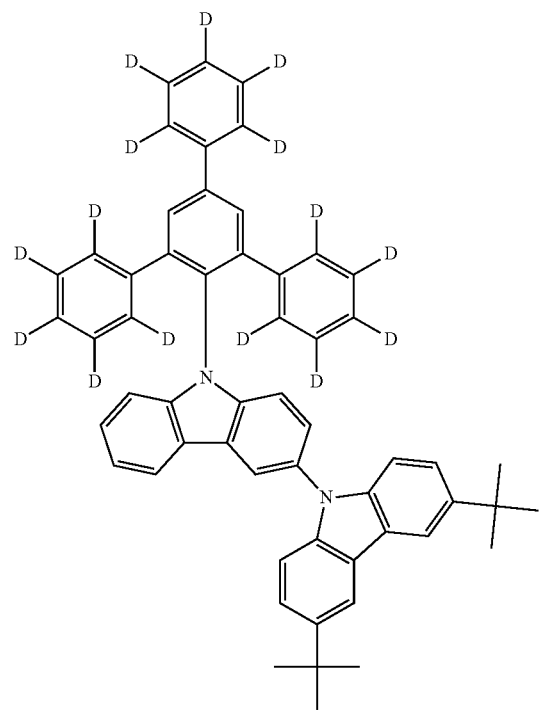
14
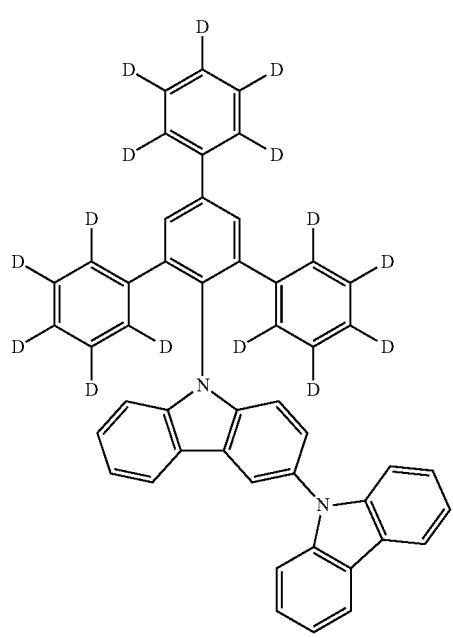
13
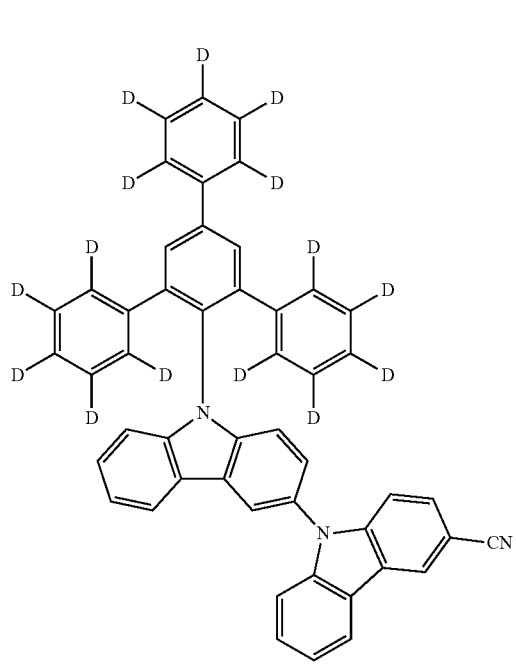
15

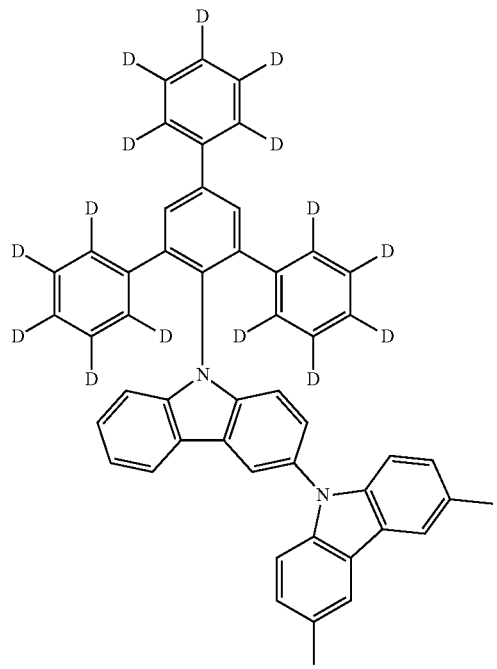
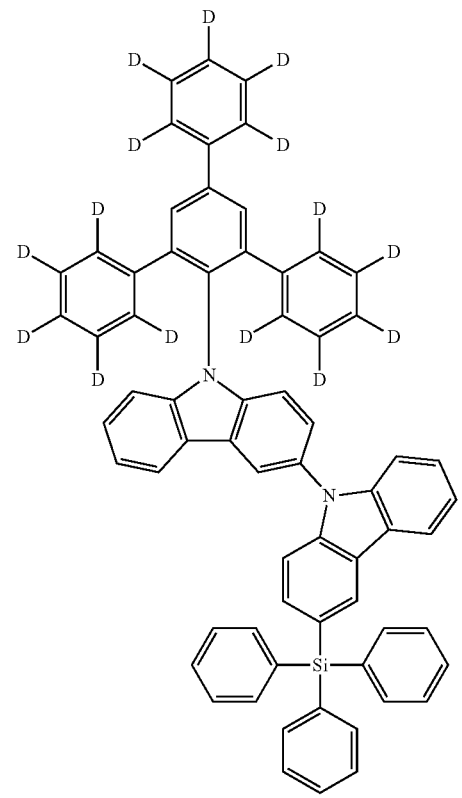
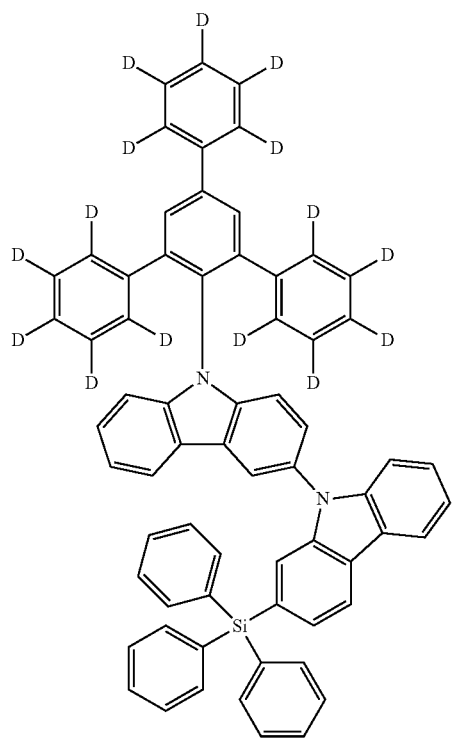
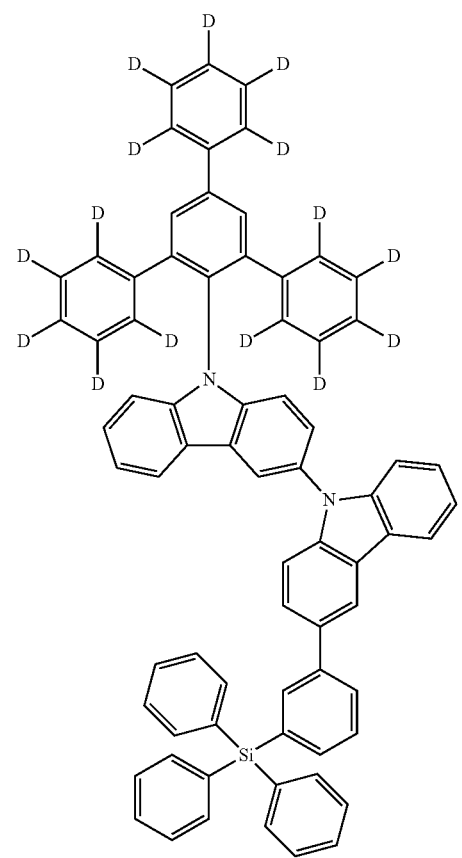

203
-continued
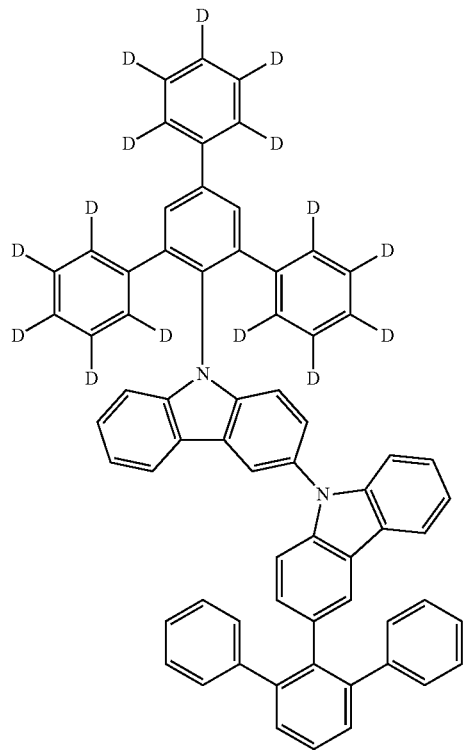
20
204
-continued
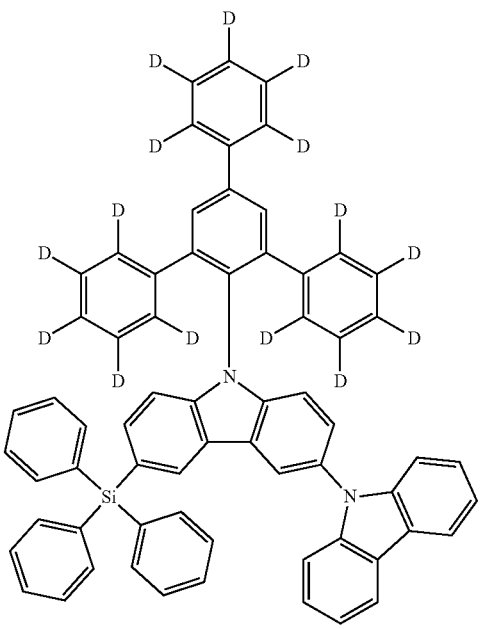
22
21
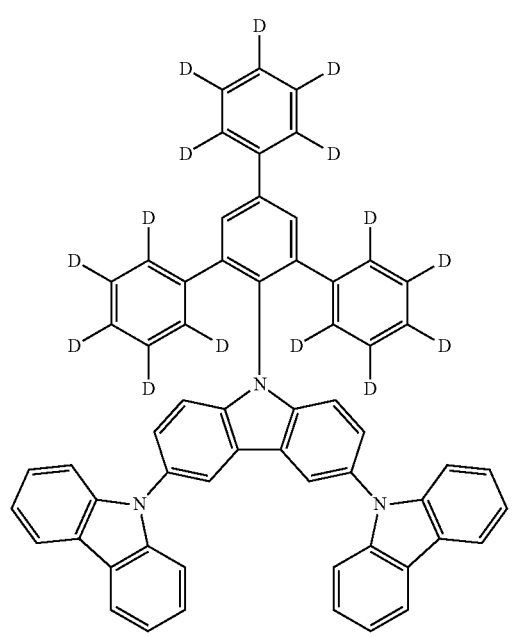
23
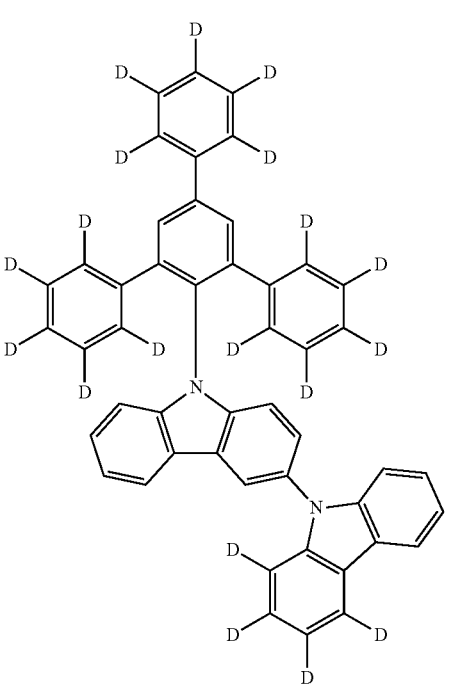

24
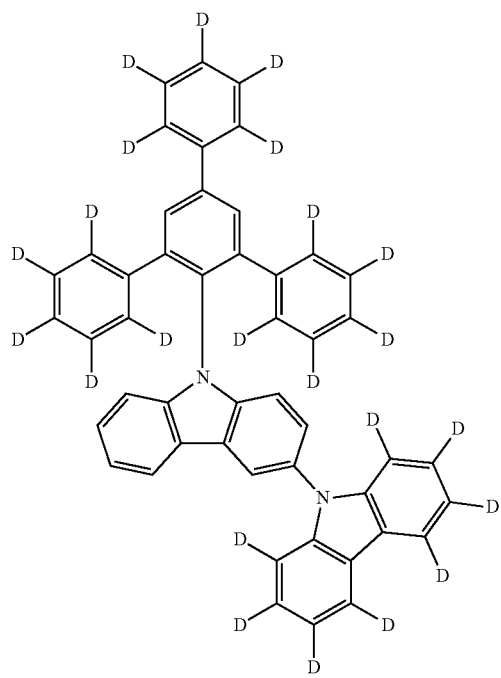
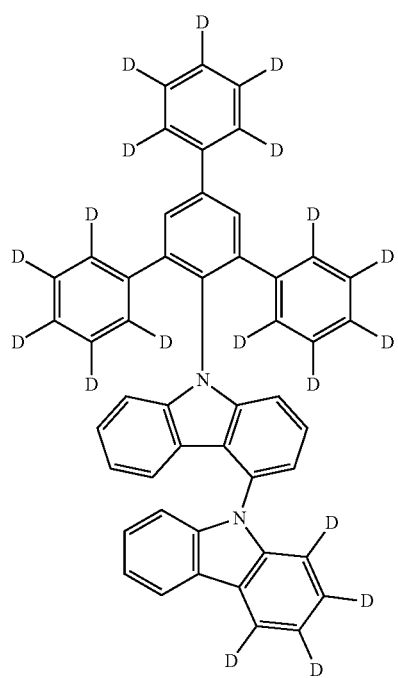
26
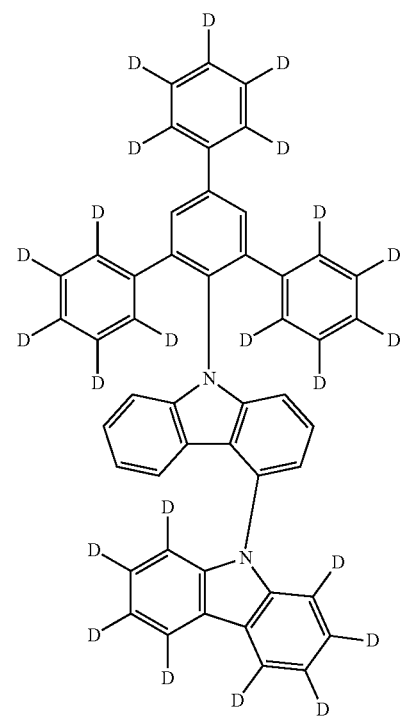
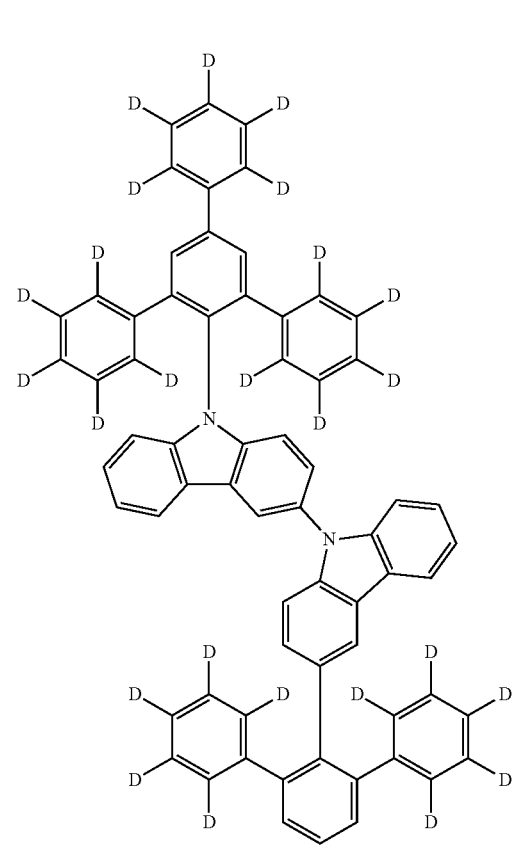

-continued
55
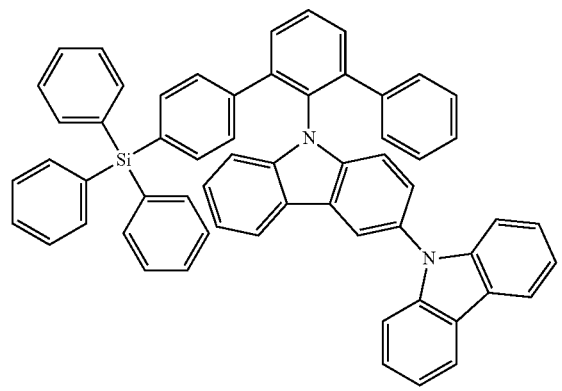
56
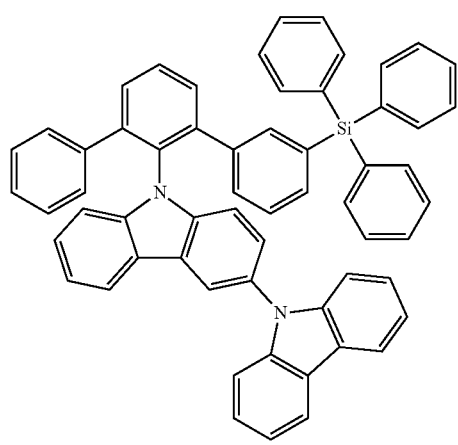
57
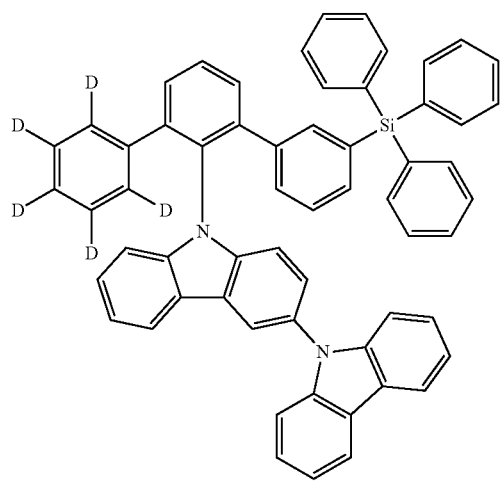
-continued
58
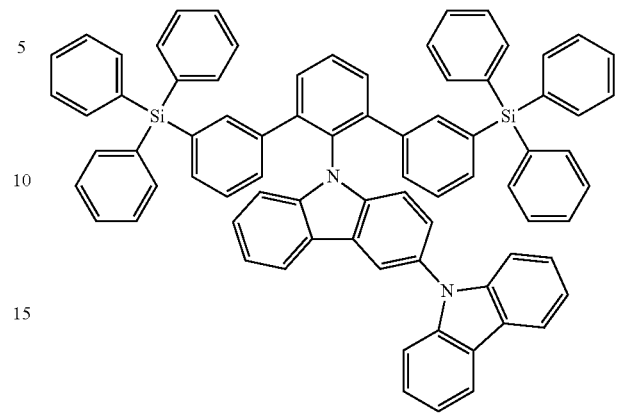
59
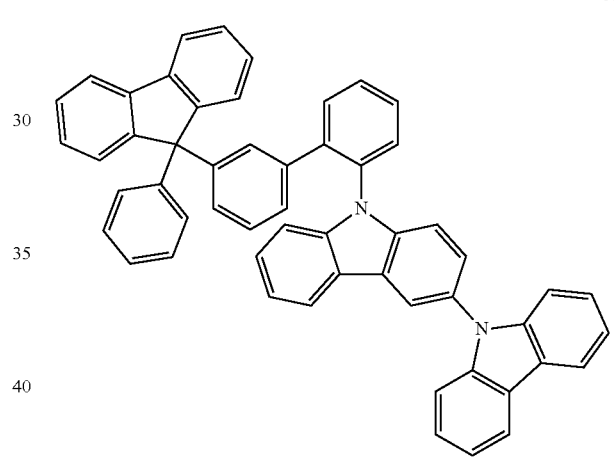
60
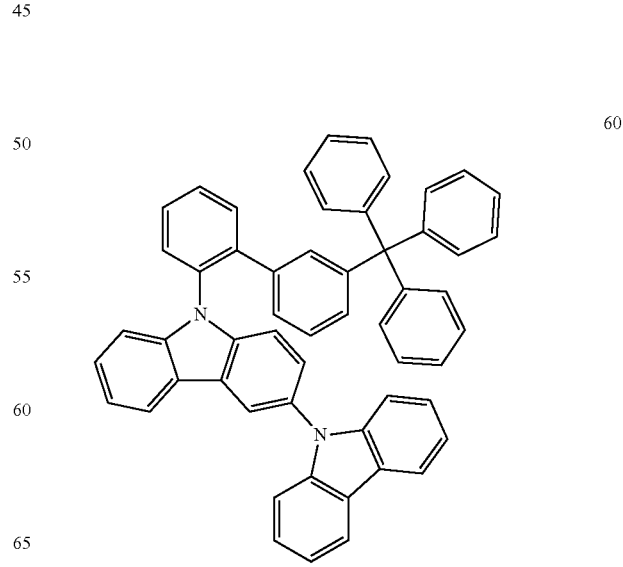

61
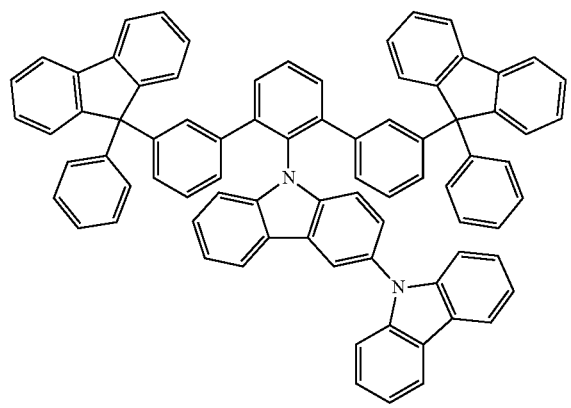
62
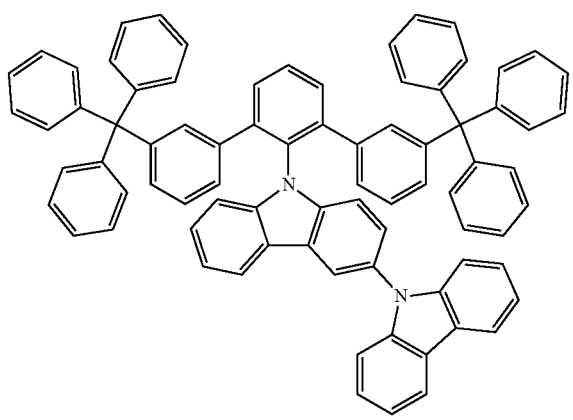
63
64
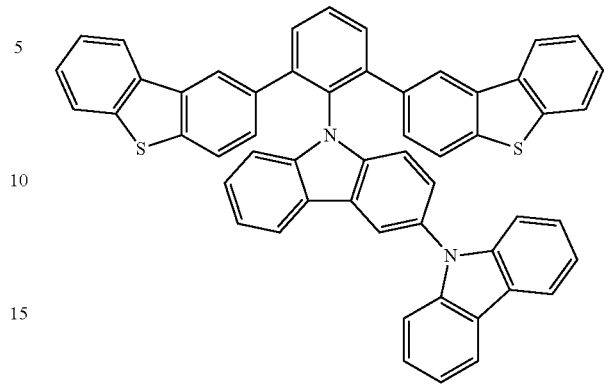
65
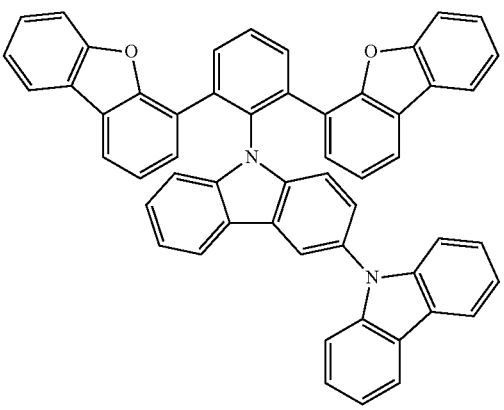
66
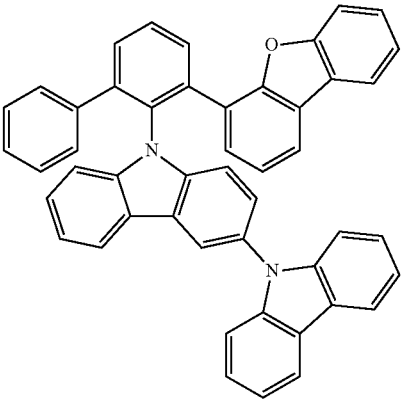
67
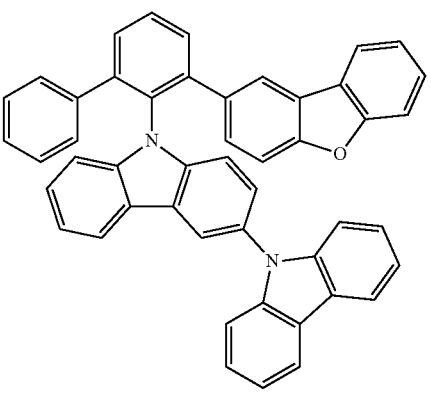

-continued
68
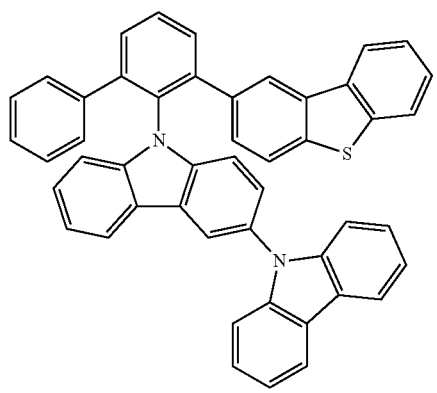
69
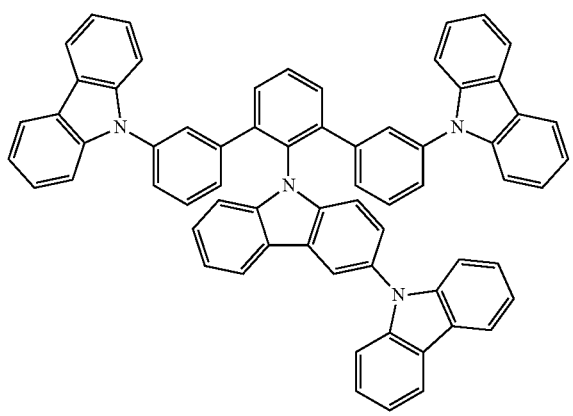
70
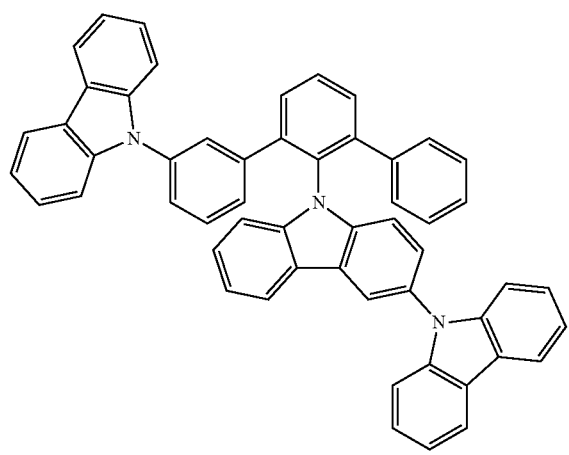
-continued
71
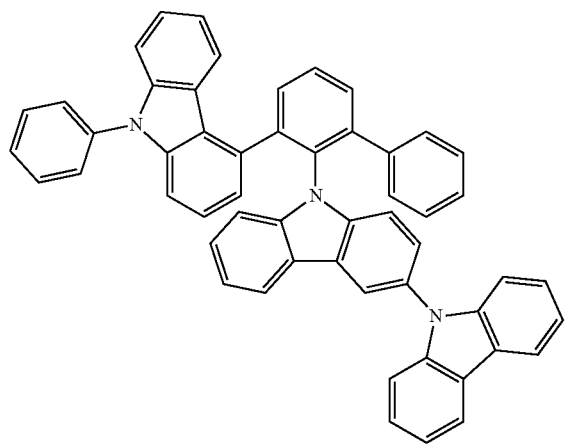
72
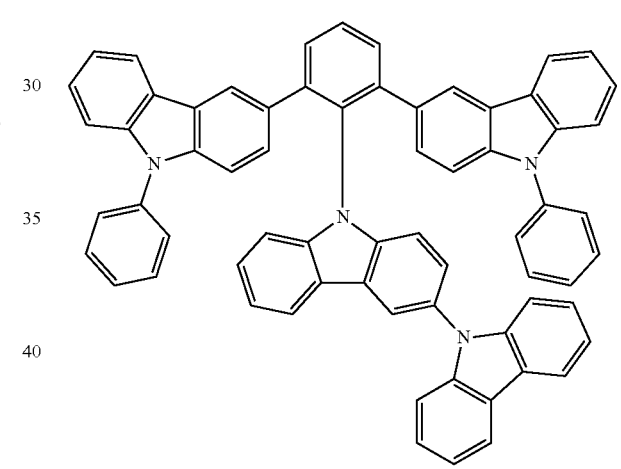
73
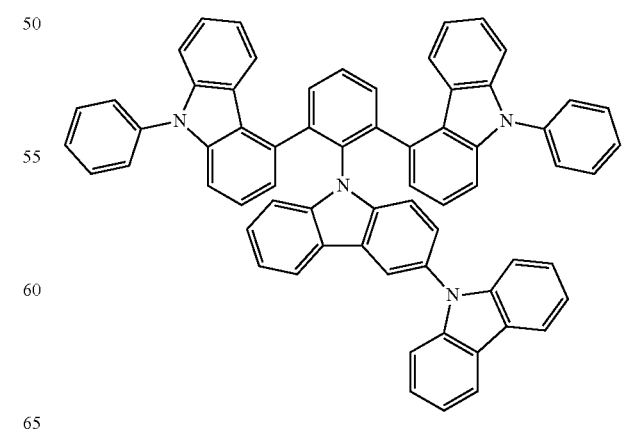

74
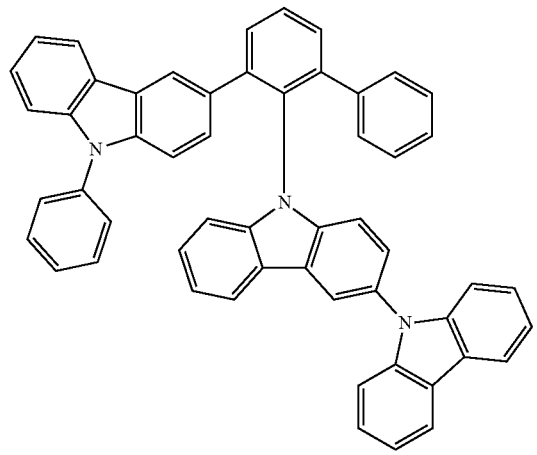
75
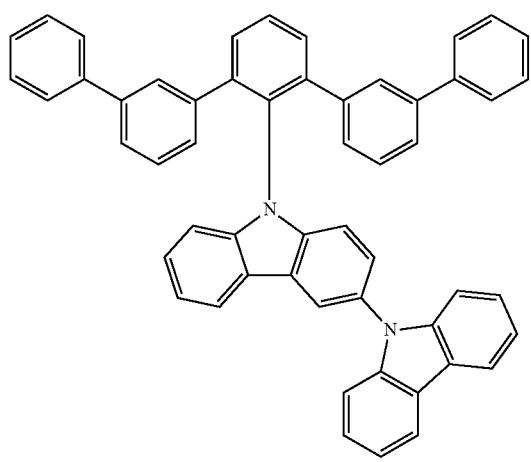
76
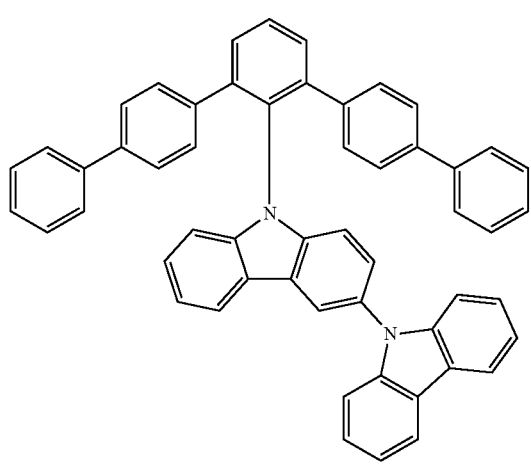
77
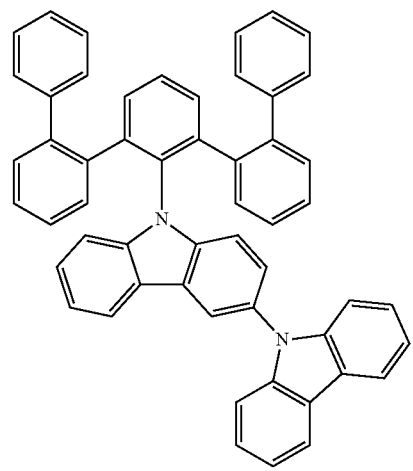
78
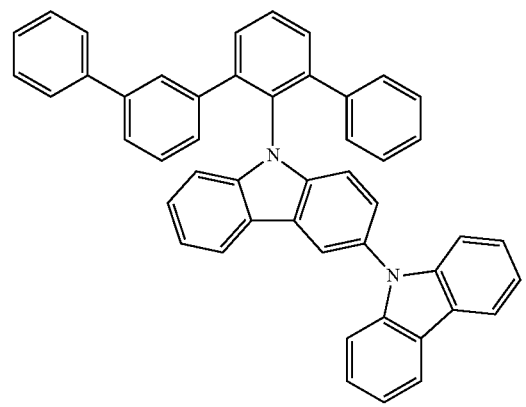
79
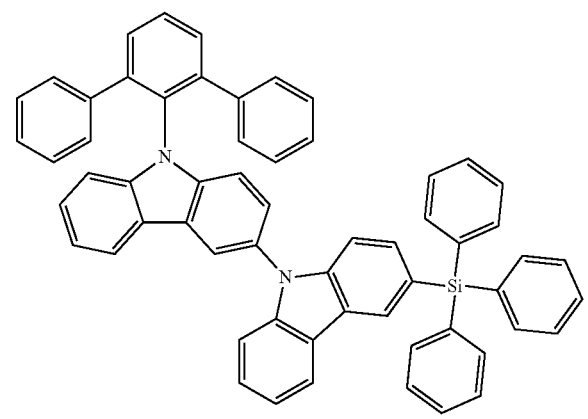

80
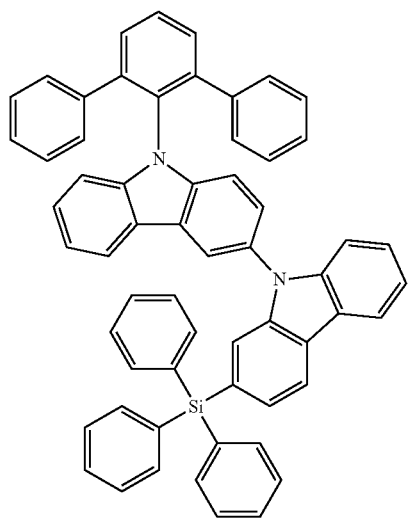
81
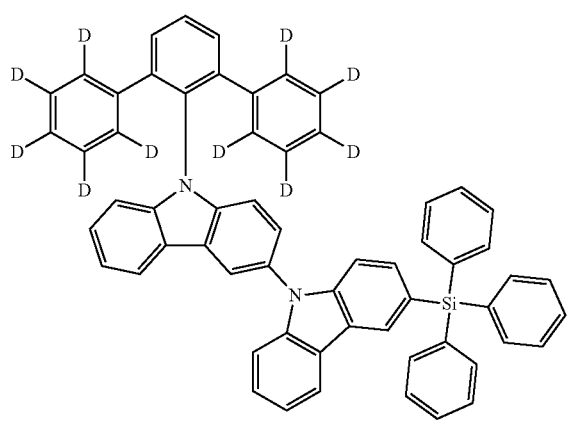
82
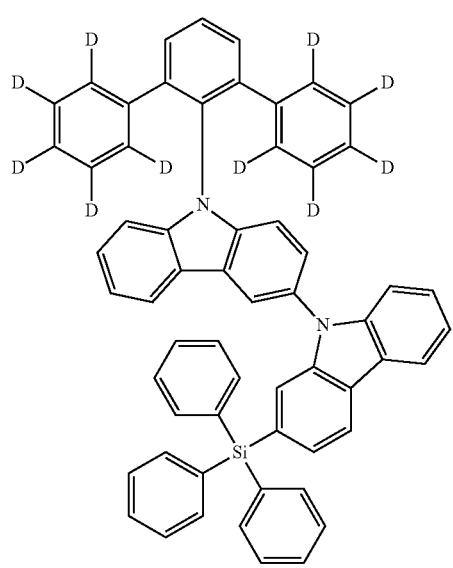
83
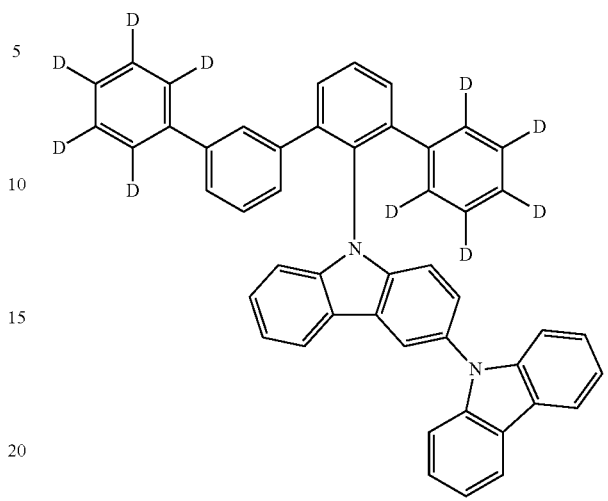
84
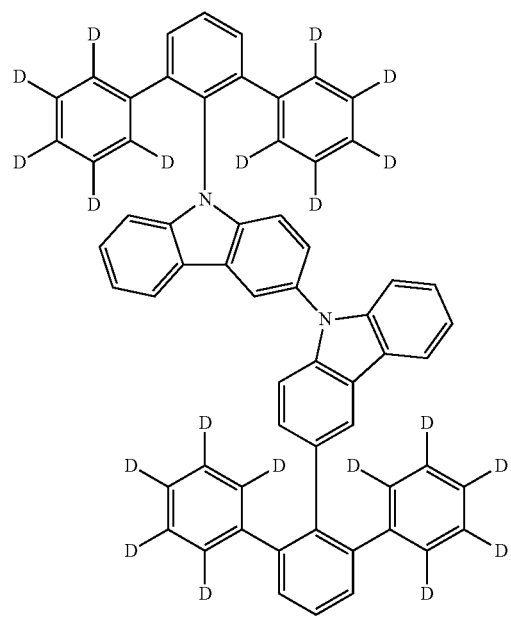

85
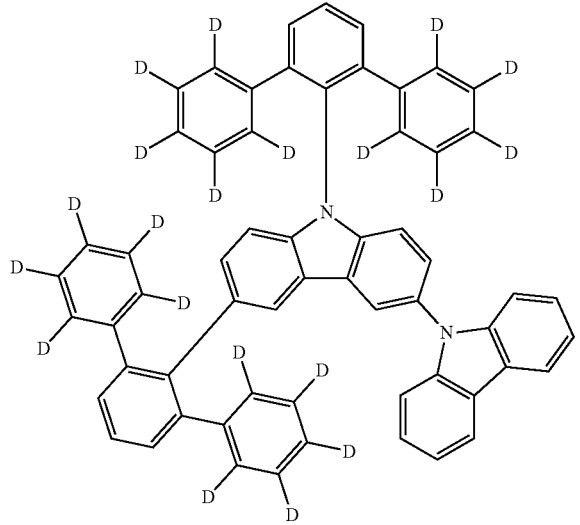
86
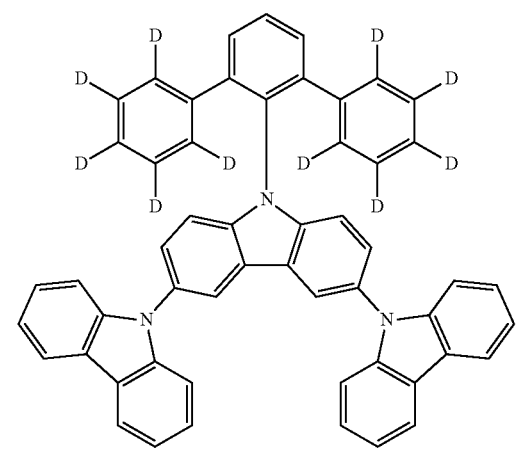
87
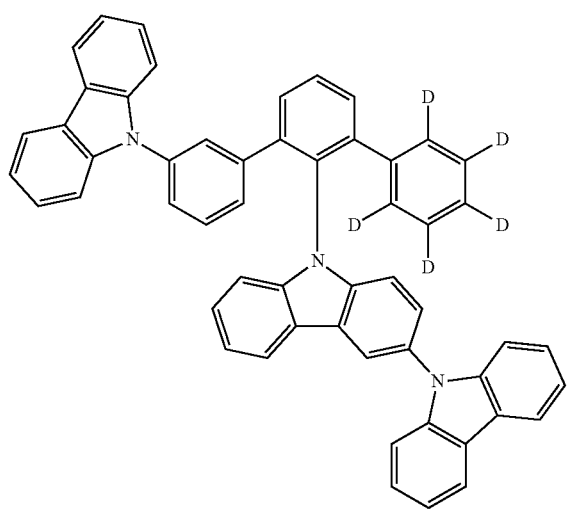
88
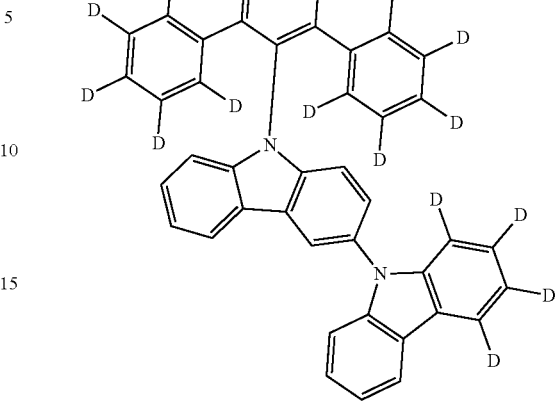
89
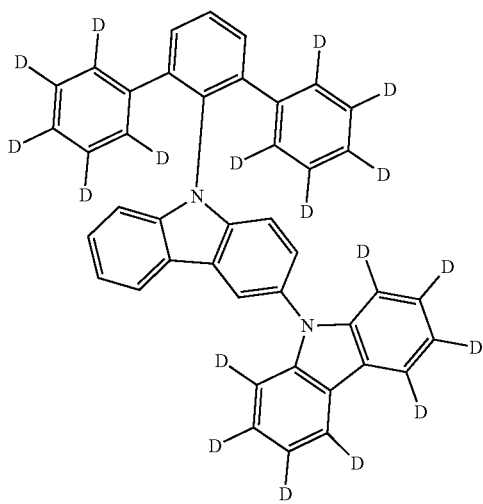
90
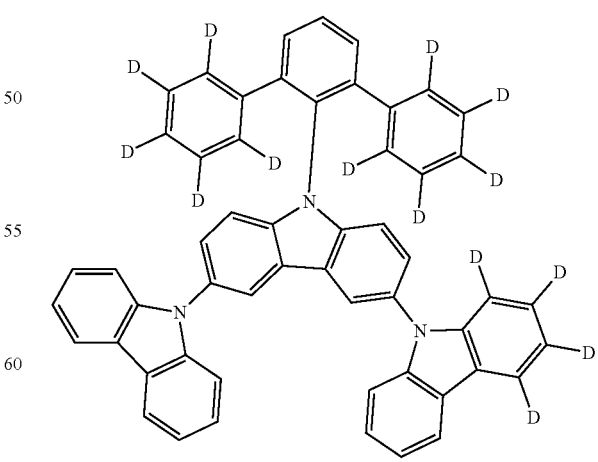

-continued
91
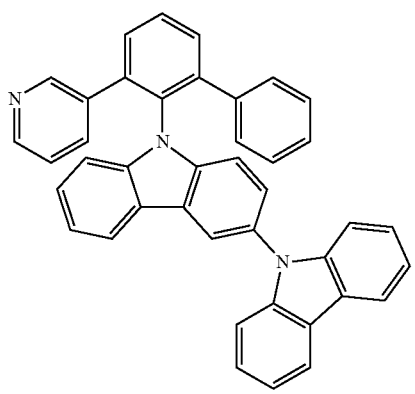
92
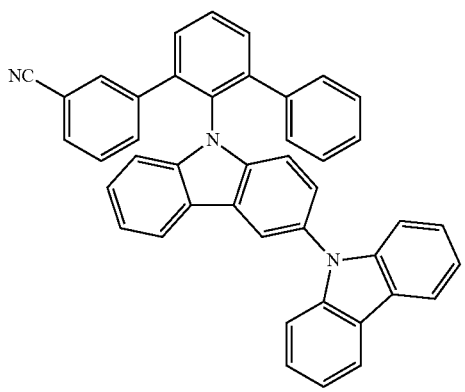
93
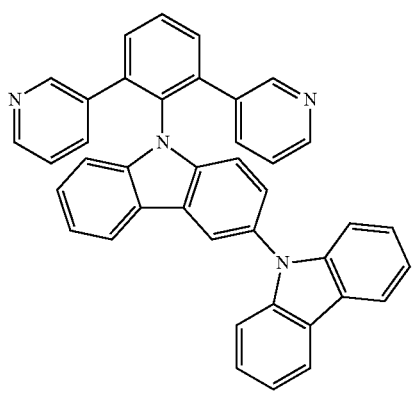
94
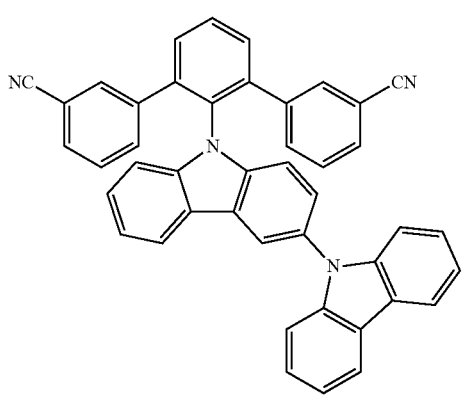
-continued
95
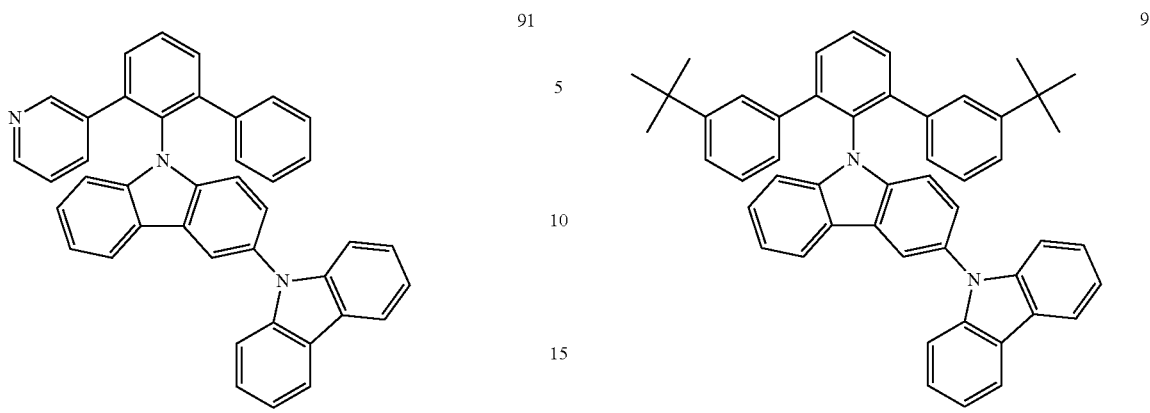
96
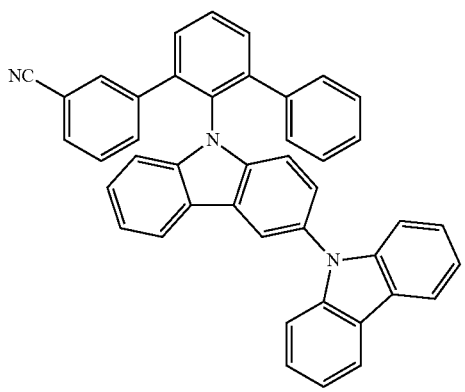
97
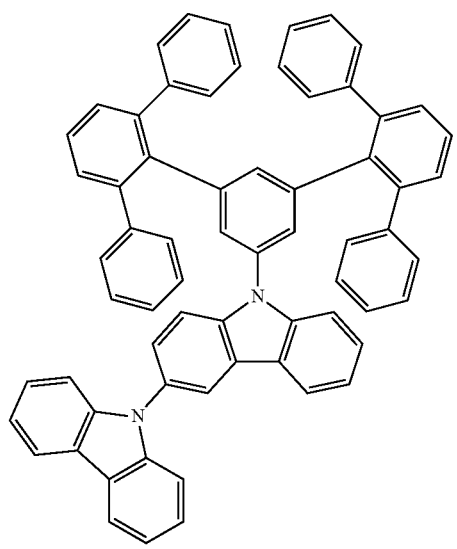

-continued

98

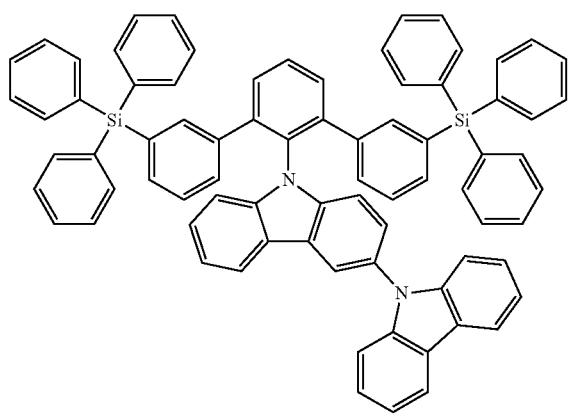

99

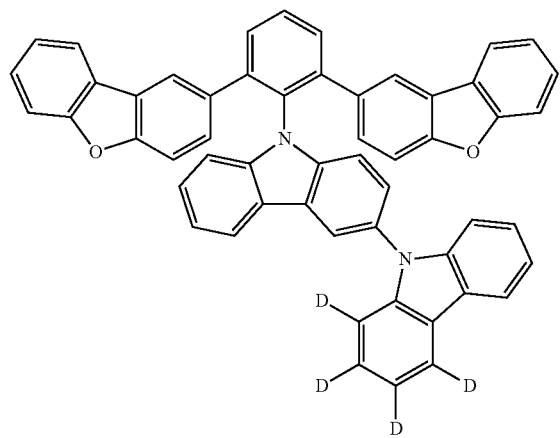

100

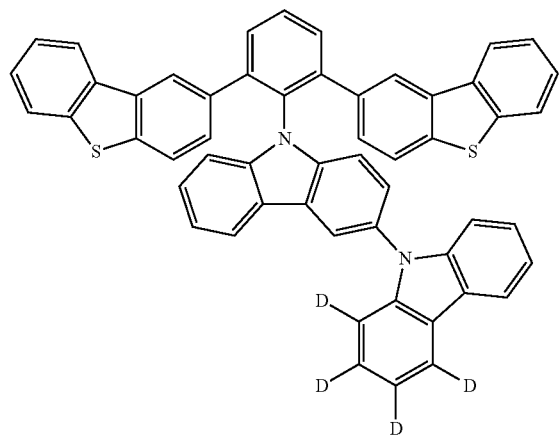

-continued

101

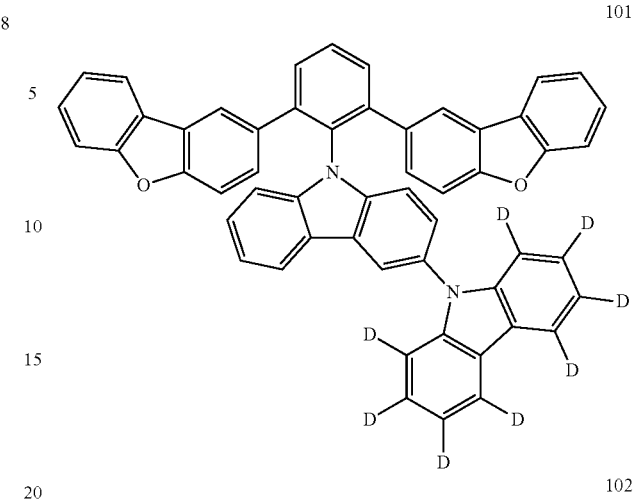

102

6. The heterocyclic compound of claim 1, wherein the heterocyclic compound emits blue light having a maximum emission wavelength of 450 nm or more and 470 nm or less, and has a difference of 0.5 eV or less between a singlet ($S_1$) energy level and a triplet ($T_1$) energy level.

7. A light-emitting device comprising:
 a first electrode;
 a second electrode facing the first electrode;
 an interlayer between the first electrode and the second electrode and comprising an emission layer; and
 the heterocyclic compound of claim 1.

8. The light-emitting device of claim 7, wherein the first electrode is an anode,
 the second electrode is a cathode,
 the interlayer further comprises a hole transport region between the first electrode and the emission layer and an electron transport region between the emission layer and the second electrode,
 the hole transport region comprises a hole injection layer, a hole transport layer, an emission auxiliary layer, an electron blocking layer, or any combination thereof, and
 the electron transport region comprises a hole blocking layer, an electron transport layer, an electron injection layer, or any combination thereof.

9. The light-emitting device of claim 7, wherein the emission layer comprises the heterocyclic compound.

10. The light-emitting device of claim 9, wherein the heterocyclic compound included in the emission layer is a host.

11. The light-emitting device of claim 8, wherein at least one of the hole transport region and the emission layer comprises an arylamine-containing compound, an acridine-containing compound, a carbazole-containing compound, or any combination thereof, or
- at least one of the emission layer and the electron transport region comprises a silicon-containing compound, a phosphine oxide-containing compound, a sulfur oxide-containing compound, a phosphorus oxide-containing compound, a triazine-containing compound, a pyrimidine-containing compound, a pyridine-containing compound, a dibenzofuran-containing compound, a dibenzothiophene-containing compound, or any combination thereof.

12. An electronic apparatus including the light-emitting device of claim 7.

13. The electronic apparatus of claim 12, further comprising a thin-film transistor,
- wherein the thin-film transistor comprises a source electrode and a drain electrode, and
- the first electrode of the light-emitting device is electrically coupled to at least one of the source electrode and the drain electrode of the thin-film transistor.

14. The electronic apparatus of claim 12, further comprising a color filter, a color conversion layer, a touch screen layer, a polarizing layer, or any combination thereof.

* * * * *